(12) United States Patent
Bertin

(10) Patent No.: US 9,007,732 B2
(45) Date of Patent: Apr. 14, 2015

(54) ELECTROSTATIC DISCHARGE PROTECTION CIRCUITS USING CARBON NANOTUBE FIELD EFFECT TRANSISTOR (CNTFET) DEVICES AND METHODS OF MAKING SAME

(71) Applicant: Nantero Inc., Woburn, MA (US)

(72) Inventor: Claude L. Bertin, Venice, FL (US)

(73) Assignee: Nantero Inc., Woburn, MA (US)

( * ) Notice: Subject to any disclaimer, the term of this patent is extended or adjusted under 35 U.S.C. 154(b) by 215 days.

(21) Appl. No.: 13/834,980

(22) Filed: Mar. 15, 2013

(65) Prior Publication Data

US 2014/0268444 A1    Sep. 18, 2014

(51) Int. Cl.
*H02H 9/00* (2006.01)
*H02H 3/20* (2006.01)
*H02H 9/04* (2006.01)
*B82Y 99/00* (2011.01)

(52) U.S. Cl.
CPC . *H02H 9/04* (2013.01); *B82Y 99/00* (2013.01); *Y10S 977/938* (2013.01)

(58) Field of Classification Search
USPC .......................................................... 361/56
See application file for complete search history.

(56) References Cited

U.S. PATENT DOCUMENTS

| | | | |
|---|---|---|---|
| 6,423,583 B1 | 7/2002 | Avouris et al. |
| 6,445,006 B1 | 9/2002 | Brandes et al. |
| 6,515,339 B2 | 2/2003 | Shin et al. |
| 6,706,402 B2 | 3/2004 | Rueckes et al. |
| 6,759,693 B2 | 7/2004 | Vogeli et al. |
| 6,803,840 B2 | 10/2004 | Hunt et al. |
| 6,835,591 B2 | 12/2004 | Rueckes et al. |
| 6,918,284 B2 | 7/2005 | Snow et al. |
| 6,919,740 B2 | 7/2005 | Snider |
| 6,955,937 B1 | 10/2005 | Burke et al. |
| 6,969,651 B1 | 11/2005 | Lu et al. |
| 6,990,009 B2 | 1/2006 | Bertin et al. |
| 7,015,500 B2 | 3/2006 | Choi et al. |
| 7,115,901 B2 | 10/2006 | Bertin et al. |
| 7,259,410 B2 | 8/2007 | Jaiprakash et al. |
| 7,335,395 B2 | 2/2008 | Ward et al. |
| 7,375,369 B2 | 5/2008 | Sen et al. |

(Continued)

OTHER PUBLICATIONS

Amblard, G., "Development and characterization of carbon nanotube processes for NRAM technology," Proc. of SPIE, 2011, vol. 7970, pp. 797017-1-797017-7.

(Continued)

*Primary Examiner* — Dharti Patel
(74) *Attorney, Agent, or Firm* — Nantero Inc.

(57) ABSTRACT

Device structures and methods for providing carbon nanotube field effect transistor (CNTFET) devices with enhanced current carrying capability at lower densities are disclosed. Apparatuses and methods using CNTFET devices for providing protection from electrostatic discharge (ESD) voltages are also disclosed. According to some aspects of the present disclosure the electrostatic discharge protection circuits are configured with CNTFET diodes and provide protection from electrostatic discharge induced voltages for a protected circuit without affecting the normal operation of the protected circuit. According to some aspects of the present disclosure the methods for providing protection from electrostatic discharge voltages create conducting paths for providing protection from electrostatic discharge induced voltages for a protected circuit without affecting the normal operation of the protected circuit.

21 Claims, 107 Drawing Sheets

(56) References Cited

U.S. PATENT DOCUMENTS

| | | | |
|---|---|---|---|
| 7,567,414 B2* | 7/2009 | Bertin et al. | 361/56 |
| 7,598,544 B2 | 10/2009 | Bertin et al. | |
| 7,781,862 B2 | 8/2010 | Bertin et al. | |
| 7,782,650 B2 | 8/2010 | Bertin et al. | |
| 7,852,114 B2 | 12/2010 | Bertin et al. | |
| 8,008,745 B2 | 8/2011 | Bertin et al. | |
| 8,183,665 B2 | 5/2012 | Bertin et al. | |
| 2001/0023986 A1 | 9/2001 | Mancevski | |
| 2002/0064007 A1* | 5/2002 | Chang et al. | 361/56 |
| 2003/0200521 A1 | 10/2003 | DeHon et al. | |
| 2004/0031975 A1 | 2/2004 | Kern et al. | |
| 2005/0056877 A1 | 3/2005 | Rueckes et al. | |
| 2006/0183278 A1 | 8/2006 | Bertin et al. | |

OTHER PUBLICATIONS

Avouris, P., "Carbon Nanotube Electronics," Chem. Physics, 2002, pp. 429-445.

Awano, Y., "Graphene for VLSI: FET and Interconnect Applications," IEDM 2009 Technical Digest, pp. 10.1.1-10.1.4.

Brock, et al., "Carbon Nanotube Memories and Fabrics in a Radiation Hard Semiconductor Foundry," 2005 IEEE Conference, 9 pages.

Brown, K.M., "System in package "The Rebirth of SIP"," 2004 IEEE Custom Circuits Conference, May 2004, 6 pages.

Crowley, et al., "512 Mb PROM with 8 layers of antifuse/Diode cells," IEEE International Solid-State Circuits, Conference, Feb. 2003, vol. XLVI, pp. 284-285.

Derycke, et al., "Carbon Nanotube Inter- and Intramolecular Logic Gates," Nano Letters, 2001, vol. 1, vol. 9, pp. 453-456.

Duan, et al., "Nonvolatile Memory and Programmable Logic from Molecule-Gate Nanowires," Nano Letters, XXXX, vol. 0, No. 0, pp. A-D.

Heinze, et al., "Carbon Nanotubes as Schottky Barrier Transistors," Phys. Rev. Ltrs., 2002, vol. 89, No. 10, pp. 106801-1-106801-4.

Huai, Y., "Spin-Transfet Torque MRAM (STT-MTAM): Challenges and Prospects," AAPS Bulletin, Dec. 2008, vol. 18, No. 6, pp. 33-40.

Javey, et al., "Carbon Nanotube Transistor Arrays for Multistage Complementary Logic and Ring Oscillators," Nano Letters, XXXX, vol. 0, No. 0, pp. A-D.

Jiang, et al., "Performance Breakthrough in 8nm Gate-All-Around Length Gate-All-Around Nanowire Transistors using Metallic Nanowire Contacts," 2008 Symposium on VLSI Technology Digest of Technical Papers, pp. 34-35.

Kianian, et al., A 3D Stackable Carbon Nanotube-based Nonvolatile Memory (NRAM) ESSDERC, Jun. 14, 2010, Nantero Inc., 4 pages.

Kinaret, et al., "A Carbon Nanotube-Based Nanorelay," App. Phys. Ltrs., 2003, vol. 82, No. 8, pp. 1287-1289.

Luyken, et al., "Concepts for Hybrid DMOS-Molecular Non-Volatile Memories," Nanotechnology, 2003, vol. 14, pp. 273-276.

Martel, et al., "Carbon Nanotube Field-Effect Transistors and Logic Circuits," DAC 2002, New Orleans, LA ACM 1-58113-461-4/02/0006.

Radosavijevic, et al., "Nonvolatile Molecular Memory Elements Based on Ambipolr Nanotube Field Effect Transistors," Nano Ltrs., 2002, vol. 2, No. 7, pp. 761-764.

Rosendale, et al., "A 4 Megabit Carbon Nanotube-based Nonvolatile Memory (NRAM)," ISSCIRC 2010 Proceedings, Sep. 2010, pp. 478-1181.

Rueckes, et al., "Carbon Nanotube-Based Nonvolatile Random Access Memory for Molecular Computing," Science, 2000, vol. 289, pp. 94-97.

Servalli, G., "A 45nm Generation Phase Change Memory Technology," IEDM 2009 Technical Digest, pp. 5.7.1-5.7.4.

Ward, et al., "A Non-Volatile Nanoelectromechanical Memory Element Utilizing a Fabric of Carbon Nanotubes," IEEE 2004, pp. 34-38.

Wind, "Fabrication and Electrical Characterization of Top Gate Single-Wall Carbon Nanotube Field-Effect Transistors," IBM T.J. Watson Research Center, Yorktown Heights, NY, 14 pages.

R. Colorado, Jr. et al., "Silica-coated single walled nanotubes: nanostructure formation," Chem. Mater., 2004, vol. 16, pp. 2691-2693.

E.A. Whitsitt et al., "Silica coated single walled nanotubes," Nano Letters, 2003, vol. 3, pp. 775-778.

Whitsitt et al., "SLP silica coating of individual single walled carbon nanotubes," J. Mater. Chem., 2005, vol. 15, pp. 4678-4687.

\* cited by examiner

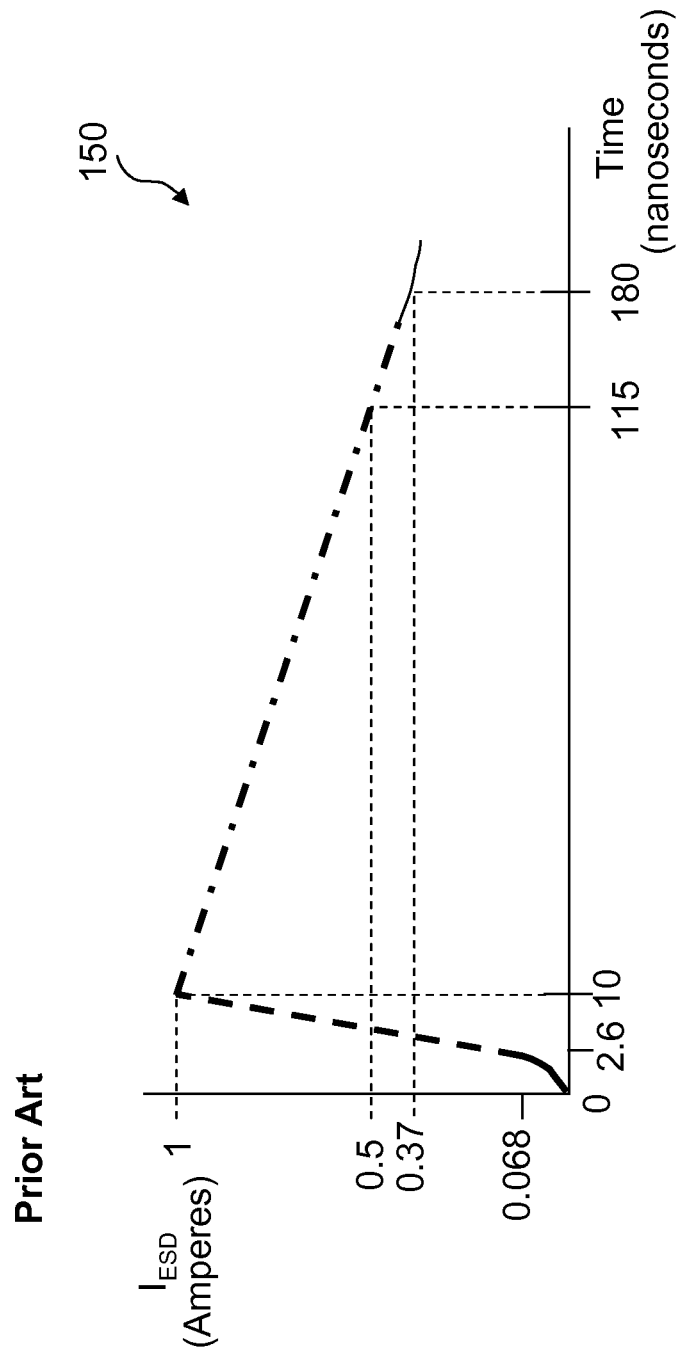

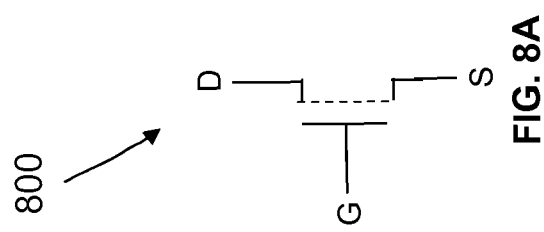

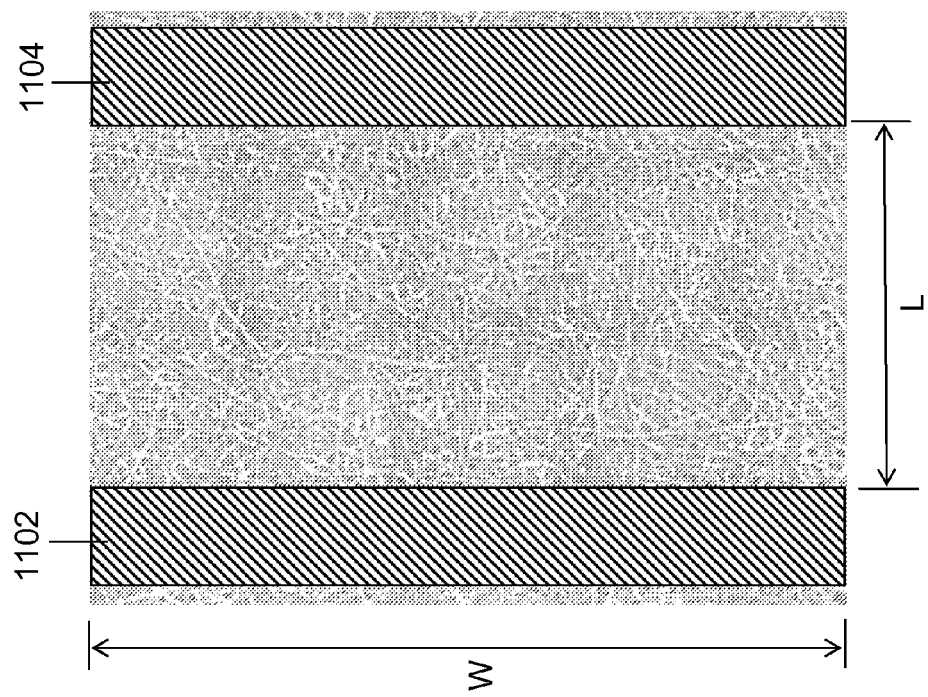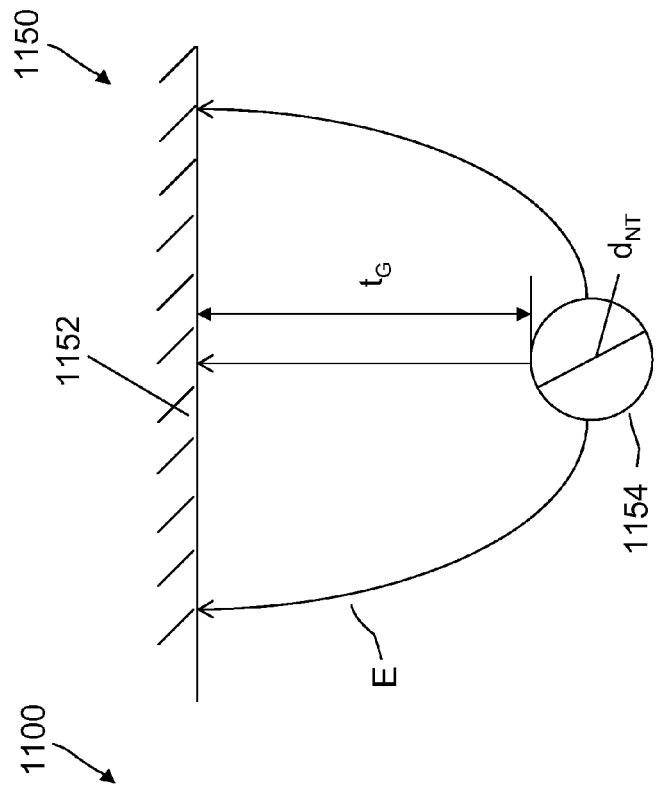

| Items | #1: pCNTFET Device Unordered NT Fabric h mobility; $\varepsilon_R = 4$ | #2: pCNTFET Device Unordered NT Fabric h mobility; $\varepsilon_R = 25$ | #3: nCNTFET Device Unordered NT Fabric e mobility; $\varepsilon_R = 4$ | #4: nCNTFET Device Unordered NT Fabric mobility; $\varepsilon_R = 25$ |
|---|---|---|---|---|
| One-Finger Wide CNTFET Device | $NTFC_P = 4 \times 10^3$ cm/V-s $L_P = 0.1$ μm $W_P = 83,300$ μm $\beta_P = 833,000$ | $NTFC_P = 4 \times 10^3$ cm/V-s $L_P = 0.05$ μm $W_P = 6,650$ μm $\beta_P = 133,000$ | $NTFC_N = 8 \times 10^3$ cm/V-s $L_N = 0.1$ μm $W_N = 41,670$ μm $\beta_N = 416,700$ | $NTFC_N = 8 \times 10^3$ cm/V-s $L_N = 0.05$ μm $W_N = 3,335$ μm $\beta_N = 66,700$ |
| Stacked Pair Multi-Finger CNTFET Devices Area = XY: | NT ESD Protect Circuit Area = XY <br> 1420  <br> 18,401 μm² | 739.4 μm² | 9,216 μm² | 314.6 μm² |
| # Fingers $N_G$ | 616 | 247 | 436 | 175 |
| $W_{FNGR}$ | 135.2 μm | 27 μm | 95.6 μm | 19.1 μm |
| X Direction | 135.6 μm | 27.2 μm | 96 μm | 19.3 μm |
| Y Direction | 135.7 μm | 27.2 μm | 96 μm | 19.3 μm |
| Adjacent Pair Multi-Finger CNTFET Devices |  1440 | 1460 | NT ESD Protect Circuit Area = 2 · XY | |
| X' Direction | 192 μm | 38.5 μm | 136 μm | 27.3 μm |
| Y' Direction | 192 μm | 38.5 μm | 136 μm | 27.3 μm |

FIG. 14

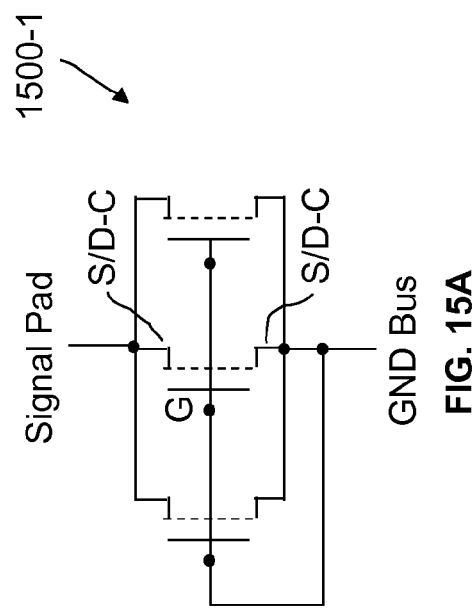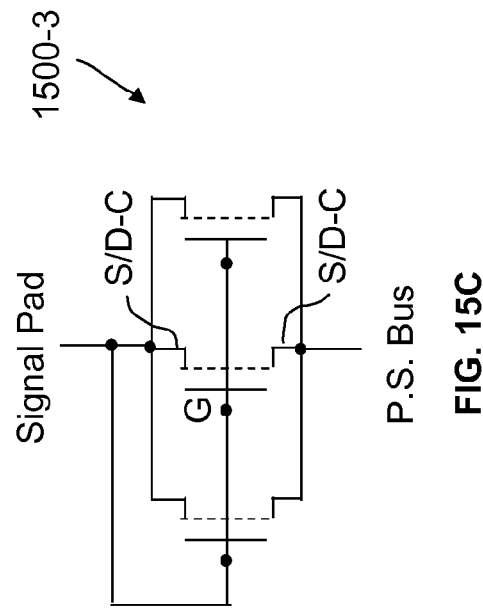

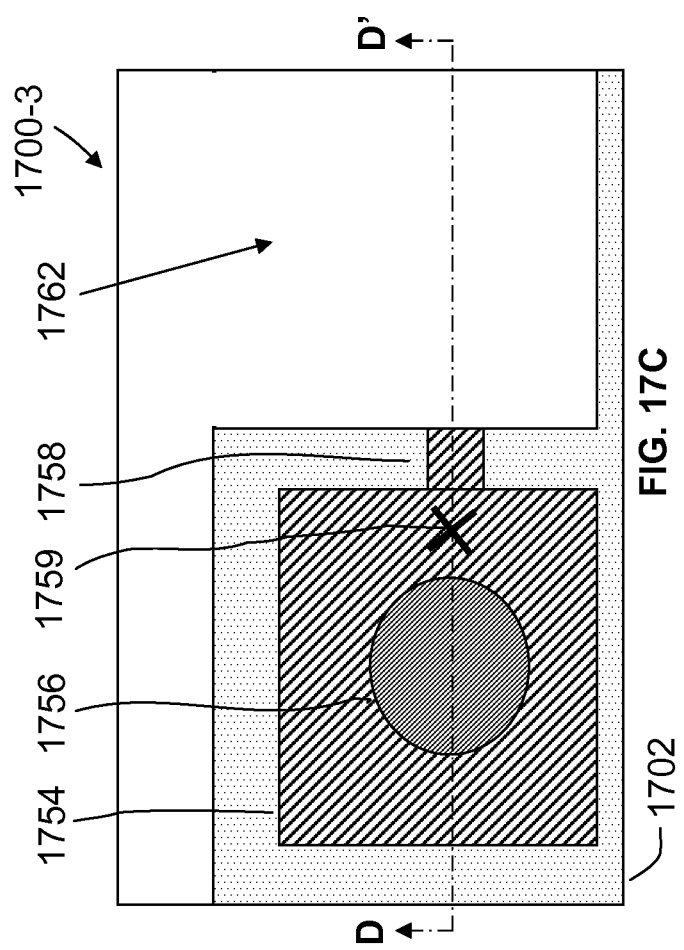

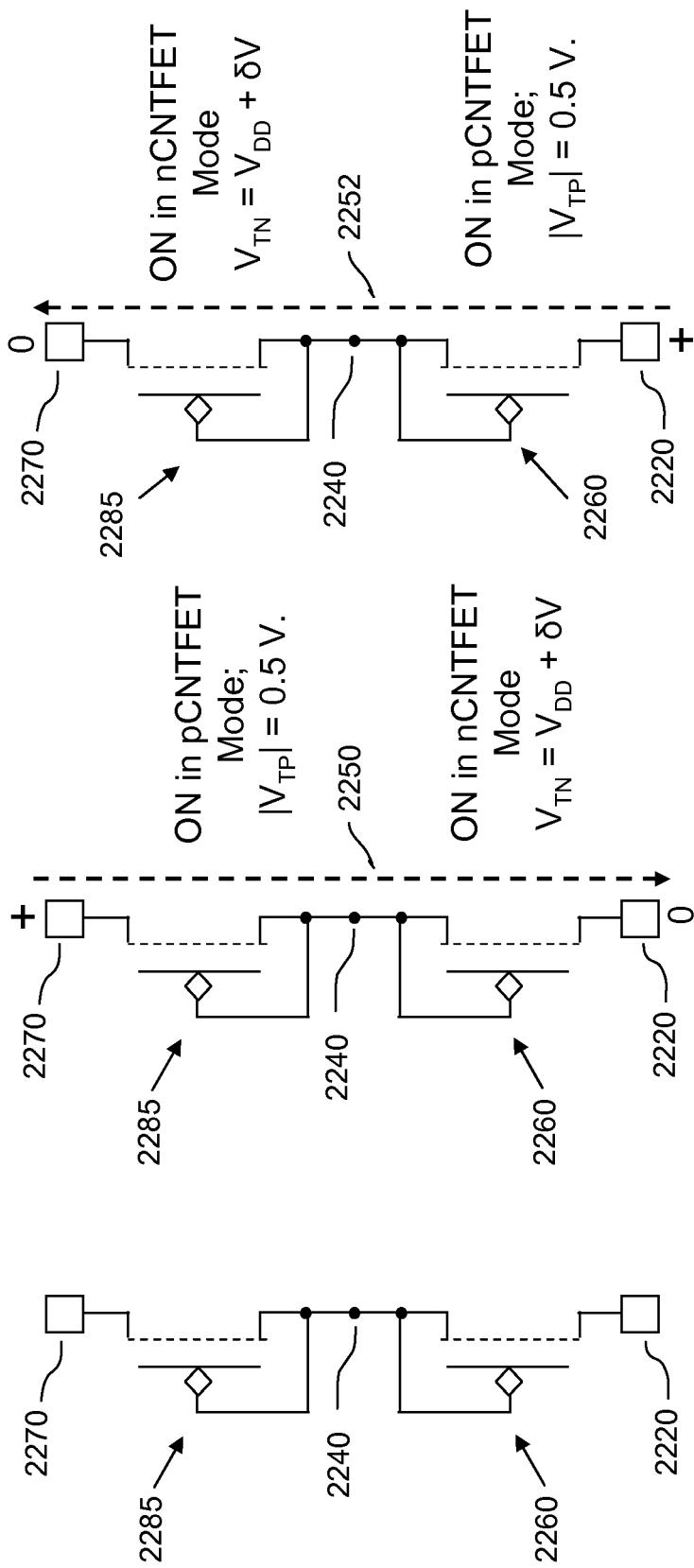

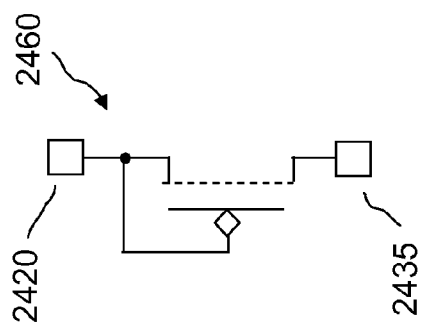
FIG. 24B1
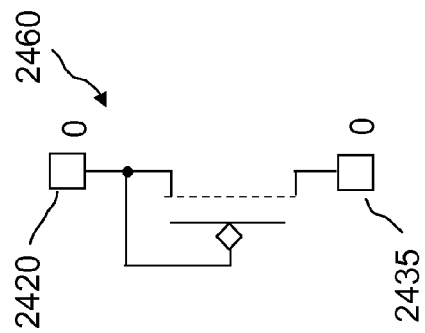
FIG. 24B3
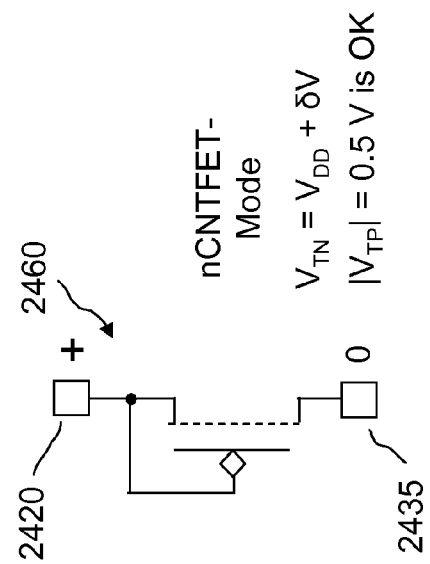
nCNTFET-
Mode
$V_{TN} = V_{DD} + \delta V$
$|V_{TP}| = 0.5$ V is OK
FIG. 24B2

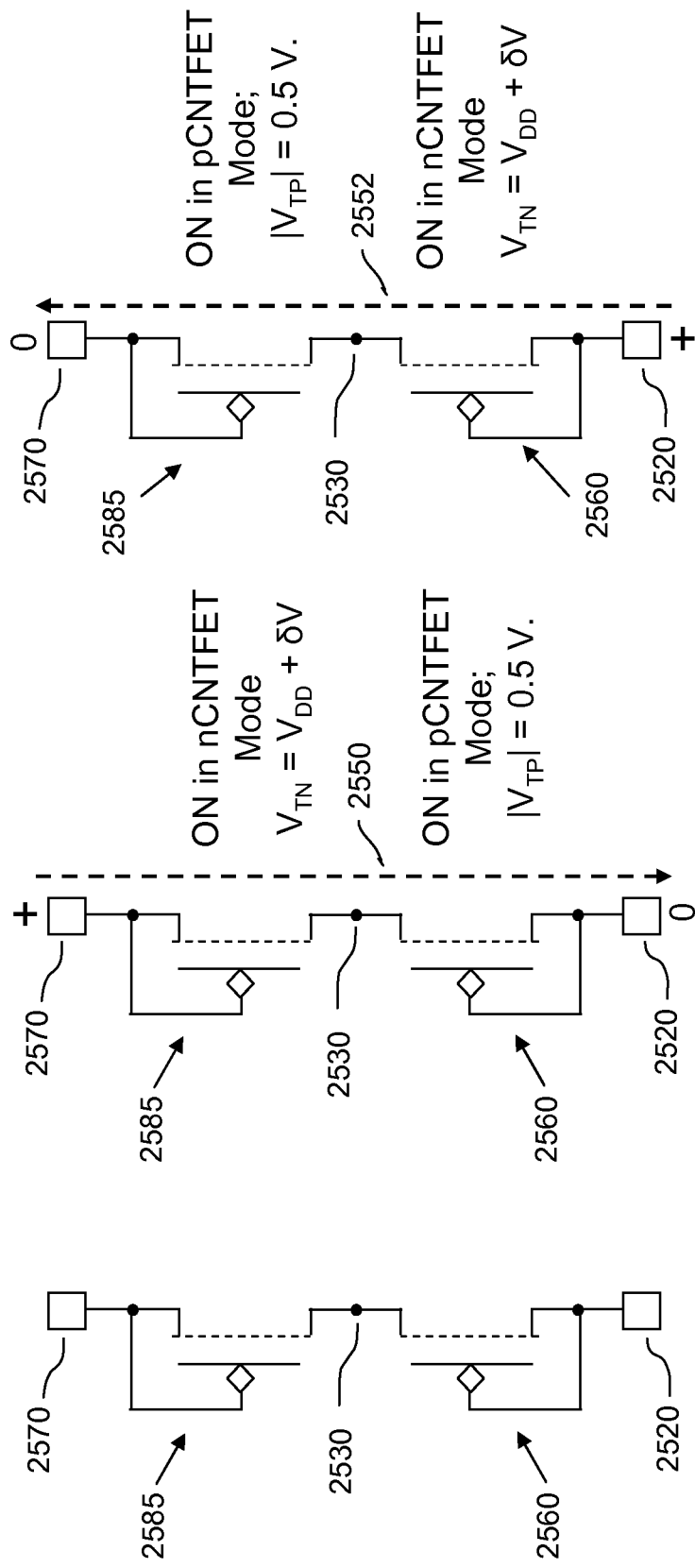

pCNTFET-
Mode
$|V_{TP}| = V_{DD} + \delta V$
$V_{TN} = 0.5$ V is OK

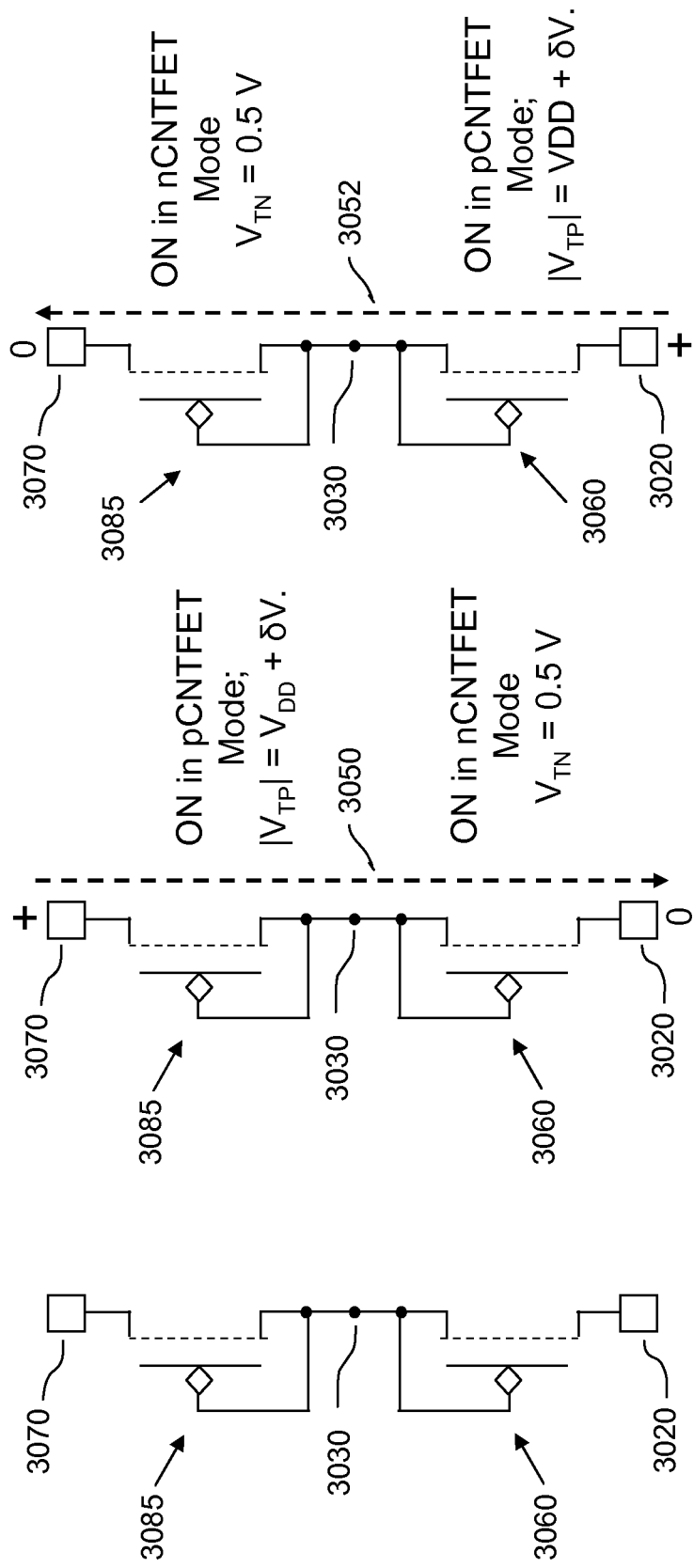

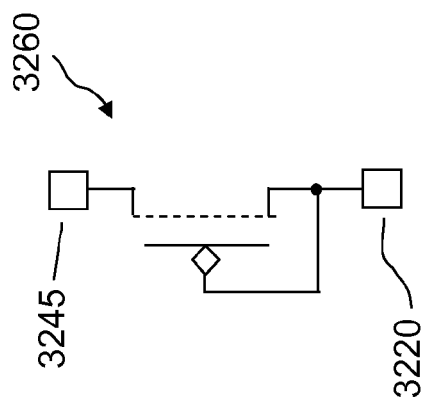
FIG. 32B1
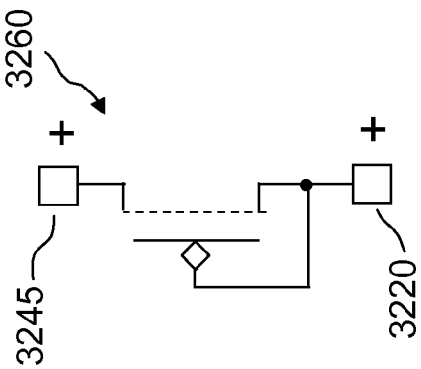
FIG. 32B3
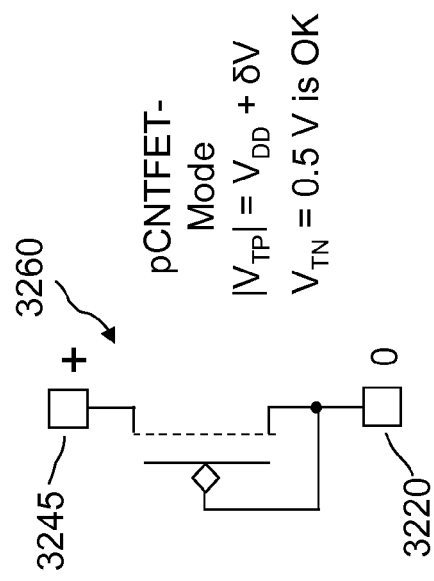
pCNTFET-
Mode
$|V_{TP}| = V_{DD} + \delta V$
$V_{TN} = 0.5$ V is OK
FIG. 32B2

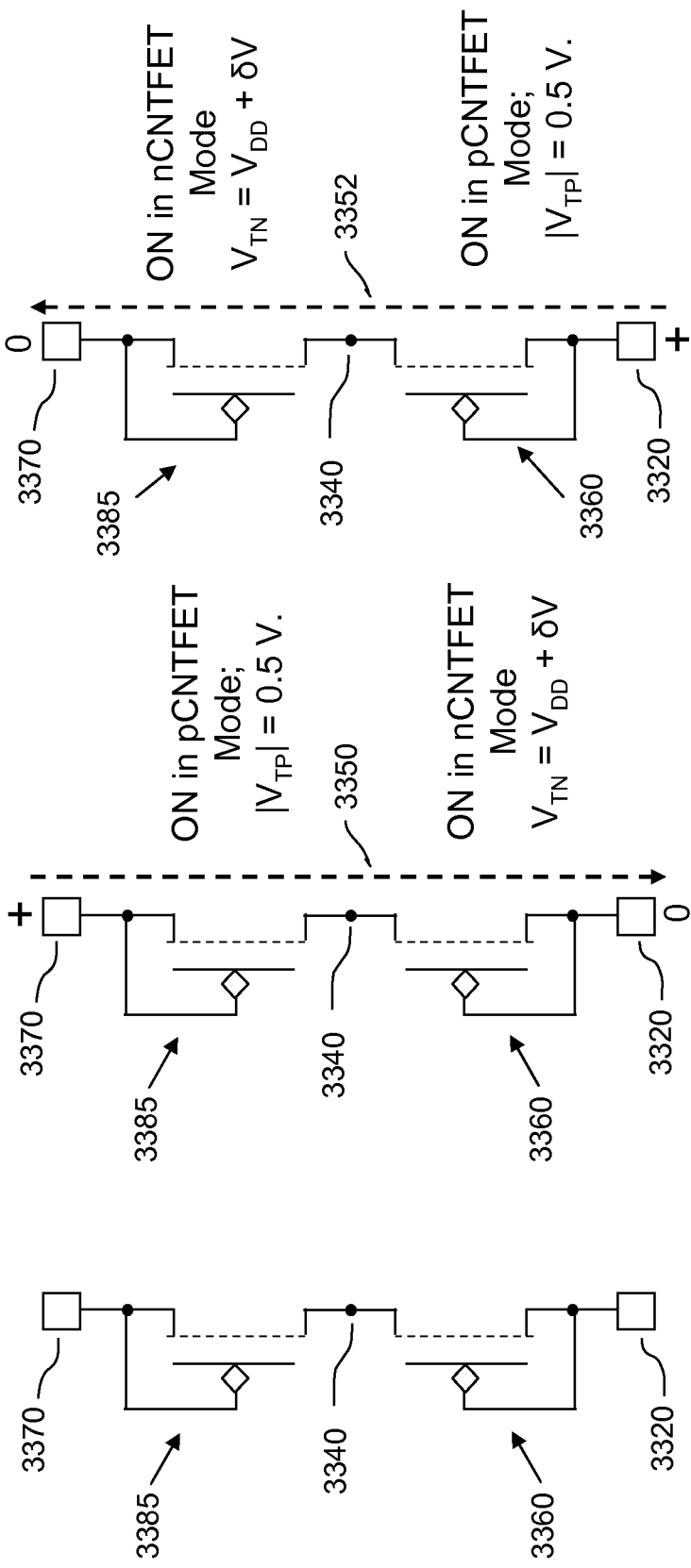

| Items | #1:pCNTFET Device Unordered NT Fab. h mobility; $\varepsilon_R = 4$ | #2:pCNTFET Device Ordered NT Fabric h mobility; $\varepsilon_R = 4$ | #3:nCNTFET Device Unordered NT Fab. e mobility; $\varepsilon_R = 4$ | #4:nCNTFET Device Ordered NT Fabric e mobility; $\varepsilon_R = 4$ |
|---|---|---|---|---|
| One-Finger Wide CNTFET Device | $NTFC_P = 4 \times 10^3$ cm²/V-s $L_P = 0.2$ um $W_P = 166,600$ um $\beta_P = 833,000$ | $\mu_P = 775$ cm²/V-s $L_P = 0.2$ um $W_P = 111$ um $\beta_P = 555$ | $NTFC_N = 6 \times 10^3$ cm²/V-s $L_N = 0.2$ um $W_N = 83,340$ um $\beta_N = 416,700$ | $\mu_N = 775$ cm²/V-s $L_N = 0.2$ um $W_N = 111$ um $\beta_N = 555$ |
| Stacked Pair Multi-Finger CNTFET Device Area = XY: | 73,604 um²; | NT ESD Protect Circuit Area = XY 4620 57 um²; ~ 1,300x less | 36,883 um² | 57 um²; ~ 650x less |
| # Fingers $N_G$ $W_{FNGR}$ X Direction Y Direction | 616 269.5 um 271.2 um 271.4 um | 17 6.53 um 7.7 um 7.4 um | 436 191.1 um 192.1 um 192.0 um | 17 6.53 um 7.7 um 7.4 um |
| Adjacent Pair Multi-Finger CNTFET Devices | | 4640 | NT ESD Protect Circuit Area = 2 · XY 4660 | |
| X' Direction Y' Direction | 384 um 384 um | 10.9 um 10.5 um | 271.7 um 271.5 um | 10.9 um 10.5 um |

FIG. 46

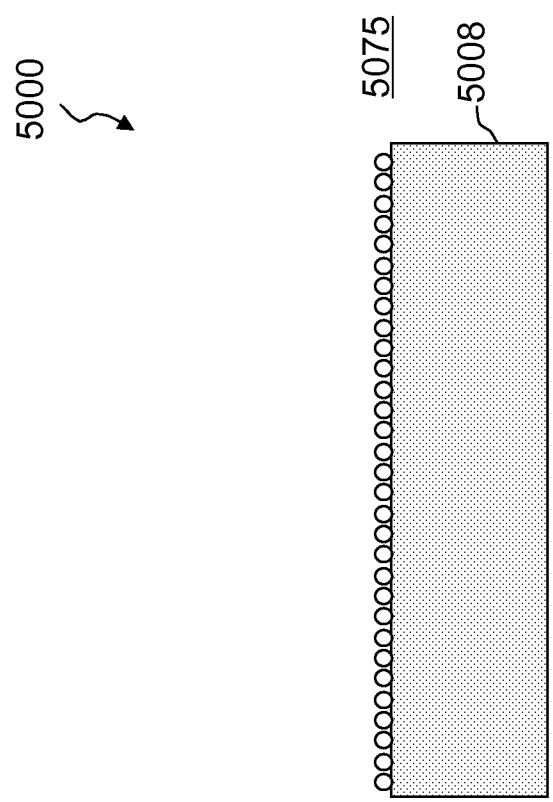

5300

CNT Fabric | pCNTFET Device

| Case # & $\epsilon_R$ | # Layers | CNT $d_{NT}/$ S (nm) | Insul $\delta NT$ (nm) | CNT # NT Dens. NTs/ μm² | Saturation Current & Channel Voltage | | | Device Resistance | | | Gate Capacitance | |
|---|---|---|---|---|---|---|---|---|---|---|---|---|
| | | | | | $I_{DS}$ (mA) | $I_{DS}$ Ratio | $V_{CH}$ (V) | $V_{CH}$ Ratio | $R_{CH(2)}$ (Ω) | $R_{CH(3)}$ (Ω) | $R_{CH}/R_{TOT}$ | Gate Cap. (F/cm × 10⁻¹¹) | Rel. Gate Cap. |
| 1) | 1 | 1.0/ 1.5 | --- | 267 / 668 | 3.20 / 7.05 | --- / 1 | 3.35 / 3.17 | 0.95 / 0.91 | 46.8 / 46.8 | 1,045 / 450 | 0.04 / 0.09 | 2.07 / 5.18 | --- / 1 |
| 2) | 1 | 1.0/ 2.0 | 0.5 | 201 / 502 | 6.43 | 0.91 | 3.10 | 0.88 | 62.2 | 464 | 0.11 | 5.17 | 0.99 |
| 3) | 1 | 1.0/ 3.0 | 1.0 | 135 / 338 | 5.86 | 0.83 | 2.94 | 0.84 | 95.6 | 502 | 0.16 | 5.11 | 0.98 |
| 4) | 1 | 1.0/ 4.0 | 1.5 | 101 / 253 | 5.25 / faster | 0.74 | 2.85 | 0.81 | 123 / 260 mA/w = 800 μm | / mA/w = 800 μm | / | 4.97 | 0.96 |

(1) L Length = Ø = 500 nm; $d_{NT}$ = CNT diameter; S = Periodicity CNTs; $\mu_P$ = 775 cm²/V-s; $t_{IO}$ = 7 nm; $\epsilon_R$ = 4
(2) $I_{DS}$ at $V_{DS}$ = 3.5 volts; $\delta NT$ = CNT-to-CNT separation; $V_{DS}$ = 3.5 V; $|V_{TP}|$ = 0.5 V
(3) $R_{12}$ = (2$R_C$ + $R_Q$)/N; RC = 3 kΩ & RQ = 6.5 kΩ
(4) $R_{CH}$ = $R_{33}$

| Case # & $\epsilon_R$ | CNT Fabric | | | | pCNTFET Device | | | | | | |
|---|---|---|---|---|---|---|---|---|---|---|---|
| | # Layers | CNT diam. $d_{CNT-EQ}$ $S_{EQ}$ (nm) | Insul $\delta NT$ (nm) | #.N(1) Dens. NTs/ $\mu m^2$ $N_{EFF}$ | Saturation Current & Channel Voltage | | | | Device Resistance | | Gate Capacitance | |
| | | | | | $I_{DS}(2)$ (mA) | $I_{DS}$ Ratio | $V_{CH}$ (V) | $V_{CH}$ Ratio | $R_{TOT}(3)$ ($\Omega$) | $R_{CH}(4)$ ($\Omega$) | $R_{Q}/R_{TOT}$ | Gate Cap (F/ $cm^2 \times 10^{-7}$) | Rel. Gate Cap. |
| 5) | 2 | 1.0 1.54 2.25 | NA 0.5 | 534 1,335 179 | 7.69 | 1 | 3.32 | 0.95 | 23.4 | 432 | 0.05 | 5.10 | 1 |
| 6) 10 | 2 | 1.0 1.76 3.0 | 0.5 1.0 | 402 1,005 135 | 7.40 | 0.96 | 3.27 | 0.93 | 31.1 | 442 | 0.07 | 5.07 | 0.99 |
| 7) 10 | 2 | 1.0 2.4 4.5 | 1.0 2.0 | 270 675 89 | 6.70 | 0.87 | 3.19 | 0.91 | 46.3 | 476 | 0.09 | 4.87 | 0.95 |
| 8) 10 | 2 | 1.0 2.97 6.0 | 1.5 3.0 | 202 505 67 | 6.30 | 0.82 | 3.11 | 0.89 | 61.6 | 494 | 0.11 | 4.76 | 0.93 |

$d_{NT}$ = CNT diameter
$d_{NT-EQ}$ = Equivalent CNT diameter
$S_{EQ}$ = Periodicity of equiv. CNT diam.
$\delta NT$ = CNT-to-CNT separation $L_{CH}$ = 200 nm; W = 400 nm
$\mu_P$ = 775 cm²/V·s; $t_O$ = 7.9nm; $\epsilon_R$ = 4
$V_{DS}$ = 3.5 V;|$V_{TP1}$| = 0.5 V
$R_C$ = 3 k$\Omega$ & $R_Q$ = 6.5 k$\Omega$ (1) In width W = 400 nm
(2) $I_{DS}$ at $V_{DS}$ = 3.5 volts
(3) $R_{T2}$ = (2$R_C$ + $R_Q$)/N
(4) $R_{T2}$ = $R_{Q2}$

FIG. 57

ELECTROSTATIC DISCHARGE PROTECTION CIRCUITS USING CARBON NANOTUBE FIELD EFFECT TRANSISTOR (CNTFET) DEVICES AND METHODS OF MAKING SAME

CROSS-REFERENCE OF RELATED CASES

This application is related to the following U.S. patents, which are assigned to the assignee of the present application, and are hereby incorporated by reference in their entirety:

Nanotube Films And Articles (U.S. Pat. No. 6,706,402), filed Apr. 23, 2002;

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed Jan. 13, 2003;

Devices Having Horizontally-Disposed Nanofabric Articles and Methods of Making the Same (U.S. Pat. No. 7,259,410), filed Feb. 11, 2004;

Non-Volatile Electromechanical Field Effect Devices and Circuits Using Same and Methods of Forming Same (U.S. Pat. No. 7,115,901), filed Jun. 9, 2004;

Nanotube ESD Protective Devices and Corresponding Nonvolatile and Volatile Nanotube Switches (U.S. Pat. No. 7,567,414), filed Nov. 2, 2005;

Two-Terminal Nanotube Devices and Systems and Methods of Making Same (U.S. Pat. No. 7,781,862), filed Nov. 15, 2005;

Latch Circuits and Operation Circuits Having Scalable Nonvolatile Nanotube Switches as Electronic Fuse Replacement Elements (U.S. Pat. No. 8,008,745), filed Aug. 8, 2007;

Nonvolatile Nanotube Diodes and Nonvolatile Nanotube Blocks and Systems Using Same and Methods of Making Same (U.S. Pat. No. 7,782,650), filed Aug. 8, 2007;

Nonvolatile Nanotube Diodes And Nonvolatile Nanotube Blocks And Systems Using Same And Methods Of Making Same (U.S. Pat. No. 8,183,665), filed Nov. 19, 2008;

Nonvolatile Nanotube Programmable Logic Devices And A Nonvolatile Nanotube Field Programmable Gate Array Using Same (U.S. Pat. No. 7,852,114), filed Aug. 6, 2009.

This application is related to the following patent applications, which are assigned to the assignee of the application, and are hereby incorporated by reference in their entirety:

NRAM Arrays with Nanotube Blocks, Nanotube Traces, and Nanotube Planes and Methods of Making Same (U.S. patent application Ser. No. 12/486,602), filed Jun. 17, 2009;

Methods For Arranging Nanoscopic Elements Within Networks, Fabrics, And Films (U.S. patent application Ser. No. 13/076,152), filed Mar. 30, 2011;

Logic Elements Comprising Carbon Nanotube Field Effect Transistor (CNTFET) Devices and Methods of Making Same (U.S. patent application Ser. No. 13/579,828), filed Aug. 17, 2012;

Carbon Based Nonvolatile Cross Point Memory Incorporating Carbon Based Diode Select Devices And MOSFET Select Devices For Memory And Logic Applications (U.S. patent application Ser. No. 13/716,453), filed Dec. 17, 2012.

BACKGROUND

1. Technical Field

The present disclosure generally relates to carbon nanotube field effect transistor (CNTFET) devices. The present disclosure also generally relates to device structures and methods for providing CNTFET devices with enhanced current carrying capability at lower densities.

2. Discussion of Related Art

Any discussion of the related art throughout this specification should in no way be considered as an admission that such art is widely known or forms part of the common general knowledge in the field.

Static electricity is generated when objects obtain electrostatic charges through contact and separation of the objects that causes a transfer of electrons between the objects. The transfer of electrons is determined by the type of contact and separation between the objects, such as rubbing, brushing, or wiping for example, and the properties of the materials of the objects. The transfer of electrons occurs when electrons on the surface of an object are relocated to the surface of another object and the transfer of electrons creates electrostatic charges on the objects. The object that donates electrons obtains a positive electrostatic charge and the object that captures electrons obtains a negative electrostatic charge. The positive electrostatically charged object can cause an electrostatic discharge event when the positive electrostatically charged object is rapidly discharged and the negative electrostatically charged object can cause an electrostatic discharge event when the negative electrostatically charged object is rapidly discharged. The positive electrostatically charged object and the negative electrostatically charged object can be rapidly discharged though direct contact or indirect contact with an object that allows for rapid discharge.

The human body frequently obtains an electrostatic charge through common daily activities, such as walking on carpet, ascending from a fabric covered seat, and removing clothing for example, that cause a transfer of electrons between the human body and other objects. The human body model (HBM) was developed to simulate an electrostatic discharge event caused by the electrostatically charged human body contacting an object that allows for rapid discharge. The human body model uses a HBM circuit 105 shown in prior art FIG. 1A and an ESD current 150 shown in prior art FIG. 1B for calculating the strength of an electrostatic discharge event caused by the electrostatically charged human body. The HBM circuit 105 has a 100 pF capacitor C that discharges through a 1,500 Ohm series resistor R and a switch 107 to the object that allows for rapid discharge. Prior art FIG. 1A illustrates circuit 100 having the HBM circuit 105 electrically connected to an on-chip circuit 110 that receives an ESD current and voltage discharge from the HBM circuit 105. The contact between HBM circuit 105 and pads 120 and 125 associated with the on-chip circuit 110 is shown symbolically by switch 107 transitioning from an open position to a closed position. Pads 120 and 125 may be input pads, output pads, input/output pads, power supply, or ground pads for example. The terms connected, coupled, electrically connected, and electrically coupled are used interchangeably in this disclosure and the terms refer to a connection that allows electrical signals to flow either directly or indirectly from one component to another. The direct flow of electrical signals from one component to another does not preclude intervening passive devices that do not generate electric energy such as resistors, capacitors, and inductors. The indirect flow of electrical signals from one component to another does not preclude intervening active devices such as transistors or flow of electrical signals by electromagnetic induction.

An electrostatic charge stored on the 100 pF capacitor C produces a voltage $V_{CHARGE}$ that is discharged when HBM circuit 105 comes into contact with pads 120 and 125 associated with the on-chip circuit 110. The electrostatic charge is discharged from capacitor C and flows through the 1,500 Ohm series resistor R, switch 107 in a closed position, and into pads 120 and 125 at a rate determined by ESD current source ($I_{ESD}$) 115. The rate of ESD current flow as a function of time, during an ESD discharge based on the human body model HBM 105, is given by ESD current 150 illustrated in prior art FIG. 1B. The ESD current 150 reaches a peak current of 1 Ampere after 10 ns, then drops to 0.5 Amperes after 115 ns, then to 0.37 Amperes (37% of the peak current value) after 180 ns, and then discharges to zero current. ESD current 150 is not defined beyond 180 ns and ESD current 150 beyond 180 ns is not needed to determine the maximum $V_{ESD}$ induced across the pads 120 and 125. The ESD current source 115 approximates an ideal current source in which ESD current 150 is independent of the voltage $V_{ESD}$ that is induced between pads 120 and 125 by ESD current 150. Therefore, circuit elements in circuit 100 determine the maximum $V_{ESD}$ during an ESD event instead of the ESD current source 115 that delivers ESD current 150 independent of voltages that may appear across the terminals of ESD current source 115.

The on-chip circuit 110 includes an ESD protect circuit 130 that is electrically connected in parallel with pads 120 and 125 by nodes 126 and 127 and a protected circuit 140 that is electrically connected in parallel with pads 120 and 125 by nodes 128 and 129. The term node refers to a point of connection or junction where conductors and/or components meet. The ESD protect circuit 130 is designed to protect the protected circuit 140 from being damaged by ESD-driven (induced) voltage surges during handling of the on-chip circuit 110. The ESD protect circuit 130 is traditionally constructed from semiconductor diodes that create conducting paths for dissipating the positive and negative ESD-driven voltages. The semiconductor diodes are used in pairs with a first semiconductor diode for creating a conducting path to limit ESD-voltage surges of a positive polarity to an acceptable value and a second semiconductor diode for creating a conducting path to limit ESD-voltage surges of a negative polarity to an acceptable value. The acceptable values are selected such that the protected circuit 140 will not be damaged by ESD-driven voltages and the acceptable values may be selected based on characteristics of the protected circuit 140. For example, the protected circuit 140 may be constructed from metal oxide semiconductor field effect transistors (MOSFETs) and the acceptable values are selected based on the dielectric breakdown strength of the MOSFETs' gate insulators. However, a circuit designer can select the acceptable values based on other characteristics of the protected circuit 140 and the circuit designer typically selects the accepted values such that ESD protect circuit 130 will be in a nonconductive state during normal chip operation in the ground (zero) to $V_{DD}$ voltage range.

SUMMARY

The present disclosure provides an electrostatic discharge protection circuit for protecting a protected circuit from an electrostatic discharge induced voltage. The electrostatic discharge protection circuit includes a nanotube diode having at least two terminals with the nanotube diode electrically connected to the protected circuit by a first node and the nanotube diode electrically connected to a second node. The nanotube diode creates a conducting path in response to the electrostatic discharge induced voltage exceeding a desired voltage, thereby limiting the electrostatic discharge induced voltage and protecting the protected circuit from the electrostatic discharge induced voltage.

According to another aspect of the present disclosure the nanotube diode is electrically connected to a signal pad by the first node and the nanotube diode is electrically connected to a power supply pad by the second node.

According to another aspect of the present disclosure the nanotube diode is electrically connected to a signal pad by the first node and the nanotube diode is electrically connected to a ground pad by the second node.

According to another aspect of the present disclosure the nanotube diode is formed using a carbon nanotube field effect transistor (CNTFET) device.

According to another aspect of the present disclosure the nanotube diode is formed using an ambipolar nanotube field effect transistor (aCNTFET) device.

According to another aspect of the present disclosure the nanotube diode is on a semiconductor chip, a carbon nanotube field effect transistor (CNTFET) chip, or a chip carrier.

According to another aspect of the present disclosure the nanotube diode is formed on an insulator.

According to another aspect of the present disclosure the nanotube diode has a plurality of fingers.

According to another aspect of the present disclosure the nanotube diode is configured in a stacked configuration, a square configuration, a rectangular configuration, an L-shaped configuration, or an angular configuration.

According to another aspect of the present disclosure the nanotube diode is formed below a pad or the protected circuit.

The present disclosure provides an electrostatic discharge (ESD) protection circuit for protecting a protected circuit from an electrostatic discharge induced voltage. The electrostatic discharge protection circuit includes a nanotube diode pair having a first nanotube diode and a second nanotube diode with the first nanotube diode having at least two terminals and the second nanotube diode having at least two terminals. The first nanotube diode electrically connected to the protected circuit by a first node and the first nanotube diode electrically connected to a second node. The second nanotube diode electrically connected to the protected circuit by a third node and the second nanotube diode electrically connected to a fourth node. The nanotube diode pair creates a conducting path in response to the electrostatic discharge induced voltage exceeding a desired voltage, thereby limiting the electrostatic discharge induced voltage and protecting the protected circuit from the electrostatic discharge induced voltage. The nanotube diode pair terminates the conducting path in response to a decrease in the electrostatic discharge induced voltage.

According to another aspect of the present disclosure the first node and the third node correspond to the same node.

According to another aspect of the present disclosure the first nanotube diode is electrically connected to a signal pad by the first node and the first nanotube diode is electrically connected to a power supply pad by the second node.

According to another aspect of the present disclosure the second nanotube diode is electrically connected to the signal pad by the third node and the second nanotube diode is electrically connected to a ground pad by the fourth node.

According to another aspect of the present disclosure the nanotube diode pair is formed using carbon nanotube field effect transistor (CNTFET) devices.

According to another aspect of the present disclosure the nanotube diode pair is formed using at least one ambipolar nanotube field effect transistor (aCNTFET) device.

According to another aspect of the present disclosure the nanotube diode pair is on a semiconductor chip, a carbon nanotube field effect transistor (CNTFET) chip, or a chip carrier.

According to another aspect of the present disclosure the nanotube diode pair is formed on an insulator.

According to another aspect of the present disclosure the first nanotube diode and the second nanotube diode are configured in a stacked configuration.

According to another aspect of the present disclosure the first nanotube diode has a plurality of fingers and the second nanotube diode has a plurality of fingers.

According to another aspect of the present disclosure the first nanotube diode and the second nanotube diode are each configured in a stacked configuration, a square configuration, a rectangular configuration, an L-shaped configuration, or an angular configuration.

According to another aspect of the present disclosure at least one of the first nanotube diode and the second nanotube diode are formed below a pad.

According to another aspect of the present disclosure the first nanotube diode and the second nanotube diode formed below the pad are configured in a stacked configuration.

According to another aspect of the present disclosure at least one the first nanotube diode and the second nanotube diode are formed below the protected circuit.

According to another aspect of the present disclosure the first nanotube diode and the second nanotube diode formed below the protected circuit are configured in a stacked configuration.

Other features and advantages of the present invention will become apparent from the following description of the invention which is provided below in relation to the accompanying drawings.

BRIEF DESCRIPTION OF THE DRAWINGS

FIG. 1B illustrates a prior art electrostatic current as function of time for the human body model of FIG. 1A;

FIG. 8A-C illustrates a schematic representation of a CNTFET device and corresponding device models;

FIG. 11A illustrates a channel region of a CNTFET device structure corresponding to FIG. 10A;

FIG. 11B illustrates a cross section of a CNTFET gate and a cross section of one carbon nanotube (CNT) corresponding to carbon nanotubes in the nanotube fabric shown in FIG. 10B;

FIG. 14 illustrates a table showing a set of scaled pCNTFET and nCNTFET diode physical characteristics and p-type and n-type carbon nanotube fabric constants for carbon nanotube fabrics used to replace semiconductor substrates;

FIG. 15A illustrates a schematic representation of a three-fingered CNTFET diode formed by connecting gates and first source/drain contacts to a common ground bus, and second source/drain contacts to a signal pad;

FIG. 15C illustrates a schematic representation of a three-fingered CNTFET diode formed by connecting gates and first source/drain contacts to signal pad, and second source/drain contacts to a power supply bus;

FIG. 17C illustrates a representation of a bumped pad connected to a first protected circuit and to a second protected circuit stacked below the first protected circuit and the pad, and to a nanotube ESD protect circuit formed by a pair of stacked CNTFET diodes placed under the pad and between the first protected circuit and the second protected circuit;

FIG. 23A illustrates a schematic representation corresponding to carbon nanotube ESD protect circuits illustrated in FIG. 22A;

FIG. 23B illustrates the schematic representation of FIG. 23A showing ESD current flow for an ESD event of a first voltage polarity;

FIG. 23C illustrates the schematic representation of FIG. 23A showing ESD current flow for an ESD event of a second voltage polarity;

FIG. 24B1-24B3 illustrates a schematic representation of the aCNTFET diode of FIG. 24A when a chip is in an operating mode, and corresponding threshold voltage values for n-type and p-type operating modes, such that the aCNTFET diode is OFF during normal powered mode of operation;

FIG. 26A illustrates a schematic representation corresponding to carbon nanotube ESD protect circuits illustrated in FIG. 25A;

FIG. 26B illustrates the schematic representation of FIG. 26A showing ESD current flow for an ESD event of a first voltage polarity;

FIG. 26C illustrates the schematic representation of FIG. 26A showing ESD current flow for an ESD event of a second voltage polarity;

FIG. 31A illustrates a schematic representation corresponding to nanotube ESD protect circuits illustrated in FIG. 30A;

FIG. 31B illustrates the schematic representation of FIG. 31A showing ESD current flow for an ESD event of a first voltage polarity;

FIG. 31C illustrates the schematic representation of FIG. 31A showing ESD current flow for an ESD event of a second voltage polarity;

FIG. 32B1-32B3 illustrates a schematic representation of the aCNTFET diode of FIG. 32A when a chip is in an operating mode, and corresponding threshold voltage values for n-type and p-type operating modes, such that the aCNTFET diode is OFF during normal powered mode of operation;

FIG. 34A illustrates a schematic representation corresponding to nanotube ESD protect circuits illustrated in FIG. 33A;

FIG. 34B illustrates the schematic representation of FIG. 34A showing ESD current flow for an ESD event of a first voltage polarity;

FIG. 34C illustrates the schematic representation of FIG. 34A showing ESD current flow for an ESD event of a second voltage polarity.

FIG. 46 illustrates a table showing a pCNTFET device formed using an unordered carbon nanotube (CNT) fabric and another pCNTFET device formed using an ordered CNT fabric to replace semiconductor substrates. And nCNTFET diode physical characteristics and p-type and n-type carbon nanotube fabric constants for carbon nanotube fabrics used to replace semiconductor substrates;

FIG. 50B illustrates a single-layer ordered CNT fabric formed on the surface of a substrate after applying a directional force to the unordered CNT fabric of FIG. 50A.

FIG. 53 illustrates a table that shows the results of calculations of physical and electrical parameters of pCNTFET devices with structures using ordered single layer CNT fabrics corresponding to the CNTFET device structure shown in FIG. 52.

FIG. 57 illustrates a table that shows the results of calculations of physical and electrical parameters of pCNTFET devices with structures using double-layer ordered CNT fabrics and double-layer ordered insulated-CNT fabrics corresponding to the CNTFET device structures shown in FIGS. 55 and 56, respectively.

FIG. 63G corresponds to the CNTFET device shown in FIG. 59.

DETAILED DESCRIPTION

Figure 1A:
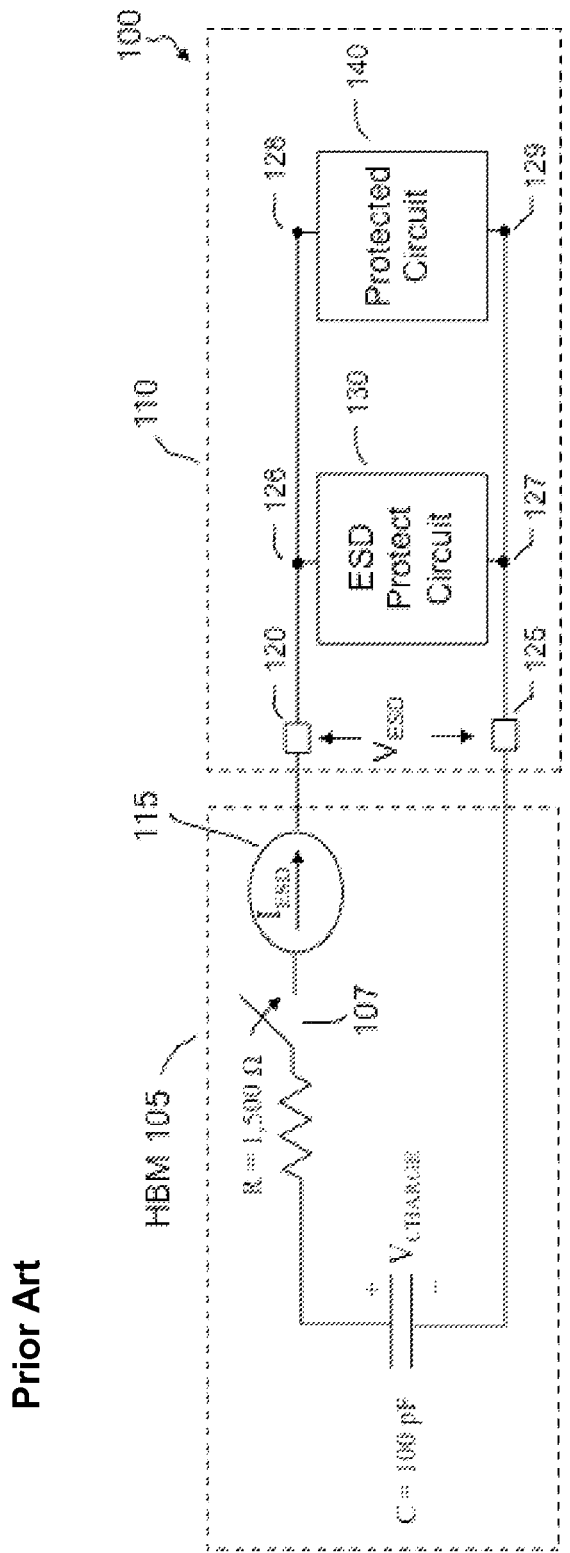
FIG. 1A illustrates a prior art electrostatic discharge (ESD) equivalent circuit human body model and an on-chip circuit that receives the ESD current and voltage discharge from the human body model.

CNTFET Technology and Corresponding CNTFET Digital Model

The present disclosure uses and extends carbon nanotube field effect transistor (CNTFET) design equations and digital models to design ESD protection devices and circuits. CNTFET current and voltage equations as a function of carbon nanotube (CNT) fabric constants, insulator dielectric constants, and geometries such as CNTFET device width and length, insulator thickness, and CNT fabric dielectric constants are described in U.S. patent application Ser. No. 13/579,828 herein incorporated by reference in its entirety. The CNTFET current and voltage equations described in U.S. Patent application Ser. No. 13/579,828 were calculated using measured CNTFET device electrical characteristics described in US Patent Application Publication US 2006/0183278, herein incorporated by reference in its entirety, and U.S. Pat. No. 7,598,544 herein incorporated by reference in its entirety. The present disclosure also relates to improving the electrical characteristics of CNTFET devices that may be used to form nanotube diodes, and may also be used in logic circuits such as NOT, NOR, and NAND logic functions for better density (smaller size), faster performance, and lower power.

The present disclosure provides carbon nanotube based transistor devices with greater current handling capability per unit width and smaller overall area for carrying relatively high currents required by electrostatic discharge circuits. These carbon nanotube based transistor devices include nanotube fabrics formed with a plurality of carbon nanotubes in one or more nanotube layers of approximately aligned (ordered) carbon nanotubes. A carbon nanotube based transistor device includes a nanotube fabric of a plurality of nanotube elements deposited over a layer of insulating material. The nanotube fabric forms the channel region of the carbon nanotube transistor device. A first conductive element (terminal) in contact with the nanotube fabric forms a source region. A second conductive element (terminal) in contact with the nanotube fabric forms a drain region. Individual nanotubes are of sufficient length to contact both source and drain terminals. An insulator formed over the nanotube fabric forms an insulating region. And a third conductive terminal formed over the insulating region forms a gate. The gate can form and unform a conductive channel in the nanotube fabric between the source and drain terminals.

According to another aspect of the present disclosure carbon nanotube transistor devices with denser nanotube fabrics in the channel region results in current flows through more nanotubes in parallel thereby reducing the current per nanotube.

According to another aspect of the present disclosure carbon nanotube transistor devices with denser nanotube fabrics in the channel region results in current flows through more nanotubes in parallel thereby reducing the contact resistance between conductive terminals and the nanotube fabric.

A fabric of nanotubes as referred to herein for the present disclosure includes a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Such larger scale positional regularity is of particular interest to the present disclosure.

The fabrics of nanotubes retain desirable physical properties of the nanotubes from which they are formed. For example, in some electrical applications the fabric preferably has a sufficient amount of nanotubes in contact so that at least one ohmic (metallic) or semi-conductive pathway exists from a given point within the fabric to another point within the fabric. Single walled nanotubes may typically have a diameter of about 1-3 nm, and multi walled nanotubes may typically have a diameter of about 3-30 nm. Nanotubes may have lengths ranging from about 0.2 microns to about 200 microns, for example. The nanotubes may curve and occasionally cross one another. Gaps in the fabric, i.e., between nanotubes either laterally or vertically, may exist. Such fabrics may include single-walled nanotubes, multi-walled nanotubes, or both. The fabric may have small areas of discontinuity with no tubes present. The fabric may be prepared as a layer or as multiple fabric layers, one formed over another. The thickness of the fabric can be chosen as thin as substantially a monolayer of nanotubes or can be chosen much thicker, e.g., tens of nanometers to hundreds of microns in thickness. The porosity of the fabrics can vary from low density fabrics with high porosity to high density fabrics with low porosity. Such fabrics can be prepared by growing nanotubes using chemical vapor deposition (CVD) processes in conjunction with various catalysts, for example. Other methods for generating such fabrics may involve using spin-coating techniques and spray-coating techniques with preformed nanotubes suspended in a suitable solvent, silk screen printing, gravure printing, and electrostatic spray coating. Nanoparticles of other materials can be mixed with suspensions of nanotubes in such solvents and deposited by spin coating and spray coating to form fabrics with nanoparticles dispersed among the nanotubes. Such exemplary methods are described in more detail in the related art cited in the Background section of this disclosure.

It should be noted that while much of the present disclosure discusses methods for the arrangement of nanotube elements within a nanotube fabric, the methods of the present disclosure are not limited in this regard. Indeed, the methods of the present disclosure can be used to arrange high aspect ratio nanoscopic elements (that is, nanoscopic "tube like" structures with length to width ratios on the order of 4 to 1 wherein at least one of those dimensions—length or width—is less than 100 nm) within a plurality of fabrics or networks. Such nanoscopic elements include, but are not limited to, single wall nanotubes, multiwalled nanotubes, nanowires, and mixtures thereof. Nanowires as mentioned herein is meant to mean single nanowires, aggregates of non-woven nanowires, nanoclusters, nanowires entangled with nanotubes comprising a nanofabric, mattes of nanowires, etc. Examples of nanowire (nanorod) materials are alumina, bismuth, cadmium, selenide, gallium nitride, gold, gallium phosphide, germanium, silicon, indium phosphide, magnesium oxide, manganese oxide, nickel, palladium, silicon carbide, titanium, zinc oxide and additional mixed nanowires such as silicon germanium or other types which are coated. Further, within the present disclosure networks of nanoscopic elements are described as arrangements of such freely formed and deposited nanoscopic elements in a substantially planer configuration. Exemplary networks of nanoscopic elements include, but are not limited to, nanotube fabric layers as described within the present disclosure and arrangements of nanowires dispersed over a material surface.

As described within U.S. Pat. No. 7,375,369 to Sen et al. and U.S. patent application Ser. No. 11/304,315 to Ghenciu et al., both incorporated herein by reference in their entirety, nanotube fabrics and films can be formed by applying a nanotube application solution (for example, but not limited to, a plurality of nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes, dip coating processes, silk screen printing processes, and gravure printing processes) can be used to apply and distribute the nanotube elements over the substrate element. In other cases, CVD growth of nanotubes on a material surface may be used to realize an unordered nanotube fabric layer. Further, U.S. Patent App. No. 61/304,045 to Sen et al., incorporated herein by reference in its entirety, teaches methods of adjusting certain parameters (for example, the nanotube density or the concentrations of certain ionic species) within nanotube application solutions to either promote or discourage rafting—that is, the tendency for nanotube elements to group together along their sidewalls and form dense, raft-like structures—within a nanotube fabric layer formed with such a solution. By increasing the incidence of rafting within nanotube fabric layers, the density of such fabric layers can be increased, reducing both the number and size of voids and gaps within such fabric layers.

It should be noted that nanotube elements used and referenced within the embodiments of the present disclosure may be single-walled nanotubes, multi-walled nanotubes, or mixtures thereof and may be of varying lengths. Further, the nanotubes may be conductive, semiconductive, or combinations thereof. Further, the nanotubes may be functionalized (for example, by oxidation with nitric acid resulting in alcohol, aldehydic, ketonic, or carboxylic moieties attached to the nanotubes), or they may be non-functionalized.

The present disclosure further provides carbon nanotube based transistor devices with greater current handling capability per unit width and smaller overall area for carrying relatively high currents required by electrostatic discharge circuits. These carbon nanotube based transistor devices include nanotube fabrics formed with a plurality of insulated carbon nanotubes in one or more nanotube layers of approximately aligned (ordered) carbon nanotubes. A carbon nanotube based transistor device includes a nanotube fabric of a plurality of insulated nanotube elements deposited over a layer of insulating material. The nanotube fabric forms the channel region of the carbon nanotube transistor device. A first conductive element (terminal) in contact with the carbon nanotubes in the nanotube fabric, after eliminating the insulator, forms a source region. A second conductive element (terminal) in contact with the carbon nanotubes in the nanotube fabric, after eliminating the insulator, forms a drain region. Individual nanotubes are of sufficient length to contact both source and drain terminals. An insulator formed over the nanotube fabric forms an insulating region. And a third conductive terminal formed over the insulating region forms a gate. The gate can form and unform a conductive channel in the nanotube fabric between the source and drain terminals.

According to another aspect of the present disclosure carbon nanotube transistor devices with denser nanotube fabrics formed with a plurality of insulated carbon nanotubes in the channel region results in current flows through more nanotubes in parallel thereby reducing the current per nanotube.

According to another aspect of the present disclosure carbon nanotube transistor devices with denser nanotube fabrics formed with a plurality of insulated carbon nanotubes in the channel region results in current flows through more nanotubes in parallel thereby reducing the contact resistance between conductive terminals and the nanotube fabric.

According to another aspect of the present disclosure carbon nanotube transistor devices with denser nanotube fabrics formed with a plurality of insulated carbon nanotubes in the channel region eliminates possible electrical contacts between carbon nanotubes that can result in carrier scattering and increased resistance to current flow.

According to another aspect of the present disclosure carbon nanotube transistor devices with denser nanotube fabrics formed with a plurality of insulated carbon nanotubes in the channel region can select the insulator thickness on the carbon nanotube surface to increase the separation between carbon nanotubes, thereby reducing electrostatic shielding effects of carbon nanotubes in closer proximity to the gate and increasing electrostatic coupling between the gate and all carbon nanotubes in the nanotube fabric.

According to another aspect of the present disclosure carbon nanotube transistor devices with denser nanotube fabrics formed with a plurality of insulated carbon nanotubes in the channel region can increase the gate to nanotube fabric electrostatic coupling by forming a gate with at least two conductors, thereby at least doubling the electrostatic coupling between the gate and nanotube fabric thereby doubling the current carrying capacity of the carbon nanotube transistor.

According to another aspect of the present disclosure carbon nanotube transistor devices with denser nanotube fabrics formed with a plurality of insulated carbon nanotubes in the channel region and having a gate with at least two conductors, may be oriented such that the gate width is parallel to the substrate.

According to another aspect of the present disclosure carbon nanotube transistor devices with denser nanotube fabrics formed with a plurality of insulated carbon nanotubes in the channel region and having a gate with at least two conductors, may be oriented such that the gate width is orthogonal to the substrate to form a carbon nanotube transistor device with a smaller surface area.

The CNTFET devices described in the examples below as having source/drain contacts, gate conductors, and corresponding gate insulators located above CNT fabrics used to form source, drain, and channel regions may have any one of or all the source/drain contacts located below the CNT fabric and in contact with the underside of the CNT fabric and the gate conductors and corresponding gate insulators located below the CNT fabric with the gate insulator in contact with the underside of the CNT fabric. Various combinations of source contacts above or below the CNT fabric; drain contacts above or below the CNT fabric; and gates and gate insulators above or below the CNT fabric may be used to form CNTFET devices.

The ESD protection devices and circuits designed using CNTFET devices can be positioned on-chip, which may refer to chips with semiconducting circuits on semiconducting substrates; or to chips designed with devices that do not require a semiconductor substrate such as CNTFET devices formed on a CNT fabric. The ESD protection devices and circuits designed using CNTFET devices may be used with CNTFET circuit designs, or also with mixed CNTFET and FET device (circuit) designs, and may be formed at the chip and/or chip carrier level. The ESD protection devices and circuits using CNTFET devices may be compatible with CNTFET-based digital and analog-mixed functions. Further, the ESD protection devices and circuits may also be incorporated at the module, card, and board levels because the ESD protection devices and circuits may be formed on CNT fabric layers deposited on any surface.

The present disclosure uses the human body model having the HBM circuit 105 shown in prior art FIG. 1A and the ESD current 150 shown in prior art FIG. 1B for calculating the strength of an ESD event caused by the electrostatically charged human body. Prior to the ESD event, a packaged chip or an unpackaged known-good-die to be handled is not powered and all pads (terminals) and circuit nodes are in the same discharged state, zero volts for example. Known-good-die (KGD) are described in the reference Puttlitz and Totta, "Area Array Interconnection Handbook", Kluwer Academic Publishers, 2001; Bertin et al., "Known Good Die (KGD)", Chapter 4, pages 149-151. During the ESD event, the packaged chip or the unpackaged known-good-die is assumed unpowered and handled in a manner that causes an ESD event which corresponds to HBM circuit 105 coming into contact with a pair of pads (terminals). Other chip conditions, such as when the chip is assumed powered for example, and other electrostatic discharge models, such as the Machine Model (MM) and the Charged Device Model (CDM) for example, may also be used for calculating the strength of electrostatic discharge events.

Schematic-Level Description of CNTFET-Based CNT ESD Protect Circuits and Placement with Respect to Chip Pads and Protected Circuits Using pCNTFET-Based and nCNTFET-Based CNTFET Diodes FIGS. 2-5 show schematics of various carbon nanotube (CNT) ESD protect circuits formed by a pair of pCNTFET devices; a pair of nCNTFET devices; and a pair of pCNTFET and nCNTFET devices connected to each signal pad. These device pairs are interconnected to form various CNT ESD protect circuits that provide ESD protection for positive and negative ESD voltages applied between pairs of pads during an ESD event, and are also designed to remain in an OFF state during normal circuit operation with voltage swings in the $V_{DD}$ to ground (zero volts) voltage range. Alternatively, a single ambipolar CNTFET (aCNTFET) device may be used as a CNTFET diode connected to each signal pad to form a protect circuit, instead of pairs of pCNTFET and/or nCNTFET devices as described further above. This is because an aCNTFET diode current flow is bidirectional (in either direction) in response to a positive or negative polarity ESD voltage as described further below with respect to FIGS. 19-34.

Figure 2:
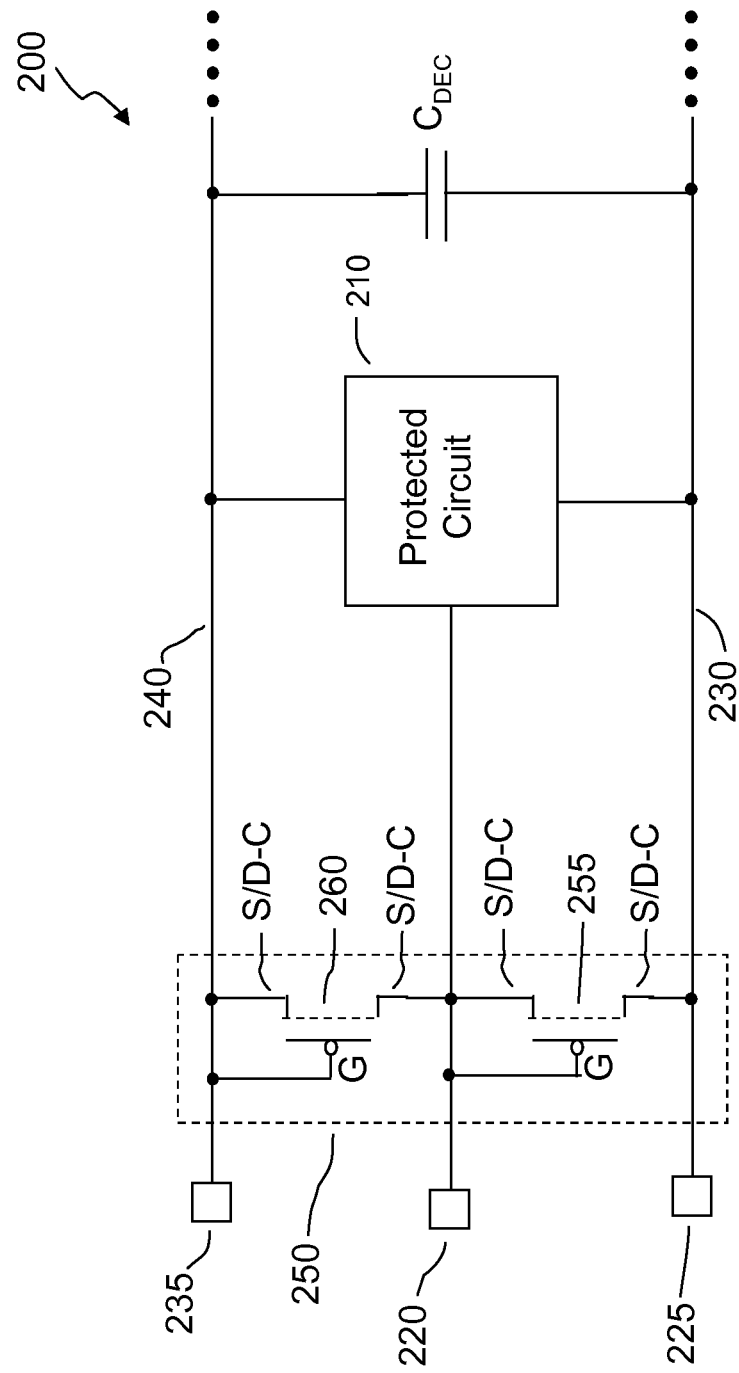
FIG. 2 illustrates a nanotube ESD protect circuit using p-type carbon nanotube field effect transistors (pCNTFETs) used to form pCNTFET diodes.

FIG. 2 illustrates a CNT-based ESD protection approach schematic 200 showing a protected circuit 210 electrically connected to a signal pad 220, a shared ground bus 230, and a shared power supply bus 240, a CNT ESD protect circuit 250 electrically connected to the signal pad 220, the shared ground bus 230, and the shared power supply bus 240, and a decoupling capacitor $C_{DEC}$ electrically connected to the shared ground bus 230 and the shared power supply bus 240. The shared ground bus 230 is electrically connected to a ground pad 225, the shared power supply bus 240 is electrically connected to a power supply pad 235, and other circuits such as protected circuit 210 can be electrically connected to the shared ground bus 230 and the shared power supply bus 240. Shared power supply bus, shared $V_{DD}$ bus, and variations thereof are used interchangeably in this disclosure. The CNT ESD protect circuit 250 is formed by a pair of p-type CNTFET devices configured as pCNTFET diode 255 and pCNTFET diode 260. The pCNTFET diode 255 has a gate G and a first source/drain contact (S/D-C) electrically connected to the signal pad 220 and a second S/D-C contact electrically connected to the shared ground bus 230, to form a two-terminal pCNTFET diode. The pCNTFET diode 260 has a gate G and a first S/D-C contact electrically connected to the shared power supply bus 240 and a second S/D-C contact electrically connected to the signal pad 220, to form a two-terminal pCNTFET diode.

P-type CNTFET devices, such as those configured as pCNTFET diode 255 and pCNTFET diode 260 and those described in other embodiments, and n-type CNTFET devices, such as those described in other embodiments, are formed on an underlying patterned CNT fabric as described in detail further below. The p-type and n-type CNTFET devices have a gate G positioned above the CNT fabric and separated from the CNT fabric by a gate insulator. The gate controls the ON/OFF and resistive ON-state of the channel region in the CNT fabric below the gate. The p-type and n-type CNTFET devices have source and drain contacts positioned above the CNT fabric that are adjacent to the gate and the source and drain contacts form source and drain regions in the CNT fabric below the source and drain contacts. However, various combinations of source contacts above or below the CNT fabric; drain contacts above or below the CNT fabric; and gates and gates insulators above or below the CNT fabric may be used to form p-type and n-type CNTFET devices.

The source and drain contacts are referred to as source/drain contact (S/D-C) because the p-type and n-type CNTFET devices are bi-directional devices and the designation source or drain depends on applied voltages with respect to the corresponding CNTFET gate. When the p-type and n-type CNTFET devices are operating in an environment where the voltages are defined, source and drain operation remains the same and can be identified for particular CNTFET devices. However, during ESD events with both positive and negative ESD voltage transitions possible, source and drain designations may not be as easily identified. When the gate is electrically connected with source or drain contacts of the p-type or n-type CNTFET devices, pCNTFET diodes or nCNTFET diodes are formed. pCNTFET diodes formed using bidirectional p-type CNTFET devices are unidirectional, that is current flows only in one direction when a corresponding voltage is applied. nCNTFET diodes formed using bidirectional n-type CNTFET devices are unidirectional, that is current flows only in one direction when a corresponding voltage is applied.

In normal circuit operating mode, with circuit voltage swings between ground (GND; zero volts) and power supply ($V_{DD}$), pCNTFET diode 255 and pCNTFET diode 260 should be in an OFF state. For example, when $V_{DD}$=3.5 volts, ground pad 225 holds shared ground bus 230 at GND (0 volts), power supply pad 235 holds shared power supply bus 240 at $V_{DD}$ (3.5 volts), and signal pad 220 swings between zero volts and 3.5 volts. When signal pad 220 is at ground (0 volts), then the gate G, the first S/D-C contact, and the second S/D-C contact of pCNTFET diode 255 are at zero volts and the pCNTFET diode 255 is in an OFF state. pCNTFET diode 260 is also in an OFF state because although the second S/D-C contact of pCNTFET diode 260 is at ground, the gate G and the first S/D C contact of pCNTFET diode 260 are both at $V_{DD}$ which prevents the corresponding gate voltage from dropping below $V_{DD}$ thereby holding pCNTFET diode 260 in an OFF state. When signal pad 220 is at $V_{DD}$ (3.5 volts), then the gate G, the first S/D-C contact, and the second S/D-C contact of pCNTFET diode 260 are at $V_{DD}$ and the pCNTFET diode 260 is in an OFF state. pCNTFET diode 255 is also in an OFF state because although the second S/D-C contact of pCNTFET diode 255 is at ground, the gate G and the first S/D-C contact of pCNTFET diode 255 are both at $V_{DD}$ which prevents the corresponding gate voltage from dropping below $V_{DD}$ thereby holding pCNTFET diode 255 in an OFF state.

In the presence of an ESD event caused by HBM 105, a maximum ESD current 150 of 1 Ampere flows between the pads and through on-chip circuits as illustrated in prior art FIG. 1. The design of CNT ESD protect circuit 250, and corresponding pCNTFET diode 255 and pCNTFET diode 260 devices as described in detail further below, prevent an ESD-driven voltage/current pulse from exceeding a maximum allowed voltage on the chip. In the examples described further below, CNTFET technology with minimum dimensions F=0.1 um or F=0.2 um and CNTFET channel lengths of Lp=0.1 um or 0.2 um are used, and CNTFET device width Wp is adjusted so as to prevent an ESD-driven voltage from exceeding a maximum allowed voltage. With respect to schematic 200 shown in FIG. 2, the operation of each device is explained with respect to ESD voltages applied between signal pad 220 and ground pad 225 connected to shared ground bus 230, or between signal pad 220 and power supply pad 235 connected to shared power supply bus 240. Shared ground bus 230, shared power supply bus 240, and decoupling capacitor $C_{DEC}$ may be used as part of CNT ESD protect circuit conducting paths as described below. ESD-driven voltage/current pulse applied between two signal pads is also described further below.

During an ESD event, ESD voltage/current may also be applied between two signal pads, similar to signal pad 220, as illustrated and described further below with respect to FIGS. 6 and 7. As described further below, ESD current 150 flowing between two signal pads flows through two pCNTFET diodes in series. The resulting voltage drop is 2× (two times) higher than when ESD current 150 flows through a single pCNTFET device between a signal pad and a ground or power supply pad. In this example, as described further below with respect to FIG. 9D, CNT ESD protect circuit 250 is designed such that the maximum allowed ESD-induced voltage is approximately 7 volts. Therefore, ESD current 150 flowing between signal pads through two devices in series typically results in the maximum voltage drop of approximately 7 volts across two signal pads. However, since the ESD current between the pair of pCNTFET diodes flows through a shared ground bus or power supply bus, the voltage between a signal node and ground or power supply connection of protected circuit 210 does not exceed 3.5 volts. ESD current 150 flowing through one CNTFET diode between a signal pad and a shared ground or power supply pad also results in approximately 3.5 Volts as described further below.

During an ESD event corresponding to HBM 105 (prior art FIG. 1) in which a positive ESD-driven voltage is applied to signal pad 220 relative to power supply pad 235, CNT ESD protect circuit 250 is activated. pCNTFET diode 260 corresponding second S/D-C contact connected to signal pad 220 is pulsed to a positive voltage while gate G and first contact S/D-C, both connected to shared power supply bus 240, remain at approximately zero volts which causes pCNTFET diode 260 device to turn ON and conduct ESD current 150 that flows into signal pad 220 and out of power supply pad 235. In this example, the voltage drop between signal pad 220 and power supply pad 235 in the presence of ESD current 150 is approximately 3.5 volts since ESD current 150 flows through one pCNTFET device. Therefore the maximum ESD-driven voltage transmitted to protected circuit 210 between signal pad 220 and power supply pad 235 is approximately 3.5 volts.

In this positive ESD-driven voltage example, ground pad 225 is not connected to HBM 105. However, shared ground bus 230 is connected to shared power supply bus 240 by large decoupling capacitor $C_{DEC}$; $C_{DEC}$ may be in the range of 10,000 to 50,000 pF for example. Since ESD current 150 peaks in 10 ns as shown in prior art FIG. 1B, a large capacitor such as $C_{DEC}$ behaves as a near-short circuit for fast rise time pulses because the decoupling capacitor $C_{DEC}$ voltage change is relatively small (as illustrated further below) such that the voltage on shared ground bus 230 (and ground pad 225) remain close to zero volts. Therefore, pCNTFET diode 255 remains in an OFF state because corresponding second S/D-C contact connected to shared ground bus 230 remains at approximately zero volts and gate G and first S/D-C contact connected to signal pad 220 are at a positive voltage. pCNTFET diode 255 does not provide ESD protection during this ESD event with a positive ESD-driven voltage. Hence, the ESD transmitted voltage to protected circuit 210 between signal pad 220 and ground pad 225 is approximately the same as the ESD transmitted voltage between signal pad 220 and power supply pad 235 or approximately 3.5 volts in this example with ESD protection provided by pCNTFET diode 260.

During an ESD event corresponding to HBM 105 (prior art FIG. 1) in which a negative ESD-driven voltage is applied to signal pad 220 relative to power supply pad 235, CNT ESD protect circuit 250 is activated. pCNTFET diode 260 corresponding second S/D-C contact connected to signal pad 220 is pulsed to a negative voltage while gate G and first S/D-C contact, both connected to shared power supply bus 240, remain at approximately zero volts which causes pCNTFET diode 260 device to remain OFF. Thus, pCNTFET diode 260 does not provide ESD protection during this ESD event with a negative ESD-driven voltage.

In this negative ESD-driven voltage example, ground pad 225 is not connected to HBM 105. However, shared ground bus 230 is connected to shared power supply bus 240 by large decoupling capacitor $C_{DEC}$; $C_{DEC}$ may be in the range of 10,000 to 50,000 pF for example. Since ESD current 150 peaks in 10 ns, a large capacitor such as $C_{DEC}$ behaves as a near-short circuit for fast rise time pulses because the decoupling capacitor $C_{DEC}$ voltage change is relatively small such that the voltage on shared ground bus 230 (and pad 225) remain close to zero volts. For example, calculations of the voltage developed across $C_{DEC}$ in 10 ns due to ESD current 150 for $C_{DEC}$ in the 10,000 to 50,000 pF capacitance is in the range of 0.1 to 0.5 volts as described further below with respect to equations 2.1, 2.2, and 2.3. Therefore, pCNTFET diode 255 turns ON and conducts the ESD current 150 pulse that flows into power supply pad 235, through decoupling capacitor $C_{DEC}$ and into shared ground bus 230, then through pCNTFET diode 255, and out of signal pad 220. pCNTFET diode 255 turns ON because corresponding second SD-C contact connected to shared ground bus 230 remains at approximately zero volts and gate G and first S/D-C contact connected to signal pad 220 are at a negative voltage. pCNTFET diode 255 provides ESD protection during this ESD event with a negative ESD-driven voltage. Thus, the ESD transmitted voltage to protected circuit 210 between signal pad 220 and ground pad 225 is approximately the same as the ESD transmitted voltage between signal pad 220 and power supply pad 235 or approximately 3.5 volts in this example with ESD protection provided by pCNTFET diode 255.

As described above, an ESD event corresponding to HBM 105 (prior art FIG. 1) in which CNT ESD protect circuit 250 provides protection when a positive ESD-driven voltage is applied to signal pad 220 relative to voltage pad 235, or a negative ESD-driven voltage is applied to signal pad 220 relative to voltage pad 235 (FIG. 2), resulting in a maximum ESD-driven voltage of approximately 3.5 volts applied across terminals of protected circuit 210. For the positive ESD-driven voltage applied to CNT ESD protect circuit 250, pCNTFET diode 260 turns ON to provide ESD protection, while for negative ESD-driven voltage applied to CNT ESD protect circuit 250, pCNTFET diode 255 turns ON to provide ESD protection. Since shared power supply bus 240 and shared ground bus 230 are coupled by large decoupling capacitor $C_{DEC}$ typically in the range of 10,000 to 50,000 pF, shared power supply bus 240 and shared ground bus 230 are at approximately the same voltage level for both positive and negative ESD-driven voltages. Hence, if HMB 105 is applied between signal pad 220 and ground pad 225 instead of between signal pad 220 and power supply pad 235 as described further above, pCNTFET diode 260 turns ON for positive ESD-driven voltages and pCNTFET diode 255 turns ON for negative ESD-driven voltages, sometimes also referred to as ESD events. ESD transmitted voltages between signal pad 220 and ground pad 225 and signal pad 220 and power supply pad 235 are limited to approximately 3.5 volts as described further above.

Figure 3:
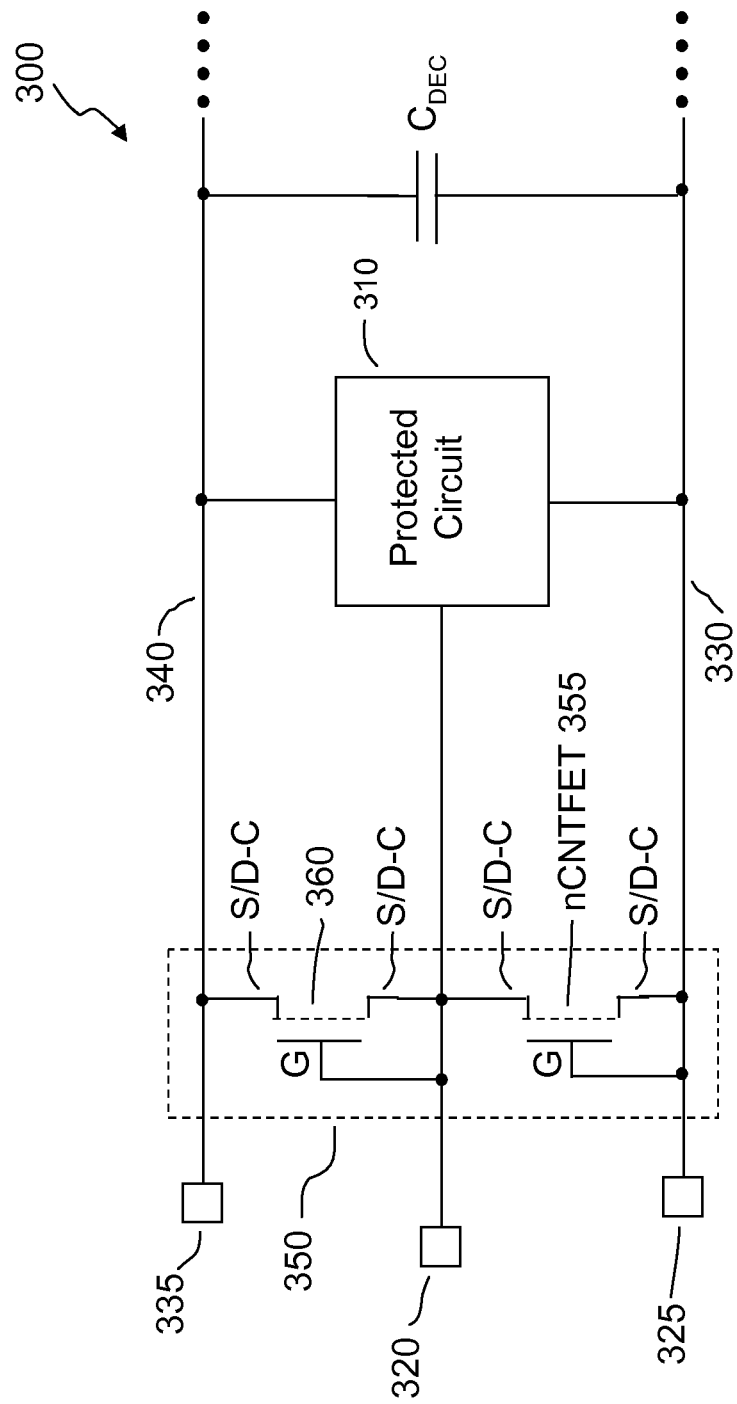
FIG. 3 illustrates a carbon nanotube ESD protect circuit using n-type carbon nanotube field effect transistors (nCNTFETs) used to form nCNTFET diodes.

FIG. 3 illustrates a CNT-based ESD protection approach schematic 300 showing a protected circuit 310 electrically connected to a signal pad 320, a shared ground bus 330, a shared power supply bus 340, a CNT ESD protect circuit 350 electrically connected to the signal pad 320, the shared ground bus 330, and the shared power supply bus 340, and a decoupling capacitor $C_{DEC}$ electrically connected to the shared ground bus 330 and the shared power supply bus 340. The shared ground bus 330 is electrically connected to a ground pad 325, the shared power supply bus 340 is electrically connected to a power supply pad 335, and other circuits such as protected circuit 310 can be electrically connected to the shared ground bus 330 and the shared power supply bus 340. The CNT ESD protect circuit 350 is formed by a pair of n-type CNTFET devices configured as nCNTFET diode 355 and nCNTFET diode 360. The nCNTFET diode 355 has a gate G and a second source/drain contact (S/D-C) electrically connected to the shared ground bus 330 and a first S/D-C contact electrically connected to the signal pad 320, to form a two-terminal nCNTFET diode. The nCNTFET diode 360 has a gate G and a second SD-C contact electrically connected to the signal pad 320 and a first S/D-C contact electrically connected to the shared power supply bus 340, to form a two-terminal nCNTFET diode.

In normal circuit operating mode, with circuit voltage swings between ground (GND; zero volts) and power supply ($V_{DD}$), nCNTFET diode 355 and nCNTFET diode 360 used to form CNT ESD protect circuit 350 should be in an OFF state. For example, when $V_{DD}$=3.5 volts, ground pad 325 holds shared ground bus 330 at GND (0 volts), power supply pad 335 holds shared power supply bus 340 at $V_{DD}$ (3.5 volts), and signal pad 320 swings between zero volts and 3.5 volts. When signal pad 320 is at ground (0 volts), then the gate G, the first S/D-C contact, and the second S/D-C contact of nCNTFET diode 355 are at zero volts and the device is in an OFF state. nCNTFET diode 360 is also in an OFF state because although the first S/D-C contact of nCNTFET diode 360 is at $V_{DD}$, the gate G and the second S/D-C contact of nCNTFET diode 360 are both at ground which prevents the corresponding gate voltage from rising above ground thereby holding nCNTFET diode 360 in an OFF state. When signal pad 320 is at $V_{DD}$ (3.5 volts), then the gate G and the first S/D-C contact and the second S/D-C contact of nCNTFET diode 360 are at $V_{DD}$ and the device is in an OFF state. nCNTFET diode 355 is also in an OFF state because although the first S/D-C contact of nCNTFET diode 355 is at $V_{DD}$, the gate G and the second S/D-C contact of nCNTFET diode 355 are both at ground which prevents the corresponding gate voltage from rising above ground thereby holding nCNTFET diode 355 in an OFF state.

In the presence of an ESD event caused by HBM 105, a maximum ESD current 150 of 1 Ampere flows between the pads and through on-chip circuits. The design of CNT ESD protect circuit 350, and corresponding nCNTFET diode 355 and nCNTFET diode 360 devices as described in detail further below, prevents an ESD-driven voltage/current pulse from exceeding a maximum allowed voltage on the chip. In the examples described further below, CNTFET technology with minimum dimensions F=0.1 um and 0.2 um and CNTFET channel length Ln=0.1 um and 0.2 um are used, and CNTFET channel width Wn is adjusted so as to prevent an ESD-driven voltage from exceeding a maximum allowed voltage. With respect to schematic 300 shown in FIG. 3, the operation of each device is explained with respect to ESD voltages applied between signal pad 320 and ground pad 325 connected to shared ground bus 330, or between signal pad 320 and power supply pad 335 connected to shared power supply bus 340. Shared ground bus 330, shared power supply bus 340, and decoupling capacitor $C_{DEC}$ may be used as part of CNT ESD protect circuit conducting paths as described below. ESD-driven voltage/current pulses applied between two signal pads are also described further below.

As explained further above with respect to FIG. 3, ESD current 150 flowing between signal pads through two devices in series typically results in the maximum voltage drop of approximately 7 volts across two signal pads. However, since the ESD current between the pair of nCNTFET diodes flows through a shared ground bus or power supply bus, the voltage between a signal node and ground or power supply connection of protected circuit 310 does not exceed 3.5 volts. ESD current 150 flowing through one CNTFET diode between a signal pad and a shared ground or power supply pad also results in approximately 3.5 Volts as described further below.

During an ESD event corresponding to HBM 105 (prior art FIG. 1) in which a positive ESD-driven voltage is applied to signal pad 320 relative to power supply pad 335, CNT ESD protect circuit 350 is activated. nCNTFET diode 360 corresponding gate G and second S/D-C contact, both connected to signal pad 320, are pulsed to a positive voltage while first contact S/D-C, connected to shared $V_{DD}$ power supply bus 340, remains at approximately zero volts which causes nCNTFET diode 360 to turn ON and conduct ESD current 150 that flows into signal pad 320 and out of power supply pad 335. In this example, the voltage drop between signal pad 320 and power supply pad 335 in the presence of ESD current 150 is approximately 3.5 volts because ESD current 150 flows through one nCNTFET device. Therefore the maximum ESD-driven voltage transmitted to protected circuit 310 between signal pad 320 and power supply pad 335 is approximately 3.5 volts.

In this positive ESD-driven voltage example, ground pad 325 is not connected to HBM 105. However, shared ground bus 330 is connected to shared power supply bus 340 by large decoupling capacitor $C_{DEC}$; $C_{DEC}$ may be in the range of 10,000 to 50,000 pF for example. Since ESD current 150 peaks in 10 ns, a large capacitor such as $C_{DEC}$ behaves as a near-short circuit for fast rise time pulses because the decoupling capacitor $C_{DEC}$ voltage change is relatively small as described further above with respect to FIG. 2 such that the voltage on shared ground bus 330 (and pad 325) remain close to zero volts. Therefore, nCNTFET diode 355 remains in an OFF state because corresponding gate G and second S/D-C contact connected to shared ground bus 330 remain at approximately zero volts even though first S/D-C contact connected to pad 320 is at a positive voltage. nCNTFET diode 355 does not provide ESD protection during this ESD event with a positive ESD-driven voltage. Hence, the ESD transmitted voltage to protected circuit 310 between signal pad 320 and ground pad 325 is approximately the same as the ESD transmitted voltage between signal pad 320 and power supply pad 335, or approximately 3.5 volts in this example, with ESD protection provided by nCNTFET diode 360.

During an ESD event corresponding to HBM 105 (prior art FIG. 1) in which a negative ESD-driven voltage is applied to signal pad 320 relative to power supply pad 335, CNT ESD protect circuit 350 is activated. nCNTFET diode 360 corresponding gate G and second S/D-C contact connected to signal pad 320 are pulsed to a negative voltage while first S/D-C contact, connected to shared power supply bus 340, remains at approximately zero volts, which causes nCNTFET diode 360 to remain OFF. nCNTFET diode 360 does not provide ESD protection during this ESD event with a negative ESD-driven voltage.

In this negative ESD-driven voltage example, ground pad 325 is not connected to HBM 105. However, shared ground bus 330 is connected to shared power bus 340 by large decoupling capacitor $C_{DEC}$ as described further above with respect to FIG. 2. Since ESD current 150 peaks in 10 ns, a large capacitor such as $C_{DEC}$ behaves as a near-short circuit for fast rise time pulses such that the voltage on shared ground bus 330 (and ground pad 325) remain close to zero volts as described further above with respect to FIG. 2. Therefore, nCNTFET diode 355 turns ON and conducts the ESD current 150 pulse that flows into power supply pad 335, through decoupling capacitor $C_{DEC}$ and into shared ground bus 330, then through nCNTFET diode 355, and out of signal pad 320. nCNTFET diode 355 turns ON because corresponding gate G and second S/D-C contact connected to shared ground bus 330 remain at approximately zero volts and first S/D-C contact connected to signal pad 320 is at a negative voltage. nCNTFET diode 355 provides ESD protection during this ESD event with a negative ESD-driven voltage. Hence, the ESD transmitted voltage to protected circuit 310 between signal pad 320 and ground pad 325 is approximately the same as the ESD transmitted voltage between signal pad 320 and power supply pad 335 or approximately 3.5 volts in this example with ESD protection provided by nCNTFET diode 355.

As described further above, an ESD event corresponding to HBM 105 (prior art FIG. 1) in which CNT ESD protect circuit 350 provides protection when a positive ESD-driven voltage is applied to signal pad 320 relative to power supply pad 335, or a negative ESD-driven voltage is applied to signal pad 320 relative to power supply pad 335 (FIG. 3), resulting in a maximum ESD-driven voltage of 3.5 volts applied across terminals of protected circuit 310. For positive ESD-driven voltage applied to CNT ESD protect circuit 350, nCNTFET diode 360 turns ON to provide ESD protection, while for negative ESD-driven voltage applied to CNT ESD protect circuit 350, nCNTFET diode 355 turns ON to provide ESD protection. Since shared power supply bus 340 and shared ground bus 330 are coupled by large decoupling capacitor $C_{DEC}$, shared power bus 340 and shared ground bus 330 are at approximately the same voltage level for both positive and negative ESD-driven voltages as described further above with respect to FIG. 2. Hence, if HMB 105 is applied between signal pad 320 and ground pad 325 instead of between signal pad 320 and power supply pad 335 as described further above, nCNTFET diode 360 turns ON for positive ESD-driven voltages and nCNTFET diode 355 turns ON for negative ESD-driven events. ESD transmitted voltages between signal pad 320 and ground pad 325 and signal pad 320 and power supply pad 335 are limited to approximately 3.5 volts as described further above.

Figure 4:
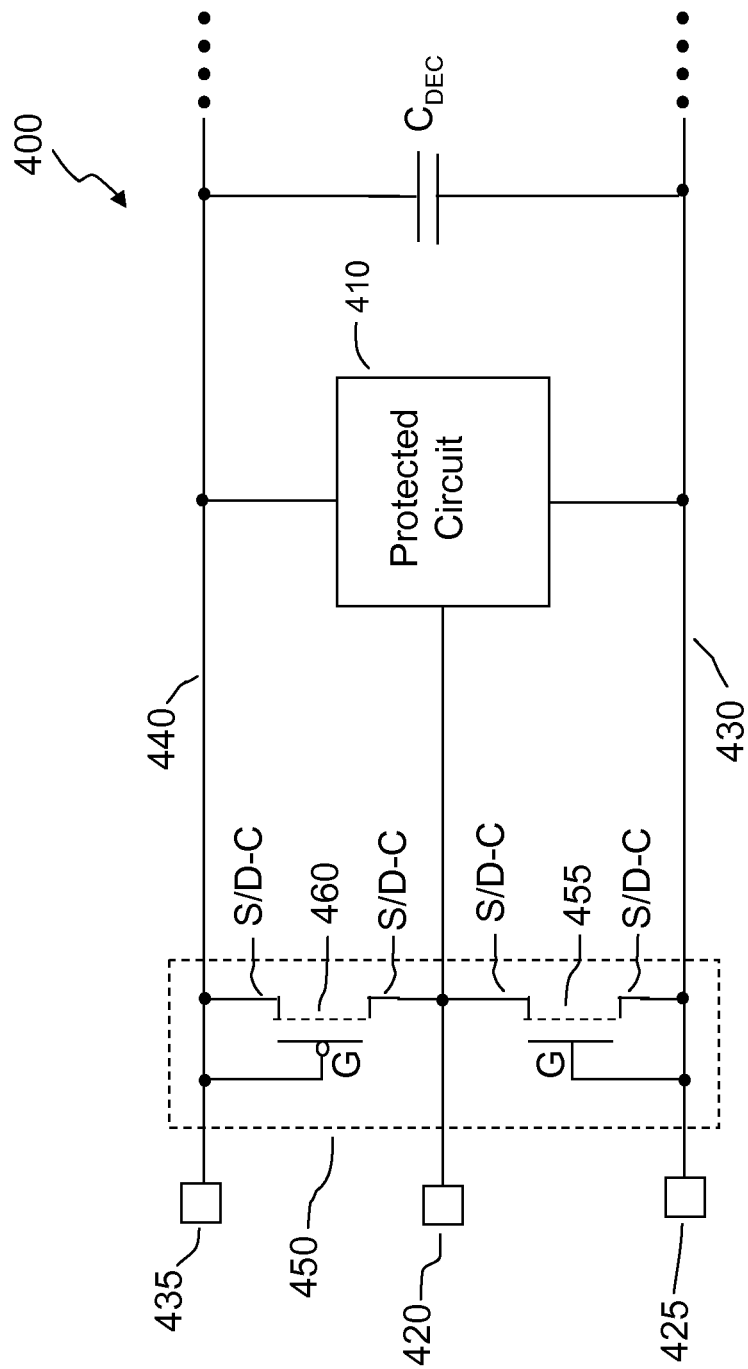
FIG. 4 illustrates a first carbon nanotube ESD protect circuit using mixed p-type and n-type CNTFET devices to form mixed p-type and n-type CNTFET diodes.

FIG. 4 illustrates a CNT-based ESD protection approach schematic 400 showing a protected circuit 410 electrically connected to a signal pad 420, a shared ground bus 430, and a shared power supply bus 440, a CNT ESD protect circuit 450 electrically connected to the signal pad 420, the shared ground bus 430, and the shared power supply bus 440, and a decoupling capacitor $C_{DEC}$ electrically connected to the shared ground bus 430 and the shared power supply bus 440. The shared ground bus 430 is electrically connected to a ground pad 425, the shared power supply bus 440 is electrically connected to a power supply pad 435, and other circuits such as protected circuit 410 can be electrically connected to the shared ground bus 430 and the shared power supply bus 440. The CNT ESD protect circuit 450 is formed by an n-type CNTFET device configured as nCNTFET diode 455 and a p-type CNTFET device configured as pCNTFET diode 460. The nCNTFET diode 455 has a gate G and a second source/drain contact (S/D-C) electrically connected to the shared ground bus 430 and a first S/D-C contact electrically connected to the signal pad 420, to form a two-terminal nCNTFET diode. The pCNTFET diode 460 has a gate G and a first S/D-C contact electrically connected to the shared power supply bus 440 and a second S/D-C contact electrically connected to the signal pad 420, to form a two-terminal pCNTFET diode.

In normal circuit operating mode, with circuit voltage swings between ground (GND; zero volts) and power supply ($V_{DD}$), nCNTFET diode 455 and pCNTFET diode 460 devices used to form CNT ESD protect circuit 450 should be in an OFF state. For example, when $V_{DD}$=3.5 volts, ground pad 425 holds shared ground bus 430 at GND (at zero volts), power supply pad 435 holds shared power supply bus 440 at $V_{DD}$ (3.5 volts), and signal pad 420 swings between zero volts and 3.5 volts. When signal pad 420 is at ground (0 volts), then the gate G, the first S/D-C contact, and the second S/D-C contact of nCNTFET diode 455 are at zero volts and the device is in an OFF state. pCNTFET diode 460 is also in an OFF state because although the second S/D-C contact of pCNTFET diode 460 is at ground, the gate G and the first S/D-C contact of pCNTFET diode 460 are both at $V_{DD}$ which prevents the corresponding gate voltage from dropping below $V_{DD}$ thereby holding pCNTFET diode 460 in an OFF state. When signal pad 420 is at $V_{DD}$ (3.5 volts), then the gate G, the first S/D-C contact, and the second S/D-C contact of pCNTFET diode 460 are at $V_{DD}$ and the device is in an OFF state. nCNTFET diode 455 is also in an OFF state because although the first S/D-C contact of nCNTFET diode 455 is at $V_{DD}$, the gate G and the second S/D-C contact of nCNTFET diode 455 are both at ground which prevents the corresponding gate voltage from rising above ground thereby holding nCNTFET diode 455 in an OFF state.

In the presence of an ESD event caused by HBM 105, a maximum ESD current 150 of 1 Ampere flows between the pads and through on-chip circuits. The design of CNT ESD protect circuit 450, and corresponding nCNTFET diode 455 and pCNTFET diode 460 devices as described in detail further below, prevent an ESD-driven voltage/current pulse from exceeding a maximum allowed voltage on the chip. In the examples described further below, CNTFET technology with minimum dimensions F=0.1 um or F=0.2 um and CNTFET channel length Lp=0.1 um or 0.2 um, and Ln=0.1 um or 0.2 um, are used for p and n-type CNTFET devices, respectively. Channel width Wp and Wn for p and n-type CNTFET devices, respectively, are adjusted so as to prevent an ESD-driven voltage from exceeding a maximum allowed voltage. With respect to schematic 400 shown in FIG. 4, the operation of each device is explained with respect to ESD voltages applied between signal pad 420 and ground pad 425 connected to shared ground bus 430, and signal pad 420 and power supply pad 435 connected to shared power supply bus 440. Shared ground bus 430, shared power supply bus 440, and decoupling capacitor $C_{DEC}$ may be used as part of CNT ESD protect circuit conducting paths as described below.

As explained further above with respect to FIG. 2, ESD current 150 flowing between signal pads through two devices in series typically results in the maximum voltage drop of approximately 7 volts across two signal pads. However, since the ESD current between the pair of pCNTFET and nCNTFET diodes flows through a shared ground bus or power supply bus, the voltage between a signal node and ground or power supply connection of protected circuit 410 does not exceed 3.5 volts. ESD current 150 flowing through one CNTFET diode between a signal pad and a shared ground or power supply pad also results in approximately 3.5 Volts as described further below.

During an ESD event corresponding to HBM 105 (prior art FIG. 1) in which a positive ESD-driven voltage is applied to signal pad 420 relative to power supply pad 435, CNT ESD protect circuit 450 is activated. pCNTFET diode 460 corresponding second S/D-C contact connected to signal pad 420 is pulsed to a positive voltage while gate G and first contact S/D-C, both connected to shared power supply bus 440, remain at approximately zero volts which causes pCNTFET diode 460 to turn ON and conduct ESD current 150 that flows into signal pad 420 and out of power supply pad 435. In this example, the voltage drop between signal pad 420 and power supply pad 435 in the presence of ESD current 150 is approximately 3.5 volts because ESD current 150 flows through one pCNTFET diode. Therefore the maximum ESD-driven voltage transmitted to protected circuit 410 between signal pad 420 and power supply pad 435 is approximately 3.5 volts.

In this positive ESD-driven voltage example, ground pad 425 is not connected to HBM 105. However, shared ground bus 430 is connected to shared power supply bus 440 by large decoupling capacitor $C_{DEC}$; $C_{DEC}$ may be in the range of 10,000 to 50,000 pF for example. Since ESD current 150 peaks in 10 ns, a large capacitor such as $C_{DEC}$ behaves as a near-short circuit for fast rise time pulses because the decoupling capacitor $C_{DEC}$ voltage change is relatively small as described further above with respect to FIG. 2 such that the voltage on shared ground bus 430 (and ground pad 425) remain close to zero volts. Therefore, nCNTFET diode 455 remains in an OFF state because corresponding gate G and second S/D-C contact connected to shared ground bus 430 remain at approximately zero volts even though first S/D-C contact connected to signal pad 420 is at a positive voltage. nCNTFET diode 455 does not provide ESD protection during this ESD event with a positive ESD-driven voltage. Hence, the ESD transmitted voltage to protected circuit 410 between signal pad 420 and ground pad 425 is approximately the same as the ESD transmitted voltage between signal pad 420 and power supply pad 435 or approximately 3.5 volts in this example with ESD protection provided by pCNTFET diode 460.

During an ESD event corresponding to HBM 105 (prior art FIG. 1) in which a negative ESD-driven voltage is applied to signal pad 420 relative to power supply pad 435, CNT ESD protect circuit 450 is activated. pCNTFET diode 460 corresponding second S/D-C contact connected to signal pad 420 is pulsed to a negative voltage while gate G and first S/D-C contact, connected to shared power supply bus 440, remains at approximately zero volts which causes pCNTFET diode 460 device to remain OFF. pCNTFET diode 460 does not provide ESD protection during this ESD event with a negative ESD-driven voltage.

In this negative ESD-driven voltage example, ground pad 425 is not connected to HBM 105. However, shared ground bus 430 is connected to shared power supply bus 440 by large decoupling capacitor $C_{DEC}$ as described further above with respect to FIG. 2. Since ESD current 150 peaks in 10 ns, a large capacitor such as $C_{DEC}$ behaves as a near-short circuit for fast rise time pulses such that the voltage on shared ground bus 430 (and pad 425) remain close to zero volts as described further above with respect to FIG. 2. Therefore, nCNTFET diode 455 turns ON and conducts the ESD current 150 pulse that flows into power supply pad 435, through decoupling capacitor $C_{DEC}$ and into shared ground bus 430, then through nCNTFET diode 455, and out of signal pad 420. nCNTFET diode 455 turns ON because corresponding gate G and second S/D-C contact connected to shared ground bus 430 remain at approximately zero volts and first S/D-C contact connected to signal pad 420 is at a negative voltage. nCNTFET diode 455 provides ESD protection during this ESD event with a negative ESD-driven voltage. Hence, the ESD transmitted voltage to protected circuit 410 between signal pad 420 and ground pad 425 is approximately the same as the ESD transmitted voltage between signal pad 420 and power supply pad 435 or approximately 3.5 volts in this example with ESD protection provided by nCNTFET diode 455.

As described further above, an ESD event corresponding to HBM 105 (prior art FIG. 1) in which CNT ESD protect circuit 450 provides protection when a positive ESD-driven voltage is applied to signal pad 420 relative to power supply pad 435, or a negative ESD-driven voltage is applied to signal pad 420 relative to power supply pad 435 (FIG. 4), resulting in a maximum ESD-driven voltage of approximately 3.5 volts applied across terminals of protected circuit 410. For positive ESD-driven voltage applied to CNT ESD protect circuit 450, pCNTFET diode 460 turns ON to provide ESD protection, while for negative ESD-driven voltage applied to CNT ESD protect circuit 450, nCNTFET diode 455 turns ON to provide ESD protection. Since shared power supply bus 440 and shared ground bus 430 are coupled by large decoupling capacitor $C_{DEC}$, shared power supply bus 440 and shared ground bus 430 are at approximately the same voltage level for both positive and negative ESD-driven voltages as described further above with respect to FIG. 2. Hence, if HMB 105 is applied between signal pad 420 and ground pad 425 instead of between signal pad 420 and power supply pad 435 as described further above, pCNTFET diode 460 turns ON for positive ESD-driven voltages and nCNTFET diode 455 turns ON for negative ESD-driven events. ESD transmitted voltages between signal pad 420 and ground pad 425, and between signal pad 420 and power supply pad 435 are limited to approximately 3.5 volts as described further above.

Figure 5:
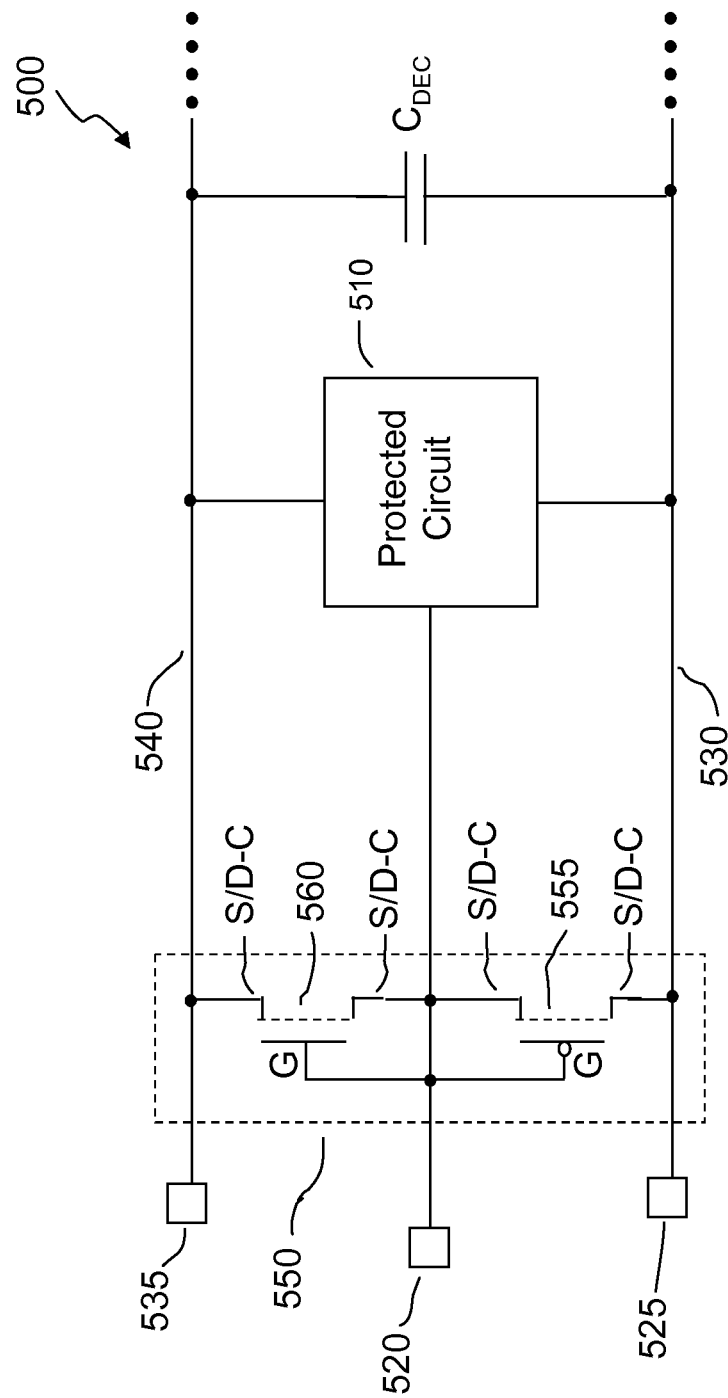
FIG. 5 illustrates a second carbon nanotube ESD protect circuit using mixed p-type and n-type CNTFET devices to form mixed p-type and n-type CNTFET diodes.

FIG. 5 illustrates a CNT-based ESD protection approach schematic 500 showing a protected circuit 510 electrically connected to a signal pad 520, a shared ground bus 530, and a shared power supply bus 540, a CNT ESD protect circuit 550 electrically connected to the signal pad 520, the shared ground bus 530, and the shared power supply bus 540, and a decoupling capacitor $C_{DEC}$ electrically connected to the shared ground bus 530 and the shared power supply bus 540. The shared ground bus 530 is electrically connected to a ground pad 525, the shared power supply bus 540 is electrically connected to a power supply pad 535, and other circuits such as protected circuit 510 can be electrically connected to the shared ground bus 530 and the shared power supply bus 540. The CNT ESD protect circuit 550 is formed by an p-type CNTFET device configured as pCNTFET diode 555 and a n-type CNTFET device configured as nCNTFET diode 560. The pCNTFET diode 555 has a gate G and a first source/drain contact (S/D-C) electrically connected to the signal pad 520 and a second S/D-C contact electrically connected to the shared ground bus 530, to form a two-terminal pCNTFET diode. The nCNTFET diode 560 has a gate G and a second S/D-C contact electrically connected to the signal pad 520 and a first S/D-C contact electrically connected to the shared power supply bus 540, to form a two-terminal nCNTFET diode.

In normal circuit operating mode, with circuit voltage swings between ground (GND; zero volts) and power supply ($V_{DD}$), nCNTFET diode 560 and pCNTFET diode 555 devices used to form CNT ESD protect circuit 550 should be in an OFF state. For example, when $V_{DD}$=3.5 volts, ground pad 525 holds shared ground bus 530 at GND (0 volts), power supply pad 535 holds shared power supply bus 540 at $V_{DD}$ (3.5 volts), and signal pad 520 swings between zero volts and 3.5 volts. When signal pad 520 is at ground (0 volts), then the gate G, the first S/D-C contact, and the second S/D-C contact of pCNTFET diode 555 are all at zero volts and the device is in the OFF state. nCNTFET 560 diode is also in an OFF state because although the first S/D-C contact of nCNTFET diode 560 is at $V_{DD}$, the gate G and the second S/D-C contact of nCNTFET diode 560 are both at ground which prevents the corresponding gate voltage from rising above ground thereby holding nCNTFET diode 560 in an OFF state. When signal pad 520 is at $V_{DD}$ (3.5 volts), then the gate G, the first S/D-C contact, and the second S/D-C contact of nCNTFET diode 560 are at $V_{DD}$ and the device is in an OFF state. pCNTFET diode 555 is also in an OFF state because although the second S/D-C contact of pCNTFET diode 555 is at ground, the gate G and the first S/D-C contact of pCNTFET diode 555 are both at $V_{DD}$ which prevents the corresponding gate voltage from dropping below $V_{DD}$ thereby holding pCNTFET diode 555 in an OFF state.

In the presence of an ESD event caused by HBM 105, a maximum ESD current 150 of 1 Ampere flows between the pads and through on-chip circuits. The design of CNT ESD protect circuit 550, and corresponding nCNTFET diode 560 and pCNTFET 555 diode devices as described in detail further below, prevent an ESD-driven voltage/current pulse from exceeding a maximum allowed voltage on the chip. In the examples described further below, CNTFET technology with minimum dimensions F=0.1 um and Lp=0.1 um and Ln=0.1 um are used for p-type and n-type CNTFET devices, respectively. Channel width Wp and Wn for p-type and n-type CNTFET devices, respectively, are adjusted so as to prevent an ESD-driven voltage from exceeding a maximum allowed voltage. With respect to schematic 500 shown in FIG. 5, the operation of each device is explained with respect to ESD voltages applied between signal pad 520 and ground pad 525 connected to shared ground bus 530, and between signal pad 520 and power supply pad 535 connected to shared power supply bus 540. Shared ground bus 530, shared power supply bus 540, and decoupling capacitor $C_{DEC}$ may be used as part of CNT ESD protect circuit conducting paths as described below.

As explained further above with respect to FIG. 2, ESD current 150 flowing between signal pads through two devices in series typically results in the maximum voltage drop of approximately 7 volts across two signal pads. However, since the ESD current between the pair of pCNTFET and nCNTFET diodes flows through a shared ground bus or power supply bus, the voltage between a signal node and ground or power supply connection of protected circuit 510 does not exceed 3.5 volts. ESD current 150 flowing through one CNTFET diode between a signal pad and a shared ground or power supply pad also results in approximately 3.5 Volts as described further below.

During an ESD event corresponding to HBM 105 (prior art FIG. 1) in which a positive ESD-driven voltage is applied to signal pad 520 relative to power supply pad 535, CNT ESD protect circuit 550 is activated. nCNTFET diode 560 corresponding gate G and second S/D-C contact both connected to signal pad 520 are pulsed to a positive voltage while first S/D-C contact connected to shared power supply bus 540, remains at approximately zero volts which causes nCNTFET diode 560 device to turn ON and conduct ESD current 150 that flows into signal pad 520 and out of power supply pad 535. In this example, the voltage drop between signal pad 520 and power supply pad 535 in the presence of ESD current 150 is approximately 3.5 volts because ESD current 150 flows through one nCNTFET diode. Therefore the maximum ESD-driven voltage transmitted to protected circuit 510 between signal pad 520 and power supply pad 535 is approximately 3.5 volts.

In this positive ESD-driven voltage example, ground pad 525 is not connected to HBM 105. However, shared ground bus 530 is coupled to shared power supply bus 540 by large decoupling capacitor $C_{DEC}$; $C_{DEC}$ may be in the range of 10,000 to 50,000 pF for example. Since ESD current 150 peaks in 10 ns, a large capacitor such as $C_{DEC}$ behaves as a near-short circuit for fast rise time pulses because the decoupling capacitor $C_{DEC}$ voltage change is relatively small as described further above with respect to FIG. 2 such that the voltage on shared ground bus 530 (and ground pad 525) remain close to zero volts. Therefore, pCNTFET diode 555 remains in an OFF state because corresponding gate G and first S/D-C contact connected to signal pad 520 are at a positive voltage and gate G voltage cannot drop below the first S/D-C contact voltage even though second S/D-C connected to shared ground bus 520 is at zero volts. pCNTFET diode 555 does not provide ESD protection during this ESD event with a positive ESD-driven voltage. Hence, the ESD transmitted voltage to protected circuit 510 between signal pad 520 and ground pad 525 is approximately the same as the ESD transmitted voltage between signal pad 520 and power supply pad 535 or approximately 3.5 volts in this example with ESD protection provided by nCNTFET diode 560.

During an ESD event corresponding to HBM 105 (prior art FIG. 1) in which a negative ESD-driven voltage is applied to signal pad 520 relative to power supply pad 535, CNT ESD protect circuit 550 is activated. nCNTFET diode 560 corresponding gate G and second S/D-C contact connected to signal pad 520 are pulsed to a negative voltage while first S/D-C contact, connected to shared power supply bus 540, remains at approximately zero volts which causes nCNTFET diode 560 device to remain OFF. nCNTFET diode 560 does not provide ESD protection during this ESD event with a negative ESD-driven voltage.

In this negative ESD-driven voltage example, ground pad 525 is not connected to HBM 105. However, shared ground bus 530 is coupled to shared power supply bus 540 by large decoupling capacitor $C_{DEC}$; $C_{DEC}$ may be in the range of 10,000 to 50,000 pF for example. Since ESD current 150 peaks in 10 ns, a large capacitor such as $C_{DEC}$ behaves as a near-short circuit for fast rise time pulses because the decoupling capacitor $C_{DEC}$ voltage change is relatively small such that the voltage on shared ground bus 530 (and pad 525) remain close to zero volts as described further above with respect to FIG. 2. Therefore, pCNTFET diode 555 turns ON and conducts the ESD current 150 pulse that flows into power supply pad 535, through decoupling capacitor $C_{DEC}$ and into shared ground conductor 530, then through pCNTFET diode 555, and out of signal pad 520. pCNTFET diode 555 turns ON because corresponding second S/D-C contact connected to shared ground bus 530 remains at approximately zero volts and gate G and first S/D-C connected to signal pad 520 are at a negative voltage. pCNTFET diode 555 provide ESD protection during this ESD event with a negative ESD-driven voltage. Hence, the ESD transmitted voltage to protected circuit 510 between signal pad 520 and ground pad 525 is approximately the same as the ESD transmitted voltage between signal pad 520 and power supply pad 535 or approximately 3.5 volts in this example with ESD protection provided by pCNTFET diode 555.

As described further above, an ESD event corresponding to HBM 105 (prior art FIG. 1) in which CNT ESD protect circuit 550 provides protection when a positive ESD-driven voltage is applied to signal pad 520 relative to power supply pad 535, or a negative ESD-driven voltage is applied to signal pad 520 relative to power supply pad 535 (FIG. 5), resulting in a maximum ESD-driven voltage of approximately 3.5 volts applied across terminals of protected circuit 510. For positive ESD-driven voltage applied to CNT ESD protect circuit 550, nCNTFET diode 560 turns ON to provide ESD protection, while for negative ESD-driven voltage applied to CNT ESD protect circuit 550, pCNTFET diode 555 turns ON to provide ESD protection. Since shared power supply bus 540 and shared ground bus 530 are coupled by large decoupling capacitor $C_{DEC}$, shared power supply bus 540 and shared ground bus 530 are at approximately the same voltage level for both positive and negative ESD-driven voltages as described further above with respect to FIG. 2. Hence, if HMB 105 is applied between signal pad 520 and ground pad 525 instead of between signal pad 520 and power supply pad 535 as described further above, nCNTFET diode 560 turns ON for positive ESD-driven voltages and pCNTFET diode 555 turns ON for negative ESD-driven events. ESD transmitted voltages between signal pad 520 and ground pad 525, and between signal pad 520 and power supply pad 535 are limited to approximately 3.5 volts as described further above.

Schematic-Level Description of CNTFET Diode-Based CNT ESD Protect Circuits Placed with Respect to Chip Pads and Protected Circuits on Peripheral and Area Pad Chip Layouts CNT ESD protect circuits such as CNT ESD protect circuit 250 illustrated in FIG. 2, CNT ESD protect circuit 350 illustrated in FIG. 3, CNT ESD protect circuit 450 illustrated in FIG. 4, and CNT ESD protect circuit 550 illustrated in FIG. 5, and other configurations (not shown) may be applied to chip or package level components having peripheral pad or area pad configurations. FIGS. 6A-6C and FIG. 7 illustrate peripheral pad configuration 600 and area pad configuration 700, respectively, using CNT ESD protect circuits corresponding to CNT ESD protect circuit 350 illustrated in FIG. 3; however, any of the CNT ESD protect circuits described further above and other configurations (not shown) may be used instead.

Figure 6A:
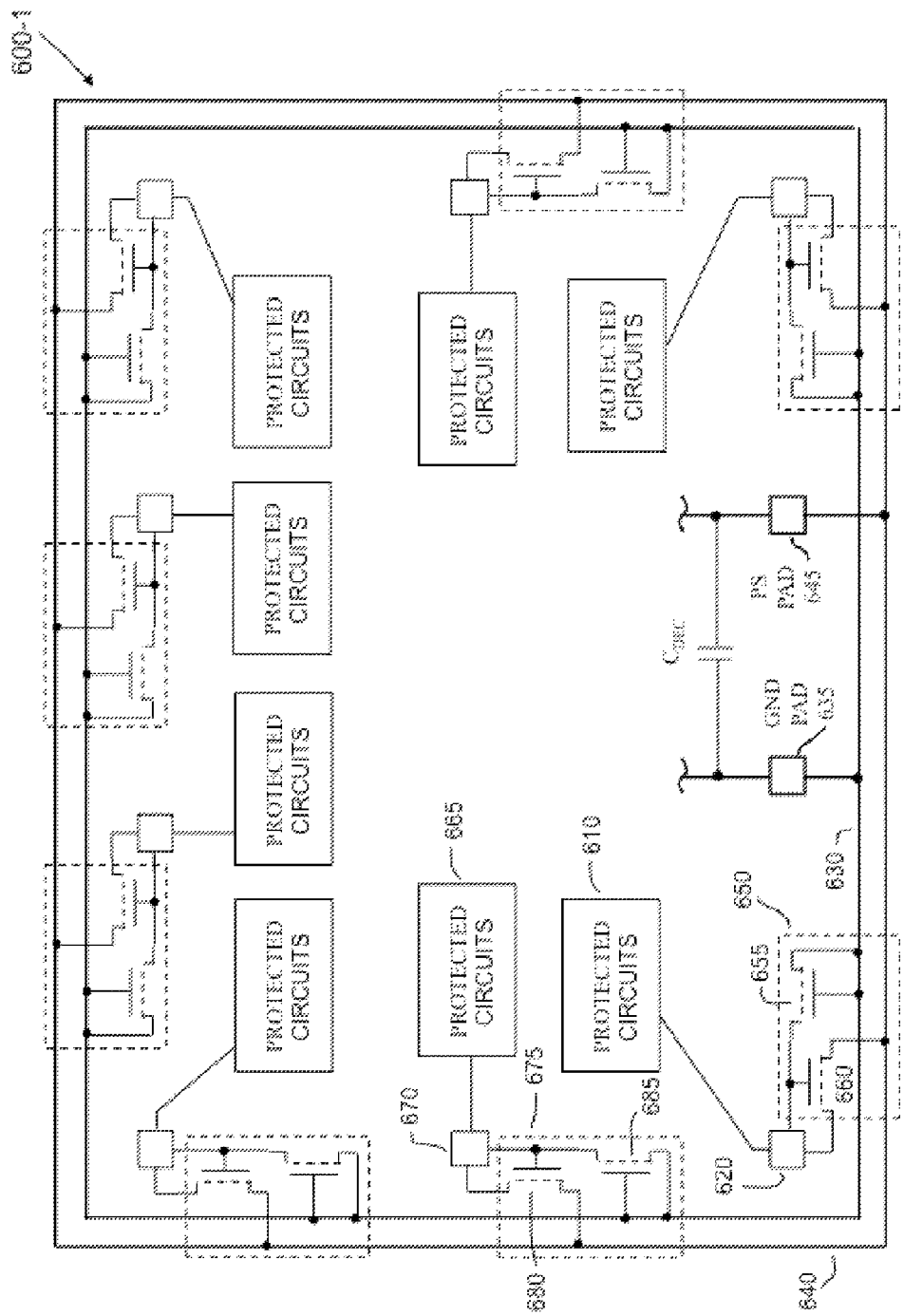
FIG. 6A illustrates a plan view of peripheral pad layouts of carbon nanotube ESD protect circuits using nCNTFET diodes.

FIG. 6A illustrates plan view 600-1 with peripheral signal pads connected to a CNT ESD protect circuit and a protected circuit. Plan view 600-1 may represent an unpacked known-good-die, a packaged chip (package connections not shown), or a package-level configuration such as a module, substrate, card, or board. In this example, pad 620 is connected to CNT ESD protect circuit 650 and also to protected circuit 610. CNT ESD protect circuit 650 is formed by interconnecting nCNTFET diode 655 having a first SD-C contact connected to pad 620 and a gate and a second S/D-C contact connected to shared ground bus 630 which is connected to ground pad 635, and nCNTFET diode 660 having a gate and a first S/D-C contact connected to pad 620 and a second S/D-C contact connected to shared $V_{DD}$ (power supply) bus 640 which is connected to power supply pad 645. A large decoupling capacitor $C_{DEC}$ in the range of 10,000 to 50,000 pF, for example, may be connected between shared ground bus 630 and shared $V_{DD}$ bus 640. In another example, pad 670 is connected to CNT ESD protect circuit 675 and also to protected circuit 665. CNT ESD protect circuit 675 is formed by interconnecting nCNTFET diode 685 having a first S/D-C contact connected to pad 670 and a gate and a second S/D-C contact connected to shared ground bus 630, and nCNTFET diode 680 having a gate and a first S/D-C contact connected to pad 670 and a second contact connected to shared $V_{DD}$ (power supply) bus.

The operation of CNT ESD protect circuits 650 and 675 have been described with respect to NT ESD protect circuit 350 illustrated in FIG. 3 for both positive and negative ESD-driven voltages applied between a signal pad such as signal pad 670 or signal pad 620 and power supply pad 645 or ground pad 635 when in contact with HBM 105 illustrated in prior art FIG. 1. However, it is also possible to apply ESD-driven voltage/current between signal pads such as signal pads 620 and 670. In this example, ESD current 150 illustrated in prior art FIG. 1B flows through CNT ESD protect circuits 650 and 675 in series.

In the presence of an ESD event caused by HBM 105, a maximum ESD current 150 of 1 Ampere flows between the pads, in this example between signal pads such as signal pads 620 and 670, and through on-chip circuits. The design of CNT ESD protect circuit 650, with corresponding nCNTFET diode 655 and nCNTFET diode 660 devices, and CNT ESD protect circuit 675, with corresponding nCNTFET diode 680 and nCNTFET diode 685 devices, is to limit the maximum ESD-driven voltage/current pulse between signal pads 620 and 670 to a maximum of approximately 7 volts in this example is described in detail further below. Note that in the case of an ESD event between two signal pads, such as signal pads 620 and 670 in this example, one nCNTFET diode in each CNT ESD protect circuits 650 and 675 is activated as described further below.

Figure 6B:
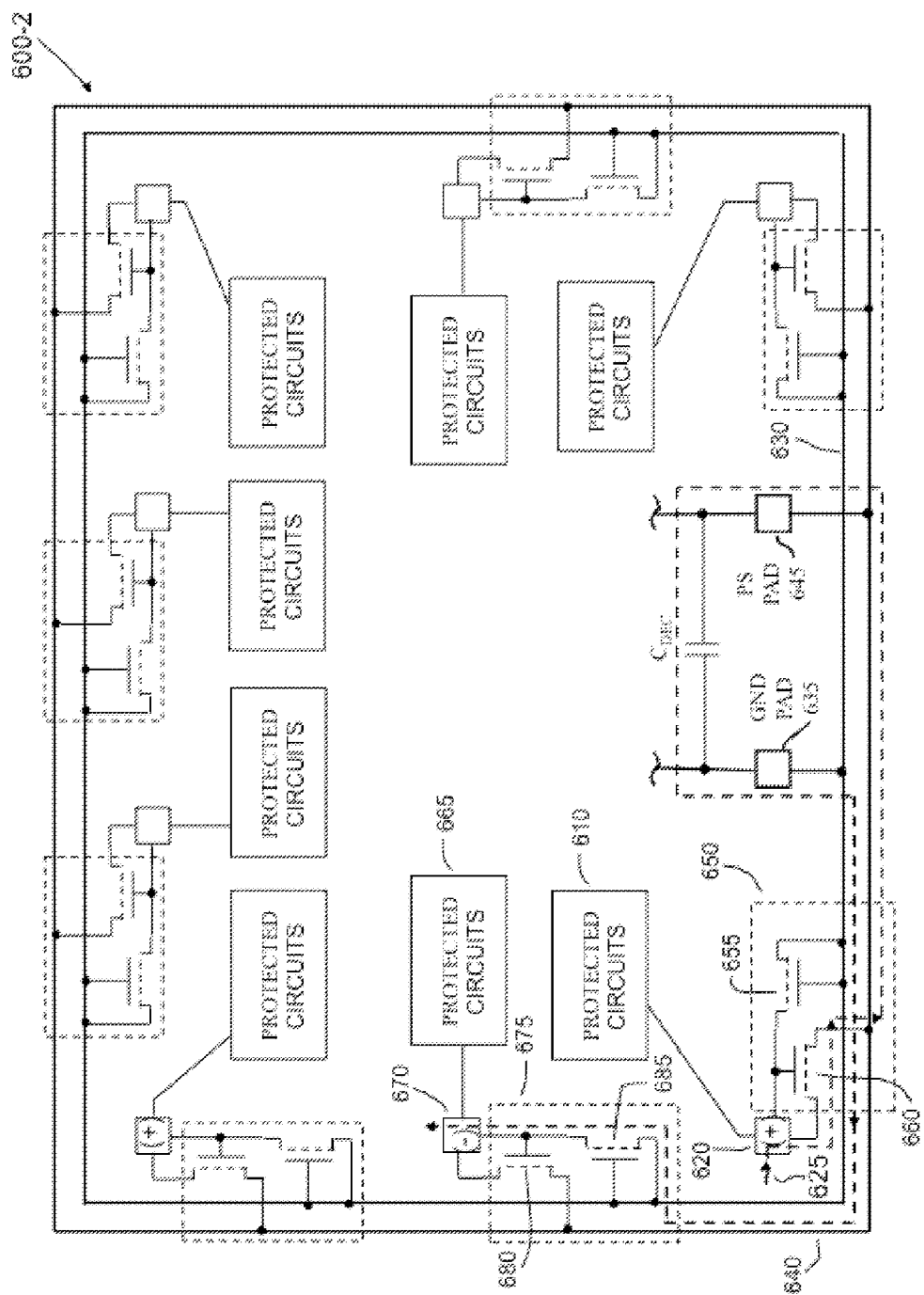
FIG. 6B illustrates the plan view of peripheral pad layouts of FIG. 6A showing ESD current flow for an ESD event of a first voltage polarity.

If an ESD pulse supplied by HBM 105 is applied between signal pads 620 and 670 such that signal pad 620 transitions to a positive voltage and signal pad 670 remains at ground, the operation of CNT ESD protect circuits 650 and 675 illustrated by plan view 600-2 in FIG. 6B is as follows. nCNTFET diode 660 turns ON (nCNTFET 655 remains OFF) and ESD current ($I_{ESD}$) 625, corresponding to ESD current 150, flows into signal pad 620, through nCNTFET diode 660, and onto shared power supply bus 640. Then, ESD current 625 flows through decoupling capacitor $C_{DEC}$ and onto shared ground bus 630, and to the gate and second S/D-C contact of nCNTFET diode 685 which turns ON. ESD current 625 then flows out of pad 670. nCNTFET diode 680 remains OFF. $C_{DEC}$ behaves as a short circuit for this short pulse transition time as explained further above with respect to FIG. 2. In this example, the maximum value of ESD current 625 is 1 Ampere at 10 ns. Since ESD current 625 flows through both nCNTFET diode 660 and nCNTFET diode 685 in series, then the resistance of each of these devices must be no more than approximately 3.5 Ohms for a total series resistance of approximately 7 Ohms such that the voltage drop between pads 620 and 670 does not exceed approximately 7 volts at 1 Ampere in this example. Design and layout of nCNTFET diodes 660 and 685 to achieve this low resistance value is described further below with respect to FIGS. 12-15. The nCNTFET devices illustrated by plan view 600-2 in FIG. 6B correspond to the nCNTFET devices illustrated by plan view 600-1 in FIG. 6A.

Figure 6C:
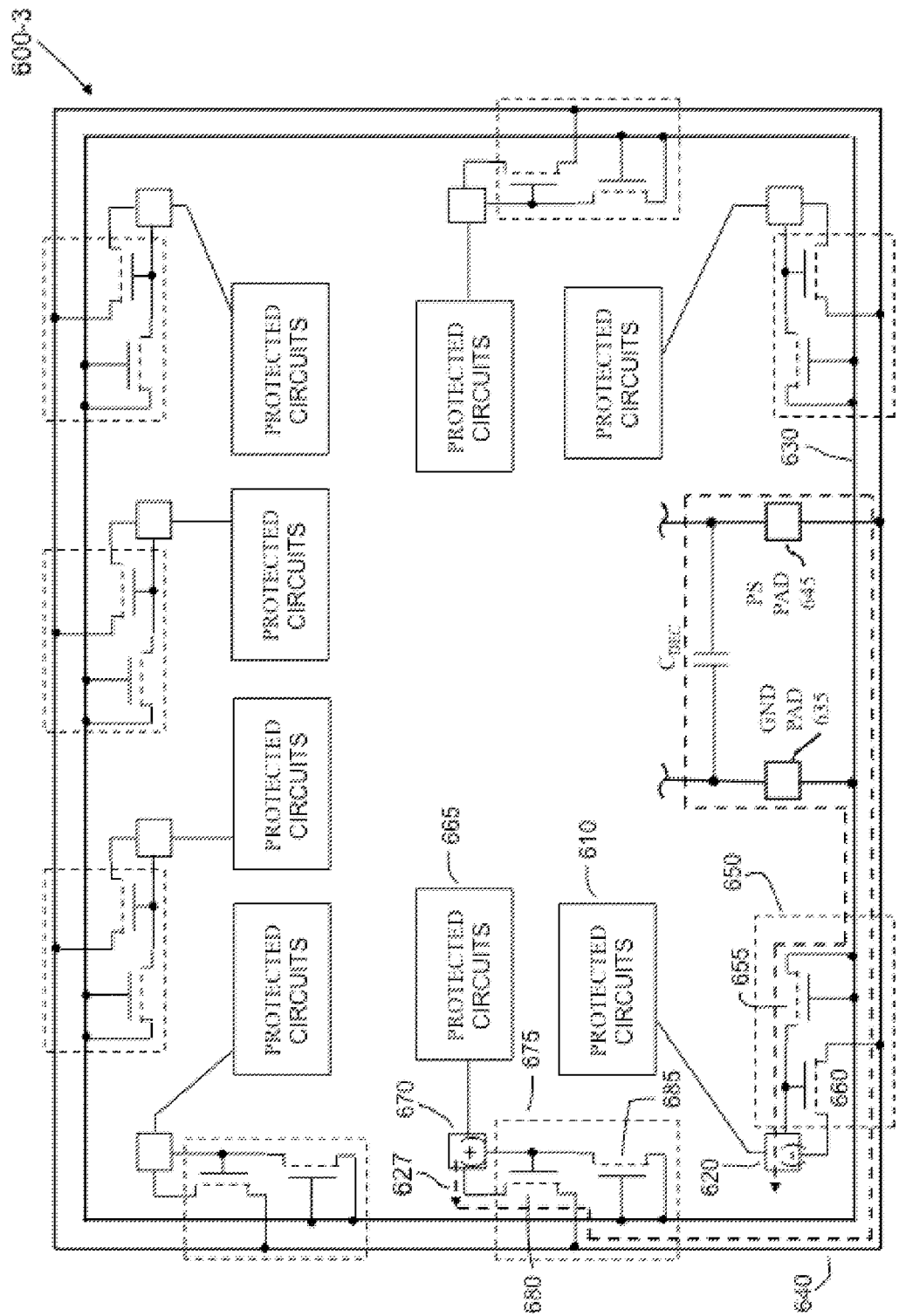
FIG. 6C illustrates the plan view of peripheral pad layouts of FIG. 6A showing ESD current flow for an ESD event of a second voltage polarity.

If an ESD pulse supplied by HBM 105 is applied between signal pads 670 and 620 such that signal pad 670 transitions to a positive voltage and signal pad 620 remains at ground (note: equivalent to a signal pad 620 negative voltage transition in the previous example), the operation of CNT ESD protect circuits 650 and 675 illustrated by plan view 600-3 in FIG. 6C is as follows. nCNTFET diode 680 turns ON (nCNTFET diode 685 remains OFF) and ESD current 627, corresponding to ESD current 150 illustrated in prior art FIG. 1, flows into signal pad 670, through nCNTFET diode 680, and onto shared power supply bus 640. Then, ESD current 627 flows through decoupling capacitor $C_{DEC}$ and onto shared ground bus 630, and to the gate and second S/D-C contact of nCNTFET diode 655 which turns ON. ESD current 627 then flows out of signal pad 620. nCNTFET diode 660 remains OFF. $C_{DEC}$ behaves as a short circuit for this short pulse transition time as explained further above with respect to FIG. 2. In this example, the maximum value of ESD current 627 is 1 Ampere at 10 ns. Since ESD current 627 flows through both nCNTFET diode 680 and nCNTFET diode 655, then the resistance of each of these devices must be no more than approximately 3.5 Ohms for a total series resistance of approximately 7 Ohms such that the voltage drop between signal pads 620 and 670 does not exceed approximately 7 volts at 1 Ampere in this example. Design and layout of nCNTFET diodes 680 and 655 to achieve this low resistance value is described further below with respect to FIGS. 12-15. The nCNTFET devices illustrated by plan view 600-3 in FIG. 6C correspond to the nCNTFET devices illustrated by plan view 600-1 in FIG. 6A.

Figure 7:
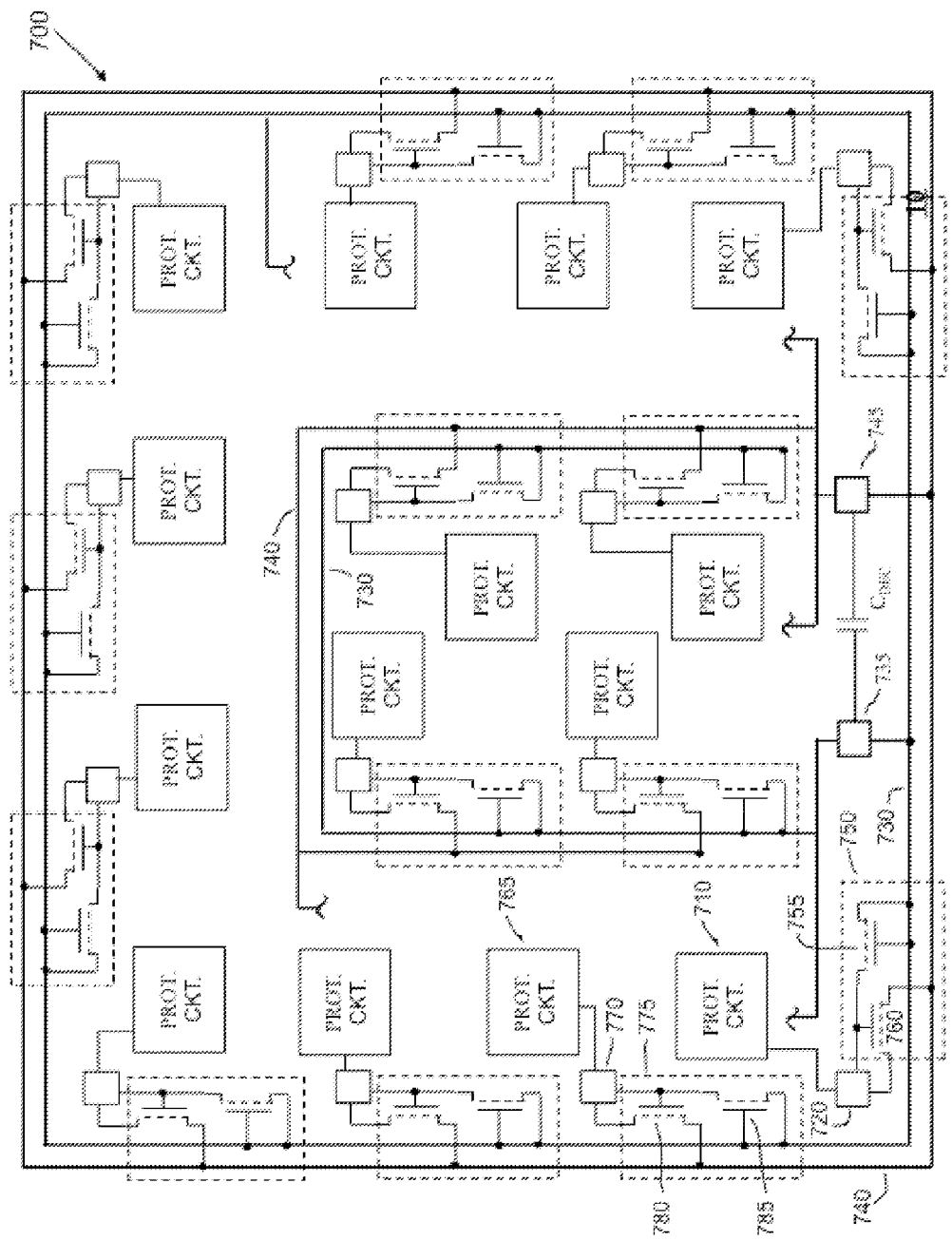
FIG. 7 illustrates a plan view of area array pad layouts of carbon nanotube ESD protect circuits using nCNTFET diodes.

FIG. 7 illustrates plan view 700 with area array signal pads connected to CNT ESD protect circuits and protected circuits. Plan view 700 may represent an unpacked known-good-die, a packaged chip (package connections not shown), or a package-level configuration at the module substrate, card, or board level. In this example, signal pad 720 is connected to CNT ESD protect circuit 750 and also to protected circuit 710. CNT ESD protect circuit 750 is formed by interconnecting nCNTFET diode 755 having a first S/D-C contact connected to signal pad 720 and a gate and second S/D-C contact connected to shared ground bus 730 which is connected to ground pad 735, and nCNTFET diode 760 having a gate and a first S/D-C contact connected to signal pad 720 and a second S/D-C contact connected to shared $V_{DD}$ power supply bus 740, which is connected to power supply pad 745. A large decoupling capacitor $C_{DEC}$ in the range of 10,000 to 50,000 pF, for example, may be connected between shared ground bus 730 and shared power supply bus 740. In another example, signal pad 770 is connected to CNT ESD protect circuit 775 and also to protected circuit 765. CNT ESD protect circuit 775 is formed by interconnecting nCNTFET diode 785 having a first S/D-C contact connected to signal pad 770 and a gate and a second S/D-C contact connected to shared ground bus 730, and nCNTFET diode 780 having a gate and a first S/D-C contact connected to signal pad 770 and a second S/D-C contact connected to shared power supply bus 740. The operation of CNT ESD protect circuit 650 corresponds to the operation of CNT ESD protect circuit 750 and the operation of CNT ESD protect circuit 675 corresponds to the operation of CNT ESD protect circuit 775.

In operation, CNT ESD protect circuits 750 illustrated in FIG. 7 corresponds to CNT ESD protect circuits 650 illustrated in FIG. 6, and CNT ESD protect circuit 775 corresponds to CNT ESD protect circuit 675. Signal pads 720 and 770 correspond to signal pads 620 and 670; ground pad 735 and shared ground bus 730 correspond to ground pad 635 and shared ground bus 630; and power supply pad 745 and shared power supply bus 740 correspond to correspond to power supply pad 645 and shared power supply bus 640. nCNTFET diodes 755 and 760 correspond to nCNTFET diodes 655 and 660; nCNTFET diodes 780 and 785 correspond to nCNTFET diodes 680 and 685. In operation, CNT ESD protect circuits 750 and 775 respond to both positive and negative ESD-driven voltages applied to signal pads 720 and 770 in the same manner as described further above with respect to positive and negative ESD-driven voltages applied signal pads 620 and 670 illustrated in FIGS. 6B and 6C. nCNTFET diode dimensions and interconnections are the same for those of FIG. 7 as those of FIG. 6. Design and layout of nCNTFET 755, 760, 780, and 785 to achieve the low resistance values needed for protection are as described further below with respect to FIGS. 12-15.

CNTFET Diode Models Based on CNTFET Devices

Figure 8B:
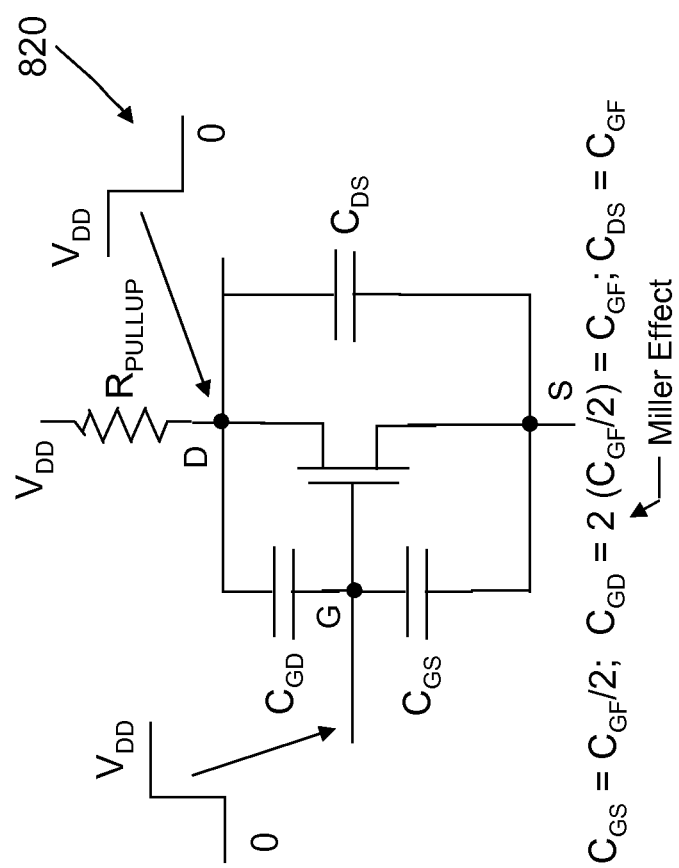

FIG. 8A shows an nCNTFET device symbol 800 and FIG. 8B shows associated capacitances and input and output voltage swings 820. Assuming $V_{DS}$ voltage is high at time zero, then when gate voltage transitions from zero to $V_{DD}$ at time zero+, the device output voltage transitions from $V_{DD}$ to ground. However, since nodes G and D switch in opposite direction, the gate-to-drain capacitance will by multiplied by 2 because of the well-known Miller Effect.

Figure 8C:
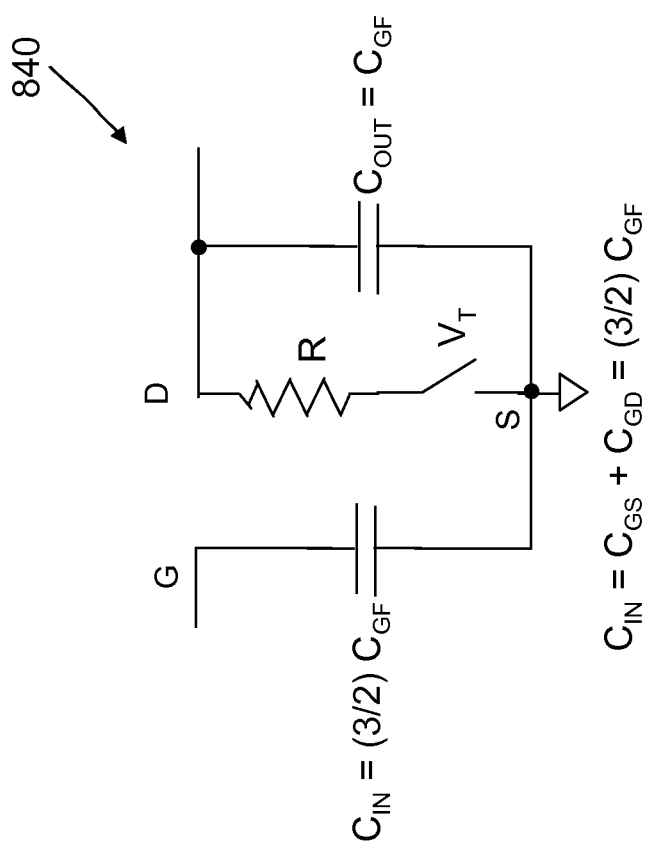

FIG. 8C shows electrical model 840 representing the FIG. 8A device in which ½ the gate-to-NT fabric ($C_{GF}$) capacitance ($C_{GF}/2$) is assigned to the drain and ½ the $C_{GF}$ capacitance is assigned to the source. So $C_{GS}=C_{GF}/2$. However, because of the Miller Effect, $C_{GD}=2 \, C_{GF}/2=C_{GF}$. Therefore, the input capacitance $C_{IN}=C_{GF}+C_{GF}/2=(3/2) \, C_{GF}$. The output capacitance $C_{OUT}=C_{GF}$.

Figure 9A:
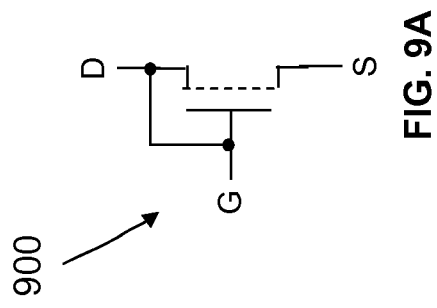
FIG. 9A-D illustrates a schematic representation of a CNTFET diode formed using a CNTFET device and a corresponding device models.
Figure 9C:
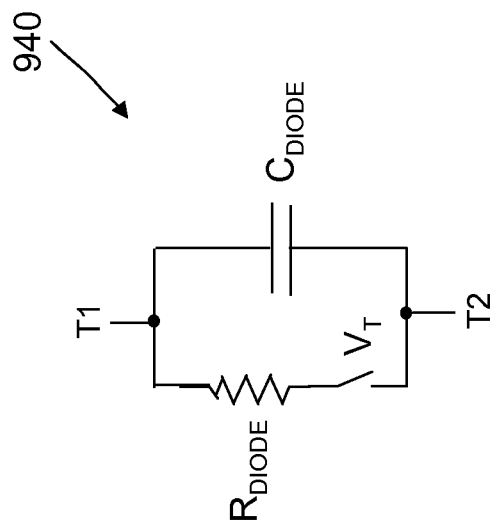
Figure 9B:
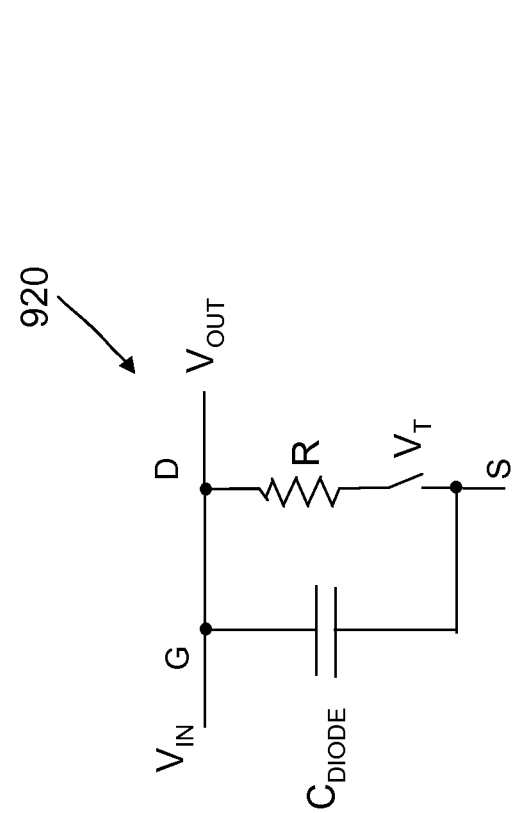

FIG. 9A illustrates a CNTFET device-based diode by symbolic representation CNTFET diode 900, and FIG. 9B illustrates device model 920 corresponding to CNTFET diode 900 symbolic representation. The CNTFET diode is formed by connecting gate G and drain D which eliminates capacitance $C_{GD}$ shown in FIG. 8B. Hence, the diode capacitance between combined gate G and drain D and source S is equal to CNTFET device-based diode capacitance $C_{DIODE}$. The capacitance $C_{DIODE}$ of CNTFET diode 900 is illustrated by CNTFET diode model 940 illustrated in FIG. 9C. The resistance $R_{DIODE}$ in the CNTFET diode model 940 is calculated using current-voltage equations illustrated further below with respect to FIG. 12, and is function of the CNT fabric constant (NTFC), device geometries, gate insulator properties, applied voltages across the terminals of CNTFET diode 900, and other factors described further below. The turn-on voltage corresponds to the threshold voltage of the FET structure used to form CNTFET diode 900.

Figure 9D:
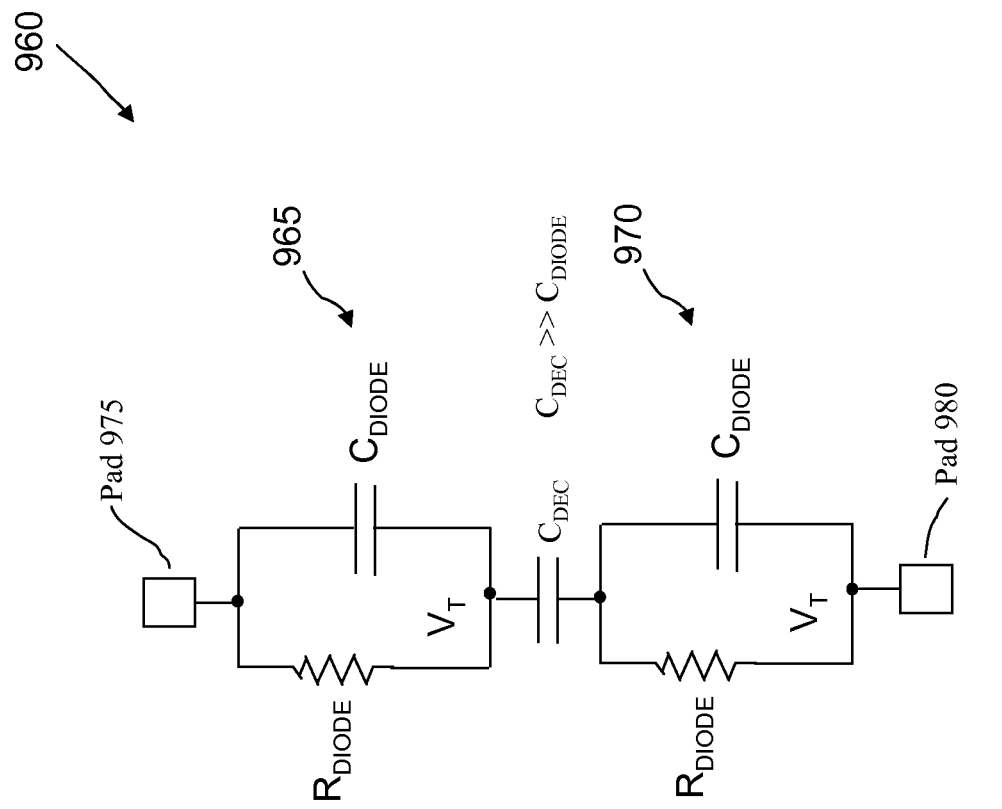

CNTFET device model 940 corresponds to a device model that may be used to calculate electrical characteristics of nCNTFET devices used to form CNT ESD protect circuits 350 shown in FIGS. 3, 650 and 675 shown in FIGS. 6, and 750 and 775 shown in FIG. 7. CNTFET device model 940 may also be used to calculate the electrical characteristics of pCNTFET devices as well. As described further above with respect to FIG. 2-5, when HBM 105 is connected between a signal pad and a shared ground bus or shared $V_{DD}$ bus, a single pCNTFET or nCNTFET device in the corresponding CNT ESD protect circuit is activated. However, as described further above with respect to FIGS. 6 and 7, if HBM 105 is connected between two signal pads, such as pads 620 and 670 or pads 720 and 770, then ESD current 150 (prior art FIG. 1B) passes (flows) through two CNTFET devices in series illustrated in FIG. 9D. FIG. 9D shows CNTFET diodes 965 and 970 in series, included in series CNTFET diode model 960. These CNTFET diodes may be nCNTFET or pCNTFET-type devices. Device model 960 corresponds to two CNTFET devices in series, devices 965 and 970 between pads 975 and 980. These devices are separated by large decoupling capacitance $C_{DEC}$ which may be treated as a direct electrical connection for high speed pulses such as ESD current 150 which results in a negligible change in voltage across $C_{DEC}$ as explained further above with respect to FIG. 2. Calculations of the voltage developed across $C_{DEC}$ in 10 ns due to ESD current 150 for $C_{DEC}$ in the 10,000 to 50,000 pF capacitance is in the range of 0.1 to 0.5 volts as described further below with respect to equations 2.1, 2.2, and 2.3. Pads 975 and 980 correspond to signal pads 620 and 670 in FIG. 6, and signal pads 720 and 770 in FIG. 7.

CNTFET diode models 940 and 960 may be applied to ambipolar CNTFET (aCNTFET) device-based diodes, referred to as aCNTFET diodes, as described further below with respect to FIGS. 19-34.

In a pad-to-pad ESD-event, each of the activated CNTFET diodes illustrated in FIG. 9D is part of a separate CNT ESD protect circuit as described further above with respect to FIGS. 6 and 7. For example, CNTFET devices 655 and 680 are connected to form CNTFET diodes corresponding to CNTFET diodes 965 and 970 illustrated in FIG. 9D. A pad-to-pad ESD-event applied between signal pads illustrated in FIG. 7 also results in two CNTFET devices activated in two separate CNT ESD protect circuits. This applies for positive and negative ESD voltage transitions; pCNTFET devices as well as nCNTFET devices.

CNTFET Current-Voltage Equations as a Function of Geometry and Materials Derived Using Measured Electrical CNTFET Device Characteristics from U.S. Pat. No. 7,598,544

The present disclosure is directed toward CNTFET-based protective devices. The carbon nanotube (CNT) fabric in each CNTFET is made of semiconducting carbon nanotubes to form either p-type, n-type, or ambipolar-type CNTFET devices. FIGS. 2-7 further above illustrate CNT ESD protect circuits formed using combinations of n-type and p-type CNTFET device-based CNTFET diodes connected between signal pads and a shared power supply bus or between signal pads and a shared ground bus. CNT ESD protect circuits based on ambipolar CNTFET device-based aCNTFET diodes are illustrated further below in FIGS. 19-34.

The construction of the sources, drains, and channel regions of a CNTFET with CNT fabrics creates current-voltage characteristics for the CNTFET that are different from the current-voltage characteristics for field effect transistors (FETs) having semiconductor substrates. The electric field induced in the gate region of the CNTFET has an electric field pattern that is different from the electric field pattern for FETs constructed having semiconductor substrates. The electrical characteristics between CNT fabrics and source contacts and drain contacts that form corresponding source and drain regions in the CNT fabric adjacent to the channel region have electrical characteristics that are different than the electrical characteristics between the semiconductor substrate and source and drain regions and corresponding contacts for FETs constructed on semiconductor substrates.

Figure 10A:
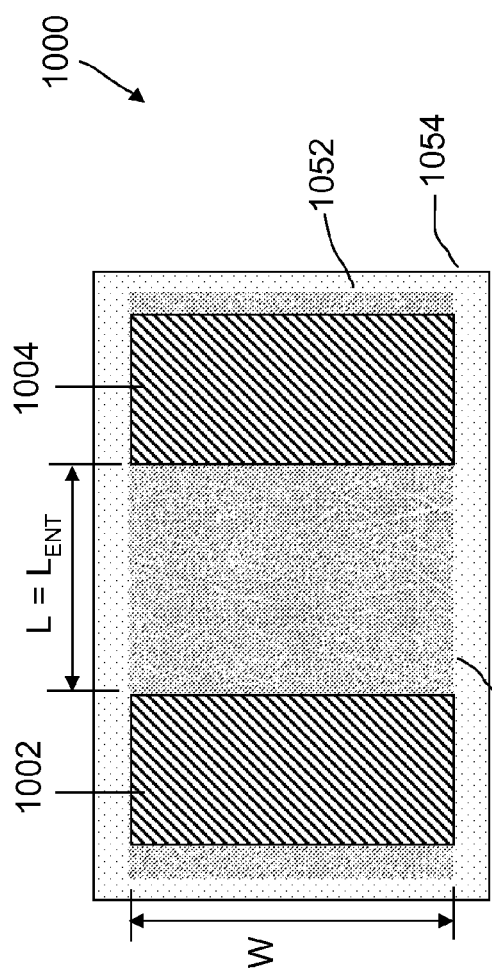
FIG. 10A illustrates a top view of a CNTFET device structures.
Figure 10B:
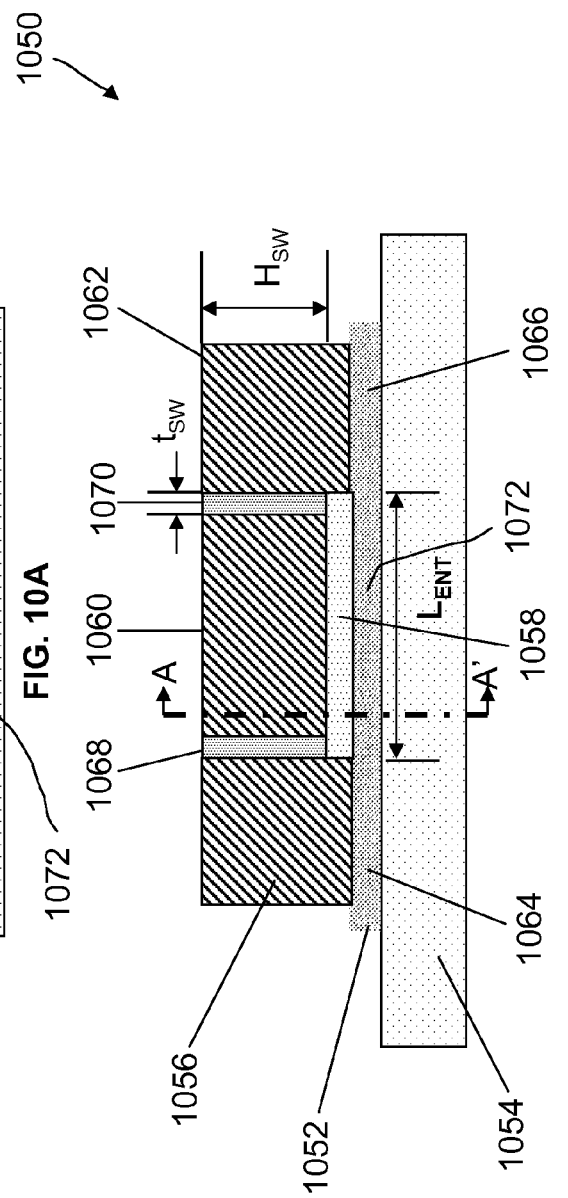
FIG. 10B illustrates a cross section of a CNTFET device structure corresponding to FIG. 10A.

FIG. 10A illustrates a plan view 1000 of an exemplary CNTFET, with the gate conductor 1060, gate insulator 1058 and spacers 1068, 1070 shown instead in cross section 1050 of the exemplary CNTFET, FIG. 10B, to provide an unobstructed plan view of the channel region of the CNT fabric 1052. Plan view 1000 and cross section 1050 refer to the same exemplary CNTFET device. The channel length L is equal to the spacing between source contact (conductor) 1056 and drain contact (conductor) 1062 with respect to the CNT fabric 1052. This length is equal to an "effective" CNT channel length, which is the effective length of carbon nanotube(s) to bridge the distance between the source and drain, and is designated as $L_{ENT}$ as shown in FIG. 10A. The channel width W is equal to the width of the source contact 1056 and the drain contact 1062 in this example. The exemplary CNTFET illustrated in FIGS. 10A and 10B may be a pCNTFET, an nCNTFET, or an aCNTFET depending on material choices, doping of the nanotube (CNT) fabric 1052, and other factors described further below with respect to FIGS. 36-40 and FIGS. 52, 54, 55, 56, 58, and 59. These FIGs. refer to cross section AA' in the gate region of the exemplary CNTFET device shown in FIG. 10B.

FIG. 10B illustrates cross section 1050 of an exemplary CNTFET having a CNT fabric 1052 deposited on an insulator (substrate) 1054. The CNT fabric 1052 is a fabric comprising semiconducting carbon nanotubes, e.g., a non-woven fabric of semiconducting carbon nanotubes, for instance, as explained further below. CNT fabric 1052 may be formed with an unordered carbon (CNT) nanotube fabric as described further below with respect to FIG. 10C, or with an ordered carbon nanotube (CNT) fabric as described further below with respect to FIG. 10D. For CNTFET devices in this disclosure, single wall carbon nanotubes (SWNTs) are assumed, although double wall and even multi-wall carbon nanotubes may sometimes be used, or combinations thereof. The exemplary CNTFET of plan view 1000 and cross section 1050 has a source contact 1056, a gate insulator 1058, a gate conductor 1060, and a drain contact 1062 fabricated above the CNT fabric 1052. A source region 1064 of the CNT fabric corresponds to the CNT fabric below the source contact 1056 and a drain region 1066 of the CNT fabric corresponds to the CNT fabric below the drain contact 1062. A channel region 1072 of the CNT fabric corresponds to the CNT fabric below the gate insulator 1058 and gate conductor 1060. The CNTFET 1000 has a spacer 1068 separating the source contact 1056 and the gate conductor and a spacer 1070 separating the gate conductor 1060 and the drain contact 1062. The spacer 1068 has a height $H_{SW}$ and a thickness $t_{SW}$ and the spacer 1070 has a height $H_{SW}$ and a thickness $t_{SW}$. The insulators 1054 and 1058 and spacers 1068 and 1070 can be any suitable insulator, such as described elsewhere herein. The source and drain contacts 1056 and 1062 can be any suitable conductor; transition metals such as Ti, Pd, and Co may be used. In the exemplary devices described in this disclosure, contacts and conductors were formed using Ti/Pd annealed to approximately 400 deg. C. Other conductors such as metals, metal alloys, semiconductors, such as W, TiN and others may also be used as described further below with respect to FIGS. 36-40 and FIGS. 52, 54, 55, 56, 58, and 59. Ion implantation, or other process methods, may used to adjust channel region threshold voltage values by controlling the position of the Fermi level in the band gap between conduction and valence bands, thereby facilitating the use of a broad range of conductive materials as described further below with respect to FIGS. 36-40 and FIGS. 52, 54, 55, 56, 58, and 59. Ti/Pd conductors can make near-Ohmic contact with metallic SWNTs in the CNT fabric and Ti/Pd conductors in contact with the CNT fabric 1052 can make Schottky-type contacts with semiconducting CNT in the CNT fabric 1052. After burn-off electrical post processing as described further below, only semiconducting-type CNTs remain in the CNT fabric. Schottky-type contacts may tend to inject majority carriers into the junctions at the source and drain (e.g., electrons for n-type CNT material, and holes for p-type CNT material, and both n and p-type carriers in the case of ambipolar CNTFETs as described further below in FIGS. 19-34. The position of the Fermi level in the conductor-to-NT fabric contact regions may also be adjusted by material work functions combined with ion implantation or other process methods thereby favoring hole injection in the case of unipolar pCNTFET devices and electron injection in the case of unipolar nCNTFET devices. In the case of ambipolar CNTFET devices, the position of the Fermi level may be positioned in approximately the middle of the bandgap such that both strong hole and electron injection occurs depending on the voltages applied to the ambipolar CNTFET device.

The exemplary CNTFET device illustrated in plan view 1000 and cross section 1050 shows the gate, and source and drain regions above the CNT fabric. However, source and drain regions may be below and in contact with the CNT fabric while the gate remains above the fabric region. Alternatively, the gate, source, and drain regions may all be below the CNT fabric. Another alternative is to have a gate above and another gate below the CNT fabric region. Still other geometries are also possible. The terms conductor, contact, electrode, and terminal are sometimes used interchangeably and refers to a source or drain region of a CNTFET in which mobile carriers are injected into a CNT channel region or removed from a CNT channel region, such as channel region 1072.

The CNT fabric 1052 comprises a layer of multiple carbon nanotubes. A fabric of carbon nanotubes (or nanofabric), in the present disclosure, e.g., a non-woven CNT fabric, may, for example, have a structure of multiple entangled carbon nanotubes that are irregularly arranged relative to one another. Alternatively, or in addition, for example, the fabric of CNTs for the present disclosure may possess some degree of positional regularity of the carbon nanotubes, e.g., some degree of parallelism along their long axes. Such positional regularity may be found, for example, on a relatively small scale wherein flat arrays of CNTs that are arranged together along their long axes in rafts on the order of one carbon nanotube long and ten to twenty carbon nanotubes wide. In other examples, such positional regularity maybe found on a larger scale, with regions of ordered carbon nanotubes, in some cases, extended over substantially the entire CNT fabric layer.

The fabrics of nanotubes retain desirable physical and electrical properties of the CNTs from which they are formed. The CNT fabric preferably has a sufficient amount of CNTs in contact so that at least one electrically semi-conductive pathway exists from a given point within the fabric to another point within the fabric. Individual CNTs may typically have a diameter of about 1-2 nm and may have lengths ranging from a 100 nm to about 200 microns, for example. The CNT lengths used in the exemplary devices were in the range of 500 nm to 2 um for example. The CNTs may curve and occasionally cross one another. Gaps in the fabric, i.e., between CNTs either laterally or vertically, may exist. Such fabrics may comprise single-walled carbon nanotubes, multi-walled carbon nanotubes, or both. The fabric may have small areas of discontinuity with no tubes present. The CNT fabric may be prepared as an individual layer or as multiple CNT fabric layers, one formed upon another. The thickness of the CNT fabric can be chosen as thin as substantially a monolayer of nanotubes, e.g., 1-10 nm for example, or can be chosen much thicker, e.g., ten or more nanometers to hundreds of microns in thickness. The porosity of the CNT fabrics can be tuned to generate low density CNT fabrics with high porosity or high density CNT fabrics with low porosity. The porosity and thickness can be chosen as desired depending upon the application at hand. Such CNT fabrics can be prepared by growing CNTs using chemical vapor deposition (CVD) processes in conjunction with various catalysts, for example. Other methods for generating such CNT fabrics may involve using spin-coating techniques and spray-coating techniques with preformed CNTs suspended in a suitable solvent. Nanoparticles of other materials can be mixed with suspensions of CNTs in such solvents and deposited by spin coating and spray coating to form CNT fabrics with nanoparticles dispersed among the CNTs. Such exemplary methods are described in more detail in the related art cited in the Background section of this disclosure.

The CNT fabric can be formed by various methods such as explained below. The source, drain, gate, gate insulator and spacers can be formed using deposition and lithographic patterning techniques that are well known to those of ordinary skill in the art. The CNT fabric can likewise be patterned using such lithographic patterning techniques.

The formation of such CNT layers is taught in several of the incorporated references. For example, U.S. Pat. No. 7,335,395 to Ward et al., incorporated herein by reference in its entirety, teaches a plurality of methods for forming CNT layers and films on a substrate element using preformed CNTs. The methods include, but are not limited to, spin coating (wherein a solution of CNTs is deposited on a substrate which is then spun to evenly distribute the solution across the surface of the substrate), spray coating (wherein a plurality of CNTs are suspended within an aerosol solution which is then disbursed over a substrate) and roll-to-roll coating (or roll coating, for brevity) such as Gravure coating (wherein an engraved roller with a surface spinning in a coating bath picks up the coating solution in the engraved dots or lines of the roller, and where the coating is then deposited onto a substrate as it passes between the engraved roller and a pressure roller). Further, U.S. Pat. No. 7,375,369 to Sen et al., incorporated herein by reference in its entirety, teaches solvents that are well suited for suspending CNTs and for forming a CNT nanotube layer over a substrate element via a spin coating process. For example, such solvents include but are not limited to ethyl lactate, dimethyl sulfoxide (DMSO), monomethyl ether, 4-methyl-2 pentanone, N-methylpyrrolidone (NMP), t-butyl alcohol, methoxy propanol, propylene glycol, ethylene glycol, gamma butyrolactone, benzyl benzoate, salicyladehyde, tetramethyl ammonium hydroxide and esters of alpha-hydroxy carboxylic acids. Such solvents can disperse the CNTs to form a stable composition without the addition of surfactants or other surface-active agents.

The substrate element can be formed from a plurality of materials as best fits the needs of a specific application. For example, in some applications the substrate element may be a silicon wafer. In other applications, the substrate element may be a layer of conductive material, such as, but not limited to, tungsten, aluminum, copper, nickel, palladium, titanium nitride, and tungsten nitride. In still other applications, the substrate element may be a layer of semiconducting material such as, but not limited to, silicon and gallium arsenide. In other applications, the substrate element may be a layer of dielectric material such as, but not limited to, silicon oxide, silicon nitride, and aluminum oxide. In other applications, the substrate element may be a layer of organic semiconducting material such as, but not limited to, polyfluorene polythiophenes, polyacetylenes, poly(acetylene)s, poly(pyrrole)s, poly(thiophene)s, polyanilines, polythiophenes, poly(p-phenylene sulfide), and poly(p-phenylene vinylene)s. In some applications, the substrate element may be formed of a rigid material, such as, but not limited to, metal (e.g., steel or aluminum), ceramic, or glass. In other applications, the substrate element may be formed of a flexible material such as a plastic film or sheet—e.g., polyethylene terephthalate (PET), polymethylmethacrylate, polyamides, polysulfones, and polycyclic olefins.

Figure 10C:
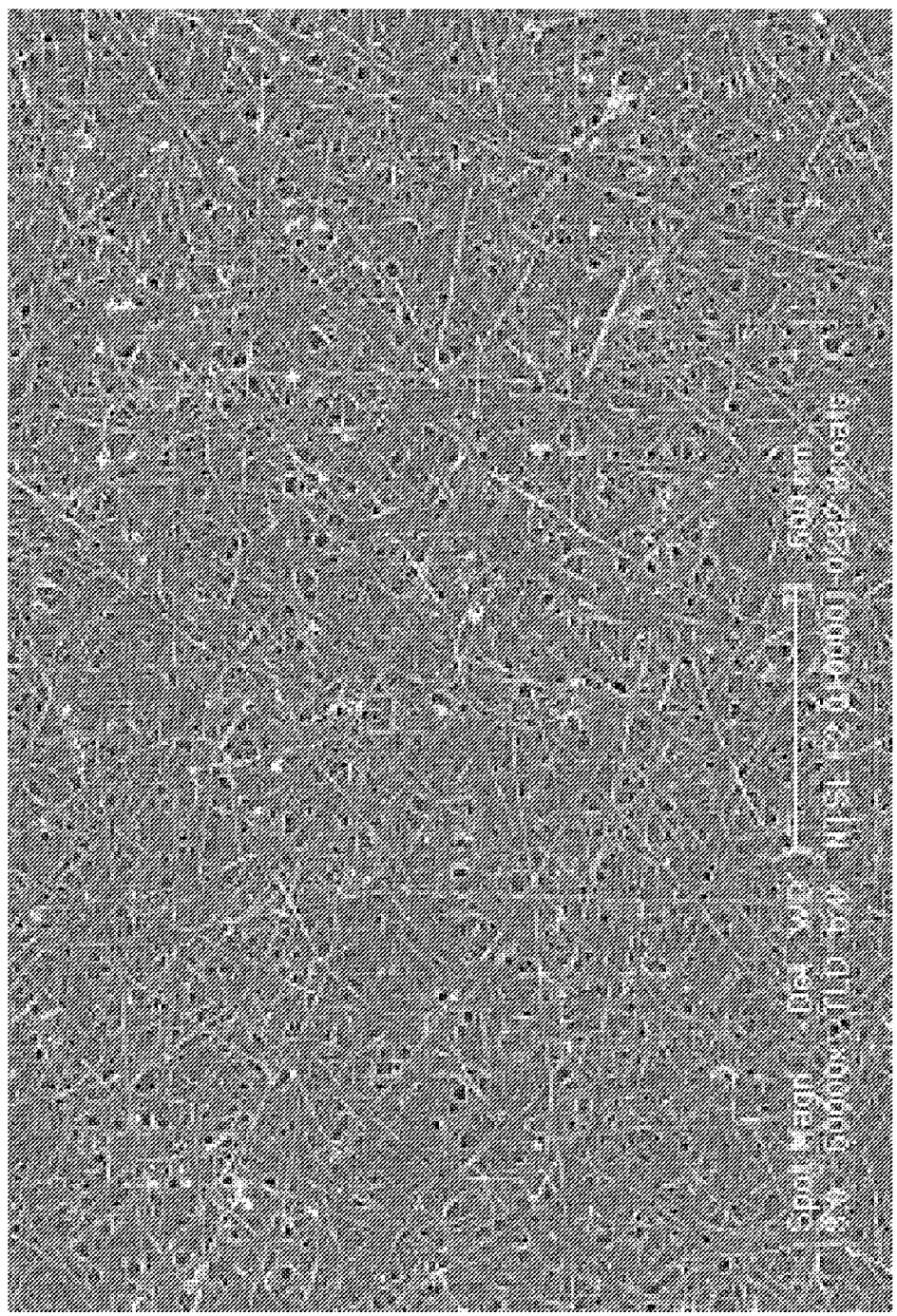
FIG. 10C illustrates a scanning electron microscope (SEM) image of an unordered nanotube fabric.

An unordered carbon nanotube fabric layer deposited on a substrate element, as shown by SEM image 1080 in FIG. 10C, has a plurality of CNTs oriented in a plurality of directions with respect to each other. The unordered CNT fabric layer contains gaps and voids between the CNTs throughout the unordered CNT fabric layer. Consequently, the unordered CNT fabric layer might be considered to have a low density of CNTs with a relatively low number of CNTs per unit of cross-sectional area. An ordered CNT fabric layer formed on a substrate element, as shown by SEM image 1085 in FIG. 10D, has a plurality of CNTs oriented in a substantially parallel direction with respect to each other and a substantially uniform arrangement along the direction of an applied force. The ordered CNT fabric layer contains adjacent CNTs grouped together along their sidewalls, reducing or substantially eliminating gaps and voids between CNTs throughout the ordered CNT fabric layer. Consequently, the ordered CNT fabric layer might be considered to have a high density of CNTs with a relatively high number of CNTs per unit of cross-sectional area. In the NT fabric examples illustrated in FIGS. 10C and 10D, some metallic CNTs may be present in addition to the semiconducting CNTs.

An unordered CNT fabric layer deposited on a substrate element can be rendered into an ordered CNT fabric layer through the use of an applied force. The applied force includes, but is not limited to, a directional mechanical force such as a rolling, rubbing, or polishing force applied to the deposited unordered CNT fabric layer linearly, in an arc, or rotationally. In some applications, unordered CNT fabric layers deposited individually on a substrate element will compress into each other under the applied force and reduce the thickness of an ordered CNT fabric layer as a result. The rendering of an unordered CNT fabric layer into an ordered CNT fabric layer through the use of an applied force reduces or substantially eliminates gaps and voids between CNTs throughout the ordered CNT fabric layer and also orients the CNTs in a substantially parallel direction with respect to each other. The rendering of an unordered CNT fabric layer deposited on a substrate element into an ordered CNT fabric layer through the use of an applied force is described in more detail in U.S. patent application Ser. No. 13/076,152 incorporated herein by reference in its entirety.

Figure 10D:
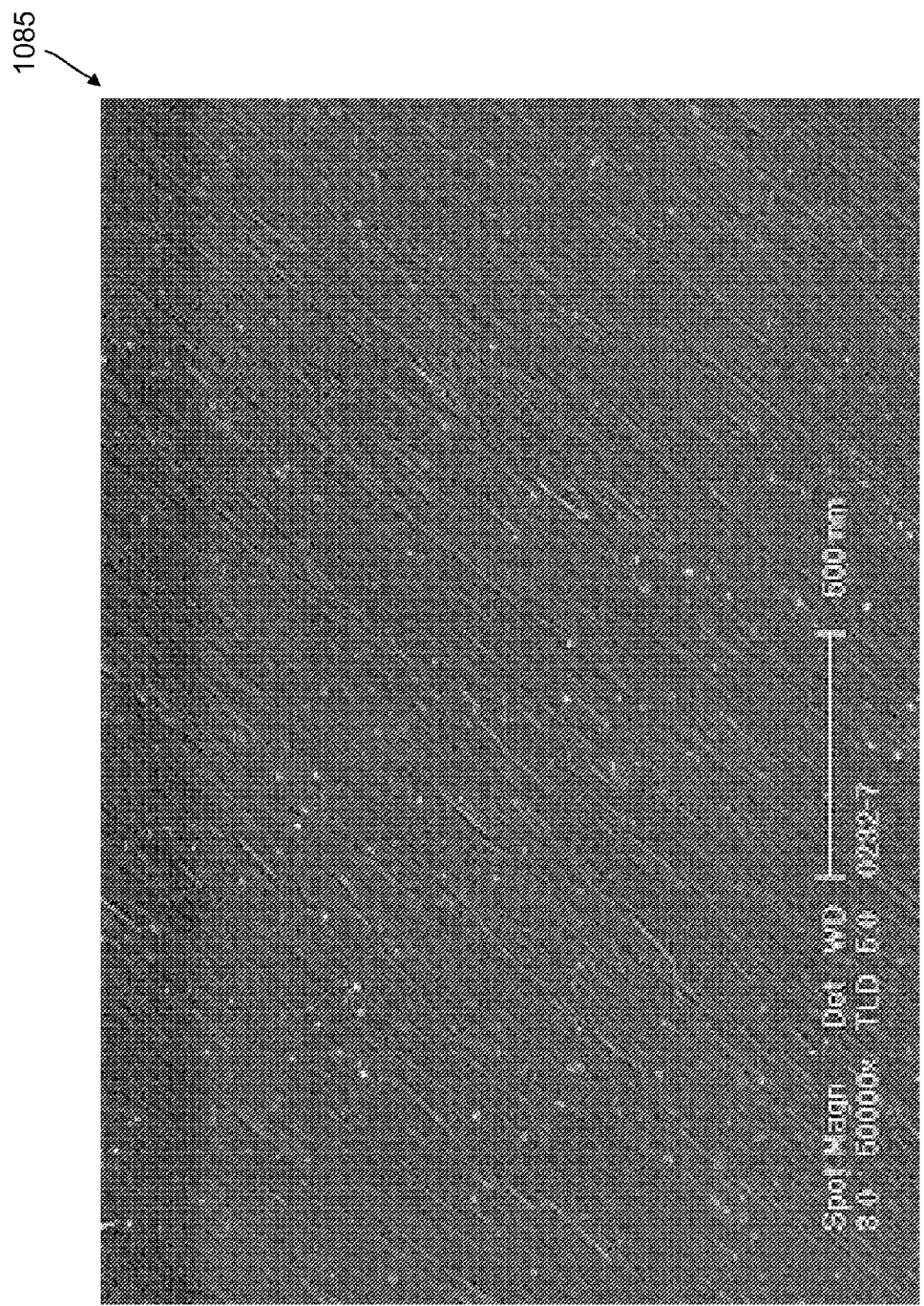
FIG. 10D illustrates a scanning electron microscope (SEM) image of an ordered nanotube fabric.

The changes made to a CNT fabric layer when rendering the CNT fabric layer from an unordered CNT layer into an ordered CNT layer can change how the current passes though the CNT fabric layer on a microscopic level. The CNTFET design methodology when using a CNT fabric with substantially parallel CNTs such as illustrated in FIG. 10D, and referred to as an ordered CNT fabric, is different than the design approach described for CNT fabrics with unordered CNTs illustrated in FIG. 10C, and referred to as an unordered CNT fabric. CNTFET device and corresponding CNTFET diode design methods for ordered CNT fabrics, with oriented, substantially parallel CNTs, are described in detail further below with respect to FIGS. 41-63.

Depending on their physical structure, individual carbon nanotubes can be highly conductive or semiconducting. The conductivity of an individual carbon nanotube is determined by the orientation of the hexagonal rings around the wall of the nanotube. This orientation is referred to as the chirality (or twist) of the carbon nanotube by those skilled in the art and can be quantified as the angle between the hexagonal pattern of the individual carbon rings making up the wall of the CNT and the axis of the CNT itself. Within a typical distribution of fabricated carbon nanotubes, for example, roughly one third will be conducting (often simply referred to as metallic nanotubes) and two thirds will be semiconducting. In the case of semiconducting nanotubes the chirality of the CNTs is responsible for the mobility of holes and/or electrons.

Further, as the need for semiconducting carbon nanotubes increases, additional techniques are being developed within the industry to manufacture supplies of semiconducting only carbon nanotubes. Such techniques include methods to sort metallic carbon nanotubes from semiconducting nanotubes, as well as methods for fabricating carbon nanotubes such that the percentage of metallic nanotubes produced is much smaller than the percentage of semiconducting nanotubes produced. As these techniques continue to develop, supplies of semiconducting only carbon nanotubes are expected to become more readily available. Current separation techniques of metallic SWNTs and MWNTs impurities from s-SWNT result in s-SWNT concentrations in the range of greater than 80%, but less than 100%, with some metallic CNTs remaining Examples of separation techniques in use are metallic burnoff, dielectrophoresis (e.g., AC dielectrophoresis and agarose gel electrophoresis), amine extraction, polymer wrapping, selective oxidation, CNT functionalization, and density-gradient ultracentrifugation.

In some applications it is desirable to form a layer of carbon nanotube elements that includes substantially only semiconducting carbon nanotubes. For example, U.S. Pat. No. 7,598, 544 to Bertin et al. and U.S. Published Patent. Application No. 2006/0183278 to Bertin et al., teach the construction of a CNTFET device which includes a layer of semiconducting carbon nanotubes as the channel element. U.S. Patent Application 2006/0183278 and U.S. Pat. No. 7,598,544 teach a method of "burning off", that is burn-off post processing, the metallic nanotubes within a deposited nanotube layer during the fabrication of a FET device. A carbon nanotube layer is deposited over a substrate and may optionally be thermally isolated from the underlying substrate (in at least one embodiment, by forming a gap within the substrate beneath the CNT layer) to enhance the burn-off post processing effect. An electrical current is then passed through the CNT layer. Current flows through the metallic CNTs since they are much lower resistance than semiconducting CNTs, and the metallic nanotubes within the CNT layer are burnt off, leaving behind a CNT layer comprised of substantially only semiconducting CNTs.

Typically, semiconducting carbon nanotubes are formed as p-type semiconducting elements. However semiconducting carbon nanotubes can be converted to n-type semiconducting elements through a plurality of methods well known to those skilled in the art. These include, but are not limited to, high temperature thermal anneal processes, and doping a layer of p-type carbon nanotubes with other materials such as nitrogen or potassium, for example. Various synthesis technologies for producing CNTs themselves in significant quantities include arc discharge, laser ablation, high pressure carbon monoxide (HiPCO), Chemical Vapor Deposition (CVD) including Plasma Enhanced CVD (PECVD), and controlled flame synthesized SWNTs (e.g., Nano-C) as known to those skilled in the art.

One of the objects of this disclosure is to provide design equations to assist with selecting design parameters for CNTFET devices, physical dimensions of CNTFET device structures for example, used in the formation CNTFET devices for use as CNT ESD protect circuits. Therefore, some preliminary concepts in that regard are now described. FIG. 11A (similar to FIG. 10B) illustrates a close-up top view of a CNT fabric in a channel region of a CNTFET 1100 with the gate conductor not shown and the gate insulator not shown to provide an unobstructed view of the channel region. Individual CNT spacings are much greater than CNT diameters such that the electrical field associated with a CNT is not significantly influenced by the presence of other CNTs. The channel region 1072 has the dimensions W×L with the source contact 1102 and the drain contact 1104 shown above the CNT fabric that forms source and drain regions 1064 and 1066, respectively. FIG. 11B shows a cross section of a gate region 1150 of a CNTFET having a gate conductor 1152 and a representative carbon nanotube 1154. A gate insulator is not shown, but the gate insulator would typically be present between the gate conductor 1152 and the carbon nanotube 1154 that forms part of CNT fabric 1052.

The carbon nanotube 1154 has a diameter $d_{NT}$, a radius $R_{NT}=d_{NT}/2$, and a separation distance from the top of carbon nanotube to the gate conductor of $t_G$. FIG. 11B further shows the gate conductor 1152 held at a negative voltage with respect to carbon nanotube 1154 to induce an electrical field illustrated by electric field lines E from the CNT 1154 and terminating on the gate conductor 1152. A reversal of voltage polarity would reverse the direction of the corresponding electric field. For relatively low density CNT fabrics, spacing between individual CNTs in the CNT fabric are generally much greater than CNT diameters such that the electrical field associated with one CNT is not significantly influenced by the presence of other CNTs. In this example, the CNTs occupy less than 10% of the CNT fabric layer, with voids in excess of 90%. The CNT spacing is at least 10× the nanotube diameter; typically NT diameters are in the 1-3 nm range. The total electric field induced at any given point is the sum of the electric field contributions at that point of an effective number of CNTs that electrically couple to the CNTFET gate conductor.

The gate region of a CNTFET is constructed from a gate conductor, an insulating layer of dielectric material, and a channel region of semiconducting CNT fabric. In comparison, the gate region of a conventional MOSFET is constructed from a gate conductor, an insulating layer of dielectric material, and a channel region of semiconducting material. The gate conductor and the channel region of semiconducting material in the MOSFET are smooth surfaces allowing uniform distribution of charge. Therefore, the gate region of a MOSFET can be modeled by a parallel-plate capacitor with a capacitance per unit area determined by $C=\epsilon_R \cdot \epsilon_0/d$, ignoring minimal fringing electric fields; where $\epsilon_R$ is the relative dielectric constant of the insulating layer of dielectric material, $\epsilon_0$ is the permittivity of free space $8.85 \times 10^{-14}$ F/cm, and d is the distance between the gate conductor and the semiconducting material. Those of skill in the art will appreciate that the product $\epsilon_R \cdot \epsilon_0$ is equivalent to the dielectric constant $\epsilon$ for a given material. The distance d is often equivalent to the thickness of the insulating layer of dielectric material. The gate conductor in the CNTFET is a smooth surface allowing uniform distribution of charge, but the CNT fabric cannot be considered a smooth surface allowing a uniform distribution of charge and thus the gate region of a CNTFET cannot be modeled by a parallel-plate capacitor.

For relatively low density CNT fabrics in which CNT spacings are relatively large with minimal or no overlap of electric fields, as illustrated for example in FIGS. 10C, 13B, and 42A, the CNTs in the CNT fabric forming the semiconducting channel and source and drain contact regions of the device can be modeled as individual cylindrical conductors (wires) and the gate conductor as a smooth surface allowing for a uniform distribution of charge as described further below with respect to FIG. 43. Therefore, channel region 1072 illustrated in FIG. 10A of a CNTFET constructed with a low density CNT fabric can be modeled by a single cylindrical conductor above a conducting plane with CNFET capacitance per unit length between the gate and CNT channel region determined by $C=2\pi\epsilon_R\epsilon_0/\ln(1+t_G/R_{NT}+\sqrt{(t_G/R_{NT}+1)^2-1})$ (equation 20.3 further below), with mostly fringing electric fields; where $\epsilon_R$ is the relative dielectric constant of the gate insulator, $\epsilon_0$ is the permittivity of free space $8.85 \times 10^{-14}$ F/cm, $t_G$ (or r) is the distance between the gate conductor and the top of the cylindrical carbon nanotube, and $R_{NT}$ (or R) is the radius of a cylindrical carbon nanotube. For simplified calculations of the capacitance per unit length for a single CNT, $C=2\pi\epsilon_R\epsilon_0/\ln(2t_G/R_{NT})$ (equation 20.4 further below) provides a good approximation of the capacitance per unit length for CNTFETs constructed with a relatively low density CNT fabric. For relatively low density CNT fabric, the total capacitance per unit length between the carbon nanotube fabric and gate conductor may be calculated by multiplying the capacitance per unit length of one CNT by an effective number of CNTs $N_{ENT}$, where $N_{ENT}$ is the effective number of CNTs in a channel region, such as channel region 1072, as described further below with respect to equations 12.2-12.8.

For relatively high density fabrics, such as illustrated in FIGS. 10D and 42B-D, electrical fields overlap between individual CNTs, and affect the gate capacitance-to-CNT channel region for each CNT as a function CNT-to-CNT spacing and other parameters described further below with respect to equations 20.6 and 20.8. So for relatively dense CNT fabrics, the capacitance per unit length of each individual CNT $C_l(m)$ is calculated using equation 20.6, and the total capacitance per unit length $C_{l-TOT}(N)$ for N CNTs, is calculated as the sum of the capacitance per unit length $C_l(m)$ corresponding each CNT m from m=1 to m=N using equation 20.8. For relatively high density fabrics, approximations such as described with respect to equations 20.3 and 20.4 may not be used.

The current-voltage equations for a CNTFET as a function of CNT fabric characteristics, geometries, and insulator materials are derived further below. These current-voltage equations are used to calculate the physical dimensions, layouts, and electrical characteristics of the CNTFET devices used in CNT ESD protect circuits as described further below. These current-voltage equations may also be used to calculate physical dimensions, layouts, and electrical characteristics for CNTFET devices used for protected circuits such as NOR, NAND, and other logic circuits, and for analog circuits as well. For relatively low density, unordered CNT fabrics, US Patent Application Publication No. US 2006/0183278 and U.S. Pat. No. 7,598,544 issued on Oct. 6, 2009 describe CNTFET devices with various geometries, layouts, structures, and material properties, with corresponding measured electrical characteristics, that may be used to calculate various CNTFET device properties shown further below with respect to equations 12.1-12.10 and 11.1-11.3.

For relatively high density, ordered CNT fabrics such as illustrated in FIG. 12D and described further below with respect to FIGS. 41-63, CNTFET devices with various geometries, layouts, structures, material properties, and electrical characteristics are shown with respect to equations 20.1-20.42.

The current-voltage relationships for a CNTFET can be expressed by Eq. 12.10, and may be applied for CNTFET device operation in non-saturated and saturated regions. Introduced in Eq. 12.9 below, is a quantity referred to as the "nanotube fabric constant" (NTFC), which provides a measure of the current carrying ability of a region (section) of CNT fabric as explained further below with equation 12.9.

The concept of a CNT fabric constant, as described with respect to equation 12.9, may be used for relatively low density fabrics. Consider that the planar structure of silicon FETs (MOSFETs) has a gate forming and unforming a channel in a semiconductor substrate between source and drain regions. These source and drain regions have very low Ohmic contact resistances, milli-Ohms for example, and are formed by conductors in contact with the heavily doped semiconductor regions in a semiconductor substrate such that drain-to-source voltages appear almost entirely across the FET channel region. CNTFET devices are formed on CNT fabric on an insulating substrate that replaces a semiconductor substrate and whose electrical characteristics cannot be calculated using planar FET device equations.

In a CNTFET device, the CNT fabric is formed with multiple CNTs of approximately cylindrical structure, and current flows through a network of individual CNTs with a gate that forms and unforms a channel in individual CNTs between source and drain regions formed by corresponding contacts with individual CNTs forming the CNT fabric as illustrated in FIGS. 10 and 11. Conductors may form Schottky barrier diodes corresponding to source and drain regions in series with and on either side of the channel region under the gate. Resistance values associated with Schottky barrier diodes are much higher than low resistance MOSFET contacts and may be in the range of 10% to 50% of the ON resistance value of the channel. These Schottky diodes may be an integral part of the CNTFET electrical characteristics. Therefore, what is needed is a way to quantify CNTFET design equations with CNT fabric as the substrate such that a CNTFET drain-to-source current can be calculated as a function of a nanotube fabric constant that reflects the diameter of individual CNTs, the CNT fabric density, and CNT fabric mobility, in addition to gate insulator dielectric constant, threshold voltage, and applied voltages, and the width and length dimensions of the device.

One approach is to define a "nanotube fabric constant" (NTFC) that reflects the CNT density in terms of an effective number of CNTs $N_{EFF}$ having an effective CNT length of $L_{EFF}$ and an effective CNT fabric mobility $\mu_{FM}$. Such a nanotube fabric constant NTFC may include not just the effects of the channel region, but also the quantum resistance of the CNTs and contact resistances associated with any Schottky diodes in series with the channel region, because the drain-to-source voltage drop appears not only across the channel but also as a voltage drop across the two Schottky diodes in series with the channel region. The channel region of the CNTFET device may be viewed as having a reduced channel region CNT fabric mobility $\mu_{FM}$ that reflects additional series resistance drops included as part of the nanotube fabric constant (NTFC). The $NTFC_P$ for p-type CNTFET devices is not the same as the $NTFC_N$ for n-type CNTFET devices because of different hole and electron mobilities.

The current equation for a CNTFET device may be calculated from first principles of field effect transistors as described further below with respect to FIG. 12 and is reflected in equation 12.10 with nanotube fabric constant NTFC defined in Equation 12.13. When designing a circuit function such as CNT ESD protect circuits using CNTFET devices, it is desirable to define a NTFC in terms of a constant value per square of NT fabric. This nanotube fabric constant, NTFC, may be viewed as a constant reflecting the ability of a CNT fabric of a certain density to carry a certain current. The current flow of a CNTFET device may then be scaled based on the dimensions chosen by multiplying the NTFC by W/L. So for example, for a fixed value of channel length L, if the width W is doubled, the current carrying capability of the CNTFET device is doubled; if W is four times as wide, the current carrying capability of the CNTFET device is four times as much; and so on. Also, for the same values of W and L, if the CNT fabric density is increased by a factor of 2, the NTFC is increased by a factor of 2 and the current carrying capability of a corresponding CNTFET device is doubled for the same device dimensions. In other words the current density per unit width of the device has increased by a factor of 2. Having defined a NTFC, the value of the NTFC may be measured for a device of known dimensions with known currents flowing when known voltages are applied as illustrated in equations 12.13 and 12.14 for a pCNTFET for example. Also, the relative values of nanotube fabric constants for both n and p-type CNTFET may be measured using an ambipolar CNTFET (aCNTFET) such that both p and n-modes of aCNTFET device operation use the same NT fabric and device dimensions, materials, and other factors, and the ratio of $NTFC_N$ to $NTFC_P$ within the same fabric may be determined more accurately as described further below with respect to FIG. 18. With p-type CNTFET device nanotube fabric constant $NTFC_P$ and n-type CNTFET device nanotube fabric constant $NTFC_N$ known for a given fabric, current equations may be used to design various CNTFET-based CNT ESD protect circuits using pCNTFET, nCNTFET, and aCNTFET devices by calculating device widths and lengths based on nanotube fabric constants, dielectric constants, threshold voltages, and applied voltages as described further below. CNT ESD protect circuits designed using pCNTFET and nCNTFET diodes are illustrated further above in FIGS. 2-5, and CNT ESD protect circuits using aCNTFET diodes are described further below with respect to FIGS. 19-34. Values of $NTFC_N$ and $NTFC_P$ are calculated further below with respect to electrical characteristic 1800 in FIG. 18 using equations 12.22, 12.23, and 12.24. The nanotube fabric constant NTFC quantifies the electrical properties of the CNT fabric that replaces semiconductor substrates, the relative dielectric constant of the gate insulator $\in_R$, the permittivity of free space $\in_0=8.85\times10^{-14}$ F/cm, the distance between the gate conductor and the CNT fabric $t_G$, and the radius of a cylindrical nanotube $R_{NT}$ are used to calculate current-voltage relationships for a CNTFET devices used to form CNTFET diodes. CNTFET device geometric parameter values of width and length are selected to achieve desired current-voltage characteristic. In particular, W/L, and W and L individually, are parameters that a circuit designer selects based on desired voltage and current characteristics. In other words, for given desired voltage and current characteristics, we seek equations that will provide W/L, such that W and L (dimensional characteristics of CNTFETs) can then be suitably determined and/or adjusted to provide the desired dimensional layout and operational characteristics. In the case of CNTFET-based NT protective devices, the values of W and L for various nCNTFET, pCNTFET, or aCNTFET diodes used to prevent ESD surge current 150 illustrated in prior art FIG. 1B from inducing (causing) a corresponding ESD voltage surge that may damage protected electrical circuits. Values of W and L required to limit ESD voltage surges to maximum voltage level are calculated further below using design equations 12.18-12.21, 15.1-15.12, 23.1-23.9, and 31.1-31.9.

With those preliminary comments in mind, equations for CNTFETs that relate current and voltage with W and L are as follows. These equations are used further below to derive design equations appropriate for p-type CNTFET devices, design equations appropriate for n-type CNTFET devices, and ambipolar-type CNTFET devices.

Design equations describing exemplary CNTFET device electrical characteristics as a function of the nanotube fabric constant, device geometry, insulator dielectric constant, and electrical characteristics such as threshold voltage are derived and described further below.

Figure 12:
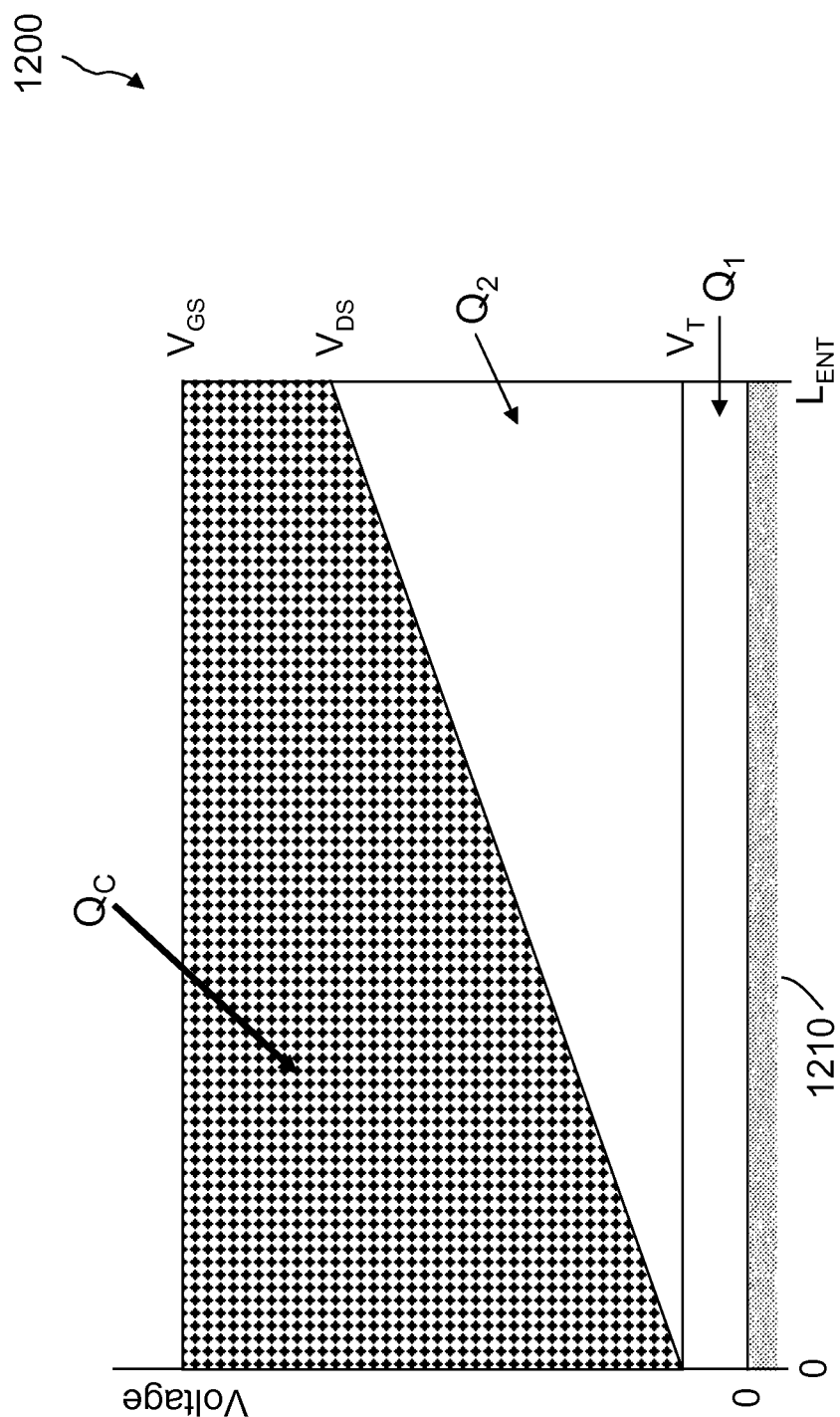
FIG. 12 illustrates a voltage-charge characteristic as a function of channel region position used to calculate mobile charge in a carbon nanotube fabric when a gate voltage forms a conductive channel in the carbon nanotube fabric.

CNTFET Device Geometries, Layouts, Structures, and Corresponding Electrical Characteristics for CNTFET Devices Formed with Relatively Low Density Fabrics FIG. 12 shows voltage-charge characteristic 1200 with charge-in-transit $Q_C$ induced in a CNT fabric 1210 in a channel region of an nCNTFET having a source terminal connected to ground and a drain terminal connected to a voltage source. The charge induced between the gate conductor and the CNT fabric is calculated using $Q=N_{ENT} \cdot C \cdot V$, where $N_{ENT}$ is the number of CNTs in the channel region, C is the calculation of the capacitance per unit length for CNTFETs constructed with a low density CNT fabric, and V is the voltage difference between the CNT fabric and the gate conductor. The amount of charge induced in the CNT fabric decreases from the source terminal to the drain terminal because the voltage difference between the gate conductor and the CNT fabric decreases from the source terminal to the drain terminal. The voltage drop from the CNT fabric near the source terminal to the CNT fabric near the drain terminal is modeled by a linear approximation for relatively long channels. The charge-in-transit $Q_C$ induced in the CNT fabric is approximated by subtracting $Q_1$ and $Q_2$ from $Q_T$ as shown in Eq. 12.1, where $Q_1$ is induced charge lost due to the threshold voltage $V_T$, and $V_T$ is determined by the insulating layer thickness and the materials used to construct a CNTFET as shown in Eq. 12.2, $Q_2$ is induced charge lost due to the voltage drop across the CNT fabric as shown in Eq. 12.3, and $Q_T$ is the total induced charge without any voltage drop and a threshold voltage of zero Eq. 12.4. The calculation for charge-in-transit $Q_C$ induced in the CNT fabric can be simplified to Eq. 12.5 considering the following:

$$Q_C = Q_T - Q_1 - Q_2, \quad [\text{EQ 12.1}]$$

$$Q_1 = N_{ENT} \cdot (2\pi \in_R \in_0 L_{ENT}/\ln(2t_G/R_{NT})) \cdot V_T, \quad [\text{EQ 12.2}]$$

$$Q_2 = N_{ENT} \cdot (2\pi \in_R \in_0 L_{ENT}/\ln(2t_G/R_{NT})) \cdot V_{DS}/2, \quad [\text{EQ 12.3}]$$

$$Q_T = N_{ENT} \cdot (2\pi \in_R \in_0 L_{ENT}/\ln(2t_G/R_{NT})) \cdot V_{GS}, \quad [\text{EQ 12.4}]$$

$$Q_C = N_{ENT} \cdot (2\pi \in_R \in_0 L_{ENT}/\ln(2t_G/R_{NT})) \cdot [V_{GS} - V_T - V_{DS}/2]. \quad [\text{EQ 12.5}]$$

The current $I_{DS}$ flowing through the nCNTFET that causes the voltage drop between drain and source can then be calculated based on the charge-in-transit $Q_C$ between the drain and source for the nCNTFET divided by a transit time τ for charges flowing between the drain and source. The transit time τ is calculated as shown in Eq. 12.6, where $L_{ENT}$ is the effective CNT length, μ is a CNT fabric mobility constant, and $V_{DS}$ is the voltage between the drain and the source. The current $I_{DS}$ may then be calculated as the ratio of $Q_C$ to τ as illustrated by Eq. 12.7 and Eq. 12.8. The charge in transit $Q_C$ is a function of the CNTFET device geometry and the applied voltage. The voltage drop between drain and source is assumed to be linear (negligible short channel effects for example). The charge-in-transit $Q_C$ given by Eq. 12.5 and the transit time τ given by Eq. 12.6 are for $V_{GS} \geq V_T$ and $V_{DS} < V_{GS} - V_T$:

$$\tau = L_{ENT}^2 / \mu \cdot V_{DS}, \quad [\text{EQ 12.6}]$$

$$I_{DS} = Q_C / \tau, \text{ and} \quad [\text{EQ 12.7}]$$

$$I_{DS} = [(N_{ENT} \cdot \mu / L_{ENT}) \cdot (2\pi \in_R \in_0 / \ln(2t_G/R_{NT}))] \cdot [(V_{GS} - V_T) V_{DS} - V_{DS}^2/2]. \quad [\text{EQ 12.8}]$$

For $V_{DS}$ greater than $V_{GS} - V_T$, $I_{DS}$ remains the same as for $I_{DS}$ at $V_{DS} = V_{GS} - V_T$.

A nanotube fabric constant NTFC could be calculated per square of CNT fabric from Eq. 12.9 illustrated further below, where $N_{ENT}$ is an effective number of CNTs in the channel region, $\mu_{FM}$ is the fabric mobility constant, $L_{ENT}$ is the effective CNT length, W is the width of the channel region as depicted in FIG. 10A, and L is the length of the channel region as depicted in FIG. 10A. However, CNT fabric mobility $\mu_{FM}$ is not known, for example, so the nanotube fabric constant NTFC is calculated from pCNTFET current voltage characteristics 1390 measured on fabricated pCNTFET 1360 illustrated in FIG. 13 described further below. The current $I_{DS}$ in Equation 12.8 can then be rewritten in terms of the nanotube fabric constant NTFC and the CNTFET channel length L and width W dimensions as illustrated by Eq. 12.10. The current $I_{DSp}$ for pCNTFET devices is given by Eq. 12.11 and the current $I_{DSn}$ for nCNTFET devices is given by Eq. 12.12. For calculations further below, $t_G$ and $R_{NT}$ can be taken as the same for p-type and n-type CNTFET devices and $|V_{TP}| = V_{TN}$. Thus:

$$N_{ENT} \mu_{FM}/L_{ENT} = (W/L) \cdot \text{NTFC, and} \quad [\text{EQ 12.9}]$$

$$I_{DS} = [(W/L) \cdot \text{NTFC} \cdot (2\pi \in_R \in_0 / \ln(2t_G/R_{NT}))] \cdot [(V_{GS} - V_T) V_{DS} - V_{DS}^2/2]. \quad [\text{EQ 12.10}]$$

For a pCNTFET Device:

$$I_{DSp} = [(W_P/L_P) \cdot \text{NTFC}_P \cdot (2\pi \in_R \in_0 / \ln(2t_G/R_{NT}))] \cdot [(V_{GS} - V_{TP}) V_{DS} - V_{DS}^2/2]. \quad [\text{EQ 12.11}]$$

For an nCNTFET Device:

$$I_{DSn} = [(W_N/L_N) \cdot \text{NTFC}_N \cdot (2\pi \in_R \in_0 / \ln(2t_G/R_{NT}))] \cdot [(V_{GS} - V_{TN}) V_{DS} - V_{DS}^2/2]. \quad [\text{EQ 12.12}]$$

Figure 13A:
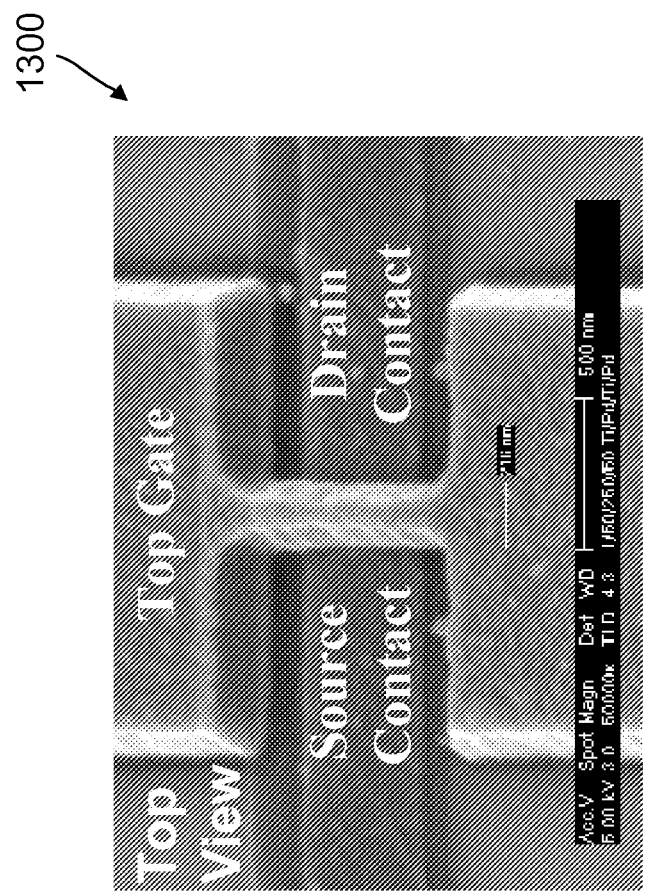
FIG. 13A-C illustrates top view, breakaway view, and side view of a fabricated CNTFET device.
Figure 13B:
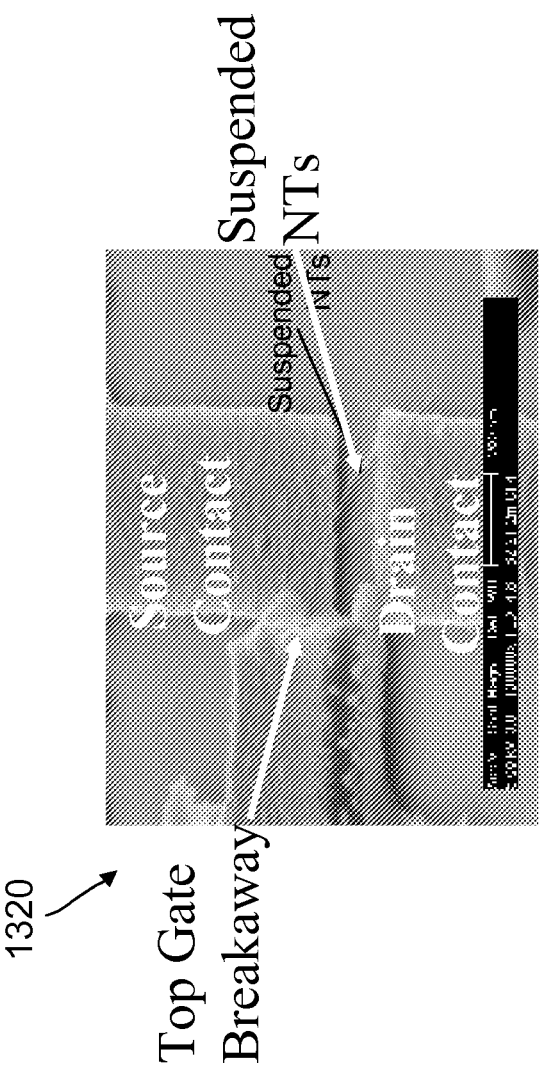
Figure 13C:
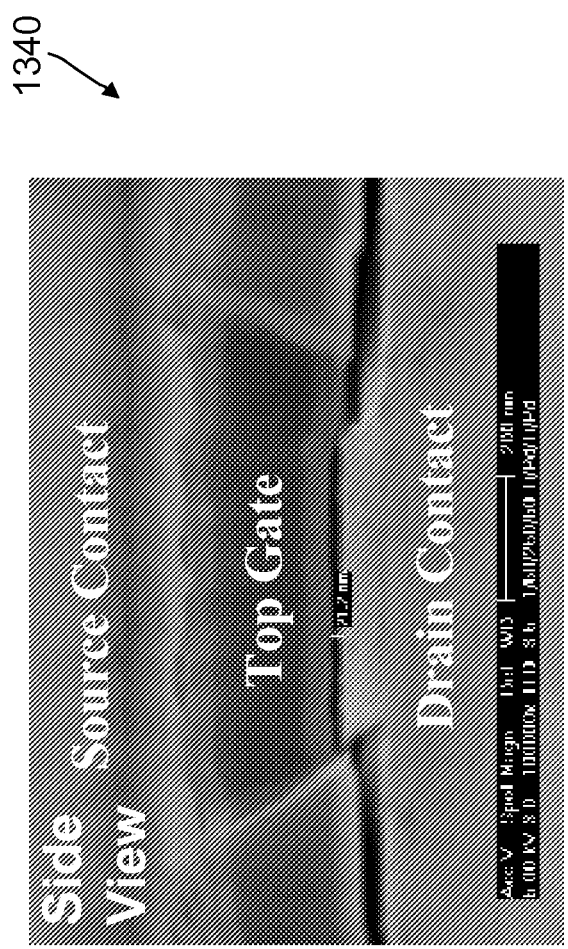
Figure 13D:
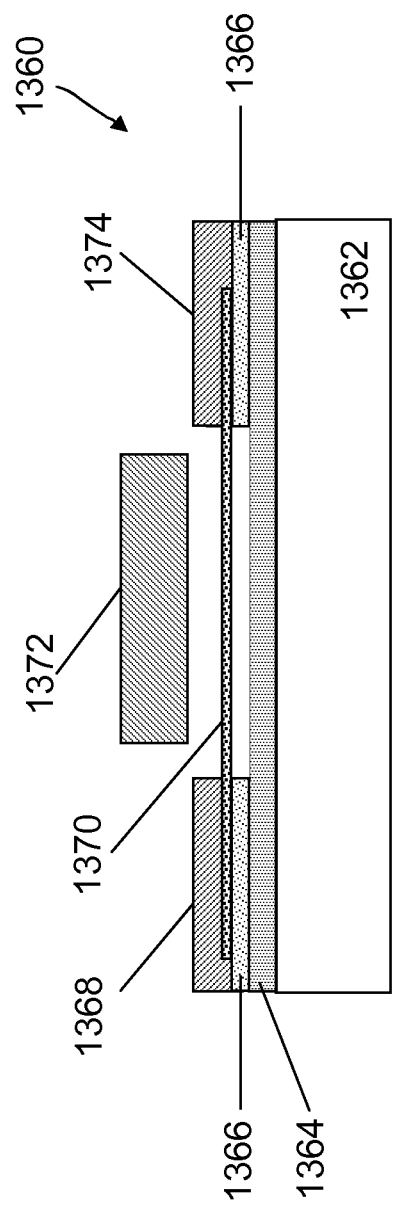
FIG. 13D illustrates a cross sectional representation of the CNTFET device shown in FIG. 13A-C.

FIGS. 13A-13C illustrate a top view of a pCNTFET device 1300, a top gate breakaway view of a pCNTFET device 1320, and side view of a pCNTFET device 1340. FIG. 13D illustrates a cross section of a pCNTFET 1360 constructed on a silicon substrate 1362. The pCNTFET has an insulating layer 1364 deposited on the silicon substrate 1362, an insulator 1366 deposited on the insulating layer 1364, a source conductor 1368, a suspended CNT fabric 1370, a gate conductor 1372, and a drain conductor 1374. A gate insulator between the gate conductor 1372 and the suspended CNT fabric 1370 is not shown; however the relative dielectric constant of the gate insulator is $\in_R = 1$. The channel region of the pCNTFET has a length of 200 nm, a width of 400 nm, and the distance between the gate conductor and the suspended CNT fabric is 20 nm. The electrical characteristics of the pCNTFET 1360 device and the materials used for construction are described in greater detail in US Patent Application Publication No. US 20060183278 and U.S. Pat. No. 7,598,544. Further, US Patent Application Publication No. US 20060183278 and U.S. Pat. No. 7,598,544 illustrate the possible use of a back gate in addition to a top gate. The use of a back gate is compatible with the disclosed CNT ESD protect circuits; however no back gate is required or assumed.

Figure 13E:
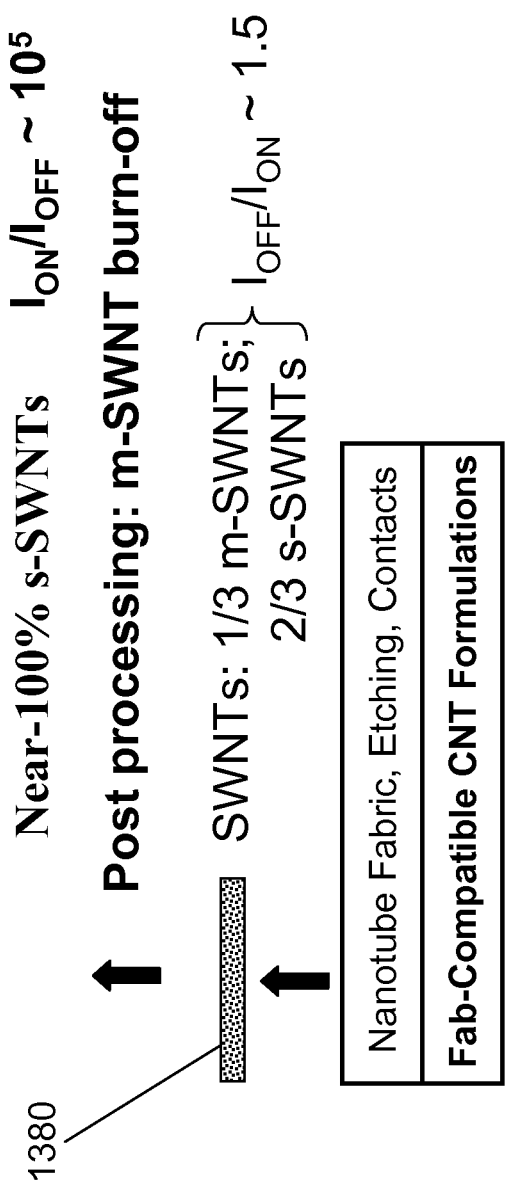
FIG. 13E illustrates some key processing steps in fabricating the CNTFET device shown in FIG. 13A-C and enhanced CNTFET device electrical characteristics with burn-off post processing.

FIG. 13E illustrates a flow chart for a method of fabrication for a CNTFET that includes post processing on the CNT fabric 1380 used in construction of the CNTFET. The CNT fabric 1380 as described in detail in US Patent Application Publication No. US 20060183278 may comprise mostly single wall nanotubes (SWNTs) with approximately ⅓ metallic and ⅓ semiconducting nanotubes. Metallic SWNT "burn-off" was used as a post processing method to eliminate metallic nanotubes in the CNT fabric; however chemical post processing may be used on the CNT fabric as described in U.S. application Ser. No. 12/536,736 to eliminate metallic nanotubes. If a source of near-100% mostly semiconducting SWNTs is available, then near-100% semiconducting SWNT fabric may be deposited that does not require post processing. The CNTFET prior to metallic SWNT burn-off has a measured $I_{ON}/I_{OFF}$ ratio of 1.5 due to the metallic SWNTs creating a conducting path between the source and drain terminals regardless of the state of the CNTFET. However, once metallic SWNT burn-off post processing is complete the semiconducting SWNTs remain to create a conducting path between the source and drain terminals depending on the state of the CNTFET and the CNTNET has a measured $I_{ON}/I_{OFF}$ ratio of $10^5$. Metallic SWNT burn-off is described further above.

Figure 13F:
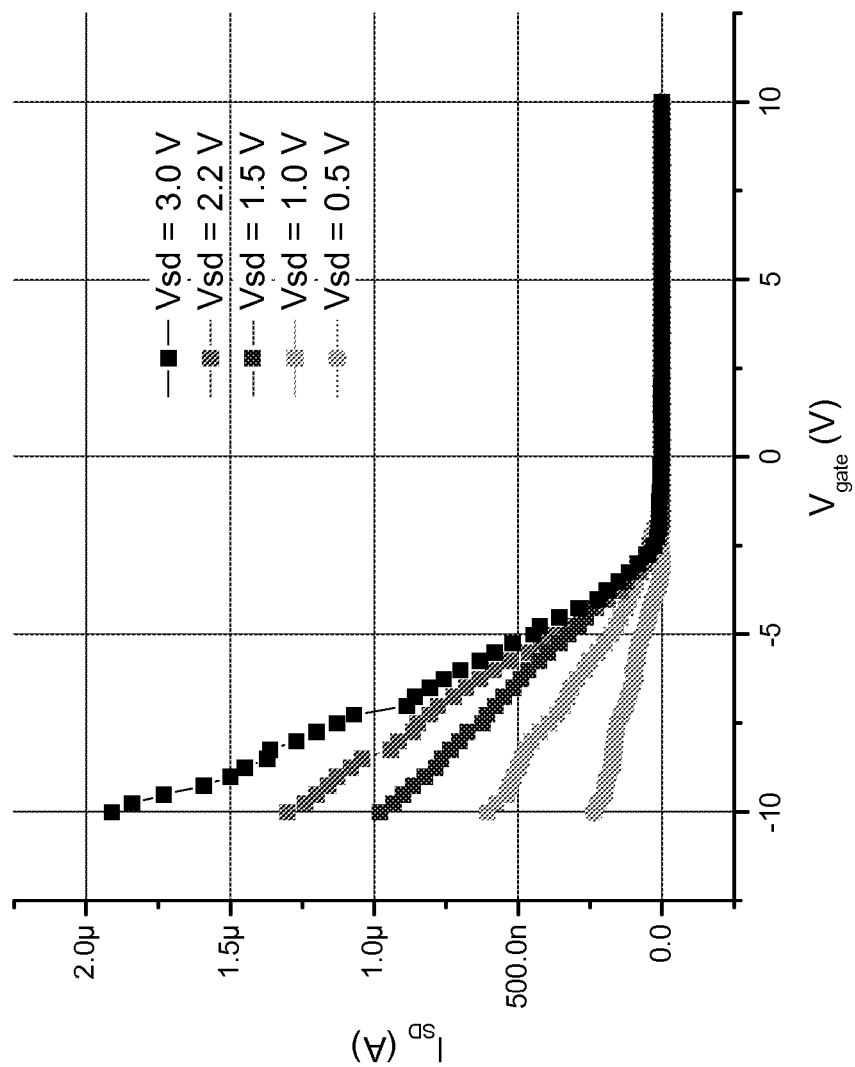
FIG. 13F illustrates a pCNTFET electrical characteristic measured on fabricated CNTFET devices shown in FIG. 13A-D.

After the metallic SWNT burn-off post processing is complete, pCNTFET devices remain as illustrated by pCNTFET current voltage characteristics 1390 shown in FIG. 13F and also in Bertin et al. U.S. Pat. No. 7,598,544. The pCNTFET current voltage characteristics 1390 shows that with gate to source voltage equal to zero, the corresponding pCNTFET device is OFF and begins to turn on at a threshold voltage of approximately −2.5 volts. That is, the corresponding pCNTFET device begins to turn ON when the gate voltage is 2.5 volts below the source voltage. The pCNTFET devices may be left as pCNTFETs, or may be converted to ambipolar CNTFETs and/or to nCNTFETs by applying heat to the entire assembly or by selectively passing elevated currents for extended periods through the semiconducting channel region of pCNTFET devices as described in U.S. Pat. No. 7,598,544. Such an ambipolar CNTFET can be used to measure voltages and currents used to calculate both $NTFC_N$ and $NTFC_P$ as described further below with respect to FIG. 18. Device dimensions and materials used are identical for both n-type and p-type modes of operation of the aCNTFET device, which eliminates these variables when calculating and comparing $NTFC_N$ and $NTFC_P$ values. Alternatively, chemical processes such as ion implantation followed by annealing may be used instead to convert pCNTFETs to ambipolar CNTFETs and/or to nCNTFETs as described in U.S. application SER. No. 12/536,736.

The calculation of $NTFC_p$ for the pCNTFET device illustrated in FIG. 13D is based on the measured pCNTFET device electrical characteristics, the device geometry, and the known permittivity of free space $\in_0 = 8.85 \times 10^{-14}$ F/cm. The nanotube fabric constant $NTFC_p$ may be calculated using Eq. 12.13. $NTFC_P$ is calculated as $4 \times 10^5$ cm/V·s (Eq. 12.14) for the CNT fabric described for pCNTFET devices illustrated in U.S. Pat. No. 7,598,544. Since measured device characteristics include contact resistance values in both source and drain regions, the values of $NTFC_P$ and $NTFC_N$ include the effects of series resistance voltage drops. The ratio of $NTFC_N/NTFC_P=2$ as described further below with respect to equation EQ 12.25; therefore $NTFC_N=8 \times 10^5$ (Eq. 12.15). Current equations for pCNTFET and nCNTFET devices are shown by Eqs. 12.14 and 12.15, respectively.

Results of measurements for an exemplary pCNTFET with suspended carbon nanotubes are as follows:
$L_{ENT}=0.2$ um ($200 \times 10^{-7}$ cm); $I_{DS}=1$ μA;
$W=0.4$ um; $V_T=2.5$ V;
$T_G=20$ nm; $V_{GS}=10$ V;
$F_{NT}=1$ nm; $V_{DS}=1.5$ V;
$E_R=1$.

Thus, $$NTFC_P=(L_P/W_P)\cdot I_{DS}/[(2\pi\in_R\in_0/\ln(2t_G/R_{NT}))\cdot((V_{GS}\oplus V_{TP}|)V_{DS}-V^2_{DS}/2)],\quad [EQ\ 12.13]$$

$$NTFC_P=(0.2/0.4)\cdot 1\times 10^6/[(2\pi\cdot 1\cdot\in_0/\ln(2\times 20/0.5))\cdot((10-2.5)1.5-(1.5)^2/2)],\text{ and}$$

$$NTFC_P=4\times 10^5\text{ cm/V}\cdot s,\quad [EQ.12.14]$$

as measured for an exemplary device such as disclosed in U.S. Pat. No. 7,598,544.

Using the measured ratio $NTFC_N/NTFC_P=2$ described further below with respect to FIG. 18, the value for n-type fabric constant $NTFC_N$ is obtained as follows:

$$NTFC_N=2\cdot 4\times 10^5\text{ cm/V}\cdot s,$$

$$NTFC_N=8\times 10^5\text{ cm/V}\cdot s.\quad [EQ\ 12.15]$$

Substituting for $NTFC_P$ and $\in_0$ in current Eq. 12.11 for a pCNTFET device, $I_{DSp}$ is given by:

$$I_{DSp}=[(W_P/L_P)\cdot 4\times 10^5\cdot(2\pi\in_R 8.85\times 10^{-14}/\ln(2t_G/R_{NT}))]\cdot[(V_{GS}-|V_{TP}|)V_{DS}-V^2_{DS}/2],$$

and $$I_{DSp}=[(W_P/L_P)\cdot 0.45\cdot\in_R/\ln(t_G/d_{NT}))]\cdot[(V_{GS}-|V_{TP}|)V_{DS}-V^2_{DS}/2]\mu A.\quad [EQ\ 12.16]$$

Substituting for $NTFC_N$ and $\in_0$ in current Eq. 12.12 for an nCNTFET device, $I_{DSn}$ is given by:

$$I_{DSn}=[(W_N/L_N)\cdot 8\times 10^5\cdot(2\pi\in_R 8.85\times 10^{-14}/\ln(2t_G/R_{NT}))]\cdot[(V_{GS}-V_{TN})V_{DS}-V^2_{DS}/2],$$

and $$I_{DSn}=[(W_N/L_N)\cdot 0.45\cdot\in_R/\ln(2t_G/R_{NT}))]\cdot[(V_{GS}-V_{TN})V_{DS}-V^2_{DS}/2]\mu A.\quad [EQ\ 12.17]$$

In order to calculate the capacitance of CNTFET devices, the effective number of CNTs in the channel region is needed. Burn-off current-voltage measurements results for the burn-off of metallic SWNTs and the remaining number of semiconducting nanotubes can be estimated based on the burn-off current measured on the pCNTFET illustrated in FIG. 13D as described further below, and illustrated in more detail in U.S. Pat. No. 7,598,544.

An estimate of the number of Effective Semiconducting SWNTs (s-SWNTs) can be determined as follows:
$I_{B\text{-}OFF\ CURRENT\ DENSITY/NT} \sim 10^9$ A/cm²; $d_{NT} \sim 1$ nm;
CNT cross section area $\sim\pi(d_{NT}/2)^2=0.785\times 10^{-14}$ cm²;
$I_{B\text{-}OFF/NT} \sim 7.85$ μA;
$I_{B\text{-}OFF} \sim 30\text{-}35$ μA for metallic SWNTs;
Metallic SWNTs~4;
Semiconducting SWNTs~2×# Metallic SWNTs; therefore,
Semiconducting SWNTs after Burn-Off~8.

For the pCNTFET exemplary devices of U.S. Pat. No. 7,598,544, using the effective number of semiconducting nanotubes $N_{ENT}=8$ in a channel region, and using width $W=400$ nm=0.4 um, and an effective length of $L_{ENT}=200$ nm=0.2 um, the capacitance between the CNT fabric channel region and the control gate may be calculated as follows. Referring to FIG. 11, the gate capacitance of one carbon nanotube of diameter $d_{NT}$, separation $t_G$, and dielectric constant $\in_R$, $\in_0$, may be calculated as illustrated by Eq. 11.1. The gate to fabric capacitance $C_{GF}$ is given by Eq. 11.3, where W and L are $W=0.4$ um and $L=L_{ENT}=0.2$ um. Therefore, the pCNTFET device of U.S. Pat. No. 7,598,544 has 8 effective semiconducting SWNTs in $W=400$ nm by $L=200$ nm fabric region.

For CNT fabrics, the electric field can be taken as the sum of the individual CNT fringing fields, while also considering diffusion capacitance. A calculation of capacitance for SWNT of effective CNT length $L_{ENT}$ can be given by $$C_{G-1N}=2\pi \in_R \in_0 L_{ENT}/\ln(2t_G/R_{NT}) \quad [\text{Eq 11.1}]$$

for $t_G > 2 d_{NT}$, where $t_G$=Gate-CNT separation and $d_{NT}$=NT diameter.

For $L_{ENT}$=200 nm and $\in_0$=8.85×10$^{-14}$ F/cm, it can be found that for one CNT:

$$C_{G-1N}=2\pi \in_R 8.85\times 10^{-14}\times 200\times 10^{-7}/\ln(2t_G/R_{NT}), \text{ and}$$

$$C_{G-1N}=11.1\times \in_R/\ln(2t_G/R_{NT})aF \text{ for a CNT of length } L_{ENT}=0.2 \text{ um}.$$

For an effective number of semiconductor nanotubes $N_{ENT}$, $$C_{GF}=N_{ENT}\times 2\pi \in_R 8.85\times 10^{14}\times 200\times 10^{-7}/\ln(2t_G/R_{NT}), \quad [\text{Eq 11.2}]$$

Capacitance for a 0.2 um×0.4 um fabric region of the exemplary device of US Patent Application Publication No. US 20060183278 and U.S. Pat. No. 7,598,544 can be calculated as follows (assuming that there are effectively eight semiconducting CNTs in 0.08 um² NT fabric area), where W & L are in um:

$$C_{GF}=8\times 11.1\times \in_R/\ln(2t_G/R_{NT})aF \text{ for a 0.08 um}^2 NT \text{ fabric region;}$$

$$C_{GF}/\mu m^2=88.8/0.08\times \in_R/\ln(2t_G/R_{NT})aF;$$

$$C_{GF}/\mu m^2=1.1\times \in_R/\ln(2t_G/R_{NT})fF/\mu m^2; \text{ and}$$

$$C_{GF}=W\cdot L[1.1\in_R/\ln(2t_G/R_{NT})]fF. \quad [\text{Eq 11.3}]$$

The capacitance of a protective diode $C_{DIODE}$ is approximately equal to the gate-to-fabric capacitance $C_{GF}$ since CNTFETs have no diffusion capacitance. The protective diode capacitance reduces the worst case surge voltage below calculated values based on the current-voltage equations. However, the protective diode capacitances are added to the total input and output capacitance for input and output circuits, respectively. CNTFET-based protective devices sizes for nCNTFET-based, pCNTFET-based, and aCNTFET-based protective devices are described further below.

Geometries, Layouts, and Structures of pCNTFET and nCNTFET Devices and Corresponding pCNTFET and nCNTFET Diodes for Use by CNT ESD Protect Circuits pCNTFET and nCNTFET device electrical and physical characteristics may be calculated for two devices in series with approximately 3.5 volts across each device. This represents a worst case ESD-driven voltage when HBM 105 is applied between two signal pads as described further above with respect to FIGS. 6, 7, and 9D and ESD currents 625 and 625, corresponding to ESD current 150 in prior art FIG. 1B, flow between the signal pads.

First, the voltage buildup across decoupling capacitor $C_{DEC}$ resulting from ESD current 150 (prior art FIG. 1B) flow from 0 to 10 ns may be calculated by using an approximation $I_{ESD}=0.1\times 10^9$ t Amperes from 0 to t=10×10$^{-9}$ s (10 ns). Schematically, $C_{DEC}$ is positioned between shared $V_{DD}$ bus 240 and GND bus 230 as illustrated in FIG. 2. Corresponding placement of $C_{DEC}$ is described with respect to FIGS. 3-5 and FIGS. 6 and 7. Since Q=CV, then $\in V=\delta Q/C_{DEC}$. The change in charge $\delta Q$ across decoupling capacitor $C_{DEC}$ caused by an ESD discharge may be calculated as follows. $\delta Q=\int I_{ESD} dt$, so $$\delta Q=0.1\times 10^9\times t^2/2 \quad [\text{EQ 2.1}]$$

from 0 to 10×10$^{-9}$ seconds. The voltage across decoupling capacitor $C_{DEC}$ may be calculated using equation 2.2.

$$\delta V=\delta Q/C_{DEC}, \quad [\text{EQ 2.2}]$$

At t=10 ns, the peak ESD current $I_{ESD}$=1 A, corresponding to a flow of charge shown in equation 2.3

$$\delta Q=5\times 10^{-9} \text{ J}=5 \text{ nJ} \quad [\text{EQ 2.3}]$$

The corresponding change in voltage $\delta V$ across decoupling capacitor $C_{DEC}$ may be calculated using equation 2.2 and the charge $\delta Q$ from equation 2.3. For $C_{DEC}$=10,000 pF, $\delta V$=0.5 V; for $C_{DEC}$=20,000 pF, $\delta V$=0.25 V; and for $C_{DEC}$=50,000 pF, $\delta V$=0.1 V. Voltage values across decoupling capacitor $C_{DEC}$ range from 0.1 to 0.5 volts and are small compared with ESD-induced voltage surges of several volts, 3.5 to 7 volts for example, so a value of $C_{DEC}$ from 10,000 to 50,000 pF may be used since $C_{DEC}$ approximates an electrical short for fast rise time ESD current 150 transitions.

Next, the width W of pCNTFET and nCNTFET devices required to limit the maximum voltage to 3.5, for example, is calculated. In this example, the ESD discharge occurs between two signal pads, and flows through a pair of 2-terminal CNTFET-based diodes in series as illustrated in FIGS. 6B and 6C. A technology with a minimum dimension F=0.1 um is assumed. An effective channel length L, corresponding approximately to the separation between source and drain contacts (FIG. 10), is set such that L=F=0.1 um for both p and n-type CNTFET devices. Also, $V_{GS}=V_{DS}$ for CNTFET diodes and widths W may be calculated for various nanotube fabric constant (NTFC) values using current equations Eq. 12.16 and Eq. 12.17. A value of W (Wp or Wn) is calculated such that two-terminal CNTFET-based diodes are of sufficient size to limit the maximum voltage drop caused by the flow of ESD current 150 through the CNTFET-based diodes to approximately 3.5 volts for each of the two devices in series using CNTFET device model 960 illustrated in FIG. 9D and CNTFET design equations Eq. 12.16 and Eq. 12.17.

FIGS. 2-5 illustrate pairs of two-terminal CNTFET-based diodes, referred to as CNTFET diodes, connected to each signal pad. One of the CNTFET diode pairs is also connected to a shared power supply ($V_{DD}$) bus (pad) and the other of the CNTFET diode pairs is also connected to a shared ground (GND) bus (pad). In case of FIG. 2, a pair of p-type CNTFET (pCNTFET) diodes is used; in the case of FIG. 3, a pair of n-type CNTFET (nCNTFET) diodes is used; and in the case of FIGS. 4 and 5 the CNTFET diode pairs include one pCNTFET diode and one nCNTFET diode. FIG. 6A illustrates connections of CNTFET diode pairs on a plan view of a chip, and/or module, and/or card, and/or board substrate. CNTFET diodes may be placed on one level, such as on a chip. However, CNTFET diodes may be placed on more than one packaging level, or on every level of an electronic assembly from chip level to board level. In this example, a pair of nCNTFET diodes is shown; however, any combination of pCNTFET diode and nCNTFET diode pairs may be used as illustrated in FIGS. 2-5. FIGS. 6B and 6C shown current flow directions as a function of applied electrostatic discharge voltage $V_{ESD}$ polarity, illustrating that the protected circuits are protected from both positive and negative electrostatic ($V_{ESD}$) voltage surges.

CNTFET Device-Based CNTFET Diode Dimensions Geometries, Layouts, Structures, and Materials for CNTFET Diodes Formed with Relatively Low Density, Unordered Carbon Nanotube Fabrics:

A first calculation assumes a pair of pCNTFET diodes as illustrated in FIG. 2 or one of the pCNTFET diodes in FIGS. 4 and 5, with human body model HBM 105 illustrated in prior art FIG. 1 applied across two signal pads. A scaled pCNTFET device is assumed at a technology with minimum dimension F=0.1 um, with channel length $L_P$=F=0.1 um, nanotube fabric constant $NTFC_P$=4×10$^5$ cm/V-s for a CNT fabric density similar to exemplary devices illustrated in FIG. 13 corresponding to those in U.S. Pat. No. 7,598,544, a SWNT semiconductor nanotube fabric with semiconducting nanotube diameter $d_{NT}$=1 nm, a gate insulator thickness $t_G$=7 nm, a gate insulator relative dielectric constant $\in_R$=4 using SiO$_2$ or ONO for example, permittivity of free space $\in_0$=8.85×10$^{-14}$ F/cm, and |$V_{TP}$|=0.5 Volts. A relatively low density, unordered CNT fabric, is used in these calculations as described further above with respect to FIGS. 10C, 13B, and 42A.

For CNTFET diodes, $V_{GS}$=$V_{DS}$ since drain and gate of the corresponding CNTFET device are electrically connected, and therefore CNTFET diodes operate in the saturation region of the corresponding CNTFET device, because the saturation region occurs when $V_{DS}$>=$V_{GS}$-$V_T$ and $V_{GS}$>=$V_T$. When $V_{DS}$=$V_{GS}$-$V_T$, the drain voltage is called the saturation voltage $V_{DS,sat}$, and indicates the onset of the saturation region of device operation, when the channel charge becomes pinched off at the drain-channel interface.

Further increase in the drain voltage $V_{DS}$ does not cause a significant increase in the drain current. So the maximum drain current $I_{DS}$ is determined by $V_{DS,sat}$, which is less than or equal to $V_{DS}$, and $I_{DS}$ may calculated by substituting $V_{DS}$=$V_{DS,sat}$=$V_{GS}$-$V_T$ in equations 12.11 and 12.12. The saturation region behavior of an FET-type device is explained in the following reference: Baker, R. J., "CMOS Circuit Design, Layout, and Simulation", IEEE series on Microelectronic Systems, 1998, pp. 96-97.

Since in operation, pCNTFET diodes are in the saturation region, with the maximum current $I_{DS}$ determined by substituting $V_{DS}$=$V_{GS}$-|$V_{TP}$| and $V_{GS}$>=|$V_{TP}$| in equation 12.11 which may be rewritten as $$I_{DSp}=[(W_P/L_P)\cdot NTFC_P\cdot(2\pi\in_R\in_0/\ln(2t_G/R_{NT}))]\cdot[(V_{GS}-|V_{TP}|)^2/2].$$

Representing the ratio of CNTFET device channel width to channel length by β, Eq.12.11 may be rewritten as:

$$I_{DSp}=[(\beta_P/2)\cdot NTFC_P\cdot(2\pi\in_R\in_0/\ln(2t_G/R_{NT}))]\cdot(V_{GS}-|V_{TP}|)^2 \quad [EQ\ 12.18]$$

where $\beta_P=W_P/L_P$ $$\beta_P=I_{DS}/\{0.5\cdot NTFC_P\cdot[2\pi\in_R\in_0/\ln(2t_G/R_{NT})]\cdot(V_{GS}-|V_{TP}|)^2\} \quad [EQ\ 12.19]$$

Based on ESD current 150 illustrated in prior art FIG. 1B, $I_{DS}$=$I_{ESD}$=1 Ampere at a time t=10 ns after the initiation of an ESD event. Using the various geometrical and material constants further above, and limiting the voltage across the pCNTFET diodes by design to $V_{DS}$=3.5 volts during peak current flow of 1 Ampere, the required value of p-channel width-to-p-channel length ratio $\beta_P$ may be calculated using Eq. 12.19 as follows:

$$\beta_P=1/\{0.5\cdot 4\times 10^5\cdot[2\pi\cdot 4\cdot 8.85\times 10^{-14}/\ln(2\cdot 7/0.5)]\cdot(3.5-0.5)^2\}$$

$$\beta_P=833,000; \text{since } L_P=0.1\ um, W_P=83,300\ um$$

These calculations result in a relatively large CNTFET channel width for single finger CNTFET diodes because of the relatively large current ($I_{DS}$=1 A) CNTFET diodes need to conduct (pass, sink), while keeping the corresponding voltage drop relatively low, during an ESD event. In order for layout of protective devices to fit between pads, multi-fingered CNTFET diode layouts are needed as described further below with respect to FIGS. 15A-15D. The required number of fingers and corresponding protective CNTFET diode layouts are described with respect to FIGS. 15A-15D further below.

The one-finger wide row of CNTFET design table 1400 illustrated in FIG. 14 shows the value of W required for one-finger CNTFET device-based CNTFET diodes; that is diodes formed using CNTFET devices with one gate and source and drain contacts on either side as illustrated in FIGS. 10 and 13. Values of $W_P$ are relatively large and shown as case #1 in table 1400.

A second calculation assumes a pair of nCNTFET diodes as illustrated in FIG. 3, with a human body model HBM 105 applied across two signal pads. A technology with minimum dimension F=0.1 um is assumed, with channel length $L_N$=0.1 um, nanotube fabric constant $NTFC_N$=8×10$^5$ cm/V-s corresponding to the CNT fabric illustrated in U.S. Pat. No. 7,598, 544, a gate insulator thickness $t_G$=7 nm, a semiconducting nanotube diameter $d_{NT}$=1 nm, a dielectric constant $\in_R$=4 using SiO$_2$ or ONO for example, permittivity of free space $\in_0$=8.85×10$^{-14}$ F/cm, $V_{TN}$=0.5 Volts.

Since in operation, nCNTFET diodes are in the saturation region with $V_{DS}$>=$V_{GS}$-$V_{TN}$ and $V_{GS}$>=$V_{TN}$, the maximum current $I_{DS}$ is determined by substituting $V_{DS}$=$V_{DS,sat}$=$V_{GS}$-$V_{TN}$ in equation 12.12 which may be rewritten as $$I_{DSn}=[(W_N/L_N)\cdot NTFC_N\cdot(2\pi\in_R\in_0/\ln(2t_G/R_{NT}))]\cdot[(V_{GD}-V_{TN})^2/2].$$

Representing the ratio of CNTFET device channel width to channel length by β, Eq.12.11 may be rewritten as:

$$I_{DSn}=[(\beta_N/2)\cdot NTFC_N\cdot(2\pi\in_R\in_0/\ln(2t_G/R_{NT}))]\cdot(V_{GD}-V_{TN})^2, \quad [EQ\ 12.20]$$

where $\beta_N=W_N/L_N$ $$\beta_N=I_{DS}/\{0.5\cdot NTFC_N\cdot[2\pi\in_R\in_0/\ln(2t_G/R_{NT})]\cdot(V_{GA}-V_{TN})^2\} \quad [EQ\ 12.21]$$

Based on ESD current 150 illustrated in prior art FIG. 1B, $I_{DS}$=$I_{ESD}$=1 Ampere at a time t=10 ns after the initiation of an ESD event. Using the various geometrical and material constants further above, and limiting the voltage across the nCNTFET diodes by design to $V_{DS}$=3.5 volts during peak current flow of 1 Ampere, the required value of re-channel width-to-n-channel length ratio $\beta_N$ may be calculated using Eq. 12.21 as follows:

$$\beta_N=1/\{0.5\cdot 8\times 10^5\cdot[2\pi\cdot 4\cdot 8.85\times 10^{-14}/\ln(2\cdot 7/0.5)]\cdot(3.5-0.5)^2\}$$

$$\beta_N=416,700; \text{since } L_N=0.1\ um, W_N=41,670\ um$$

These calculations result in a relatively large CNTFET channel width for single finger CNTFET diodes because of the relatively large current ($I_{DS}$=1 A) CNTFET diodes need to conduct, while keeping the corresponding voltage drop relatively low, during an ESD event. In order for layout of protective devices to fit between pads, multi-fingered CNTFET diode layouts are needed as described further below with respect to FIGS. 15A-15D. The required number of fingers and corresponding protective CNTFET diode layouts are described with respect to FIGS. 15A-15D further below.

The one-finger wide row of CNTFET design table 1400 illustrated in FIG. 14 shows the value of W required for one-finger CNTFET diodes; that is CNTFET diodes with one gate and source and drain contacts on either side as illustrated in FIGS. 10 and 13. Values of $W_N$ are relatively large and shown as case #3 in table 1400.

Channel width $W_P$ and $W_N$ values shown as case #1 and case #3, respectively, are relatively large for one-fingered CNTFET diodes. Therefore, multi-fingered CNTFET diode layouts designed to fit between pads are used and described further below with respect to FIGS. 15A-15D. Multi-finger CNTFET device geometries, layouts, and structures calculated further below with respect to equations 15.1-15.4 for both pCNTFET and nCNTFET diodes are included in tables 1400 illustrated in FIG. 14

First and second calculations illustrated further above, and summarized as cases #1 and #3, respectively, in table 1400, are based on pCNTFET diodes and nCNTFET diodes, respectively, using nanotube fabric constants NTFCp and NTFCn, respectively, calculated using equations 12.13, 12.14, and 12.15 further above. Using these nanotube fabric constants, pCNTFET diodes and nCNTFET diodes were formed by scaling devices as described further above based on a relative dielectric constant $\in_R=4$, an insulator thickness of $t_G=7$ nm, channel lengths L for p-type and n-type devices of 0.1 um, and threshold voltages of $V_{TN}=|V_{TE}|=0.5$ V.

At this point in calculations of CNTFET diode sizes, a CNTFET device material change and a geometrical change are introduced by increasing the gate insulator dielectric constant $\in_R$ of gate insulator 1058 illustrated in FIG. 10B, and reducing the channel length $L_{ENT}$ of channel region 1072 illustrated in FIG. 10B. The semiconductor industry has introduced new scaled devices with a combination of metallic gates (and also polysilicon and silicided gates) and various insulators such as $Al_2O_3$ with $\in_R\sim8$-9, hafnium oxide ($HfO_2$) with $\in_R\sim15$-19, and $ZrO_2$ with $\in_R\sim20$-29, for example . . . $\in_R=25$ was selected in this example, although other dielectric constant values may be used, with corresponding CNTFET diode dimensions calculated. A third calculation assumes a pair of pCNTFET diodes as illustrated in FIG. 2, with a human body model HBM 105 applied across two signal pads. A technology with minimum dimension F=0.05 um is assumed, with channel length $L_P=0.05$ um, nanotube fabric constant $NTFC_P=4\times10^5$ cm/V-s for a fabric density corresponding to the CNT fabric density illustrated in U.S. Pat. No. 7,598,544, a gate insulator thickness $t_G=7$ nm, a semiconducting nanotube diameter $d_{NT}=1$ nm, a dielectric constant $\in_R=25$, permittivity of free space $\in_0=8.85\times10^{-14}$ F/cm, and threshold voltage $|V_{TP}|=0.5$ Volts.

Based on ESD current 150 illustrated in prior art FIG. 1B, $I_{DS}=I_{ESD}=1$ Ampere at a time t=10 ns after the initiation of an ESD event. Keeping the nanotube fabric constant $NTFC_P=4\times10^5$ cm/V-s, but using a pCNTFET diode channel length of $L_P=0.05$ um and relative dielectric constant $\in_R=25$ described further above, and limiting the voltage across the pCNTFET diodes by design to $V_{DS}=3.5$ volts during peak ESDS current flow of 1 Ampere, the required value of p-channel width-to-p-channel length ratio $\beta_P$ for this new CNTFET diode scaling may be calculated using Eq. 12.19 as follows:

$$\beta_P=1/\{0.5\cdot4\times10^5\cdot[2\pi\cdot25\cdot8.85\times10^{-14}/\ln(2\cdot7/0.5)]\cdot(3.5-0.5)^2\}$$

$$\beta_P=133,000; \text{since } L_P=0.05 \text{ um}, W_P=6,650 \text{ um}$$

The one-finger wide row of CNTFET design table 1400 illustrated in FIG. 14 shows the value of W required for one-finger CNTFET diodes; that is diodes with one gate and source and drain contacts on either side as illustrated in FIGS. 10 and 13. New values of $W_P$ are shown as case #2 in table 1400 and are substantially smaller than for case #1. The new values of $\beta_P$ and $L_P$ based on the third calculation described further above are shown. Values of $W_P$ are greatly reduced for the reduced channel length $L_P$ from 0.1 to 0.05 um and the increased relative dielectric constant $\in_R$ from 4 to 25. For example, for pCNTFET devices illustrated in table 1400, the required $W_P$ is reduced from 83,300 um (case #1) to 6,650 um (case #2).

A fourth calculation assumes a pair of nCNTFET diodes as illustrated in FIG. 3, with a human body model HBM 105 applied across two signal pads. A technology with minimum dimension F=0.05 um is assumed, with channel length $L_N=0.05$ um, nanotube fabric constant $NTFC_N=8\times10^5$ cm/V-s for a CNT fabric corresponding to the CNT fabric illustrated in U.S. Pat. No. 7,598,544, a gate insulator thickness $t_G=7$ nm, a semiconducting nanotube diameter $d_{NT}=1$ nm, a relative dielectric constant $\in_R=25$, permittivity of free space $\in_0=8.85\times10^{-14}$ F/cm, $V_{TN}=0.5$ Volts.

Based on ESD current 150 illustrated in prior art FIG. 1B, $I_{DS}=I_{ESD}=1$ Ampere at a time t=10 ns after the initiation of an ESD event. Keeping the nanotube fabric constant $NTFC_N=8\times10^5$ cm/V-s, but using a nCNTFET diode channel length of $L_N=0.05$ um and relative dielectric constant $\in_R=25$ described further above, and limiting the voltage across the nCNTFET diodes by design to $V_{DS}=3.5$ volts during peak current flow of 1 Ampere, the required value of n-channel width-to-n-channel length ratio $\beta_N$ for this new CNTFET diode scaling may be calculated using Eq. 12.21 as follows:

$$\beta_N=1/\{0.5\cdot8\times10^5\cdot[2\pi\cdot25\cdot8.85\times10^{-14}/\ln(2\cdot7/0.5)]\cdot(3.5-0.5)^2\}$$

$$\beta_N=66,700; \text{since } L_N=0.05 \text{ um}, W_N=3,335 \text{ um}$$

The one-finger wide row of CNTFET design table 1400 illustrated in FIG. 14 shows the value of W required for one-finger CNTFET diodes; that is diodes with one gate and source and drain contacts on either side as illustrated in FIGS. 10 and 13. The results of the fourth calculation, labeled case #4 in table 1400, shows reduced values of the new values of $\beta_N$ and $L_N$ and the corresponding reduction in $W_N$. Values of $W_N$ are greatly reduced for the reduced channel length $L_N$ from 0.1 to 0.05 um and the increased relative dielectric constant $\in_R$ from 4 to 25. For example, for nCNTFET devices illustrated in table 1400, the required $W_N$ is reduced from 41,670 um (case #3) to 3,335 um (case #4). Even though $W_P$ and $W_N$ values are greatly reduced by pCNTFET diode and nCNTFET diode scaling, respectively, channel widths remain relatively large. Therefore, multi-fingered CNTFET diode layouts designed to fit between pads are used and described further below with respect to FIGS. 15A-15D. Calculated multi-finger CNTFET device dimensions for both pCNTFET and nCNTFET diodes are included in table 1400 illustrated in FIG. 14.

Multi-Fingered CNTFET Device-Based CNTFET Diodes Used to Optimize the Geometries, Layouts. Structures, and Materials of CNTFET Devices Formed with Relatively Low Density, Unordered Nanotube Fabrics:

CNT ESD protect circuits may be formed (integrated and placed) in the vicinity of pads. The CNTFET device pair included in CNT ESD protect circuits illustrated schematically in FIGS. 6 and 7 may be formed next to a pad or they may be formed (integrated and placed) under a pad. Values of Wp and $W_N$ for one-finger devices are much larger in the CNTFET channel width (W) direction and much smaller in the CNTFET channel length (L) direction with respect to pad dimensions (FIGS. 6 and 7) that may be in the range of approximately 25 to 150 um on each side, for example. In order to fit CNT ESD protect circuits near pads, a near-square configuration may be advantageous, although other configurations may be used as well. Therefore, multi-finger CNTFET devices, sometimes also referred to as inter-digitated devices or comb-structure devices, may be used to form CNTFET diodes. CNTFET device pairs used to form CNT ESD protect circuits may be placed adjacent to each other to form adjacent CNTFET diode pair 1440 or 1460 or may be stacked to form stacked CNTFET diode pair 1420 for a smaller footprint (less area), with each CNTFET diode formed on a different integration level as illustrated in FIG. 14. The adjacent pair of multi-finger CNTFET diode dimensions illustrated table 1400 correspond to adjacent CNTFET diode pair 1460. These CNTFET-based CNT ESD protect circuits may be placed adjacent to pads or may be placed below pads as described further below with respect to FIGS. 16 and 17.

Multi-fingered devices may be used to enhance device performance for the same overall W/L ratio devices because of geometrical flexibility; multi-fingered devices are not limited to CNT ESD protect device applications. Such devices may be used in designing any CNTFET-based analog or digital circuit. For example, relatively large devices used in off-chip drivers may be multi-fingered. Shorter gate fingers, source contact fingers, and drain contact fingers, result in better control of current distribution and may be used to improve overall CNTFET device performance by reducing device capacitance and resistance. Also, placement and layout flexibility when designing circuits may result in less use of area and corresponding reduction in power dissipations. Multi-fingered devices may be laid out in square, rectangular, or other layout configurations. Also, layouts may be at any angle to X-Y coordinates. Layouts may also be L (or other) shaped for example. Various shapes may be selected to achieve dense and/or low power and/or high performance objectives for an overall electrical function formed using numerous CNTFET devices and circuits.

FIG. 15A illustrates a schematic 1500-1 representation of a multi-finger CNTFET device configured as a three-finger CNTFET diode having three first S/D-C contacts connected in parallel and connected to a signal pad, three second S/D-C contacts connected in parallel and connected to a shared ground bus, and to three corresponding gates connected to the shared ground bus. For some configurations, the second S/D-C contacts and the gates may be connected to a shared $V_{DD}$ bus instead.

Figure 15B:
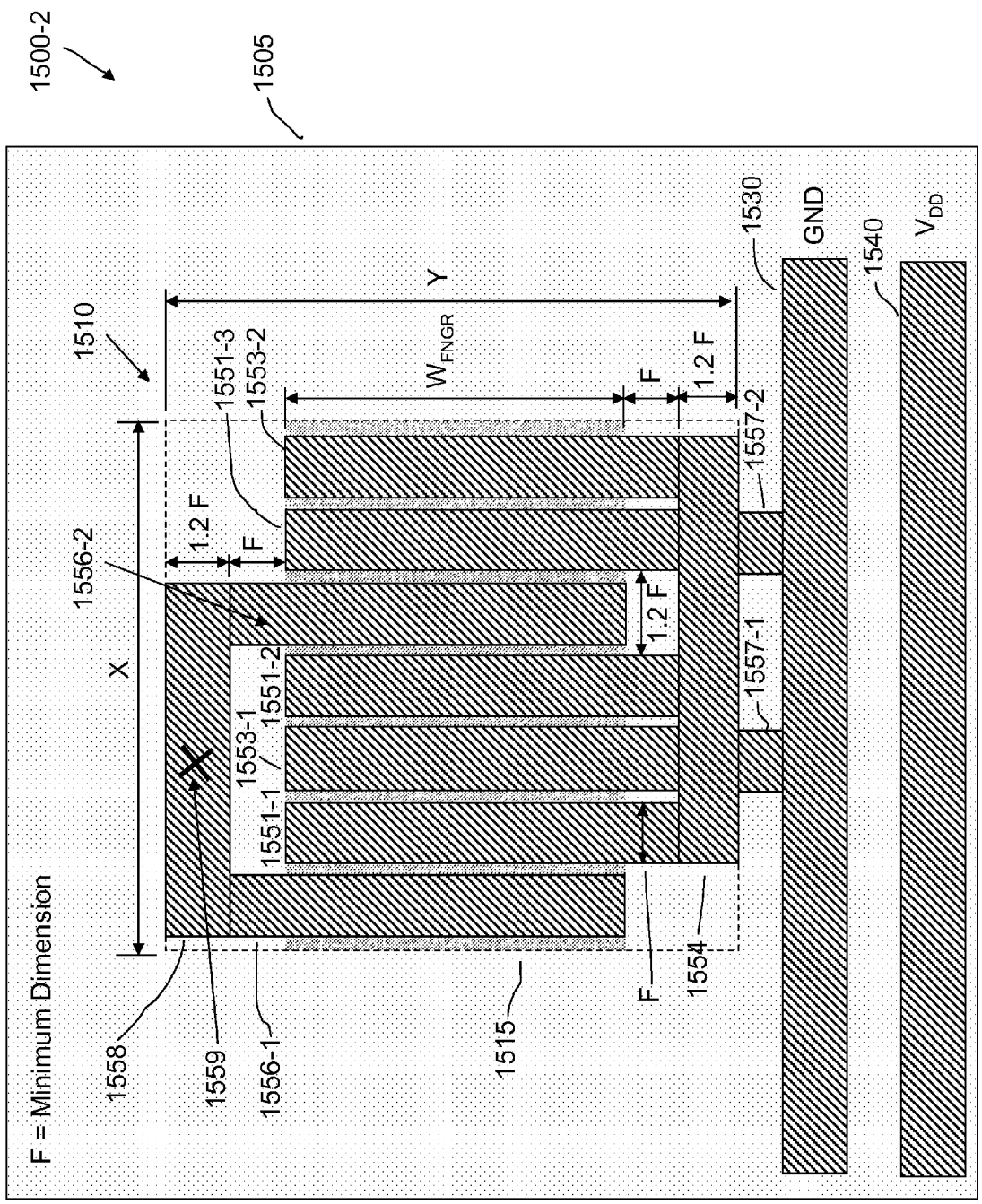
FIG. 15B illustrates a CNTFET diode layout corresponding to the schematic illustrated in FIG. 15A.

FIG. 15B illustrates plan view 1500-2 of a CNTFET device layout having three gates ($N_G=3$) which corresponds to schematic 1500-1. The CNTFET device layout plan view 1500-2 also corresponds to plan view 1000 and cross section 1050 illustrated in FIGS. 10A and 10B, respectively, of a CNTFET device structure. CNTFET diode 1510 may be formed (integrated and placed) on insulator 1505. Patterned NT fabric 1515 is in contact with underlying insulator 1505. Shared ground bus 1530 may be used as part of CNT ESD protect circuit conducting paths as illustrated above in FIGS. 6 and 7, and corresponds to shared ground buses 630 and 730 in peripheral pad configuration 600 and area pad configuration 700, respectively. Shared $V_{DD}$ bus 1540 may be used as part of CNT ESD protect circuit conducting paths as illustrated above in FIGS. 6 and 7, and corresponds to shared $V_{DD}$ buses 640 and 740 in peripheral pad configuration 600 and area pad configuration 700, respectively. In the example illustrated in FIG. 15B, the multi-finger channel region width per finger $W_{FNGR}$ is ⅓ of the single-finger channel width W in this example; that is $W_{FNGR}=W/N_G$, where $N_G=3$. Gate fingers 1551-1, 1551-2, and 1551-3 extend beyond the channel region by a distance F and are connected in parallel by trace 1554. Drain (source) contact fingers 1556-1 and 1556-2 extend beyond the channel region by a distance F and are connected in parallel by trace 1558. Trace 1558 is connected to a trace (not shown) by contact 1559, and then to a signal pad. Source (drain) contact fingers 1553-1 and 1553-2 are also connected in parallel by trace 1554. Traces 1557-1 and 1557-2 connect trace 1554 to shared ground bus 1530 thereby connecting both gate fingers and source (drain) fingers to ground (zero volts). Although trace 1554 is connected to shared ground bus 1530, trace 1554 may also be connected to shared $V_{DD}$ bus 1540 (not shown).

The number of multi-gate fingers $N_G$ needed to meet the total width W requirement and also to achieve a layout in which the X dimension is approximately equal to the Y dimension of CNTFET diode 1510 may be calculated as described further below. The X dimension of the CNTFET diode 1510 layout shown in plan view 1500-2 illustrated in FIG. 15B may be calculated as follows:

$$X=N_G F+(N_G+1)\times 1.2F;$$

Where: $N_G$_ the number of fingers calculated further below;
F_ the minimum technology dimension; F=0.1 um is used;
Minimum gate finger width=F; and
Minimum source & drain finger width=1.2F (includes spacer)

$$X=(2.2N_G+1.2)F \quad [\text{EQ 15.1}]$$

$$Y=W_{FNGR}+F+1.2F+1.2F=W_{FNGR}+4.4F$$

Where: $W_{FNGR}=W/N_G$; $\beta=W/L=W/F$; therefore $W_{FNGR}=(\beta F/N_G)$;
$W_{FNGR}$ is the width of CNTFET channel region;
F_ channel region to edge of rail 1554 or rail 1558; and
1.2F_ width of rail 1554 and 1558

$$Y=(\beta/N_G+4.4)F \quad [\text{EQ. 15.2}]$$

$N_G$ is calculated for a square layout of CNTFET diode 1510 by setting X=Y as follows:

$$(2.2N_G+1.2)F=(\beta/N_G+4.4)F$$

which may be reduced to the following quadratic equation:

$$2.2N_G^2-3.2N_G-\beta=0$$

The well known general solution to quadratic equations is as follows:

$$ax^2+bx+c=0; \text{ and } x=(-b+-(b^2-4ac)^{1/2})/2a$$

Hence:

$$a=2.2; b=-3.2; \text{and } c=-\beta; \text{ and}$$

$$N_G=(3.2+-(10.24+8.8\beta)^{1/2})/4.4 \quad [\text{EQ. 15.3}]$$

The width per finger $W_{FNGR}$ may be calculated using the single finger value W divided by $N_G$:

$$W_{FNGR}=W/N_G \quad [\text{EQ. 15.4}]$$

Equations 15.1-15.4 may be used to optimize overall multi-fingered CNTFET device-based CNTFET diodes forming ESD protect circuits, such as ESD protect circuit 130 illustrated in FIG. 1A, with layout areas and shapes to fit between pads or under pads using various geometries, structures and materials. These CNTFET devices and corresponding CNTFET diode layout geometries may be calculated using equations 15.1-15.4 for relatively low density, unordered carbon nanotube fabrics, or for relatively high density ordered carbon nanotube fabrics. CNTFET devices and corresponding CNTFET diode geometries for CNTFET diodes formed with unordered CNT fabrics are described with respect to table 1400 illustrated in FIG. 14. CNTFET devices and corresponding CNTFET diode geometries for CNTFET diodes formed with ordered CNT fabrics are described further below with respect to table 4600 illustrated in FIG. 46

The following is an example of multi-fingered ESD protective CNTFET diode dimensions illustrated in column 1, case #1 of table 1400 in FIG. 14, in rows corresponding to stacked pair multi-fingered CNTFET devices, referred to as stacked CNTFET diode pairs 1420. For stacked CNTFET diode pairs 1420, X and Y dimensions are approximately the same as X and Y dimensions for an individual CNTFET diode.

In this example in which $\beta_P$=833,000 and $W_P$=83,300 um, $N_G$ may be calculated using equation 15.3 as follows:

$N_G$=(3.2+−(10.24+8.8×833,000)$^{1/2}$)/4.4;$N_G$=616 fingers

Then using equation 15.1 and F=0.1 um, X may be calculated as follows:

X=(2.2X616+1.2)0.1;X=135.6 um

The Y dimension may be calculated using equation 15.2 and F=0.1 um as follows:

Y=(833,000/616+4.4)0.1;Y=135.7 um

The width per finger $W_{FNGR}$ for $N_G$ fingers may be calculated for this example using equation 15.4 as follows:

$W_P$=83,300 um; $N_G$=616;therefore $W_{FNGR}$=83,300/616;$W_{FNGR}$=135.2 um

The $N_G$, $W_{FNGR}$, X, and Y values are in table 1400, FIG. 14, in the section for stacked pair multi-finger CNTFET devices.

In cases where pairs of multi-fingered devices are placed adjacent to one another on the same level to form adjacent CNTFET diode pair 1460, instead of stacked CNTFET diode pair 1420, then:

X'=√2·X, and Y'=√2·Y

Values of X' and Y' for adjacent pair of multi-fingered CNTFET diodes are also shown in table 1400. The area X'Y' for adjacent CNTFET diode pair 1460 is approximately 2-times the area XY for stacked CNTFET diode pair 1420.

The values of $N_G$, $W_{FNGR}$, X, Y, X', and Y' for the various CNTFET diode choices have been calculated using the same approach and are listed in table 1400 shown in FIG. 14.

FIG. 15C illustrates a schematic 1500-3 representation of a multi-finger CNTFET device configured as a three-finger CNTFET diode having three first S/D-C contacts connected in parallel and connected to a signal pad, three corresponding gates connected to the signal pad, and three second S/D-C contacts connected in parallel and connected to a shared $V_{DD}$ bus. For some configurations, the second S/D-C contacts and the gates may be connected to a shared ground bus instead (not shown).

Figure 15D:
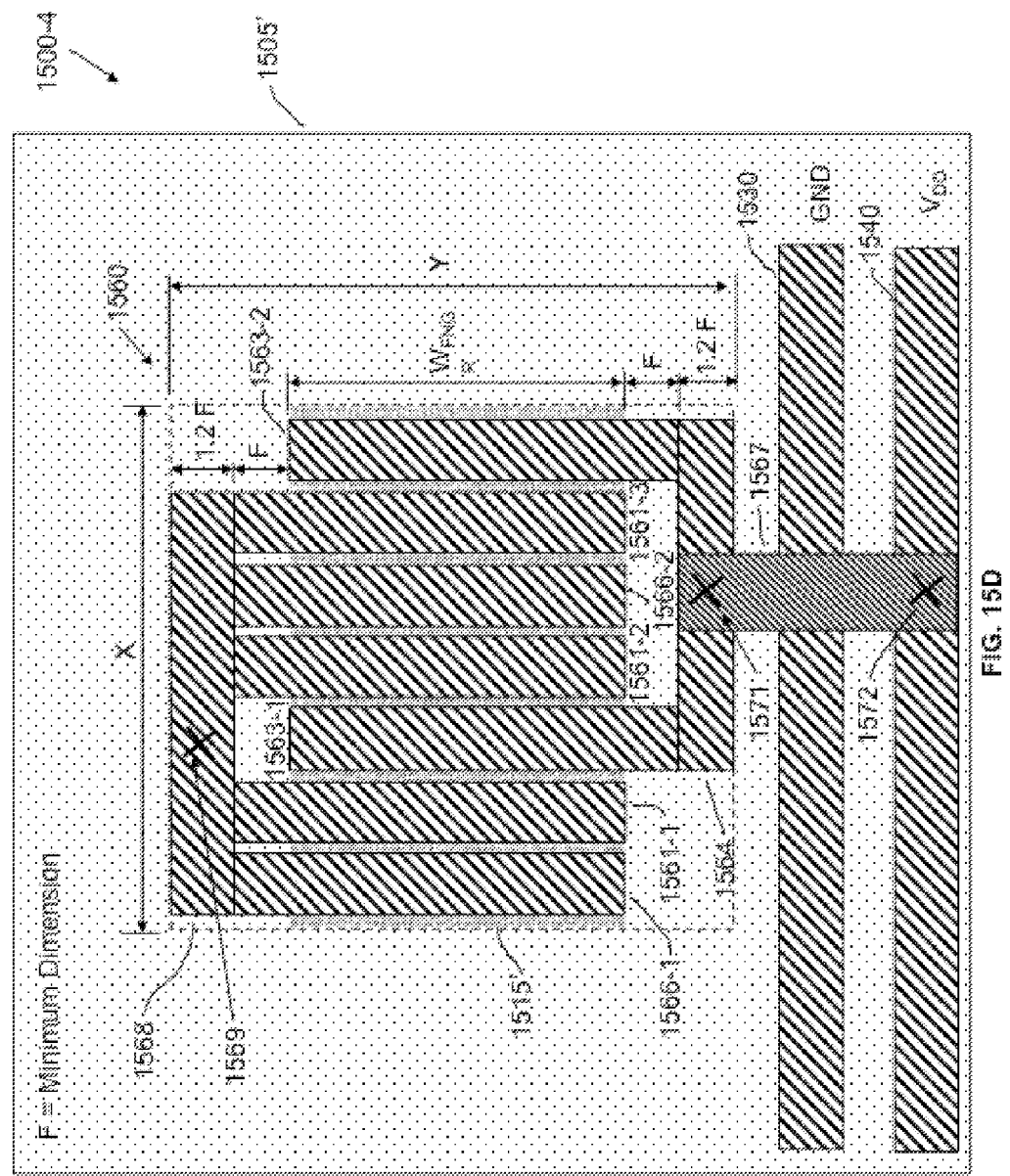
FIG. 15D illustrates a CNTFET diode layout corresponding to the schematic illustrated in FIG. 15C.

FIG. 15D illustrates plan view 1500-4 of a CNTFET device layout having three gates ($N_G$=3) which corresponds to schematic 1500-3. The CNTFET device layout plan view 1500-4 also corresponds to plan view 1000 and cross section 1050 illustrated in FIGS. 10A and 10B, respectively, of a CNTFET device structure. CNTFET diode 1560 is formed (integrated and placed) on insulator 1505'. Patterned NT fabric 1515' is in contact with underlying insulator 1505'. Shared ground bus 1530 may be used as part of CNT ESD protect circuit conducting paths as illustrated above in FIGS. 6 and 7, and corresponds to shared ground buses 630 and 730 in peripheral pad configuration 600 and area pad configuration 700, respectively. Shared $V_{DD}$ bus 1540 may be used as part of CNT ESD protect circuit conducting paths as illustrated above in FIGS. 6 and 7, and corresponds to shared $V_{DD}$ buses 640 and 740 in peripheral pad configuration 600 and area pad configuration 700, respectively. In the example illustrated in FIG. 15D, the multi-finger channel region width per finger $W_{FNGR}$ is ⅓ of the single-finger channel width W in this example; that is $W_{FNGR}$=W/$N_G$, where $N_G$=3. Gate fingers 1561-1, 1561-2, and 1561-3 extend beyond the channel region by a distance F and are connected in parallel by trace 1568. Drain (source) contact fingers 1566-1 and 1566-2 extend beyond the channel region by a distance F and are connected in parallel by trace 1568. Trace 1568 is connected to a trace (not shown) by contact 1569, and then to a signal pad. Source (drain) contact fingers 1563-1 and 1563-2 are also connected in parallel by trace 1564. Trace 1567 is connected to trace 1564 by contact 1571 and connects trace 1564 to shared $V_{DD}$ bus 1540 by contact 1572 thereby connecting source (drain) fingers to $V_{DD}$. Although trace 1564 is connected to shared $V_{DD}$ bus 1540, trace 1564 may also be connected to shared ground bus 1530 (not shown).

CNTFET diode 1560 layout illustrated in FIG. 15D is similar to CNTFET diode 1510 layout illustrated in FIG. 15B. Comparing dimensions labeled in both FIGs. shows that overall CNTFET device layout dimensions are the approximately the same for both devices. Therefore, equations 15.1, 15.2, 15.3, and 15.4 derived above for calculating the value of $N_G$ and corresponding values of $W_{FNGR}$, X, Y, X', and Y', and other dimensions are approximately the same.

CNTFET design tables 1400 illustrated in FIG. 14 show various CNTFET device parameters such as the number of gate fingers $N_G$, finger width $W_{FNGR}$, and X and Y layout dimensions for stacked CNTFET diode pair 1420 and adjacent CNTFET diode pair 1440 and 1460. These layout dimensions correspond to CNTFET diode 1510 illustrated in FIG. 15B and CNTFET diode 1560 illustrated in FIG. 15D. The area required for stacked CNTFET diode pair 1420 is XY. For adjacent CNTFET diode pairs, configured in an approximately square shape as illustrated by FIG. 1460 in FIGS. 14A and 14B, dimensions are increased to X'=√2X and Y'=√2 Y, and adjacent CNTFET diode pairs require approximately 2-times the area of stacked CNTFET diode pairs. CNTFET device layouts shown in CNTFET design table 1400 are compatible with pad dimensions in the range of 25 to 150 um.

Integration and Placement of CNT ESD Protect Circuits Formed Using CNTFET Diode Pairs CNT ESD protect circuits may be designed and laid out by interconnecting pairs of CNTFET diodes as described further above with respect to FIGS. 2-5; 6-9; 10; and 15. CNT ESD protect circuits may be formed in a variety of sizes, using various integration methods, in various layout configurations. FIG. 15B illustrates plan view 1500-2 of a CNTFET diode 1510 layout example having three gates ($N_G$=3) that corresponds to schematic 1500-1 show in FIG. 15A, and FIG. 15D illustrates plan view 1500-4 of a CNTFET diode 1560 layout example having three gates (NG=3) that corresponds to schematic 1500-3 shown in FIG. 15C as described further above. CNTFET design table 1400 illustrated in FIG. 14 shows CNTFET diode dimensions for one-finger wide CNTFET diodes designed with various nanotube fabric constant (NTFC) values. Then, design examples for various multi-fingered CNTFET diodes are shown as described further above with respect to FIGS. 14A and 14B. Each CNTFET diode is designed such that if HBM 105 (prior art FIG. 1A) causes an ESD event resulting in ESD current 150 (prior art FIG. 1B) passing through a pair of CNTFET diodes in series (FIG. 9D), the maximum voltage between signal pads is no more than 7 volts, and the maximum voltage between a signal pad and a ground pad or power supply pad is 3.5 volts, when ESD current 150 reaches a maximum current of 1 Ampere after 10 ns. Various designs and layouts may be used in addition to those illustrated with respect to FIGS. 14 and 15 that conform to the maximum allowed ESD-event induced voltages described further above. In these examples, CNT ESD protect circuits designs using CNTFET diodes illustrated in FIGS. 14 and 15, and others (not shown), may be combined with wirebond pads as illustrated in FIG. 16 and bump pads (terminals) as illustrated in FIG. 17. A comparison of wirebond pad and bump pad configurations may be found in the reference Puttlitz and Totta, "Area Array Interconnection Handbook", Kluwer Academic Publishers, 2001; Bertin et al., "Known Good Die (KGD)", Chapter 4, pages 149-151.

Chip designs that use well known wirebond connections between pads and the next level of assembly typically do not place circuits below pads because physical pressure applied by wirebond tools during bonding operations may affect underlying device electrical characteristics. Plan view 1600-1 and corresponding cross section 1600-2 (cross section A-A') illustrated in FIGS. 16A and 16B, respectively, illustrate an underlying insulator level 1602 and pad 1604 with wirebond 1606 connecting pad 1604 to another level of assembly such as a module substrate, card, or board (not shown). Pad 1604 is also connected to circuits 1612 by trace 1608; to CNT ESD protect circuit 1614, which includes CNTFET diodes 1616 and 1618, by trace 1610. CNTFET diode 1616 is connected to shared ground bus 1630 by trace 1620, and CNTFET device 1618 is connected to shared power supply bus 1640 by trace 1622, which is connected to shared power supply bus 1640 by contact 1624.

CNT ESD protect circuit 1614 corresponds to a multi-finger adjacent CNTFET diode pair 1460 illustrated in FIGS. 14A and 14B, and occupies an area of approximately X'Y'=2XY. The layout of CNT ESD protect circuit 1614 may be selected such that X' is approximately equal to Y' as illustrated by corresponding adjacent CNTFET pair 1460. However, CNT ESD protect circuit 1614 may instead be laid out in a rectangular shape of 2X in the x direction and Y in the y direction as illustrated by adjacent CNTFET diode pair 1440. Also, CNT ESD protect circuit 1614 may instead be laid out in a rectangular shape of X in the x direction and 2Y in the y direction (not shown). Other shapes such as an L shape and other variations may be used (not shown). Calculation of layout dimensions is illustrated further above with respect to FIGS. 14 and 15.

Figure 16A:
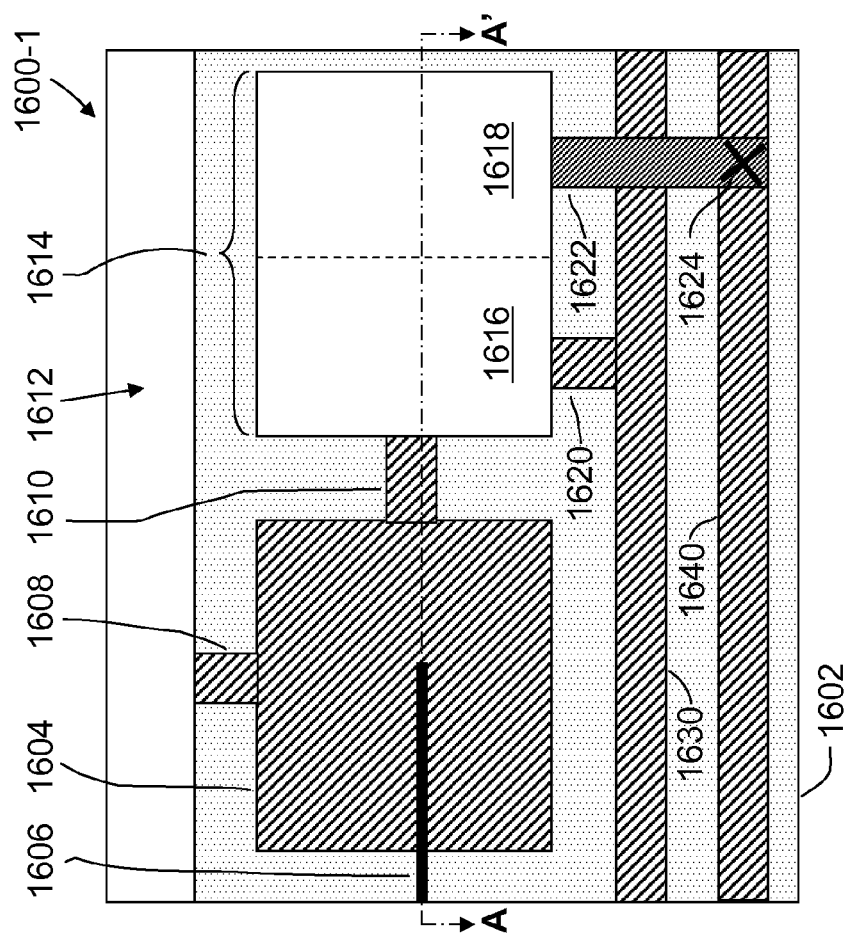
FIG. 16A illustrates a representation of a wirebonded pad connected to a protected circuit and to an adjacent nanotube ESD protect circuit formed by a pair of adjacent CNTFET diodes.
Figure 16B:
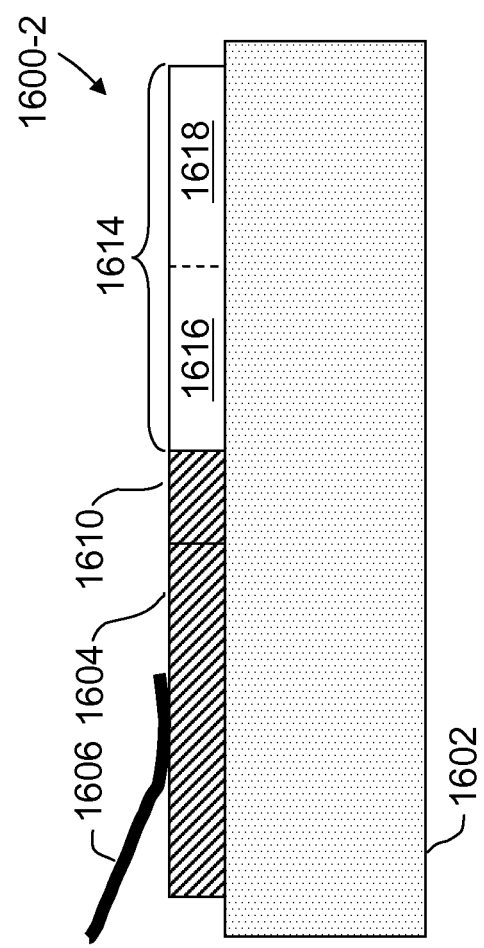
FIG. 16B illustrates a cross sectional representation of FIG. 16A.

The layout area CNT ESD protect circuit 1614 illustrated in FIGS. 16A and 16B may be reduced by using a stacked pair of multi-finger CNTFET diodes 1666 and 1668 as illustrated further above, corresponding to stacked CNTFET diode pair 1420 shown in FIGS. 14A and 14B, to form a CNT ESD protect circuit that occupies an area of approximately XY. The layout of CNT ESD protect circuit 1664 may be selected such that X is approximately equal to Y as illustrated by corresponding stacked CNTFET diode pair 1420. The area of CNT ESD protect circuit 1664 (area approximately XY) is approximately half the area of CNT ESD protect circuit 1614 (area approximately 2XY) enabling closer pad-to-pad spacing for example. Other shapes such as an L shape and other variations may be used when forming a stacked CNTFET diode pair (not shown). Calculation of layout dimensions is illustrated further above with respect to FIGS. 14 and 15.

Figure 16C:
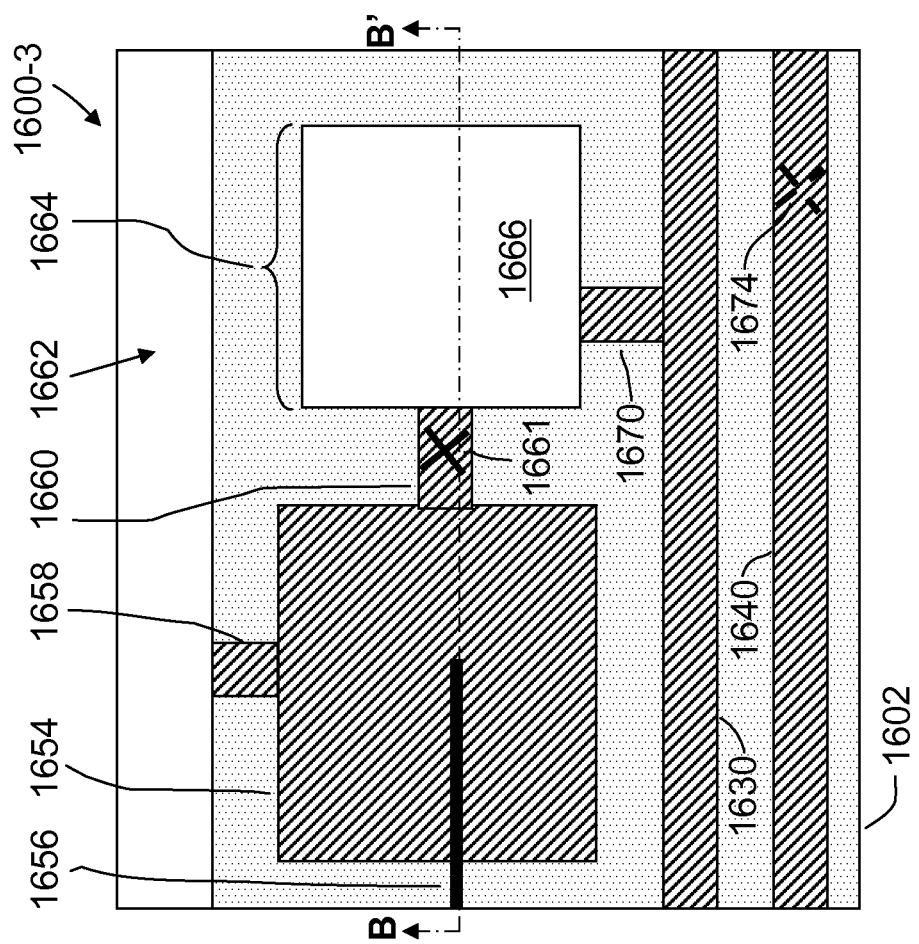
FIG. 16C illustrates a representation of a wirebonded pad connected to a protected circuit and to an adjacent nanotube ESD protect circuit formed by a pair of stacked CNTFET diodes.
Figure 16D:
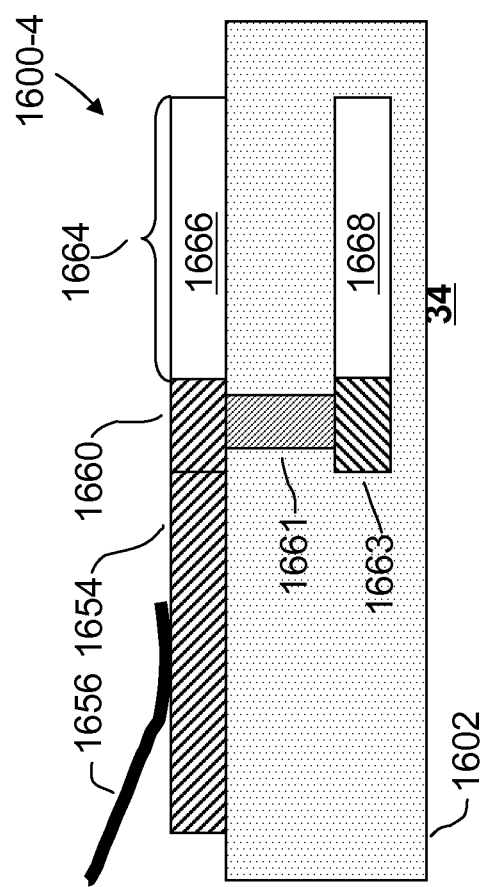
FIG. 16D illustrates a cross sectional representation of FIG. 16C.

Plan view 1600-3 and corresponding cross section 1600-4 (cross section B-B') illustrated in FIGS. 16C and 16D, respectively, shows an underlying insulator level 1602 and pad 1654 with wirebond 1656 connecting pad 1654 to another level of assembly such as a module substrate, card, or board (not shown). Pad 1654 is also connected to circuits 1662 by trace 1658. CNTFET diode 1666, included in CNT ESD protect circuit 1664, is connected to pad 1654 by trace 1660, and CNTFET diode 1668, also included in CNT ESD protect circuit 1664, is also connected by trace 1663, via 1661, and trace 1660 to pad 1654. CNTFET diode 1666 is connected to shared ground bus 1630 by trace 1670, and CNTFET diode 1668 is connected to shared power supply bus 1640 by contact 1674 and a trace (not shown in FIGS. 16C and 16D). CNTFET diodes 1666 and 1668 form a stacked CNTFET diode pair corresponding to stacked CNTFET diode pair 1420.

Figure 17A:
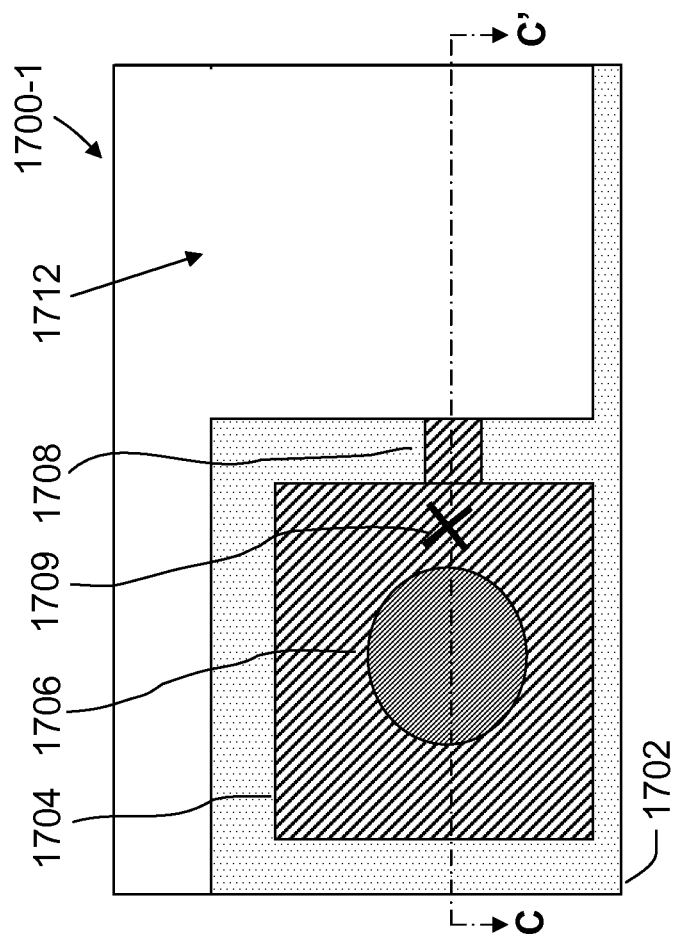
FIG. 17A illustrates a representation of a bumped pad connected to a protected circuit and to a nanotube ESD protect circuit formed by a pair of stacked CNTFET diodes placed under the pad.
Figure 17B:
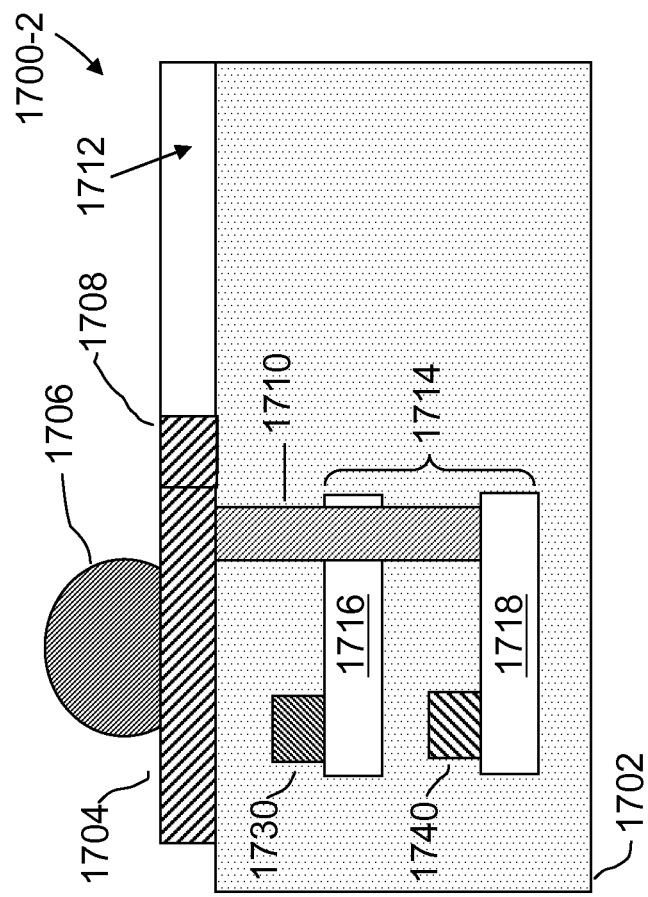
FIG. 17B illustrates a cross sectional representation of FIG. 17A.

Chip designs that use well known bump connections between pads and the next level of assembly may place circuits below pads without affecting underlying device electrical characteristics. FIG. 17 illustrates a bump terminal in direct contact with a corresponding pad. However, in some integration approaches (not shown), a terminal metal layer may be used between a bump and pad layer as described in Puttlitz and Totta, "Area Array Interconnection Handbook", Kluwer Academic Publishers, 2001; Brofman et al., "Flip-Chip Die Attach Technology", Chapter 8, pages 317-319. Plan view 1700-1 and corresponding cross section 1700-2 (cross section C-C') illustrated in FIGS. 17A and 17B, respectively, illustrate an underlying insulator level 1702 and pad 1704 with bump 1706 connecting pad 1704 to another level of assembly such as a module substrate, card, or board (not shown). Pad 1704 is also connected to circuits 1712 by trace 1708; to underlying CNT ESD protect circuit 1714, which includes stacked CNTFET diodes 1716 and 1718, corresponding to stacked CNTFET diode pair 1420, and is connected to pad 1704 by via 1710 and contact 1709. CNTFET diode 1716 is connected to shared ground bus 1730, and CNTFET diode 1718 is connected to shared power supply bus 1740. By placing CNT ESD protect circuit 1714 under pad 1704, circuit 1712 may be extended to regions between adjacent pads for increased circuit density. Circuit 1712, in the region between pads, may include large off-chip drivers (OCDs) to drive large loads (2-100 pF for example), input/output circuits, input/output buffers, and other circuits. Large OCDs placed adjacent to pads may also contribute some protection from an ESD-event. Alternatively, pad-to-pad spacing may be reduced by eliminating CNT ESD protect circuits, and other circuits, from between pads.

The layout area (footprint) of CNT ESD protect circuit 1714 illustrated in FIGS. 17A and 17B has been reduced by using a stacked CNTFET diode pair, corresponding to stacked CNTFET diode pair 1420, of multi-finger CNTFET diodes 1716 and 1718 as illustrated further above to form CNT ESD protect circuit 1714 that occupies an area of approximately XY. The layout of CNT ESD protect circuit 1714 may be selected such that X is approximately equal to Y as illustrated by corresponding stacked CNTFET diode pair 1420. Other shapes such as an L shape and other variations may be used when forming a stacked CNTFET pair (not shown). Calculation of layout dimensions is illustrated further above with respect to FIGS. 14 and 15.

Plan view 1700-3 and corresponding cross section 1700-4 (cross section D-D') show an additional circuit layer that extends below the pad region for still greater circuit density. This additional circuit layer may be interconnected to other circuit layers and also to protect devices placed under the pads for greater density and lower power operation.

Figure 17D:
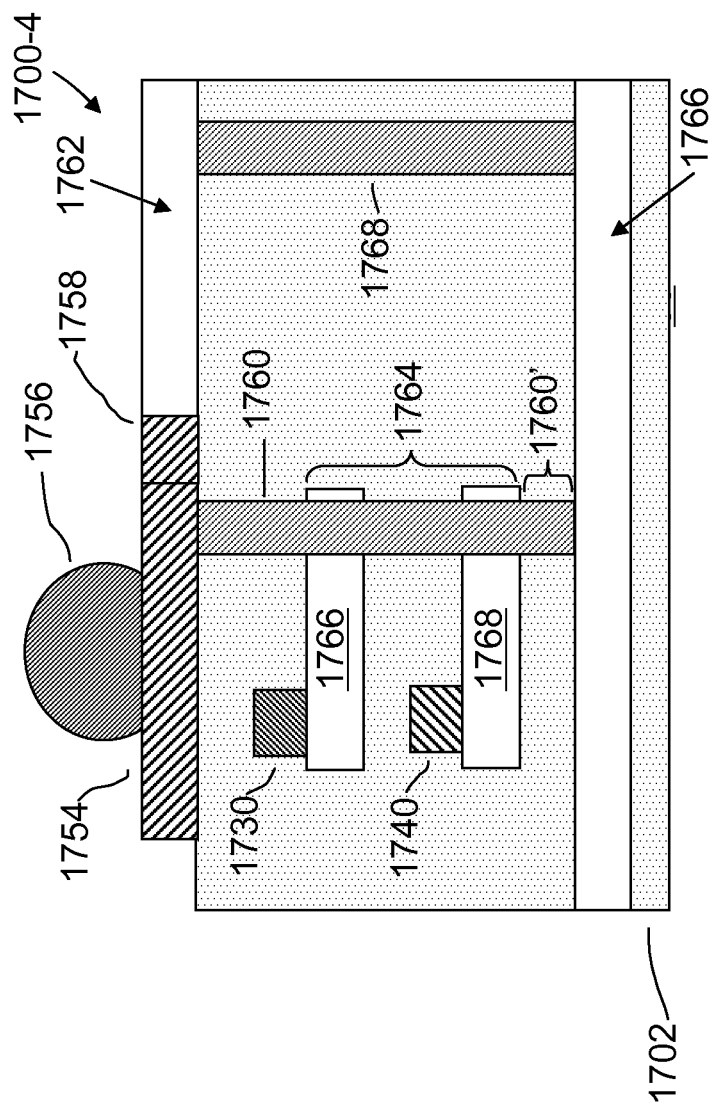
FIG. 17D illustrates a cross sectional representation of FIG. 17C.

FIGS. 17C and 17D illustrate pad, bump, circuit, and CNT ESD protect device layouts that are similar to those illustrated in FIGS. 17A and 17B. However, in addition to circuits 1762 on same wiring level as pad 1754, circuits 1766 may be placed in an underlying level and also be extended below pad 1754, and in this example, below CNT ESD protect circuit 1764. Alternatively, circuits 1766 may be placed on a level between pad 1754 and CNT ESD protect device 1764 instead (not shown). In this example, CNT ESD protect circuit 1764 is shown protecting both circuit 1762 and 1766; however, CNT ESD protect circuit 1764 may be used to protect only circuit 1762 or only circuit 1766 (not shown). Circuits 1762 and 1766 are examples of CNTFET-based circuit stacking of two (or more layers), and methods of sharing a CNT ESD protect circuit and corresponding CNTFET diodes with both circuit layers.

Plan view 1700-3 and corresponding cross section 1700-4 (cross sectionD-D') illustrated in FIGS. 17C and 17D, respectively, illustrate an underlying insulator level 1702 and pad 1754 with bump 1756 connecting pad 1754 to another level of assembly such as a module substrate, card, or board (not shown). Pad 1754 is also connected to circuits 1762 by trace 1758; to CNT ESD protect circuit 1764, which includes CNTFET devices 1766 and 1768, also connected to pad 1754 by via 1760 and contact 1759. CNTFET device 1766 is connected to shared ground bus 1730, and CNTFET device 1768 is connected to shared power supply bus 1740. CNT ESD protect circuit 1764 corresponds to stacked CNTFET diode pair 1420 illustrated in FIGS. 14A and 14B, and occupies an area of approximately XY. The layout of CNT ESD protect circuit 1764 may be selected such that X is approximately equal to Y as illustrated by corresponding stacked CNTFET diode pair 1420. Other shapes such as an L shape and other variations may be used when forming a stacked CNTFET pair (not shown). Calculation of layout dimensions is illustrated further above with respect to FIGS. 14 and 15.

Via 1760 may be extended by via 1760' to also contact circuits 1766. Hence, CNT ESD protect device 1764 protects both circuits 1762 and 1766. However, via 1760' may be omitted, such that CNT ESD protect circuit 1764 protects only circuit 1762. However, since circuits 1762 and 1766 are connected by via 1768, then circuits 1766 may also be protected. Alternatively, trace 1758 may be omitted such that CNT ESD protect circuit 1764 protects only circuit 1766. However, since circuits 1762 and 1766 are connected by via 1768, then circuits 1762 may also be protected.

NT protect circuits formed using CNTFET diodes may be located on any level of assembly. So for example, CNTFET diodes may be fabricated as part of a chip with CNTFET-based circuits for example. However, CNTFET diodes may be fabricated on a module substrate, a card layer, or a card layer. NT protect circuits formed using CNTFET diodes may be included on multiple levels of assembly to offer protection for every level prior to assembly, and then multi-levels of protection after assembly of the various levels such as chip, module, card, and board Calculation of Carbon Nanotube Fabric Constants (NTFC) for p and n-Type Operation Based on Electrical Device Measurements on an Ambipolar CNTFET (aCNTFET) Device Measured ambipolar CNTFET (aCNTFET) device characteristics are described further below. aCNTFET devices are important because aCNTFET devices exhibit both p-type and n-characteristics in the same device as illustrated in FIG. 18. This enables measuring nanotube fabric constant values for a CNT fabric for both p-type and n-type operation (NTFC$_P$ and NTFC$_N$) on the same aCNTFET device. Measurements described further below, and in more detail in U.S. application Ser. No. 13/579,828 result in a NTFC$_N$/NTFC$_P$ ratio of 2, which reflects differences in electron and hole CNT fabric mobility, and is used further above in equation 12.5. Electron and hole CNT fabric mobility is different than mobility in a silicon substrate in which electron mobility is approximately 3 times the hole mobility.

Ambipolar CNTFET (aCNTFET) devices are particularly useful in calculating both NTFC$_P$ and NTFC$_N$ nanotube fabric constants for CNT fabrics. This is because both n-type and p-type CNTFET behaviors are exhibited in the same aCNTFET device. Therefore, for aCNTFET devices, the same CNT fabric forms the substrate region; the same gate-to-fabric separation is used; gate and contact materials are the same; the same physical device dimensions contribute to n-type and p-type electrical characteristics, and other similarities. Contacts to aCNTFET devices are able to inject both holes and electrons thereby enabling both n-type and p-type CNTFET characteristics over a portion of the aCNTFET device operating range. aCNTFET devices are also of interest because scaled (optimized) aCNTFET diodes may be formed with these devices, and unlike unidirectional scaled pCNTFET and nCNTFET diodes described further above, aCNTFET diodes are bi-directional. That is, aCNTFET diodes respond to both positive and negative ESD voltages and corresponding ESD current flows in opposite directions. Accordingly, CNT ESD protect circuits formed using aCNTFET diodes require only one aCNTFET diode per pad as described further below.

Figure 18:
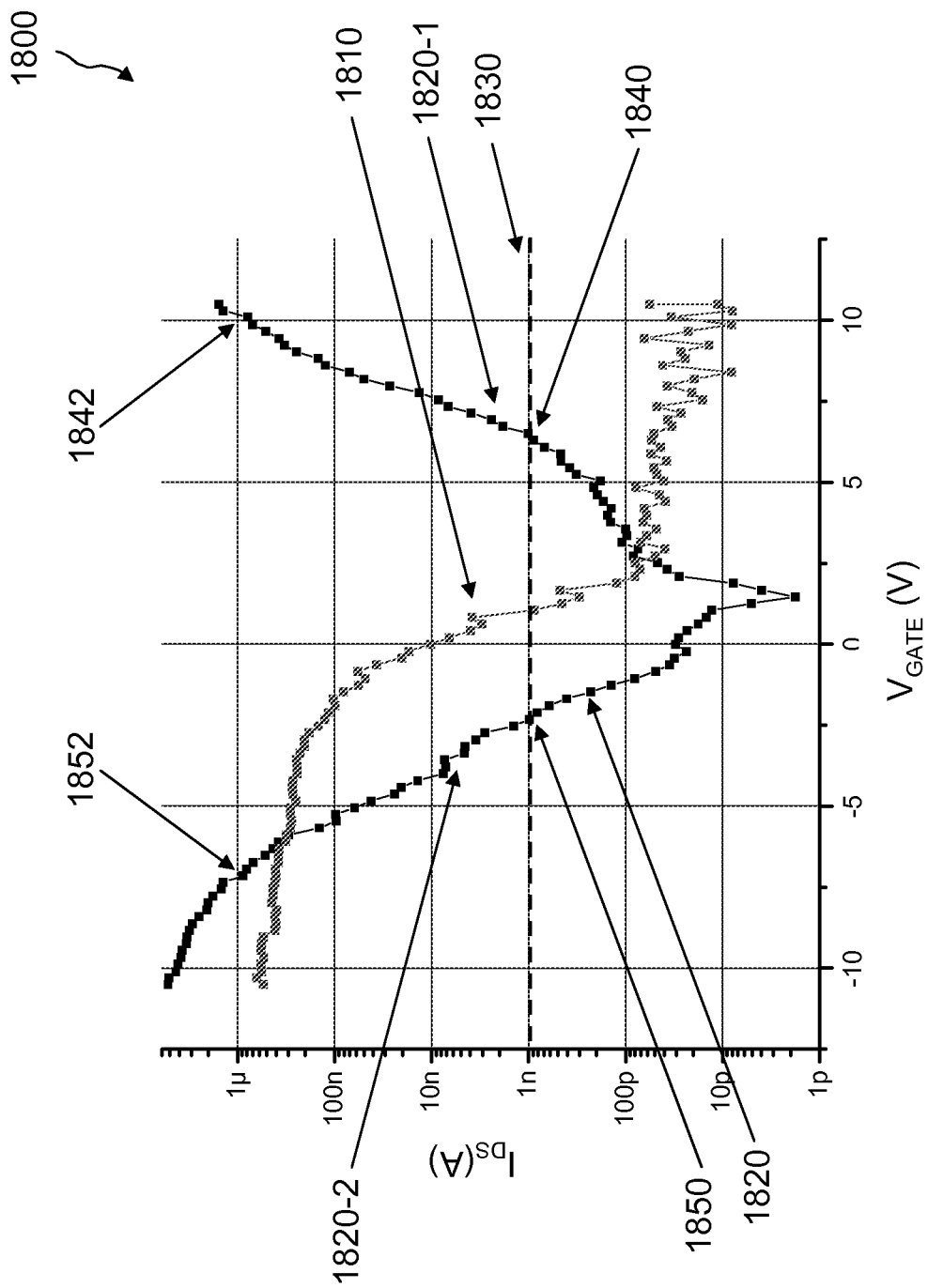
FIG. 18 illustrates an electrical characteristic of a pCNTFET device exhibiting a pCNTFET operating mode, and an electrical characteristic of an ambipolar CNTFET (aCNTFET) device exhibiting both p-type and n-type electrical characteristics in the same device. pCNTFET device and aCNTFET device electrical characteristics were measured on fabricated CNTFET devices illustrated in FIG. 13A-C.

The aCNTFET device electrical characteristic 1800 illustrated in FIG. 18 was measured on an ambipolar device with the same structure as described in FIG. 13 further above, and is described in more detail in Bertin et al. U.S. Pat. No. 7,598,544. Measured electrical characteristics 1800 include pCNTFET device electrical (transfer) characteristic 1810 as and ambipolar CNTFET (aCNTFET) device electrical (transfer) characteristic 1820. nCNTFET segment 1820-1 portion of electrical characteristic 1820 shows drain-source current I$_{DS}$ as a function of gate voltage V$_{GS}$, with a drain-source voltage V$_{DS}$ held at 1.5 volts. Equation 12.12 for I$_{Psn}$ may be used to calculate the value of NTFC$_N$ using equation based on the electrical characteristics of nCNTFET segment 1820-1 of aCNTFET device electrical characteristic 1820. The I$_{DS}$ current flow in nCNTFET segment 1820-1 is referred to as I$_{DS}$. The threshold voltage V$_{TN}$ for nCNTFET segment 1820-1 is approximately 7 volts, defined by intersection 1840 of current onset value 1830 and nCNTFET segment 1820-1. The current flow I$_{DSn}$=1 µA at V$_{GATE}$=10 V as indicated by the intersection 1842 between the 1 µA reference line and nCNTFET segment 1820-1. The I$_{DS}$ current axis was plotted on a logarithmic scale to display pico-Ampere level currents. However, currents at and below 100 pA reflect noise in the measuring instrument, so a current onset value 1830 of 1 nA is used.

As described further above, the relationship between gate voltage, drain-to-source voltage, and threshold voltage, and drain-to-source current for an nCNTFET is given by equation 12.12, repeated here, as follows:

$$I_{DSn}=[(W_N/L_N)\cdot NTFC_N\cdot(2\pi\epsilon_R\epsilon_0/\ln(2t_G/R_{NT}))]\cdot[(V_{GS}-V_{TN})V_{DS}-V^2_{DS}/2]. \qquad [EQ\ 12.12]$$

where t$_G$ is the gate-NT fabric distance, R$_{NT}$=CNT radius=d$_{NT}$/2, d$_{NT}$ is NT diameter, $\epsilon_R$=relative dielectric constant of gate insulator, $\epsilon_0$=8.85×10$^{-14}$ F/cm permittivity of free space, L$_N$=NT fabric length between source & drain regions, W$_N$=fabric width between source and drain regions, and NTFC$_N$=nanotube fabric constant in cm/V-s.

Therefore, the nanotube fabric constant NTFC$_N$ may be calculated using equation 12.22 further below, and the device dimensions corresponding to CNTFET device 1360 illustrated in FIG. 13D, as follows:

$$NTFC_N=(L_N/W_N)\cdot I_{DSn}/[(2\pi\epsilon_R\epsilon_0/\ln(2t_G/R_{NT}))\cdot((V_{GS}-V_{TN})V_{DS}-V^2_{DS}/2)], \qquad [Eq\ 12.22]$$

where

T$_G$=20 nm; I$_{DS}$=1 µA;

d$_{EN}$=1 nm; V$_{TN}$=7 V;

$E_R=1$; $V_{GS}=10$ V;
$E_0=8.85 \times 10^{-14}$ F/cm; $V_{DS}=1.5$ V;
$L_N=0.2$ µm;
$W_N=0.4$ µm.
Thus, $$NTFC_N=(0.2/0.4) \cdot 1 \times 10^{-6}/[(2\pi \cdot 1 \cdot 8.85 \times 10^{-14}/\ln(2 \times 20/0.5)) \cdot ((10^{-7})1.5-(1.5)^2/2)],$$

and $$NTFC_N=12 \times 10^5 \text{ cm/V} \cdot \text{s}. \quad [EQ\ 12.23]$$

The value of $NTFC_N$ includes contact resistance between electrodes and the NT fabric at both drain-source and source-drain terminals in series with the NT fabric channel resistance; therefore, $NTFC_N$ in just the channel region is a larger value.

pCNTFET segment 1820-2 of aCNTFET electrical characteristic 1820 illustrated in FIG. 18, and the device dimensions corresponding to CNTFET device 1360 illustrated in FIG. 13D, are used to calculate $NTFC_P$. pCNTFET segment 1820-2 portion of electrical characteristic 1820 shows drain-source current $I_{DS}$ as a function of gate voltage $V_{GS}$, with a drain-source voltage $V_{DS}$ held at 1.5 volts. Equation 12.11 represents drain-source current $I_{DSp}$ and equation 12.13 may be used to calculate $NTFC_P$ based on the electrical characteristics of pCNTFET segment 1820-1 of aCNTFET electrical characteristic 1820. The $I_{DS}$ current flow in pCNTFET segment 1820-2 is referred to as $I_{DSp}$. The threshold voltage $|V_{TP}|$ for pCNTFET segment 1820-2 is approximately 2.5 volts, as defined by intersection 1840 of current onset value 1830 and pCNTFET segment 1820-2. However, the gate voltage $V_{GATE}$ shown in FIG. 18 is applied with respect to the p-type drain, while the p-type source is held at 1.5 volts because $V_{DS}$ is held at 1.5 volts. Therefore, the threshold voltage $|V_{TP}|$ for pCNTFET segment 1820-2 is $|V_{TP}|'+1.5$ V, or $|V_{TP}|=4$ V, where $|V_{TP}|'$ refers to the intersection of pCNTFET segment 1820-2 and current onset value 1830. The current flow $I_{DSp}=1$ µA at $|V_{GATE}|=7.5$ V as indicated by the intersection 1852 between the 1 µA reference line and pCNTFET segment 1820-2. However, since $V_{DS}$ is held at 1.5 volts, the gate voltage $|V_{GATE}|$ applied to the pCNTFET segment 1820-2 relative to the pCNTFET device source is effectively $|V_{GATE}|=7.5+1.5=9$ V.

As described further above, the relationship between gate voltage, drain-to-source voltage, and threshold voltage, and drain-to-source current for a pCNTFET can be given by equation 12.11 as follows:

$$I_{DSp}=[(W_P/L_P) \cdot NTFC_P \cdot (2\pi \in_R \in_0/\ln(2t_G/R_{NT}))] \cdot [(V_{GS}-|V_{TP}|)V_{DS}-V^2_{DS}/2] \quad [EQ\ 12.11]$$

where $t_G$ is the gate-NT fabric distance, $R_{NT}$=CNT radius=$d_{NT}/2$, $d_{NT}$ is NT diameter, $\in_R$=relative dielectric constant of gate insulator, $\in_0=8.85 \times 10^{-14}$ F/cm permittivity of free space, $L_P$=NT fabric length between source & drain regions, $W_P$=fabric width between source & drain regions, and $NTFC_P$=nanotube fabric constant in cm/V·s as.

Therefore, the nanotube fabric constant $NTFC_P$ may be given using equation 12.13 as follows:

$$NTFC_P=(L_P/W_P) \cdot I_{DS}/[(2\pi \in_R \in_0/\ln(2t_G/R_{NT})) \cdot ((V_{GS}-|V_{TP}|)V_{DS}-V^2_{DS}/2)], \quad [EQ\ 12.13]$$

where
$T_G=20$ nm; $I_{DS}=1$ µA;
$D_{NT}=1$ nm; $|V_{TP}|=4$ V;
$E_R=1$; $|V_{GS}|=9$ V;
$E_0=8.85 \times 10^{-14}$ F/cm; $V_{DS}=1.5$ V;
$L_P=0.2$ µm;
$W_P=0.4$ µm.
Thus, $$NTFC_P=(0.2/0.4) \cdot 1 \times 10^{-6}/[(2\pi 1 \cdot 8.85 \times 10^{-14}/\ln(2 \times 20/0.5)) \cdot ((9-4)1.5-(1.5)^2/2)],$$

And $$NTFC_P=6.2 \times 10^5 \text{ cm/V} \cdot \text{s}. \quad [EQ\ 12.24]$$

The value of $NTFC_P$ includes contact resistance between electrodes and the NT fabric at both drain-source and source-drain terminals in series with the NT fabric channel resistance; therefore, $NTFC_P$ in just the channel region is a larger value.

The ratio $NTFC_N/NTFC_P=1.94$. Therefore, the approximate value $$NTFC_N/NTFC_P=2 \quad [EQ\ 12.25]$$

is used further above when calculating a corresponding value of $NTFC_N$ as shown by equation 12.15.

aCNTFET-Based CNT ESD Protect Circuits, Placement, and Wiring, with Respect to Chip Pads and Protected Circuits aCNTFET diodes may be formed using aCNTFET devices by connecting the gate to one of the source or drain contacts. The aCNTFET diodes have the ability to conduct current independent of the polarity of the applied voltage and corresponding current flow direction because the aCNTFET diodes exhibit both nCNTFET and pCNTFET modes of operation in the same device. The ability of aCNTFET diodes to respond to positive or negative electrostatic voltage polarities enables just one electrostatic protective aCNTFET diode per pad instead of two pCNTFETdiodes per pad; two nCNTFET diodes per pad; or a pair of pCNTFET and nCNTFET diodes per pad. The aCNTFET diodes exhibit both nCNTFET and pCNTFET modes of operation in the same device because of corresponding n-type and p-type segments of the aCNTFET diode electrical characteristic as illustrated by measured aCNTFET device electrical characteristic 1800 in FIG. 18, and as also described further below.

In scaled aCNTFET devices and corresponding aCNTFET diodes formed from these devices, threshold voltages $V_{TN}$ and $|V_{TP}|$ for p-type and n-type segments may be set based on the aCNTFET diode placement between signal pads and a shared ground bus, or between signal pads and a shared power supply bus, and also on whether the gate terminal of the corresponding aCNTFET device is connected to a signal pad or to one of the shared ground or power supply buses as described further below. For aCNTFET diode placement and gate connections such that the nCNTFET segment of the corresponding aCNTFET diode could be activated when power supply $V_{DD}$ and ground are applied during normal chip operation, the nCNTFET segment electrical characteristic is set such that $V_{TN}=V_{DD}+\delta V$; and since the pCNTFET segment cannot be activated, then $|V_{TP}|$ may be set to a low threshold voltage value, $|V_{TP}|=0.5$ volts for example. For aCNTFET diode placement and gate connections such that the pCNTFET segment of the corresponding aCNTFET diode could be activated when power supply $V_{DD}$ and ground are applied during normal chip operation, the pCNTFET segment electrical characteristic is set such that $|V_{TP}|=V_{DD}+\delta V$; and since the nCNTFET segment cannot be activated, then $V_{TN}$ may be set to a low threshold voltage value, $V_{TN}=0.5$ volts for example. The threshold voltage $V_{TN}$ and $|V_{TP}|$ are set based on aCNTFET diode placement and gate connection because the aCNTFET diode is designed not to conduct current during normal chip operation, that is when signals swing between power supply $V_{DD}$ and ground. aCNTFET diodes are designed to only conduct when an ESD event occurs, such as described further above with respect to electrostatic discharge circuit HBM 105 illustrated in prior art FIGS. 1A and 1B.

In examples 1, 2, 3, and 4 described further below, the aCNTFET diodes have two sets of $V_{TN}$ and $|V_{TP}|$ values that are selected based on aCNTFET diode placement. The threshold voltages $V_{TN}$ and $|V_{TP}|$, corresponding to the n-type and p-type segments of the aCNTFET diodes electrical characteristics, respectively, are selected to ensure that the aCNTFET diodes do not conduct current during normal operation. In examples 1 and 2 aCNTFET diodes are designed with $V_{TN}=V_{DD}+\delta V$ and $|V_{TP}|=0.5$ volts. In example 1, an aCNTFET diode has a first source/drain contact forming a first aCNTFET diode terminal electrically connected to a signal pad and a second source/drain contact and a gate forming a second terminal electrically connected to a shared power supply bus. In example 2, an aCNTFET diode has a first source/drain contact forming a first aCNTFET diode terminal electrically connected to a shared ground bus and a second source/drain contact and a gate forming a second terminal electrically connected to a signal pad. In examples 3 and 4 aCNTFET diodes are designed with $|V_{TP}|=V_{DD}+\delta V$ and $V_{TN}=0.5$ volts. In example 3, an aCNTFET diode has a first source/drain contact forming a first aCNTFET diode terminal electrically connected to a signal pad and a second source/drain contact and a gate forming a second terminal electrically connected to a shared ground bus. In example 4, an aCNTFET diode has a first source/drain contact forming a first aCNTFET diode terminal electrically connected to a shared power supply bus and a second source/drain contact and a gate forming a second terminal electrically connected to a signal pad. The electrical characteristics of aCNTFET diodes corresponding to examples 1, 2, 3, and 4 are described further below and summarized in table 3500 in FIG. 35.

The aCNTFET diodes illustrated in schematic representations for examples 1, 2, 3, and 4 can have layout configurations that generally correspond to the layout configuration of the exemplary CNTFET device illustrated in plan view 1000 shown in FIG. 10A and cross section 1050 shown in FIG. 10B. The aCNTFET diode can have a gate conductor whose location corresponds to gate conductor 1060 of the exemplary CNTFET device, a source/drain conductor whose location corresponds to source conductor 1056 of the exemplary CNTFET device, and a source/drain conductor whose location corresponds to drain conductor 1062 of the exemplary CNTFET device. The aCNTFET diode can also have layout configurations where various combinations of gate conductors are located above or below the CNT fabric and source/drain conductors are located above or below the CNT fabric. The aCNTFET diodes use a CNTFET technology with minimum dimensions F=0.05 um and have a high relative gate insulator constant of $\in_R$=25, a channel length L=0.05 um, and a channel width W that is adjusted so as to prevent an ESD-driven voltage and current surge from exceeding a maximum allowed value. The physical characteristics of aCNTFET diodes corresponding to examples 1, 2, 3, and 4 are described further below and summarized in table 3500 in FIG. 35.

Example #1

Figure 19:
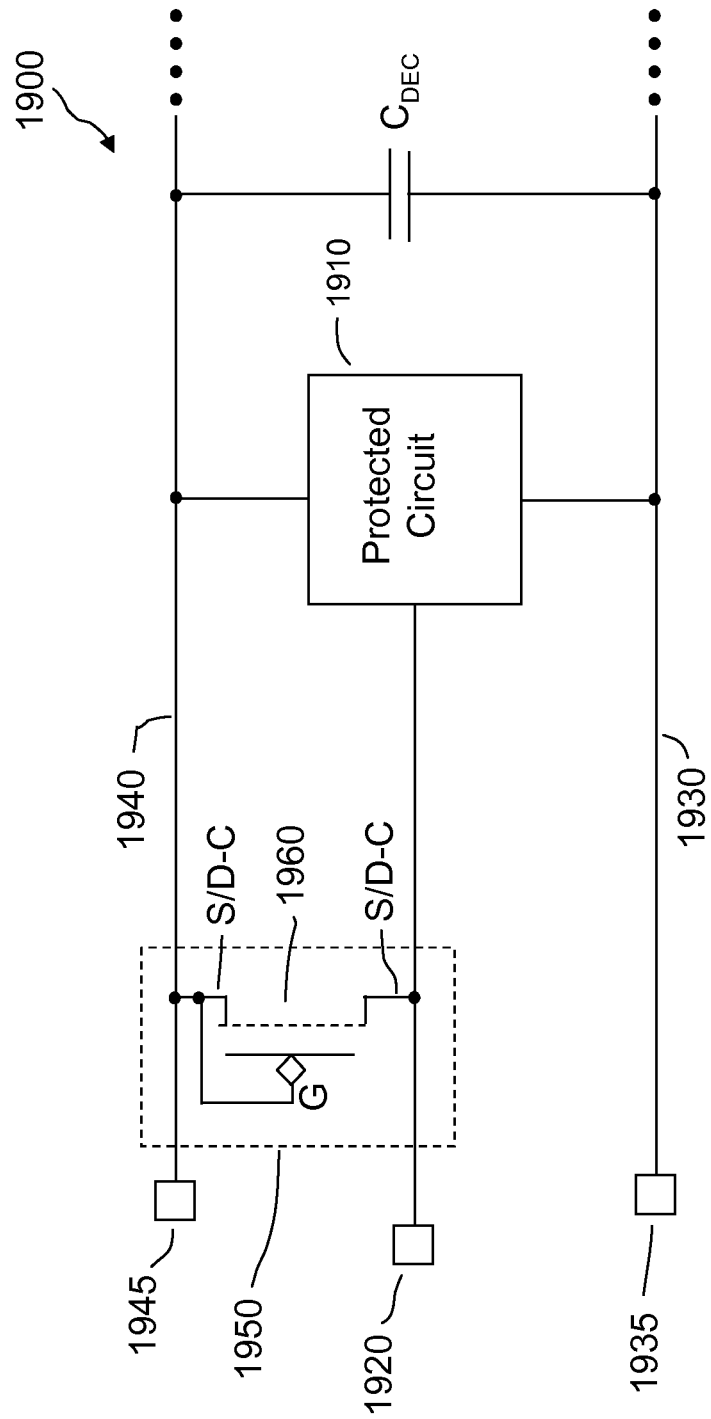
FIG. 19 illustrates a schematic representation of a nanotube ESD protect circuit approach showing a signal pad, shared power supply bus, decoupling capacitor, shared ground bus, and where the nanotube ESD protect circuit is formed by one aCNTFET diode placed between a signal pad and the shared power supply bus, with the gate connected to the power supply bus.

Schematic Representation of aCNTFET Diode Between a Signal Pad and a Shared Power Supply Bus, with aCNTFET Diode Gate Connected to the Shared Power Supply Bus FIG. 19 illustrates a CNT ESD protection approach schematic 1900 showing a protected circuit 1910 electrically connected to a signal pad 1920, a shared ground bus 1930, and a shared power supply bus 1940, a CNT ESD protect circuit 1950 electrically connected to the signal pad 1920 and the shared power supply bus 1940, and a decoupling capacitor $C_{DEC}$ electrically connected to the shared ground bus 1930 and the shared power supply bus 1940. The shared ground bus 1930 is electrically connected to a ground pad 1935, the shared power supply bus 1940 is electrically connected to a power supply pad 1945, and other circuits (not shown) can be electrically connected to the shared ground bus 1930 and the shared power supply bus 1940. The CNT ESD protect circuit 1950 is formed using one ambipolar CNTFET (aCNTFET) device, with a gate G electrically connected to a first S/D-C contact, the first S/D-C contact electrically connected to the shared power supply bus 1940, and a second S/D-C contact electrically connected to the signal pad 1920, to form a two-terminal aCNTFET diode 1960. The aCNTFET diode 1960 is designed to protect the protected circuit 1910 from damage due to an ESD event corresponding to electrostatic discharge from HBM 105 described with respect to prior art FIG. 1A and corresponding ESD current ($I_{ESD}$) 150 illustrated in prior art FIG. 1B. The placement and values of decoupling capacitor $C_{DEC}$ illustrated in FIG. 19 and plan view 2200-1 illustrated in FIG. 22 further below, corresponds to the placement and description of $C_{DEC}$ and current flow through $C_{DEC}$ during an ESD event as described further above with respect to FIGS. 2-7 and with respect to equations 2.1, 2.2, and 2.3.

Figure 20C:
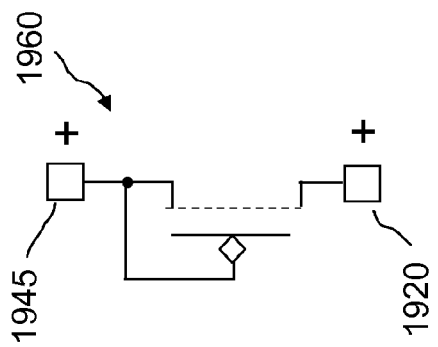
FIG. 20A-C illustrates a schematic representation of the aCNTFET diode of FIG. 19 when a chip is in an operating mode, and corresponding threshold voltage values for n-type and p-type operating modes, such that the aCNTFET diode is OFF during normal powered mode of operation.
Figure 20A:
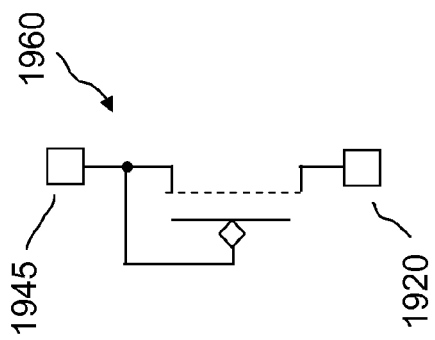
Figure 20B:
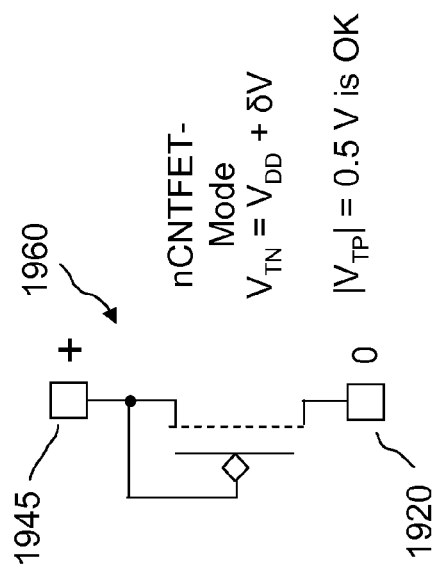
Figure 21:
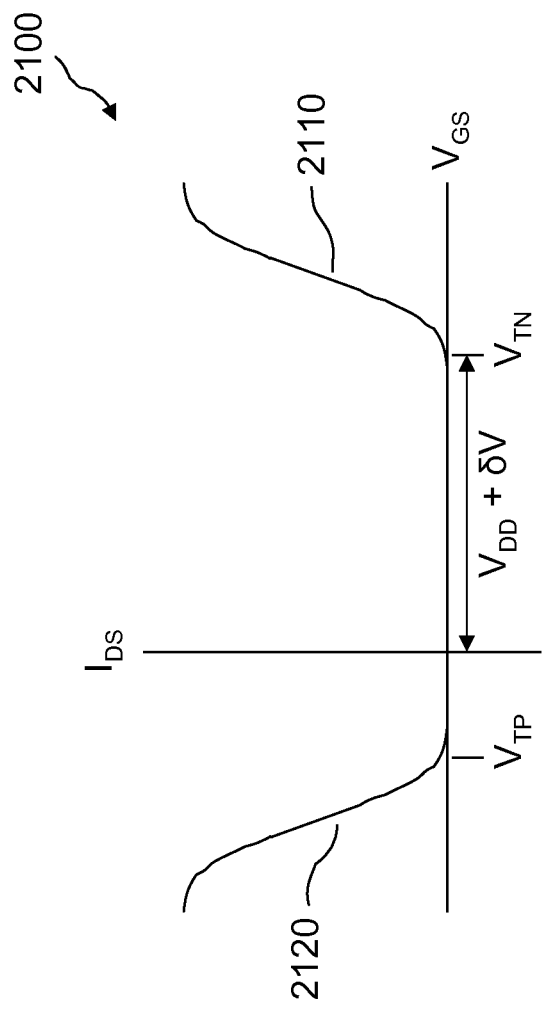
FIG. 21 illustrates an aCNTFET device characteristic having n-type and p-type operating modes corresponding to the aCNTFET diode of FIG. 20A-C.

In normal circuit operating mode, with circuit voltage swings between ground (GND; zero volts) and power supply ($V_{DD}$), aCNTFET diode 1960 used to form CNT ESD protect circuit 1950 should be in an OFF state. Referring to FIGS. 20A-C in this example, aCNTFET diode 1960 is designed such that no current flows as illustrated further below. Operating voltage $V_{DD}$=1.5 volts is present on shared power supply bus 1940 relative to shared ground bus 1930. $V_{DD}$ may be applied to power supply pad 1945 or may be generated on chip. Ground pad 1935 holds shared ground bus 1930 at GND (at zero volts). Signal pad 1920 swings between zero volts and $V_{DD}$ ($V_{DD}$=1.5 volts in this example). If signal pad 1920 is at ground (zero volts for example) and power supply pad 1945 is at a positive voltage $V_{DD}$ as shown in FIG. 20B, then aCNTFET diode 1960 conducts unless threshold voltage $V_{TN}$ is set such that $V_{TN}=V_{DD}+\delta V$ to ensure that the n-type conduction mode of aCNTFET diode 1960 remains in an OFF state during normal operation. In this example, $\delta V$=0.2 volts is chosen, which is more than 10% above the nominal $V_{DD}$ voltage of 1.5 volts, such that $V_{TN}$=1.7 volts. If signal pad 1920 is at 1.5 volts as illustrated in FIG. 20C, then no current flows during normal operation since both power supply pad 1945 and signal pad 1920 are at 1.5 volts. The p-type conduction mode of aCNTFET is not activated in the configuration illustrated in FIG. 19 and $|V_{TP}|$ may be set at 0.5 volts. With $V_{TN}$=1.7 volts, and $|V_{TP}|$=0.5 volts, and aCNTFET diode 1960 connected as illustrated in FIG. 19, no current flows through aCNTFET diode 1960 during normal operation. FIG. 21 illustrates aCNTFET device electrical (transfer) characteristic 2100, with nCNTFET segment 2110 and pCNTFET segment 2120 having corresponding $V_{TN}$ and $|V_{TP}|$, respectively, used to form aCNTFET diode 1960. aCNTFET device electrical (transfer) characteristic 2100 may be formed by scaling aCNTFET devices using nanotube fabric constants $NTFC_N=12\times10^5$ and $NTFC_P=6\times10^5$ cm/V-s in equations 12.23 and 12.24, respectively, and as illustrated further below with respect to FIGS. 19-23.

In the presence of an ESD event caused by HBM 105, a maximum ESD current 150 of 1 Ampere flows between pads and through on-chip circuits if ESD protect circuits are not present. The design of CNT ESD protect circuit 1950, and corresponding aCNTFET diode 1960, prevents an ESD-driven voltage/current pulse from exceeding a maximum allowed voltage on the chip. With respect to schematic 1900 shown in FIG. 19, the operation of each device is explained with respect to ESD voltages applied between signal pad 1920 and ground pad 1935 connected to shared ground bus 1930 and between signal pad 1920 and power supply pad 1945 connected shared power supply bus 1940. Shared ground bus 1930 and shared power supply bus 1940 may be used as part of CNT ESD protect circuit conducting paths, and in the case of ESD voltage applied between signal pad 1920 and shared ground bus 1930, the ESD voltage is applied though decoupling capacitor $C_{DEC}$ and applied to shared power supply bus 1940, as described further above with respect to FIGS. 2-7 and with respect to equations 2.1, 2.2, and 2.3.

Figure 22A:
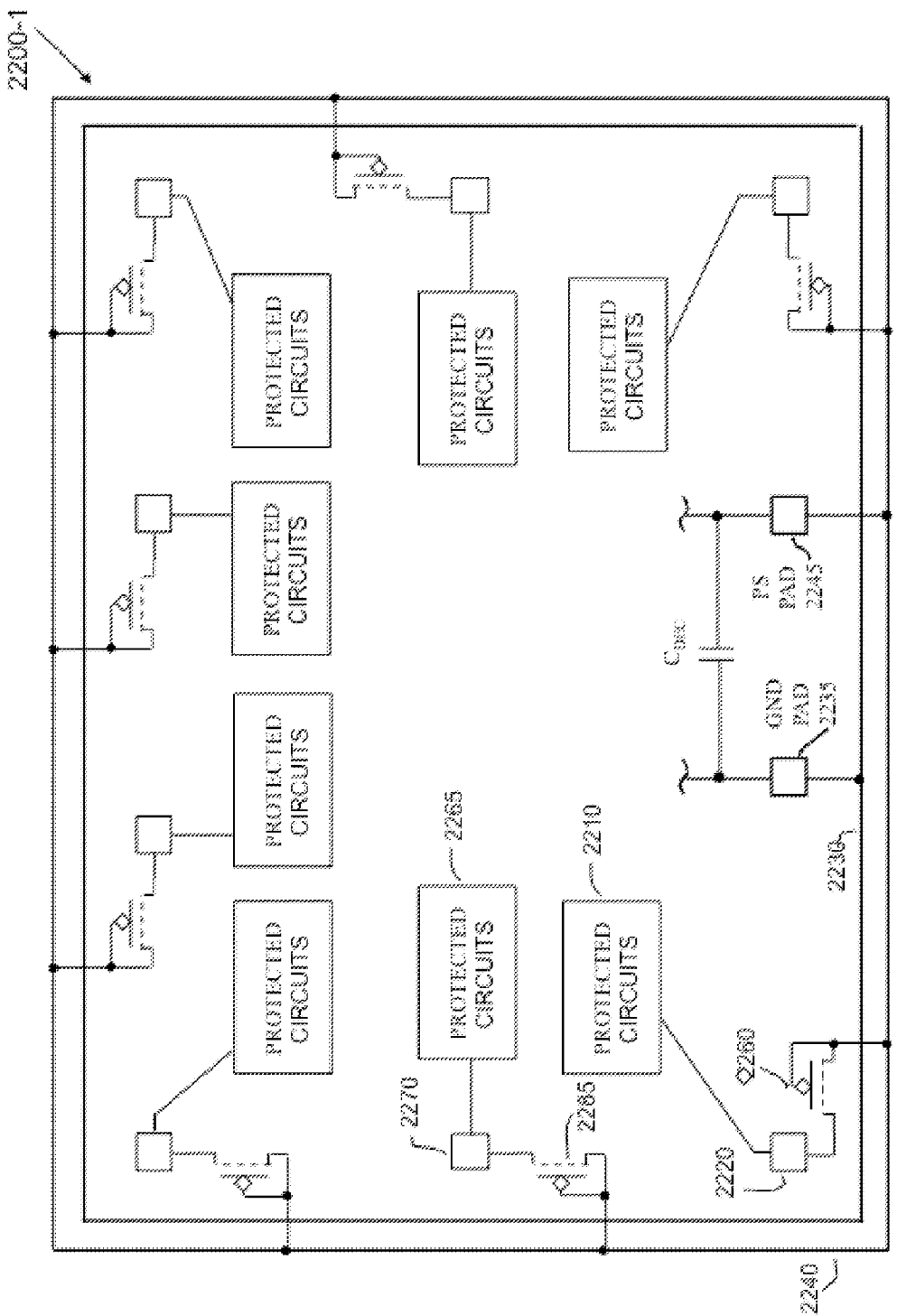
FIG. 22A illustrates a plan view of peripheral pad layouts of nanotube ESD protect circuits using an aCNTFET diode corresponding to the aCNTFET diode of FIG. 19.

During an ESD event, ESD voltage/current may also be applied between two signal pads, similar to pad 1920, as illustrated and described further below with respect to FIGS. 22 and 23. In this example, aCNTFET diode 2285 is connected between signal pad 2270 and shared power supply bus 2240, and aCNTFET diode 2260 is connected between signal pad 2220 and shared power supply bus 2240 as shown in FIGS. 22A-C. As described further below, ESD current 150 flows between two signal pads and flows through two aCNTFET devices in series, when an ESD voltage is applied across two signal pads.

Figure 22B:
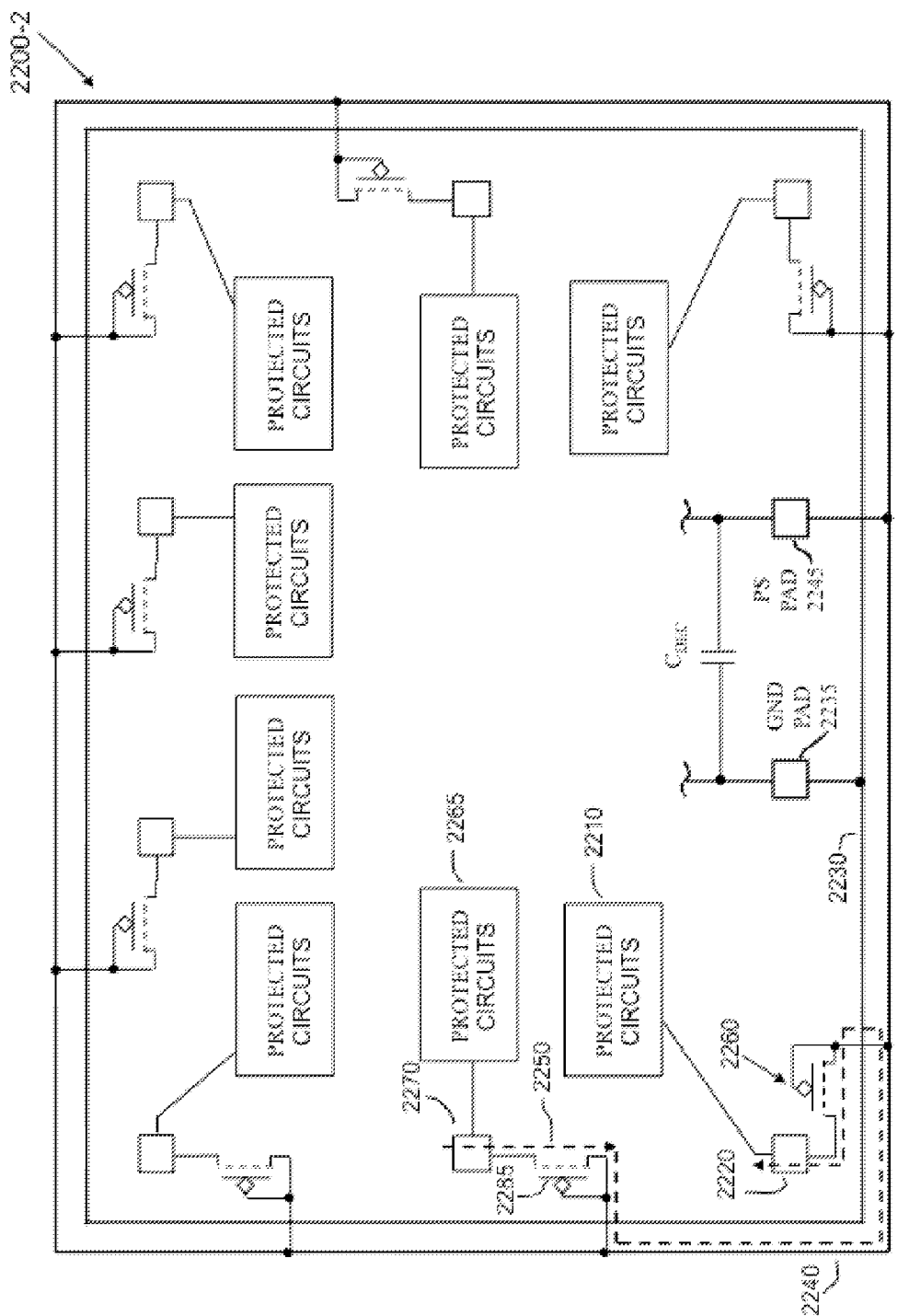
FIG. 22B illustrates the plan view of peripheral pad layouts of FIG. 22A showing ESD current flow for an ESD event of a first voltage polarity.

As illustrated by plan view 2200-2 in FIG. 22B, and also in FIG. 23B, a positive ESD voltage may be applied to signal pad 2270 relative to signal pad 2220. aCNTFET diode 2285 turns ON and conducts in a pCNTFET mode (with $|V_{TP}|=0.5$ volts), because signal pad 2270 connected to a first S/D-C contact is more positive than gate terminal G and a second S/D-C contact, both connected to shared power supply bus 2240. aCNTFET diode 2260 turns ON and conducts in an nCNTFET mode (with $V_{TN}=1.7$ volts), because signal pad 2220 connected to a first S/D-C contact that is more negative than gate terminal G and a second S/D-C contact, both connected to shared power supply bus 2240. ESD current ($I_{ESD}$) 2250, corresponding to ESD current 150 in prior art FIG. 1B, flows through both aCNTFET diodes in series. The width W of aCNTFET diode 2260 is calculated further below such that the ESD-induced voltage $V_{ESD}$ between signal pad 2220 and shared power supply bus 2240 is not greater than 4 volts. Width W is then used to calculate the ESD-induced voltage $V_{ESD}$ of aCNTFET diode 2285, as illustrated further below, to ensure that $V_{ESD}$ between signal pad 2270 and shared power supply bus 2240 is not greater than 4 volts. Therefore, ESD current 150 flowing between signal pads through two aCNTFET diodes in series results in an ESD-induced voltage $V_{ESD}$ between any signal pad and a shared power supply bus of less than or equal to 4 volts across or terminals of protected circuit 2210 and protected circuit 2265.

Figure 22C:
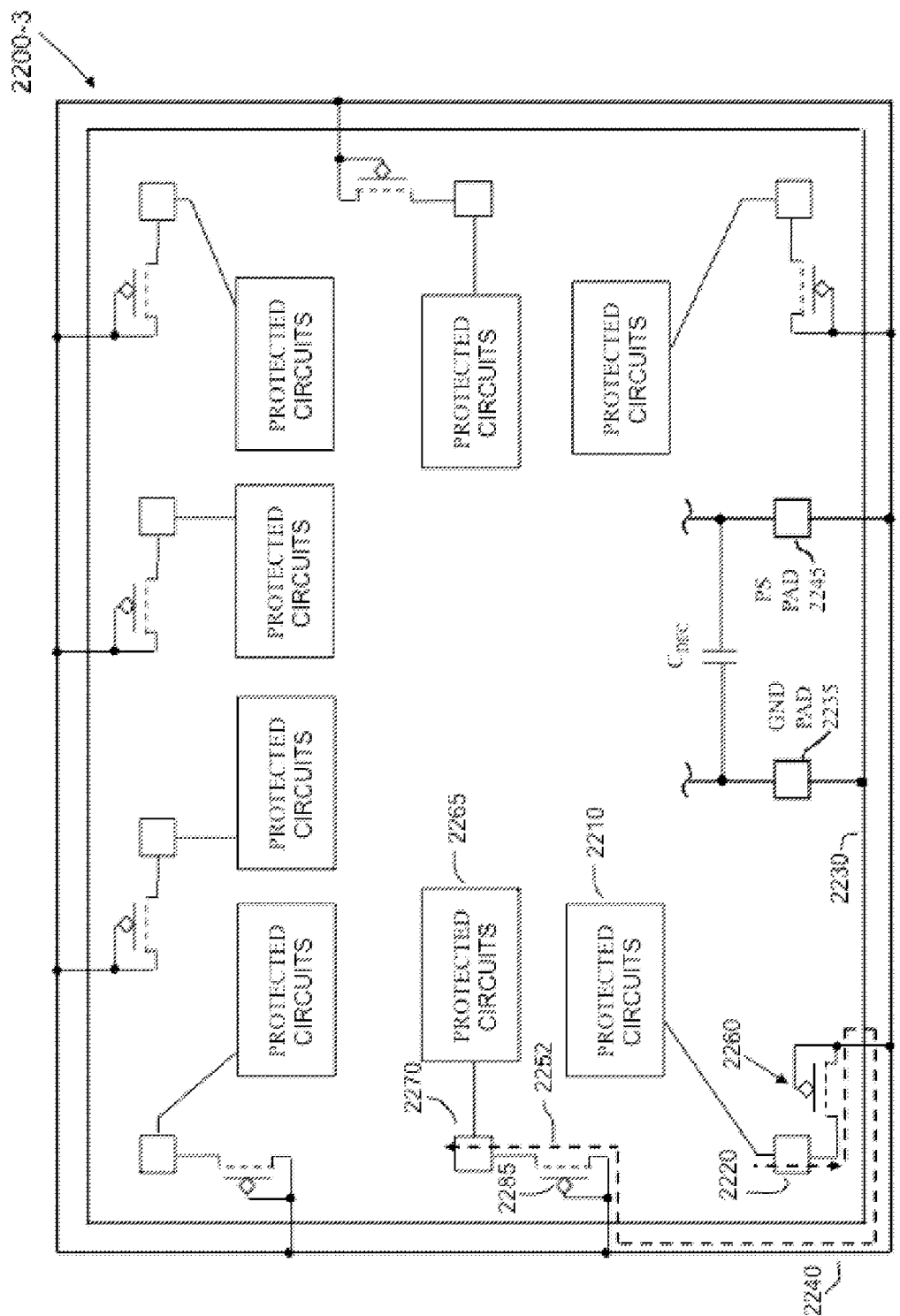
FIG. 22C illustrates the plan view of peripheral pad layouts of FIG. 22A showing ESD current flow for an ESD event of a second voltage polarity.

As illustrated by plan view 2200-3 in FIG. 22C, and also in FIG. 23C, a positive ESD voltage is applied to signal pad 2220 relative to signal pad 2270. aCNTFET diode 2260 turns ON and conducts in a pCNTFET mode (with $|V_{TP}|=0.5$ volts), because signal pad 2220 is connected to a first S/D-C contact that is more positive than gate terminal G and a second S/D-C contact, both connected to shared power supply bus 2240. aCNTFET diode 2285 turns ON and conducts in an nCNTFET mode (with $V_{TN}=1.7$ volts), because signal pad 2270 is connected to a first S/D-C contact that is more negative than gate terminal G and a second S/D-C contact, both connected to shared power supply bus 2240. ESD current ($I_{ESD}$) 2252, corresponding to ESD current 150 in prior art FIG. 1B, flows through both aCNTFET diodes in series. ESD current 2252 is in the opposite direction to ESD current 2250. The width W of aCNTFET diode 2285 is calculated further below such that the ESD-induced voltage $V_{ESD}$ between signal pad 2270 and shared power supply bus 2240 is not greater than 4 volts. Width W is then used to calculate the ESD-induced voltage $V_{ESD}$ of aCNTFET diode 2260, as illustrated further below, to ensure that $V_{ESD}$ between signal pad 2220 and shared power supply bus 2240 is not greater than 4 volts. Therefore, ESD current 150 flowing between signal pads through two aCNTFET diodes in series results in an ESD-induced voltage $V_{ESD}$ voltage between any signal pad and a shared power supply bus of less than or equal to 4 volts across terminals of protected circuit 2210 and protected circuit 2265.

Calculation of aCNTFET Diode Dimensions to Limit ESD Surge Voltage ($V_{ESD}$) for aCNTFET Diodes Connected Between a Signal Pad and a Shared Power Supply Bus The scaled (optimized) electrical (transfer) characteristic 2100 illustrated in FIG. 21 corresponds to an aCNTFET device corresponding to plan view 1000 and cross section 1050 described further above with respect to FIGS. 10A and 10B, respectively, formed on a CNT fabric with nanotube fabric constants $NTFC_N=12\times10^5$ and $NTFC_P=6\times10^5$ cm/V-s given by equations 12.23 and 12.24, respectively, a gate insulator of thickness $t_G=7$ nm and relative dielectric constant $\in_R=25$, a channel L=0.05 um, and semiconducting single wall nanotubes (s-SWNT) of diameter $d_{NT}=1$ nm. aCNTFET diodes are formed by connecting the gate G of aCNTFET devices to one S/D-C forming a source or drain as illustrated in FIGS. 19, 20, 22, and 23.

Unique to two-terminal aCNTFET diodes formed using aCNTFET devices, is that aCNTFET diodes are bidirectional. That is, current may flow in one direction or in the opposite direction, using a single discharge path, and corresponding voltages may be of positive or negative polarity. Referring to FIG. 23 to illustrate aCNTFET diode bidirectional operation, when ESD current ($I_{ESD}$) 2250, equal to ESD current 150 illustrated in prior art FIG. 1B, flows from signal pad 2270 to signal pad 2220 as illustrated in FIG. 23B, aCNTFET diode 2285 operates in a pCNTFET mode corresponding to pCNTFET segment 2120 illustrated in FIG. 21, and aCNTFET diode 2260 operates in an nCNTFET mode corresponding to nCNTFET segment 2110. However, when ESD current ($I_{ESD}$) 2252, equal to ESD current 150, flows from signal pad 2220 to signal pad 2270 as illustrated in FIG. 23C, aCNTFET diode 2285 operates in an nCNTFET mode corresponding to nCNTFET segment 2110, and aCNTFET diode 2260 operates in a pCNTFET mode corresponding to pCNTFET segment 2120 shown in FIG. 21.

aCNTFET diode dimensions needed to limit ESD surge voltage $V_{ESD}$ to 4 volts may be calculated as follows, beginning with $I_{SD}$ equation 12.10 for a CNTFET device, $$I_{DS}=[(W/L)\cdot NTFC\cdot(2\pi\in_R\in_0/\ln(2t_G/R_{NT}))]\cdot[(V_{GS}-V_T)V_{DS}-V_{DS}^2/2] \quad [EQ\ 12.10]$$

and connecting the gate terminal to one of the source or drain contacts to form a two-terminal aCNTFET diode such that $V_{GS}=V_{DS}$. As described further above with respect to Eq. 12.18 and Eq. 12.20, when $V_{GS}=V_{DS}$, then $V_{DS}>=V_{GS}-V_T$ and when $V_{GS}>=V_T$, CNTFET diodes, in this case aCNTFET diodes, operate in the saturation region. The maximum current $I_{DS}$ is determined by substituting $V_{DS}=V_{DS,sat}=V_{GS}-V_T$ in Eq. 12.10. Using the ratio β=W/L, equation 12.10 may rewritten as:

$$I_{DS}=[((\beta/2)\cdot NTFC\cdot(2\pi\in_R\in_0/\ln(2t_G/R_{NT}))]\cdot(V_{GS}-V_T)^2 \quad [EQ\ 23.1]$$

$V_{ESD}$ voltage surge calculation between two signal pads. At the peak of the ESD current surge, 1 Ampere flows between two signal pads 2220 and 2270 illustrated in FIG. 23. The rise in voltage between each of the signal pads and the shared power supply bus may be calculated for the two polarities of the $V_{ESD}$ voltage surge. This calculation applies to both voltage polarities and corresponding current flow directions illustrated in FIG. 23.

During an ESD-discharge by a circuit corresponding to HBM 105 in prior art FIG. 1A and corresponding ESD current 150 illustrated in prior art FIG. 1B, each of the aCNTFET diodes 2285 and 2260 turn ON, and each exhibits either nCNTFET and pCNTFET modes of operation depending on the polarity of applied voltages between signal pads 2220 and 2270 and corresponding ESD current flow as illustrated in FIG. 23. However, the nCNTFET mode results in a higher $V_{ESD}$ voltage drop because $V_{TN}$ has been set at 1.7 volts to prevent current flow during normal operation. $\beta_N$ for nCNTFET segment 2110 may be calculated such that the maximum surge voltage between a signal pad and the shared power supply bus is not more than 4 volts. When the pCNTFET mode corresponding to pCNTFET segment 2120 is activated, $\beta_P=\beta_N$ is used since aCNTFET diode dimensions are the same for both p-type and n-type operating modes. The maximum voltage across the two terminal aCNTFET-based protective when operating in the pCNTFET mode is calculated to verify that the $V_{ESD}$ voltage drop does not exceed 4 volts as illustrated further below. $V_{DS}=V_{GS}$ and the aCNTFET diode operates in the saturation region as described further above.

$$I_{DSn}=[(\beta_N/2)\cdot NTFC_N\cdot(2\pi\varepsilon_R\varepsilon_0/\ln(2t_G/R_{NT}))]\cdot(V_{GS}-V_{TN})^2 \quad [EQ\ 23.2]$$

Since the maximum ESD current $I_{ESD}=1$ Ampere as illustrated by ESD current 150, then:

$$I_{DSn\text{-}MAX}=1=[0.5\cdot\beta_N\cdot 12\times 10^5\cdot(2\times 3.14\times 25\times 8.85\times 10^{-14}/\ln(2\times 7/0.5))]\cdot(4-1.7)^2$$

So that $$I_{DSn\text{-}MAX}=1=0.5\cdot\beta_N\cdot 12\times 10^5\cdot 417\times 10^{-14}\cdot 5.29,$$

And $\beta_N=W_N/L_N=75,500; W_N=3,775$ um for $L_N=0.05$ um

At this point in the ESD voltage surge calculation, a value of W has been calculated which corresponds to a maximum of 4 volts between a first signal pad and a shared power supply bus, based on ESD voltage $V_{ESD}$ across an aCNTFET diode operating in an nCNTFET mode corresponding to nCNTFET segment 2110 illustrated in FIG. 21. Next, this value of W may be used to calculate the ESD voltage $V_{ESD}$ across a second signal pad and a shared power supply bus, based on ESD voltage $V_{ESD}$ across an aCNTFET diode operating in a pCNTFET mode corresponding to pCNTFET segment 2120 shown in FIG. 21.

aCNTFET diodes have of the same dimensions for both pCNTFET and nCNTFET operating modes. Therefore, $$\beta_P=\beta_N=\beta=75,500, L_P=L_N=L=0.05\ \text{um, and}\ W_P=W_N=W=3,775\ \text{um}$$

When aCNTFET diodes operate in a pCNTFET mode, in the saturation region, $$I_{DSp}=[(\beta_P/2)\cdot NTFC_P\cdot(2\pi\varepsilon_R\varepsilon_0/\ln(2t_G/R_{NT}))]\cdot(V_{GS}-|V_{TP}|)^2 \quad [EQ\ 23.3]$$

The maximum $V_{DS}$ resulting from an ESD event may be calculated as follows:

$$I_{DSp\text{-}MAX}=1=[0.5\cdot\beta_P\cdot 6\times 10^5\cdot(2\times 3.14\times 25\times 8.85\times 10^{-14}/\ln(2\times 7/0.5))]\cdot(V_{GS}-0.5)^2$$

$$I_{DSp\text{-}MAX}=1=[0.5\cdot\beta_P\cdot 6\times 10^5\cdot(2\times 3.14\times 25\times 8.85\times 10^{-14}/\ln(2\times 7/0.5))]\cdot(V_{GS}-0.5)^2$$

$$1=[0.5\cdot 75,500\cdot 6\times 10^5\cdot 417\times 10^{-14}]\cdot(V_{GS}-0.5)^2$$

$$(V_{GS}-0.5)^2=10.6 \quad [EQ\ 23.4]$$

$$V_{GS}-0.5=3.26$$

$$V_{GS}=V_{DS}=3.76\ \text{volts} \quad [EQ\ 23.5]$$

As explained further above, $V_{GS}=V_{DS}$ because gate and source are electrically connected. Therefore, $V_{GS}$ and $V_{DS}$ have the same value for CNTFET diodes. The current flow $I_{DS}$ in the saturation region is determined by the lower value $V_{DS,sat}=V_{GS}-V_T$ at the onset of saturation. Since aCNTFET diodes 2285 and 2260 illustrated in FIG. 23 must accommodate both ESD voltage polarities and corresponding ESD current directions illustrated in FIG. 23, W=3,775 um and L=0.05 um dimensions may be used for both aCNTFET diodes 2285 and 2260. The maximum voltage $V_{DS}$, which is the same as $V_{GS}$, across two terminal aCNTFET diodes is 4 volts when operating in an nCNTFET mode and $V_{DS}=3.76$ volts when operating in a pCNTFET mode.

$V_{ESD}$ voltage surge calculation between a signal pad and a voltage pad. In this example, an ESD source such as HBM 150 is applied across an aCNTFET diode such as aCNTFET diodes 2260 or 2285 illustrated in FIG. 22A, for example, having a channel width W=3,775 um and a channel length L=0.05 um so the width-to-length ratio $\beta=75,500$ as calculated further above in equations 23.1-23.5 corresponding to FIG. 23.

In a first calculation, ESD voltage $V_{ESD}$ is positive on a power supply pad with respect to a signal pad. For example, power supply pad 2245 is positive with respect to signal pad 2220 illustrated in FIG. 22A and an ESD current $I_{ESD}$ flows through aCNTFET diode 2260 between power supply pad 2245 and signal pad 2220.

The value of $V_{DS}$ resulting from the ESD event may be calculated using equation 23.2 because aCNTFET diode 2260 responds in an nCNTFET diode mode corresponding to nCNTFET segment 2110 illustrated in FIG. 21.

$$I_{DSn}=[(\beta_N/2)\cdot NTFC_N\cdot(2\pi\varepsilon_R\varepsilon_0/\ln(2t_G/R_{NT}))]\cdot(V_{GS}-V_{TN})^2 \quad [EQ\ 23.2]$$

$$I_{DSn\text{-}MAX}=1=[0.5\cdot 75,500\cdot 12\times 10^5\cdot(2\times 3.14\times 25\times 8.85\times 10^{-14}/\ln(2\times 7/0.5))]\cdot(V_{GS}-1.7)^2$$

$$I_{DSn\text{-}MAX}=1=[0.5\cdot 75,500\cdot 12\times 10^5\cdot 417\times 10^{-14}]\cdot(V_{GS}-1.7)^2$$

$$(V_{GS}-1.7)^2=5.26 \quad [EQ\ 23.6]$$

$$V_{GS}-1.7=2.3$$

$$V_{GS}=V_{DS}=4\ \text{volts} \quad [EQ\ 23.7]$$

Thus, the maximum voltage across the two terminal aCNTFET-based protective device between a signal pad and the power supply pad operating in the nCNTFET mode is $V_{DS}=4$ volts when the ESD voltage results in a positive voltage to the power supply pad with respect to the signal pad. This voltage also appears across the corresponding protected circuit or circuits.

In a second calculation, ESD voltage $V_{ESD}$ is positive on a signal pad with respect to a power supply pad. For example, signal pad 2220 is positive with respect to power supply pad 2245 illustrated in FIG. 22A and an ESD current $I_{ESD}$ flows through aCNTFET diode 2260 between signal pad 2220 and power supply pad 2245.

The value of $V_{DS}$ resulting from the ESD event may be calculated using equation 23.3 because aCNTFET diode 2260 responds in a pCNTFET diode mode corresponding to pCNTFET segment 2120 illustrated in FIG. 21.

$$I_{DSp}=[(\beta_P/2)\cdot NTFC_P\cdot(2\pi\epsilon_R\epsilon_0/\ln(2t_G/R_{NT}))]\cdot(V_{GS}-|V_{TP}|)^2 \quad [EQ\ 23.3]$$

$$I_{DSp-MAX}=1=[0.5\cdot 75{,}500\cdot 6\times 10^5\cdot(2\times 3.14\times 25\times 8.85\times 10^{-14}/\ln(2\times 7/0.5))]\cdot(V_{GS}-0.5)^2$$

$$I_{DSp-MAX}=1=[0.5\cdot 75{,}500\cdot 6\times 10^5\cdot 417\times 10^{-14}]\cdot(V_{GS}-0.5)^2$$

$$(V_{GS}-0.5)^2=10.57 \quad [EQ\ 23.8]$$

$$V_{GS}-0.5=3.25$$

$$V_{GS}=V_{DS}=3.75\ \text{volts} \quad [EQ\ 23.9]$$

Thus, the maximum voltage across the two terminal aCNTFET-based protective device between a signal pad and the power supply pad (bus) operating in the pCNTFET mode is $V_{DS}=3.75$ volts when the ESD voltage results in a positive voltage to the signal pad with respect to the power supply pad. This voltage also appears across the corresponding protected circuit or circuits.

$V_{ESD}$ voltage surge calculation between a signal pad and a ground pad. In this example, an ESD source such as HBM 150 is applied between a ground pad, such as ground pad 2235, and a signal pad, such as signal pad 2220 illustrated in FIG. 22A. The electrostatic voltage $V_{ESD}$ is applied across decoupling capacitor $C_{DEC}$ and an aCNTFET diode such as aCNTFET diode 2260 illustrated in FIG. 22A, for example. Since there is a relatively small voltage drop across $C_{DEC}$ during an ESD event as illustrated above with respect to equations 2.1, 2.2, and 2.3, the resulting ESD voltage $V_{ESD}$ appears on shared power supply bus 2240, and then across aCNTFET diodes such as aCNTFET diode 2260 connected between shared power supply bus 2240 and signal pad 2220. The voltage drops across aCNTFET diode 2260 during an ESD event is the same as shown further above with respect to $V_{ESD}$ applied between a signal pad and power supply pad.

Example #2

Figure 24A:
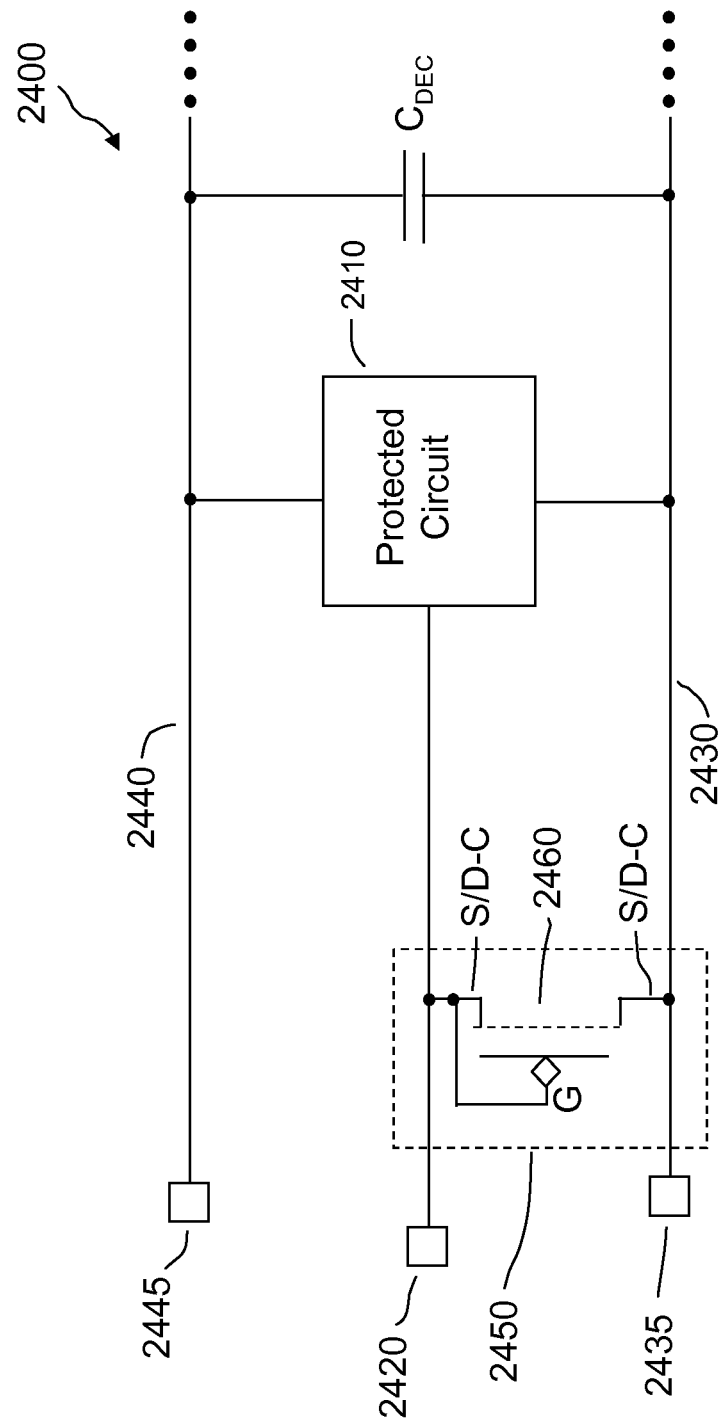
FIG. 24A illustrates a schematic representation of a nanotube ESD protect circuit approach showing a signal pad, shared power supply bus, decoupling capacitor, shared ground bus, and where the nanotube ESD protect circuit is formed by one aCNTFET diode placed between a signal pad and the shared ground bus, with the gate connected to the signal pad.

Schematic Representation of aCNTFET Diode Between a Signal Pad and a Shared Ground Bus, with aCNTFET Diode Gate Connected to the Signal Pad FIG. 24A illustrates a CNT ESD protection approach schematic 2400 showing a protected circuit 2410 electrically connected to a signal pad 2420, a shared ground bus 2430, and a shared power supply bus 2440, a CNT ESD protect circuit 2450 electrically connected to the signal pad 2420 and the shared ground bus 2430, and a decoupling capacitor $C_{DEC}$ electrically connected to the shared ground bus 2430 and the shared power supply bus 2440. The shared ground bus 2430 is electrically connected to a ground pad 2435, the shared power supply bus 2440 is electrically connected to a power supply pad 2445, and other circuits (not shown) can be electrically connected to the shared ground bus 2430 and the shared power supply bus 2440. The CNT ESD protect circuit 2450 is formed using one ambipolar CNTFET (aCNTFET) device, with a gate G electrically connected to a first S/D-C contact, the first S/D-C contact electrically connected to the signal pad 2420, and a second S/D-C contact electrically connected to the shared ground bus 2430, to form a two-terminal aCNT-FET diode 2460. The aCNTFET diode 2460 is designed to protect the protected circuit 2410 from damage due to an ESD event corresponding to electrostatic discharge from HBM 105 described with respect to prior art FIG. 1A and corresponding ESD current ($I_{ESD}$) 150 illustrated in prior art FIG. 1B. The placement and values of decoupling capacitor $C_{DEC}$ illustrated in FIG. 24A and plan view 2500-1 illustrated in FIG. 25A further below, corresponds to the placement and description of $C_{DEC}$ and current flow through $C_{DEC}$ during an ESD event as described further above with respect to FIGS. 2-7 and with respect to equations 2.1, 2.2, and 2.3.

In normal circuit operating mode, with circuit voltage swings between ground (GND; zero volts) and power supply ($V_{DD}$), aCNTFET diode 2460 used to form CNT ESD protect circuit 2450 should be in an OFF state. Referring to FIGS. 24B1, 24B2, and 24B3 in this example, aCNTFET diode 2460 is designed such that no current flows as illustrated further below. Operating voltage $V_{DD}=1.5$ volts is present on shared power supply bus 2440 relative to shared ground bus 2430. $V_{DD}$ may be applied to power supply pad 2445 or may be generated on chip. Ground pad 2435 holds shared ground bus 2430 at GND (at zero volts). Signal pad 2420 swings between zero volts and $V_{DD}$ ($V_{DD}=1.5$ volts in this example). If signal pad 2420 is at a positive voltage $V_{DD}$ and ground pad 2435 is at ground (zero volts) as shown in FIG. 24B2, then aCNTFET diode 2460 conducts unless threshold voltage $V_{TN}$ is set such that $V_{TN}=V_{DD}+\delta V$ to ensure that the n-type conduction mode of aCNTFET diode 2460 remains in an OFF state during normal operation. In this example, $\delta V=0.2$ volts is chosen, which is more than 10% above the nominal $V_{DD}$ voltage of 1.5 volts, such that $V_{TN}=1.7$ volts. If signal pad 2420 is at 0 volts as illustrated in FIG. 24B3, then no current flows during normal operation since both ground pad 2435 and signal pad 2420 are at 0 volts. The p-type conduction mode of aCNTFET diode 2460 is not activated in the configuration illustrated in FIG. 24B3 and $|V_{TP}|$ may be set at 0.5 volts. With $V_{TN}=1.7$ volts, and $|V_{TP}|=0.5$ volts, and aCNTFET diode 2460 connected as illustrated in FIG. 24A, no current flows through aCNTFET diode 2460 during normal operation. FIG. 21 illustrates aCNTFET device electrical (transfer) characteristic 2100, with nCNTFET segment 2110 and pCNTFET segment 2120 having corresponding $V_{TN}$ and $|V_{TP}|$, respectively, used to form aCNTFET diode 2460. aCNTFET device electrical (transfer) characteristic 2100 may be formed by scaling aCNTFET devices using nanotube fabric constants $NTFC_N=12\times 10^5$ and $NTFC_P=6\times 10^5$ cm/V-s in equations 12.23 and 12.24, respectively, and as illustrated further below with respect to FIGS. 25 and 26.

In the presence of an ESD event caused by HBM 105, a maximum ESD current 150 of 1 Ampere flows between pads and through on-chip circuits if ESD protect circuits are not present. The design of CNT ESD protect circuit 2450, and corresponding aCNTFET diode 2460, prevents an ESD-driven voltage/current pulse from exceeding a maximum allowed voltage on the chip. With respect to schematic 2400 shown in FIG. 24A, the operation of each device is explained with respect to ESD voltages applied between signal pad 2420 and ground pad 2435 connected to shared ground bus 2430 and between signal pad 2420 and power supply pad 2445 connected to shared power supply bus 2440, respectively. Shared ground bus 2430 and shared power supply bus 2440 may be used as part of CNT ESD protect circuit conducting paths, and in the case of ESD voltage applied between signal pad 2420 and shared power supply bus 2440, the ESD voltage is applied though decoupling capacitor $C_{DEC}$ and applied to shared ground bus 2430, as described further above with respect to FIGS. 2-7 and with respect to equations 2.1, 2.2, and 2.3.

Figure 25A:
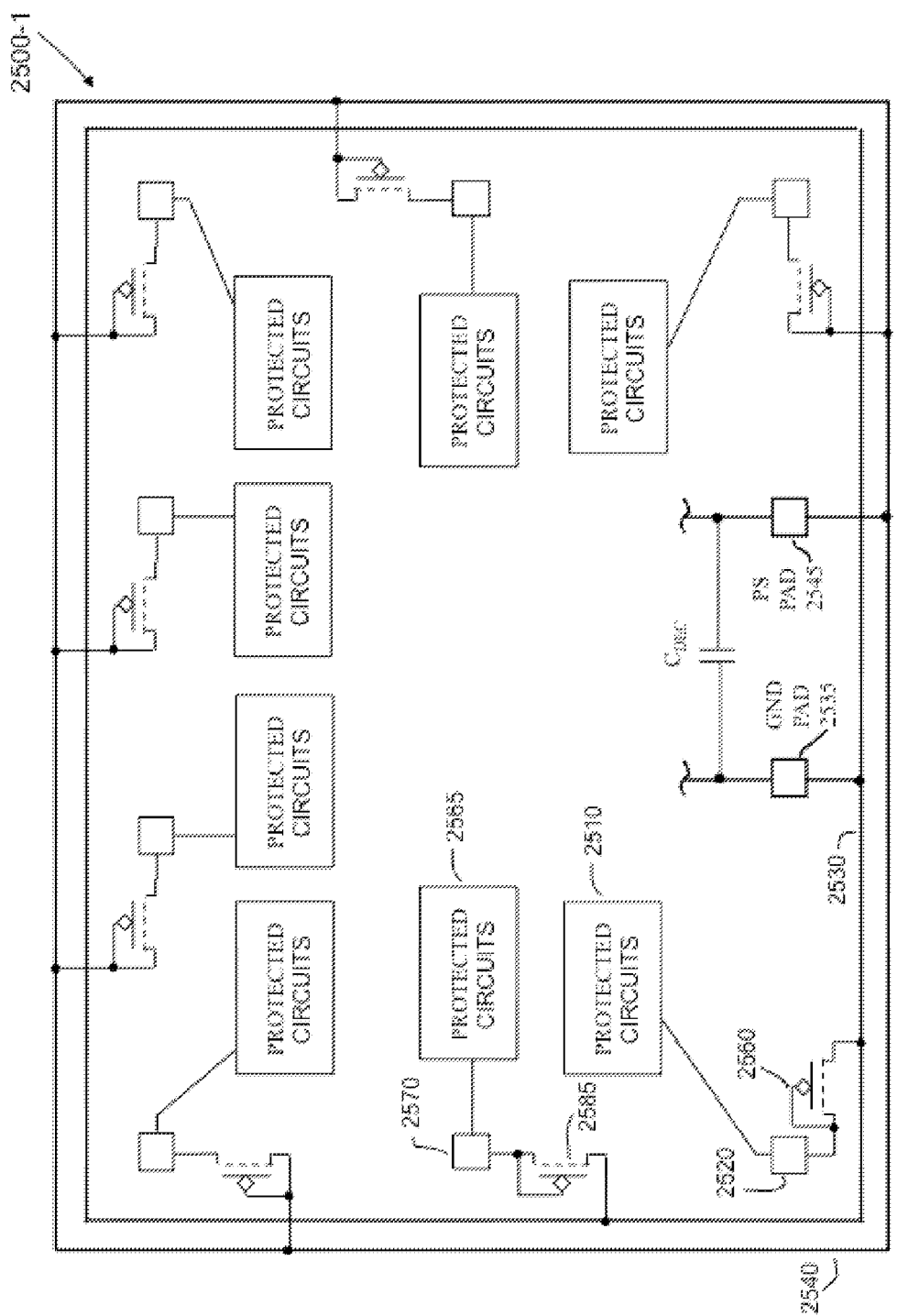
FIG. 25A illustrates a plan view of peripheral pad layouts of carbon nanotube ESD protect circuits using an aCNTFET diode corresponding to the aCNTFET diode of FIG. 24A.

During an ESD event, ESD voltage/current may also be applied between two signal pads, similar to pad 2420, as illustrated and described further below with respect to FIGS. 25 and 26. In this example, aCNTFET diode 2585 is connected between signal pad 2570 and shared ground bus 2530, and aCNTFET diode 2560 is connected between signal pad 2520 and shared ground bus 2430 as shown in FIGS. 25A-C. As described further below, ESD current 150 flows between two signal pads flows through two aCNTFET devices in series when an ESD voltage is applied across two signal pads.

Figure 25B:
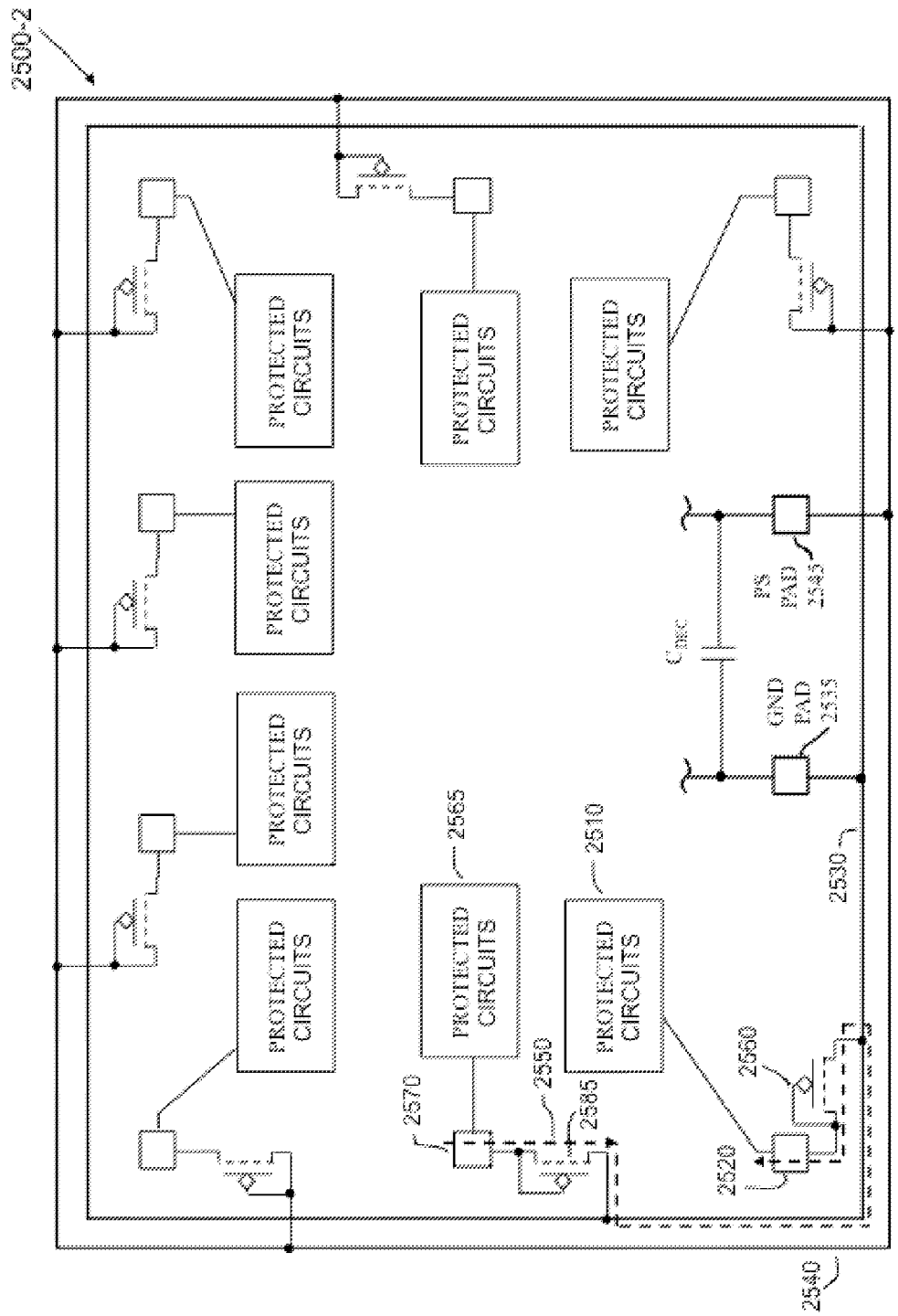
FIG. 25B illustrates the plan view of peripheral pad layouts of FIG. 25A showing ESD current flow for an ESD event of a first voltage polarity.

As illustrated by plan view 2500-2 in FIG. 25B, and also in FIG. 26B, a positive ESD voltage may be applied to signal pad 2570 relative to signal pad 2520. aCNTFET diode 2585 turns ON and conducts in an nCNTFET mode (with $V_{TN}$=1.7 volts), because signal pad 2570 connected to a first S/D-C contact and gate terminal G is more positive than a second S/D-C contact connected to shared ground bus 2530. aCNTFET diode 2560 turns ON and conducts in an pCNTFET mode (with $|V_{TP}|$=0.5 volts), because signal pad 2520 connected to a first S/D-C contact and gate G that is more negative than a second S/D-C contact connected to shared ground bus 2530. ESD current 2550, corresponding to ESD current 150 in prior art FIG. 1B, flows through both aCNTFET diodes in series. The width W of aCNTFET diode 2585 is calculated further below such that the ESD-induced voltage $V_{ESD}$ between signal pad 2570 and shared ground bus 2530 is not greater than 4 volts. Width W is then used to calculate the ESD-induced voltage $V_{ESD}$ of aCNTFET diode 2560, as illustrated further below, to ensure that $V_{ESD}$ between signal pad 2520 and shared ground bus 2530 is not greater than 4 volts. Therefore, ESD current 150 flowing between signal pads through two aCNTFET diodes in series results in an ESD-induced voltage $V_{ESD}$ voltage between any signal pad and a shared ground bus of less than or equal to 4 volts across terminals of protected circuit 2510.

Figure 25C:
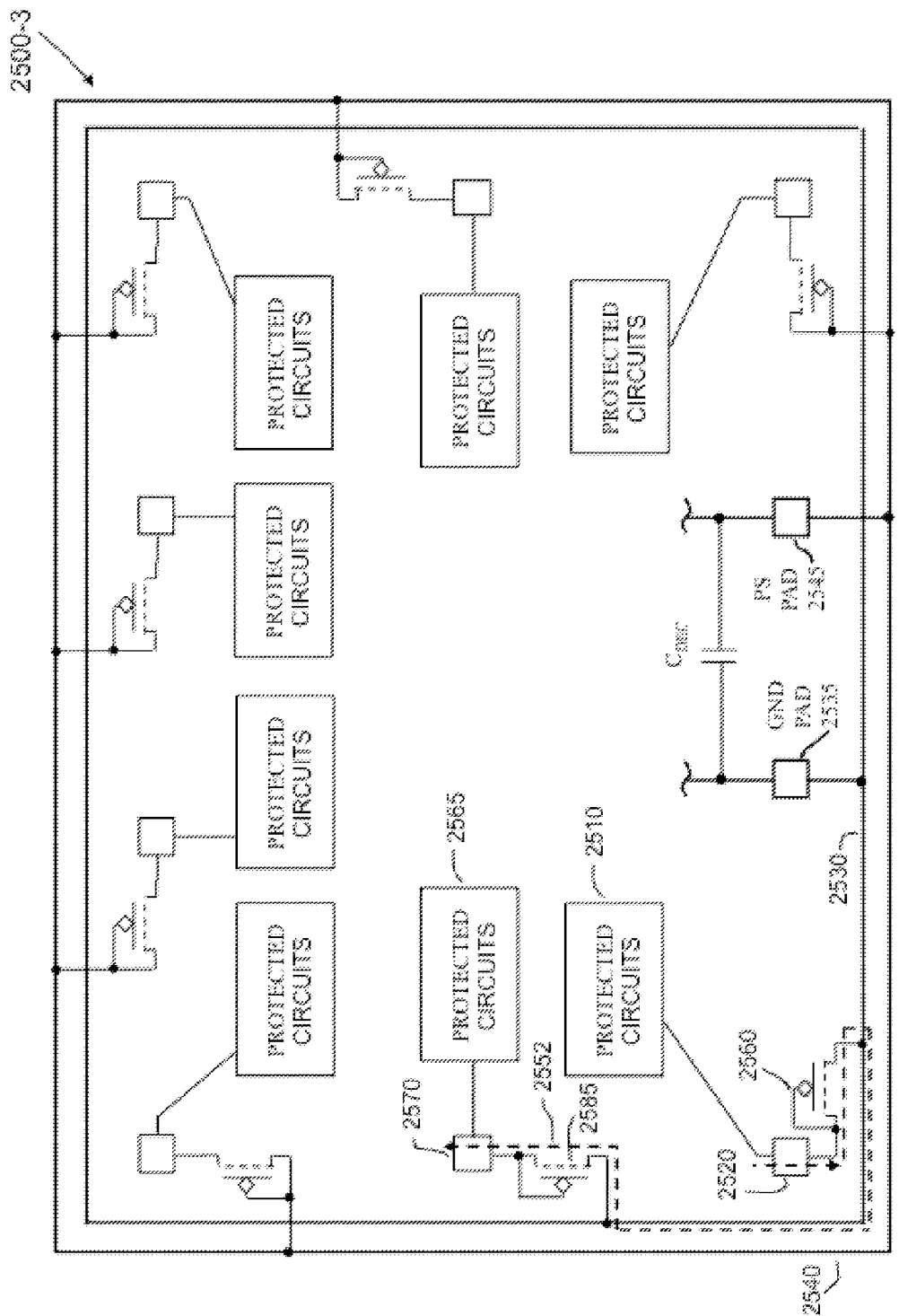
FIG. 25C illustrates the plan view of peripheral pad layouts of FIG. 25A showing ESD current flow for an ESD event of a second voltage polarity.

As illustrated by plan view 2500-3 in FIG. 25C, and also in FIG. 26C, a positive ESD voltage is applied to signal pad 2520 relative to signal pad 2570. aCNTFET diode 2560 turns ON and conducts in an nCNTFET mode (with $V_{TN}$=1.7 volts), because signal pad 2520 is connected to a first S/D-C contact and a gate G that is more positive than a second S/D-C contact connected to shared ground bus 2530. aCNTFET diode 2585 turns ON and conducts in a pCNTFET mode (with $|V_{TP}|$=0.5 volts), because signal pad 2570 is connected to a first S/D-C contact and a gate G that is more negative than a second S/D-C contact connected to shared ground bus 2530. ESD current ($I_{ESD}$) 2552, corresponding to ESD current 150 in prior art FIG. 1B, flows through both aCNTFET diodes in series. ESD current 2552 is in the opposite direction to ESD current 2550. The width W of aCNTFET diode 2560 is calculated further below such that the ESD-induced voltage $V_{ESD}$ between signal pad 2520 and shared ground bus 2530 is not greater than 4 volts. Width W is then used to calculate the ESD-induced voltage $V_{ESD}$ of aCNTFET diode 2585, as illustrated further below, to ensure that $V_{ESD}$ between signal pad 2570 and shared ground bus 2530 is not greater than 4 volts. Therefore, ESD current 150 flowing between signal pads through two aCNTFET diodes in series results in an ESD-induced voltage $V_{ESD}$ voltage between any signal pad and a shared ground bus of less than or equal to 4 volts across terminals of protected circuit 2510 and protected circuit 2565.

A channel width dimension W=3,775 um for aCNTFET diodes with channel length L=0.05 um has been calculated as described further above with respect to equations 23.1-23.9 for aCNTFET diodes 2260 and 2285 illustrated further above with respect to FIGS. 22 and 23, respectively. ESD currents ($I_{ESD}$) corresponding to ESD current 150 illustrated in prior art FIG. 1B flow through two aCNTFET diodes in series. pCNTFET and nCNTFET modes of operation are activated in aCNTFET diodes as illustrated further above in FIG. 22 and FIG. 23.

Figure 35:
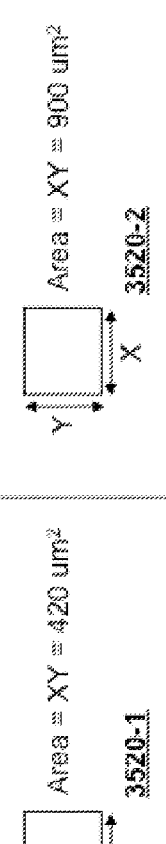
FIG. 35 illustrates a table showing a first set and a second set of scaled aCNTFET diode physical characteristics and p-type and n-type carbon nanotube fabric constants for nanotube fabrics used to replace semiconductor substrates.

Comparing FIG. 23B and FIG. 26B, signal pads 2270 and 2220 in FIG. 23B correspond to signal pads 2570 and 2520 in FIG. 26B. aCNTFET diode 2260 and aCNTFET diode 2585 both respond in the same nCNTFET mode, and aCNTFET diode 2285 and aCNTFET device 2560 both respond in the same pCNTFET mode. aCNTFET diodes 2285 and 2260 are interconnected by shared power supply bus 2240, while aCNTFET diodes 2585 and 2560 are interconnected by shared ground bus 2530. Shared power supply bus 2240 and shared ground bus 2230 are decoupled by decoupling capacitor $C_{DEC}$ as illustrated in FIG. 22, and shared power supply bus 2540 and shared ground bus 2530 are also decoupled by decoupling capacitor $C_{DEC}$ as illustrated in FIG. 25. Decoupling capacitor $C_{DEC}$ does not charge significantly during an ESD voltage surge as described further above with respect to equations 2.1-2.3. Therefore, with respect to ESD voltage surges, shared power supply bus and shared ground buses respond essentially the same way. Hence, the same device dimensions calculated further above with respect to aCNTFET diodes 2260 and 2285 apply to aCNTFET diodes 2560 and 2585 as well, and there is no need for separate calculations. Table 3500 illustrated in FIG. 35 shows that example #1 and example #2 have the same electrical characteristics.

Comparing FIG. 23C and FIG. 26C, signal pads 2270 and 2220 in FIG. 23C correspond to signal pads 2570 and 2520 in FIG. 26C. aCNTFET diode 2260 and aCNTFET diode 2585 both respond in the same pCNTFET mode, and aCNTFET diode 2285 and aCNTFET device 2560 both respond in the same nCNTFET mode. aCNTFET diodes 2285 and 2260 are interconnected by shared power supply bus 2240, while aCNTFET diodes 2585 and 2560 are interconnected by shared ground bus 2530. Shared power supply bus 2240 and shared ground bus 2230 are decoupled by decoupling capacitor $C_{DEC}$ as illustrated in FIG. 22, and shared power supply bus 2540 and shared ground bus 2530 are also decoupled by decoupling capacitor $C_{DEC}$ as illustrated in FIG. 25.

Decoupling capacitor $C_{DEC}$ does not charge significantly during an ESD voltage surge as described further above with respect to equations 2.1-2.3. Therefore, with respect to ESD voltage surges, shared power supply buses and shared ground buses respond essentially the same way. Hence, the same device dimensions calculated further above with respect to aCNTFET diodes 2260 and 2285 apply to aCNTFET diodes 2560 and 2585 as well, and there is no need for separate calculations. Table 3500 illustrated in FIG. 35 shows that example #1 and example #2 have the same electrical characteristics.

Calculation of Multi-Fingered aCNTFET Diode Dimensions for aCNTFET Diodes Connected Between a Signal Pad and a Shared Ground Bus The aCNTFET diodes described in example #1 and example #2 can be configured as one-finger devices or multi-finger devices. The aCNTFET diodes configured as multi-finger devices can have layout configurations that generally correspond to the layout configuration of multi-fingered nCNTFET diode 1510 illustrated in FIG. 15B. The multi-fingered aCNTFETs diodes can have gate fingers, source fingers, and drain fingers that have differing connections to the shared ground supply bus, shared power supply bus, and signal pads from those connections illustrated in FIG. 15B for multi-fingered nCNTFET diode 1510 and still generally correspond to the layout configuration of multi-fingered nCNTFET diode 1510. For example, the aCNTFET diodes in example #1 would have gate fingers and drain fingers connected to shared power supply bus instead of shared ground bus. Multi-finger device calculations for multi-finger aCNTFET diodes having a layout configuration where the X dimension is approximately equal to the Y dimension can be similar to the calculations for multi-fingered nCNTFET diode 1510 having a layout configuration where the X dimension is approximately equal to the Y dimension shown further above with respect to equations 15.1, 15.2, 15.3, and 15.4. Accordingly, equations 15.1, 15.2, 15.3 and 15.4 derived above for calculating the value of $N_G$ and corresponding values of $W_{FNGR}$, X, Y, X', Y', and other dimensions are used for calculating layout dimensions for the aCNTFET diodes described example #1 and example #2 configured as multi-finger devices having a layout configuration where the X dimension is approximately equal to the Y dimension.

In example #1 and example #2, F=0.05 um, $\beta=\beta_P=\beta_N=75{,}500$, $L=L_P=L_N=0.5$ um, and $W=W_P=W_N=3{,}775$ um, the number of fingers $N_G$ may be calculated as follows:

$$N_G = (3.2 + (10.24 + 8.8\beta)^{1/2})/4.4 \quad [\text{EQ 15.3}]$$

$$N_G = (3.2 + (10.24 + 8.8 \times 75{,}500)^{1/2})/4.4$$

$$N_G = 186$$

The width of the aCNTFET channel region may be calculated as follows:

$$W_{FNGR} = W/N_G \quad [\text{EQ 15.4}]$$

$$W_{FNGR} = 3{,}775/186$$

and $W_{FNGR}=20.3$ um.

The X dimension of the aCNTFET device may be calculated as follows:

$$X = (2.2 N_G + 1.2)F \quad [\text{EQ 15.1}]$$

$$X = (2.2 \times 186 + 1.2) \times 0.05$$

$$X = 20.5 \text{ um}$$

The Y dimension of the aCNTFET device may be calculated as follows:

$$Y = (\beta/N_G + 4.4)F \quad [\text{EQ 15.2}]$$

$$Y = (75{,}500/186 + 4.4) \times 0.05$$

$$Y = 20.5 \text{ um}$$

Example #1 and example #2 shown in Table 3500 illustrated in FIG. 35 show one-fingered aCNTFET diode dimensions based on calculations illustrated further above with respect to equations 23.1-to-23.9. aCNTFET diodes exhibit both p-mode and n-mode electrical characteristics as described further above. The CNT fabric constant for the p-mode of aCNTFET diode operation is $NTFC_P = 6 \times 10^5$ cm/V-s, and the nanotube fabric constant for the n-mode of aCNTFET diode operation is $NTFC_N = 12 \times 10^5$ cm/V-s. The aCNTFET diode dimensions for both modes of operation are identical since both modes are present in the same aCNTFET diode, with channel length L=0.05 um and channel width W=3,775 um. In the case of aCNTFET diodes, only one diode per pad is needed because aCNTFET operation is independent of voltage polarity and corresponding current direction as described further above with respect to FIGS. 19-23 and 24-26.

The dimensions of multi-finger aCNTFET diodes, in which X and Y dimensions are approximately equal, were calculated as described further above with respect to equations 15.1-to-15.4 and are also shown in example #1 and example #2 in table 3500. There are 186 fingers of length 20.3 um, interconnected to form an aCNTFET diode of dimensions X=20.5 um and Y=20.5 um. CNT ESD protect circuit area 3520-1 is defined by the X and Y dimensions and are designed to fit between pads for both peripheral pad configurations illustrated in FIGS. 22 and 25, and area pad configurations (not shown) corresponding to FIG. 7. aCNTFET diode 3520-1 layout area $XY=420 \text{ um}^2$. Further, as discussed above multi-fingered devices can be laid out in a square configuration, a rectangular configuration, an L shaped configuration, a configuration at any angle to x-y coordinates, or any other configuration shapes.

Example #3

Figure 27:
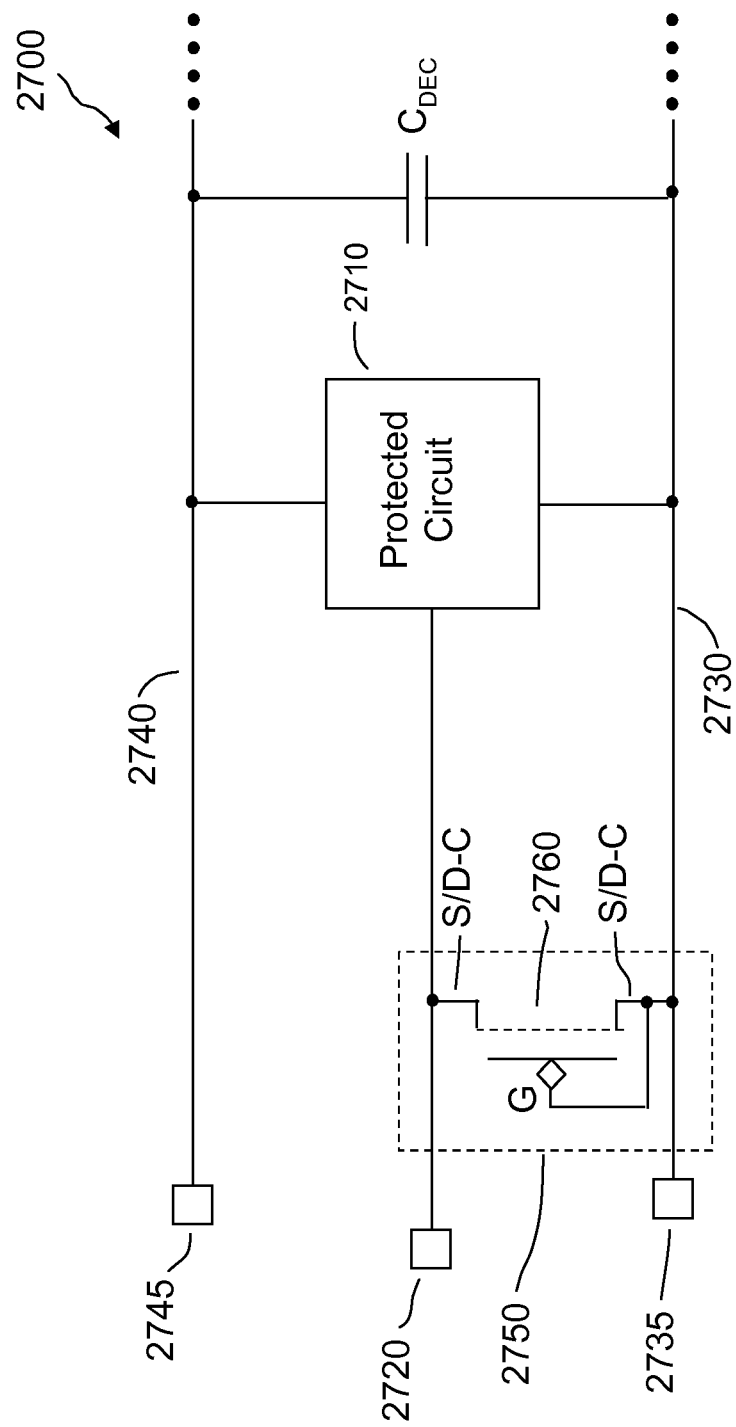
FIG. 27 illustrates a schematic representation of a carbon nanotube ESD protect circuit approach showing a signal pad, shared power supply bus, decoupling capacitor, shared ground bus, and where the carbon nanotube ESD protect circuit is formed by one aCNTFET diode placed between a signal pad and the shared ground bus, with the gate connected to the ground bus.

Schematic Representation of aCNTFET Diode Between a Signal Pad and a Shared Ground Bus with aCNTFET Diode Gate Connected to the Shared Ground Bus FIG. 27 illustrates a CNT ESD protection approach schematic 2700 showing a protected circuit 2710 electrically connected to a signal pad 2720, a shared ground bus 2730, and a shared power supply bus 2740, a CNT ESD protect circuit 2750 electrically connected to the signal pad 2720 and the shared ground bus 2730, and a decoupling capacitor $C_{DEC}$ electrically connected to the shared ground bus 2730 and the shared power supply bus 2740. The shared ground bus 2730 is electrically connected to a ground pad 2735, the shared power supply bus 2740 is electrically connected to a power supply pad 2745, and other circuits (not shown) can be electrically connected to the shared ground bus 2730 and the shared power supply bus 2740. The CNT ESD protect circuit 2750 is formed using one ambipolar CNTFET (aCNTFET) device, with a gate G electrically connected to a first S/D-C contact, the first S/D-C contact electrically connected to the shared ground bus 2730, and a second S/D-C contact electrically connected to the signal pad 2720, to form a two-terminal aCNTFET diode 2760. The aCNTFET diode 2760 is designed to protect the protected circuit 2710 from damage due to an ESD event corresponding to electrostatic discharge from HBM 105 described with respect to prior art FIG. 1A and corresponding ESD current ($I_{ESD}$) 150 illustrated in prior art FIG. 1B. The placement and values of decoupling capacitor $C_{DEC}$ illustrated in FIG. 27 and plan view 3000-1 illustrated in FIG. 30 further below, corresponds to the placement and description of $C_{DEC}$ and current flow through $C_{DEC}$ during an ESD event as described further above with respect to FIGS. 2-7 and with respect to equations 2.1, 2.2, and 2.3.

Figure 28C:
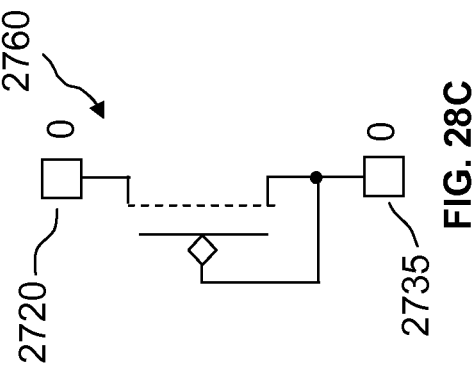
FIG. 28A-C illustrates a schematic representation of the aCNTFET diode of FIG. 27 when a chip is in an operating mode, and corresponding threshold voltage values for n-type and p-type operating modes, such that the aCNTFET diode is OFF during normal powered mode of operation.
Figure 28A:
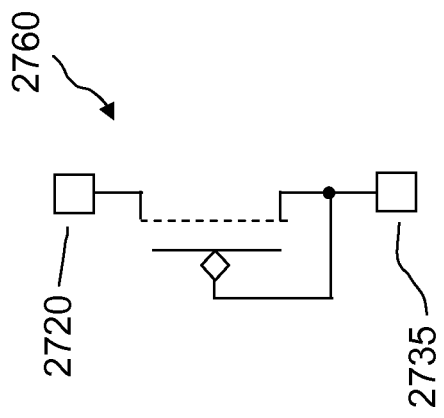
Figure 28B:
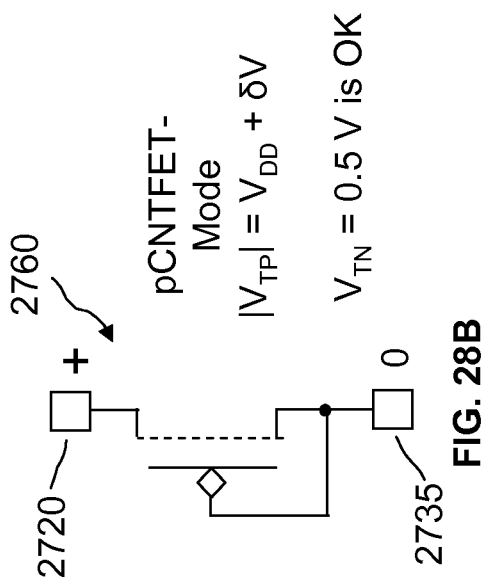
Figure 29:
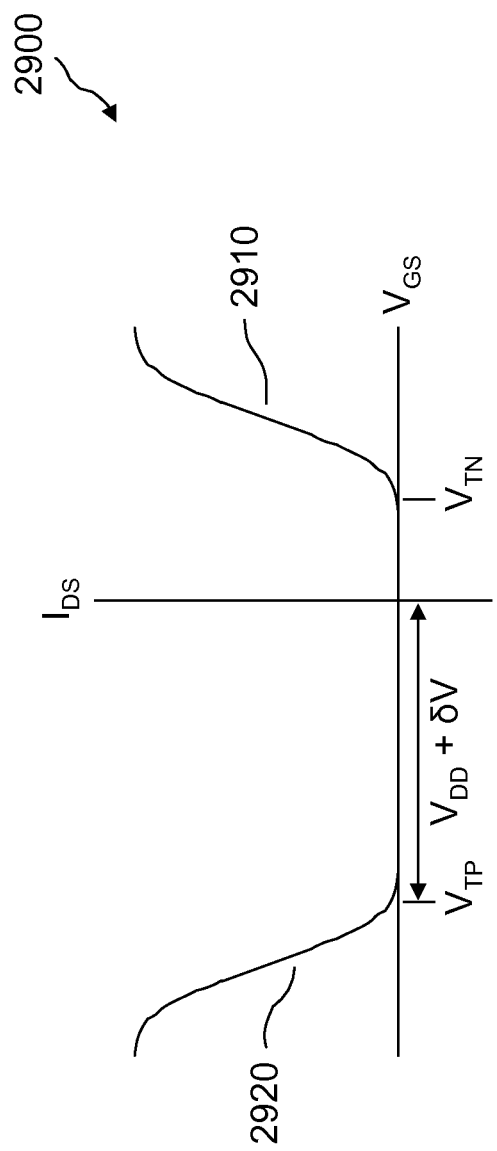
FIG. 29 illustrates an aCNTFET device characteristic having n-type and p-type operating modes corresponding to the aCNTFET diode of FIG. 28A-C.

In normal circuit operating mode, with circuit voltage swings between ground (GND; zero volts) and power supply ($V_{DD}$), aCNTFET diode 2760 used to form CNT ESD protect circuit 2750 should be in an OFF state. Referring to FIGS. 28A-C in this example, aCNTFET diode 2760 is designed such that no current flows as illustrated further below. Operating voltage $V_{DD}=1.5$ volts is present on shared power supply bus 2740 relative to shared ground bus 2730. $V_{DD}$ may be applied to power supply pad 2445 or may be generated on chip. Ground pad 2735 holds shared ground bus 2730 at GND (at zero volts). Signal pad 2720 swings between zero volts and $V_{DD}$ ($V_{DD}=1.5$ volts in this example). If signal pad 2720 is at positive voltage $V_{DD}$ and ground pad 2735 is at ground (zero volts) as shown in FIG. 28B, then aCNTFET diode 2760 conducts unless threshold voltage $V_{TP}$ is set such that $|V_{TP}|=V_{DD}+\delta V$ to ensure that the p-type conduction mode of aCNTFET diode 2760 remains in an OFF state during normal operation. In this example, $\delta V=0.2$ volts is chosen, which is more than 10% above the nominal $V_{DD}$ voltage of 1.5 volts, such that $|V_{TP}|=1.7$ volts. If signal pad 2720 is at 0 volts as illustrated in FIG. 20C, then no current flows during normal operation since both ground pad 2735 and signal pad 2720 are at ground (zero volts). The n-type conduction mode of aCNTFET is not activated in the configuration illustrated in FIG. 27 and $V_{TN}$ may be set at 0.5 volts. With $|V_{TP}|=1.7$ volts, and $V_{TN}=0.5$ volts, and aCNTFET diode 2760 connected as illustrated in FIG. 27, no current flows through aCNTFET diode 2760 during normal operation. FIG. 29 illustrates aCNTFET device electrical (transfer) characteristic 2900, with nCNTFET segment 2910 and pCNTFET segment 2920 having corresponding $V_{TN}$ and $|V_{TP}|$, respectively, used to form aCNTFET diode 2760. aCNTFET device electrical (transfer) characteristic 2100 may be formed by scaling aCNTFET devices using nanotube fabric constants $NTFC_N=12\times10^5$ and $NTFC_P=6\times10^5$ cm/V-s in equations 12.23 and 12.24, respectively, and as illustrated further below with respect to FIGS. 27-31.

In the presence of an ESD event caused by HBM 105, a maximum ESD current 150 of 1 Ampere flows between pads and through on-chip circuits if ESD protect circuits are not present. The design of CNT ESD protect circuit 2750, and corresponding aCNTFET diode 2760, prevents an ESD-driven voltage/current pulse from exceeding a maximum allowed voltage on the chip. With respect to schematic 2700 shown in FIG. 27, the operation of each device is explained with respect to ESD voltages applied between signal pad 2720 and ground pad 2735 connected to shared ground bus 2730 and between signal pad 2720 and power supply pad 2745 connected to shared power supply bus 2740. Shared ground bus 2730 and shared power supply bus 2740 may be used as part of CNT ESD protect circuit conducting paths, and in the case of ESD voltage applied between signal pad 2720 and shared power supply bus 2740, the ESD voltage is applied though decoupling capacitor $C_{DEC}$ and applied to shared ground bus 2740, as described further above with respect to FIGS. 2-7 and with respect to equations 2.1, 2.2, and 2.3.

Figure 30A:
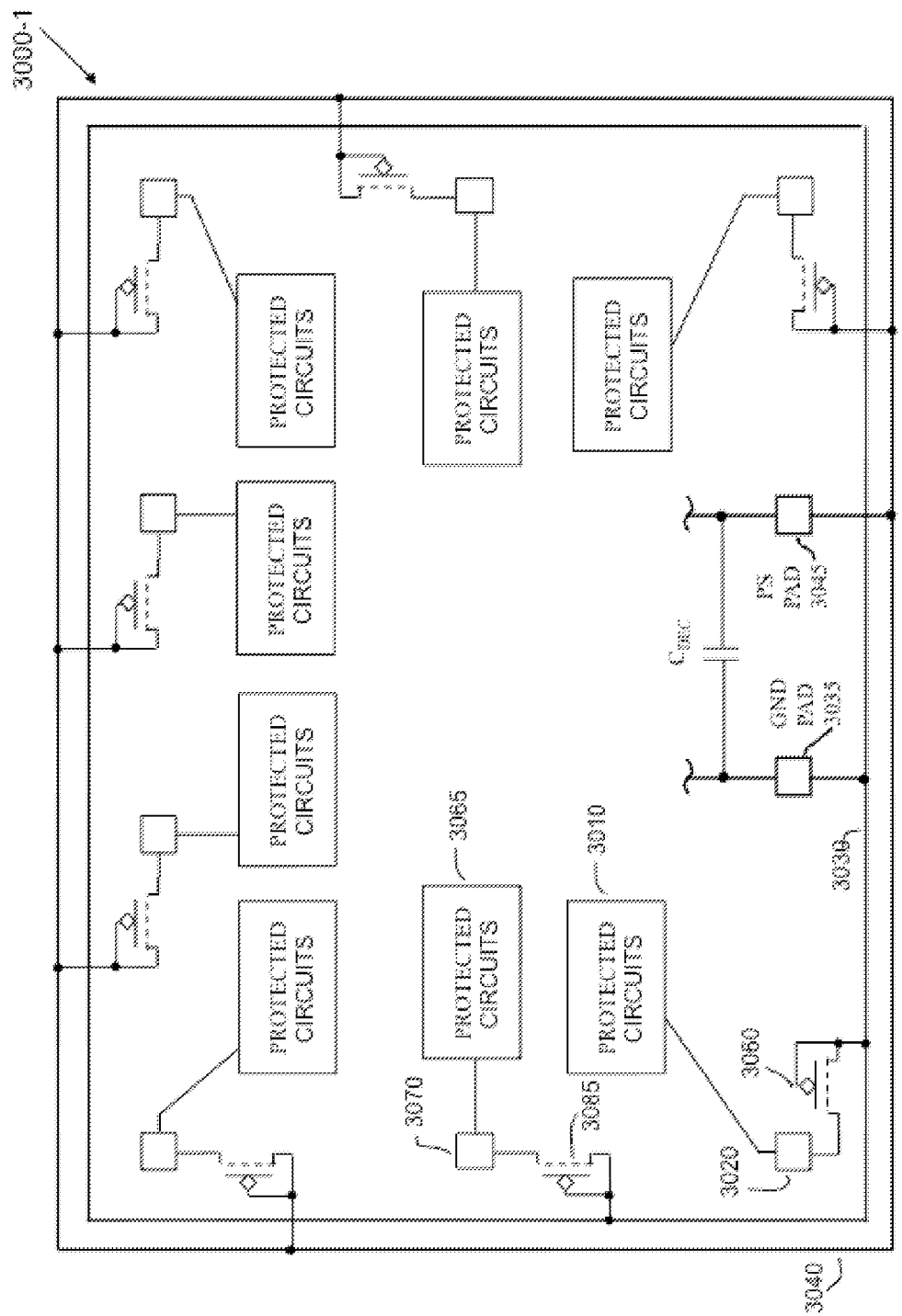
FIG. 30A illustrates a plan view of peripheral pad layouts of nanotube ESD protect circuits using an aCNTFET diode corresponding to the aCNTFET diode of FIG. 27.

During an ESD event, ESD voltage/current may also be applied between two signal pads, similar to pad 2720, as illustrated and described further below with respect to FIGS. 30 and 31. In this example, aCNTFET diode 3085 is connected between signal pad 3070 and shared ground bus 3030, and aCNTFET diode 3060 is connected between signal pad 3020 and shared ground bus 3030 as shown in FIGS. 30A-C. As described further below, ESD current 150 flows between two signal pads and flows through two aCNTFET devices in series, when an ESD voltage is applied across two signal pads.

Figure 30B:
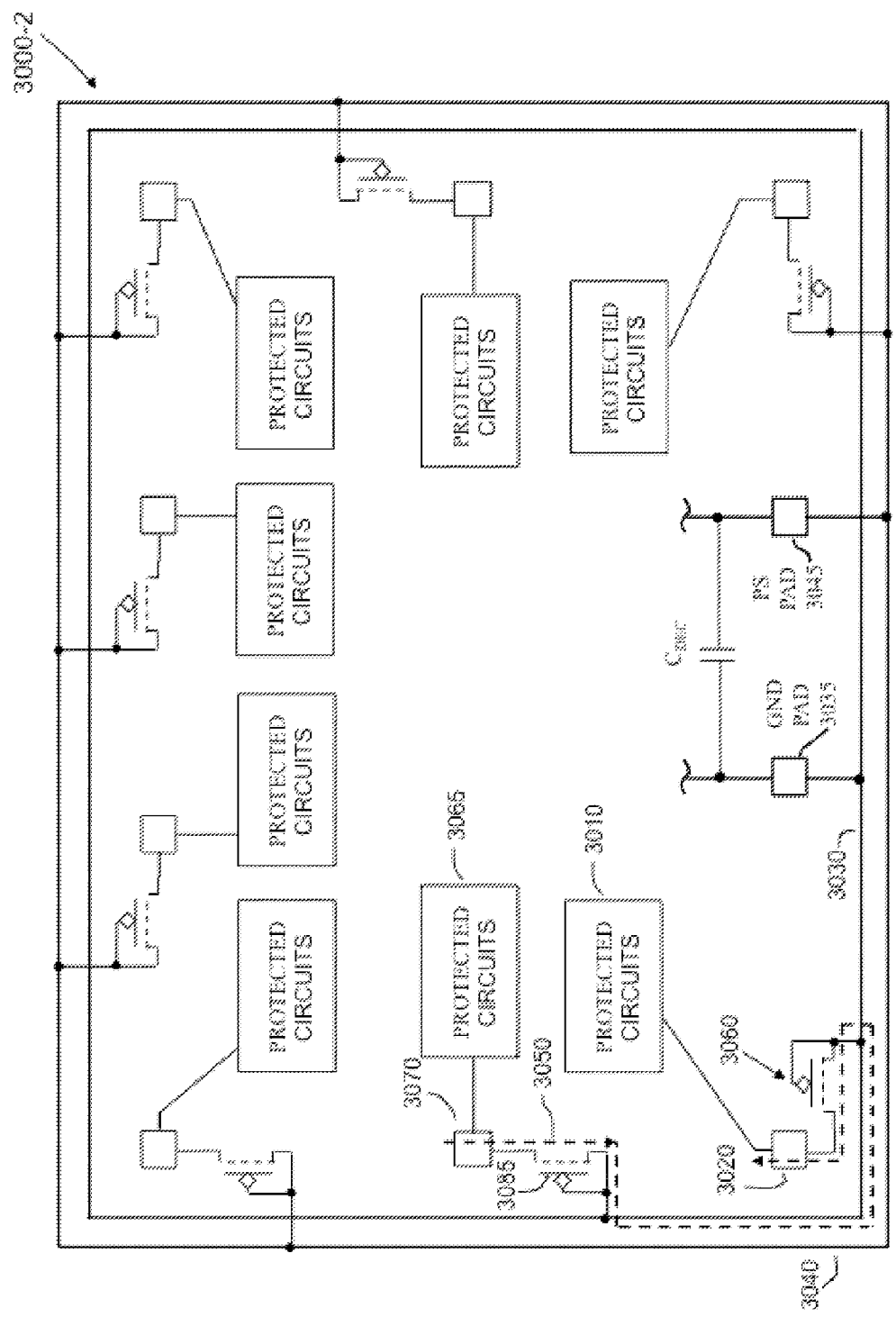
FIG. 30B illustrates the plan view of peripheral pad layouts of FIG. 30A showing ESD current flow for an ESD event of a first voltage polarity.

As illustrated by plan view 3000-2 in FIG. 30B, and also in FIG. 31B, a positive ESD voltage may be applied to signal pad 3070 relative to signal pad 3020. aCNTFET diode 3085 turns ON and conducts in a pCNTFET mode (with $|V_{TP}|=1.7$ volts), because signal pad 3070 connected to a first S/D-C contact is more positive than gate terminal G and a second S/D-C contact, both connected to shared ground bus 3030. aCNTFET diode 3060 turns ON and conducts in an nCNTFET mode (with $V_{TN}=0.5$ volts), because signal pad 3020 connected to a first S/D-C contact that is more negative than gate terminal G and a second S/D-C contact, both connected to shared ground bus 3030. ESD current 3050, corresponding to ESD current 150 in prior art FIG. 1B, flows through both aCNTFET diodes in series. The width W of aCNTFET diode 3060 is calculated further below such that the ESD-induced voltage $V_{ESD}$ between signal pad 3020 and shared ground bus 3030 is not greater than 4 volts. Width W is then used to calculate the ESD-induced voltage $V_{ESD}$ of aCNTFET diode 3085, as illustrated further below, to ensure that $V_{ESD}$ between signal pad 3070 and shared ground bus 3030 is not greater than 4 volts. Therefore, ESD current 150 flowing between signal pads through two aCNTFET diodes in series results in an ESD-induced voltage $V_{ESD}$ voltage between any signal pad and a shared ground bus of less than or equal to 4 volts across terminals of protected circuit 3010.

Figure 30C:
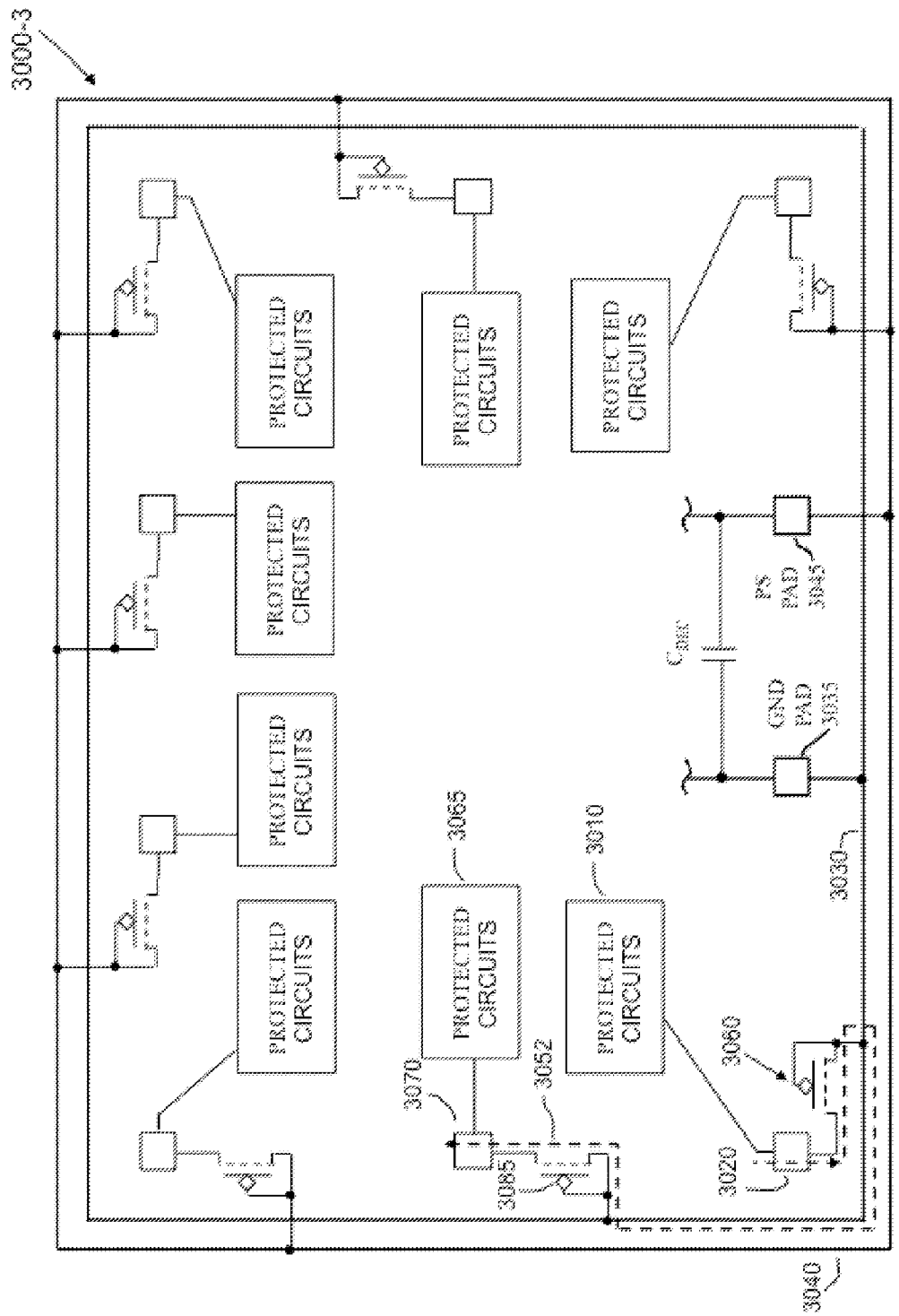
FIG. 30C illustrates the plan view of peripheral pad layouts of FIG. 30A showing ESD current flow for an ESD event of a second voltage polarity.

As illustrated by plan view 3000-3 in FIG. 30C, and also in FIG. 31C, a positive ESD voltage is applied to signal pad 3020 relative to signal pad 3070. aCNTFET diode 3060 turns ON and conducts in a pCNTFET mode (with $|V_{TP}|=1.7$ volts), because signal pad 3020 is connected to a first S/D-C contact that is more positive than gate terminal G and a second S/D-C contact, both connected to shared ground bus 3030. aCNTFET diode 3085 turns ON and conducts in an nCNTFET mode (with $V_{TN}=0.5$ volts), because signal pad 3070 is connected to a first S/D-C contact that is more negative than gate terminal G and a second S/D-C contact, both connected to shared ground bus 3030. ESD current 3052, corresponding to ESD current 150 in prior art FIG. 1B, flows through both aCNTFET diodes in series. ESD current 3052 is in the opposite direction to ESD current 3050. The width W of aCNTFET diode 3085 is calculated further below such that the ESD-induced voltage $V_{ESD}$ between signal pad 3070 and shared ground bus 3030 is not greater than 4 volts. Width W is then used to calculate the ESD-induced voltage $V_{ESD}$ of aCNTFET diode 3060, as illustrated further below, to ensure that $V_{ESD}$ between signal pad 3020 and shared ground bus 3030 is not greater than 4 volts. Therefore, ESD current 150 flowing between signal pads through two aCNTFET diodes in series results in an ESD-induced voltage $V_{ESD}$ voltage between any signal pad and a shared ground bus of less than or equal to 4 volts across terminals of protected circuit 3010.

Calculation of aCNTFET Diode Dimensions to Limit ESD Surge Voltage ($V_{ESD}$) for aCNTFET Diodes Connected Between a Signal Pad and a Shared Power Supply Bus The scaled (optimized) electrical (transfer) characteristic 2900 illustrated in FIG. 29 corresponds to an aCNTFET device corresponding to plan view 1000 and cross section 1050 described further above with respect to FIGS. 10A and 10B, respectively, formed on a CNT fabric with nanotube fabric constants $NTFC_N=12\times10^5$ and $NTFC_P=6\times10^5$ cm/V-s given by equations 12.23 and 12.24, respectively, a gate insulator of thickness $t_G=7$ nm and relative dielectric constant $\in_R=25$, a channel $L=0.05$ um, and semiconducting single wall nanotubes (sSWNT) of diameter $d_{NT}=1$ nm. aCNTFET diodes are formed by connecting the gate G of aCNTFET devices to one S/D-C forming a source or drain as illustrated in FIGS. 27, 28, 30, and 31.

Unique to two-terminal aCNTFET diodes formed using aCNTFET devices, is that aCNTFET diodes are bidirectional. That is, current may flow in one direction or in the opposite direction, and corresponding voltages may be of positive or negative polarity. Referring to FIG. 31 to illustrate aCNTFET diode bidirectional operation, when ESD current 3050, equal to ESD current 150 illustrated in prior art FIG. 1B, flows from signal pad 3070 to signal pad 3020 as shown in FIG. 31B, aCNTFET diode 3085 operates in a pCNTFET mode corresponding to pCNTFET segment 2920 illustrated in FIG. 29, and aCNTFET diode 3060 operates in an nCNTFET mode corresponding to nCNTFET segment 2910. However, when ESD current ($I_{ESD}$) 3052, equal to ESD current 150, flows from signal pad 3020 to signal pad 3070 as illustrated in FIG. 31C, aCNTFET diode 3085 operates in an nCNTFET mode corresponding to nCNTFET segment 2910, and aCNTFET diode 3060 operates in a pCNTFET mode corresponding to pCNTFET segment 2920 shown in FIG. 29.

aCNTFET diode dimensions needed to limit ESD surge voltage $V_{ESD}$ to 4 volts may be calculated as follows, beginning with $I_{SD}$ equation 12.10 for a CNTFET device, $$I_{DS}=[(W/L)\cdot NTFC\cdot(2\pi\epsilon_R\epsilon_0/\ln(2t_G/R_{NT}))]\cdot[(V_{GS}-V_T)V_{DS}-V_{DS}^2/2] \quad [\text{EQ 12.10}]$$

and connecting the gate terminal to one of the source or drain contacts to form a two-terminal aCNTFET diode such that $V_{GS}=V_{DS}$. As described further above with respect to Eq. 12.18 and Eq. 12.20, when $V_{GS}=V_{DS}$, $V_{DS}>=V_{GS}-V_T$ and $V_{GS}>=V_T$, then CNTFET diodes, and in this case aCNTFET diodes, operate in the saturation region. Using the ratio $\beta=W/L$, equation 12.10 may rewritten as:

$$I_{DS}=[(\beta/2)\cdot NTFC\cdot(2\pi\epsilon_R\epsilon_0/\ln(2t_G/R_{NT}))]\cdot(V_{GS}-V_T)^2 \quad [\text{EQ 23.1}]$$

$V_{ESD}$ voltage surge calculation between two signal pads. At the peak of the ESD current surge, 1 Ampere flows between two signal pads 3020 and 3070 illustrated in FIG. 31. The rise in voltage between each of the signal pads and the ground bus may be calculated for the two polarities of the $V_{ESD}$ voltage surge. This calculation applies to both voltage polarities and corresponding current flow directions illustrated in FIG. 31.

During an ESD-discharge by a circuit corresponding to HBM 105 in prior art FIG. 1A and corresponding ESD current 150 illustrated in prior art FIG. 1B, each of the aCNTFET diodes 3085 and 3060 turn ON, and each exhibits either nCNTFET and pCNTFET modes of operation depending on the polarity of applied voltages between signal pads 3020 and 3070 and corresponding ESD current flow as illustrated in FIG. 31.

However, the pCNTFET mode results in a higher $V_{ESD}$ voltage drop because $|V_{TP}|$ has been set at 1.7 volts to prevent current flow during normal operation. $\beta_P$ may be calculated such that the maximum surge voltage between a signal pad and the ground bus is not more than 4 volts. When the nCNTFET mode corresponding to nCNTFET segment 2910 is activated, $\beta_N=\beta_P$ is used since aCNTFET diode dimensions are the same for both p-type and n-type operating modes. The maximum voltage across the two terminal aCNTFET-based protective when operating in the nCNTFET mode is calculated to verify that the $V_{ESD}$ voltage drop does not exceed 4 volts as illustrated further below. $V_{DS}=V_{GS}$ and the aCNTFET diode operates in the saturation region as described further above, with current flow $I_{DS}$ in the saturation region determined by the lower voltage value $V_{DS,sat}=V_{GS}-V_T$ at the onset of saturation.

$$I_{DSp}=[(\beta_P/2)\cdot NTFC_P\cdot(2\pi\epsilon_R\beta_0/\ln(2t_G/R_{NT}))]\cdot(V_{GS}-V_{TP}|)^2 \quad [\text{EQ 31.1}]$$

Since the maximum ESD current $I_{ESD}=1$ Ampere as illustrated by ESD current 150, then:

$$I_{DSp-MAX}=1=[(\beta_P/2)\cdot 6\times10^5\cdot(2\times3.14\times25\times8.85\times10^{-14}/\ln(2\times7/0.5))]\cdot(4-1.7)^2$$

So that $$I_{DSp-MAX}=1=0.5\cdot\beta_P\cdot 6\times10^5\cdot 417\times10^{-14}\cdot 5.29,$$

And $\beta_P=W_P/L_P=151,000; W_P=7,550$ um for $L_P=0.05$ um

At this point in the ESD voltage surge calculation, a value of W has been calculated which corresponds to a maximum of 4 volts between a first signal pad and a shared ground bus, based on ESD voltage $V_{ESD}$ across an aCNTFET diode operating in a pCNTFET mode corresponding to pCNTFET segment 2920 illustrated in FIG. 29. Next, this value of W may be used to calculate the ESD voltage $V_{ESD}$ across a second signal pad and a shared ground bus, based on ESD voltage $V_{ESD}$ across an aCNTFET diode operating in an nCNTFET mode corresponding to nCNTFET segment 2910 shown in FIG. 29.

aCNTFET diodes have of the same dimensions for both pCNTFET and nCNTFET operating modes. Therefore, $$\beta_N=\beta_P=\beta=151,000, L_N=L_P=L=0.05 \text{ um, and}$$
$$W_N=W_P=W=7,550 \text{ um}$$

When aCNTFET diodes operate in an nCNTFET mode, in the saturation region, $$I_{DSn}=[(\beta_N/2)\cdot NTFC_N\cdot(2\pi\epsilon_R\epsilon_0/\ln(2t_G/R_{NT}))]\cdot(V_{GS}-V_{TN})^2 \quad [\text{EQ 31.2}]$$

The maximum $V_{DS}$ resulting from an ESD event may be calculated as follows:

$$I_{DSn-MAX}=1=[0.5\cdot\beta_N\cdot 12\times10^5\cdot(2\times3.14\times25\times8.85\times10^{-14}/\ln(2\times7/0.5))]\cdot(V_{GS}-V_{TN})^2$$

$$I_{DSn-MAX}=1=[0.5\cdot 151,000\cdot 12\times10^5\cdot(2\times3.14\times25\times8.85\times10^{-14}/\ln(2\times7/0.5))]\cdot(V_{GS}-0.5)^2$$

$$1=[0.5\cdot 151,000\cdot 12\times10^5\cdot 417\times10^{-14}]\cdot(V_{GS}-0.5)^2$$

$$(V_{GS}-0.5)^2=2.65 \quad [\text{EQ 31.3}]$$

$$V_{GS}-0.5=1.63$$

$$V_{GS}=V_{DS}=2.13 \text{ volts} \quad [\text{EQ 31.4}]$$

As explained further above, $V_{GS}=V_{DS}$ because gate and source are electrically connected. Therefore, $V_{GS}$ and $V_{DS}$ have the same value for CNTFET diodes. The current flow $I_{DS}$ in the saturation region is determined by the lower value $V_{DS,sat}=V_{GS}-V_T$ at the onset of saturation. Since aCNTFET diodes 3085 and 3060 illustrated in FIG. 30 must accommodate both ESD voltage polarities and corresponding ESD current directions illustrated in FIG. 31, W=7,550 um and L=0.05 um dimensions may be used for both aCNTFET diodes 3085 and 3060. The maximum voltage $V_{DS}$, which is the same as $V_{GS}$, across two terminal aCNTFET diodes is 4 volts when operating in a pCNTFET mode and $V_{DS}=2.13$ volts when operating in an nCNTFET mode.

$V_{ESD}$ voltage surge calculation between a signal pad and a ground pad. In this example, an ESD source such as HBM 150 is applied across an aCNTFET diode such as aCNTFET diodes 3060 or 3085 illustrated in FIG. 30A, for example, having a channel width W=7,550 um and a channel length L=0.05 um so the width-to-length ratio $\beta=151,000$ as calculated further above with respect to FIG. 31.

In a first calculation, ESD voltage $V_{ESD}$ is positive on a signal pad with respect to a ground pad. For example, signal pad 3020 is positive with respect to ground pad 3035 illustrated in FIG. 30A and an ESD current $I_{ESD}$ flows through aCNTFET diode 3060 between signal pad 3020 and ground pad 3035.

The value of $V_{DS}$ resulting from the ESD event may be calculated using equation 31.1 because aCNTFET diode 3060 responds in a pCNTFET diode mode corresponding to pCNTFET segment 2120 illustrated in FIG. 21.

$$I_{DSp}=[(\beta_P/2)\cdot NTFC_P\cdot(2\pi\epsilon_R\epsilon_0/\ln(2t_G/R_{NT}))]\cdot(V_{GS}|V_{TP}|)^2 \quad [\text{EQ 31.1}]$$

$I_{DSp\text{-}MAX}=1=[0.5 \cdot 151{,}000 \cdot 6 \times 10^5 \cdot (2 \times 3.14 \times 25 \times 8.85 \times 10^{-14}/\ln(2 \times 7/0.5))] \cdot (V_{GS}-1.7)^2$ $I_{DSp\text{-}MAX}=1=[0.5 \cdot 151{,}000 \cdot 6 \times 10^5 \cdot 417 \times 10^{-14}] \cdot (V_{GS}-1.7)^2$ $(V_{GS}-1.7)^2 = 5.29$ [EQ 31.5]

$V_{GS}-1.7=2.3$ $V_{GS}=V_{DS}=4 \text{ volts}$ [EQ 31.6]

Thus, the maximum voltage across the two terminal aCNT-FET-based protective device between a signal pad and a ground pad (bus) operating in the nCNTFET mode is $V_{DS}=4$ volts when the ESD voltage results in a positive voltage to the $V_{DD}$ pad (bus) with respect to the signal pad. This voltage also appears across the corresponding protected circuit or circuits.

In a second calculation, ESD voltage $V_{ESD}$ is positive on a ground pad with respect to a signal pad. For example, ground pad 3035 is positive with respect to signal pad 3020 illustrated in FIG. 30A and an ESD current $I_{ESD}$ flows through aCNT-FET diode 3060 between ground pad 3035 and signal pad 3020.

The value of $V_{DS}$ resulting from the ESD event may be calculated using equation 31.2 because aCNTFET diode 3060 responds in an nCNTFET diode mode corresponding to nCNTFET segment 2910 illustrated in FIG. 29.

$I_{DSn}=[(\beta_N/2) \cdot NTFC_N \cdot (2\pi \in_R \in_0/\ln(2t_G/R_{NT}))] \cdot (V_{GS}-V_{TN})^2$ [EQ 31.7]

$I_{DSn\text{-}MAX}=1=[0.5 \cdot 151{,}000 \cdot 12 \times 10^5 \cdot (2 \times 3.14 \times 25 \times 8.85 \times 10^{-14}/\ln(2 \times 7/0.5))] \cdot (V_{GS}-0.5)^2$ $I_{DSn\text{-}MAX}=1=[0.5 \cdot 151{,}000 \cdot 12 \times 10^5 \cdot 417 \times 10^{-14}] \cdot (V_{GS}-0.5)^2$ $(V_{GS}-0.5)^2 = 2.65$ [EQ 31.8]

$V_{GS}-0.5=1.63$ $V_{GS}=V_{DS}=2.13 \text{ volts}$ [EQ 31.9]

Thus, the maximum voltage across the two terminal aCNT-FET-based protective device between a signal pad and the ground pad operating in the nCNTFET mode is $V_{DS}=2.13$ volts when the ESD voltage results in a positive voltage to the ground pad with respect to the signal pad. This voltage also appears across the corresponding protected circuit or circuits.

$V_{ESD}$ voltage surge calculation between a signal pad and a power supply pad. In this example, an ESD source such as HBM 150 is applied between a power supply pad, such as 3045, and a signal pad, such as signal pad 3020 illustrated in FIG. 30A. The electrostatic voltage $V_{ESD}$ is applied across decoupling capacitor $C_{DEC}$ and a aCNTFET diode such as aCNTFET diode 3060 illustrated in FIG. 30A, for example. Since there is a relatively small voltage drop across $C_{DEC}$ during an ESD event as illustrated above with respect to equations 2.1, 2.2, and 2.3, the resulting ESD voltage $V_{ESD}$ appears across aCNTFET diodes such as aCNTFET diode 3060. The voltage drops across aCNTFET diode 3060 during an ESD event is the same as shown further above with respect to $V_{ESD}$ applied between a signal pad and ground pad.

Example #4

Figure 32A:
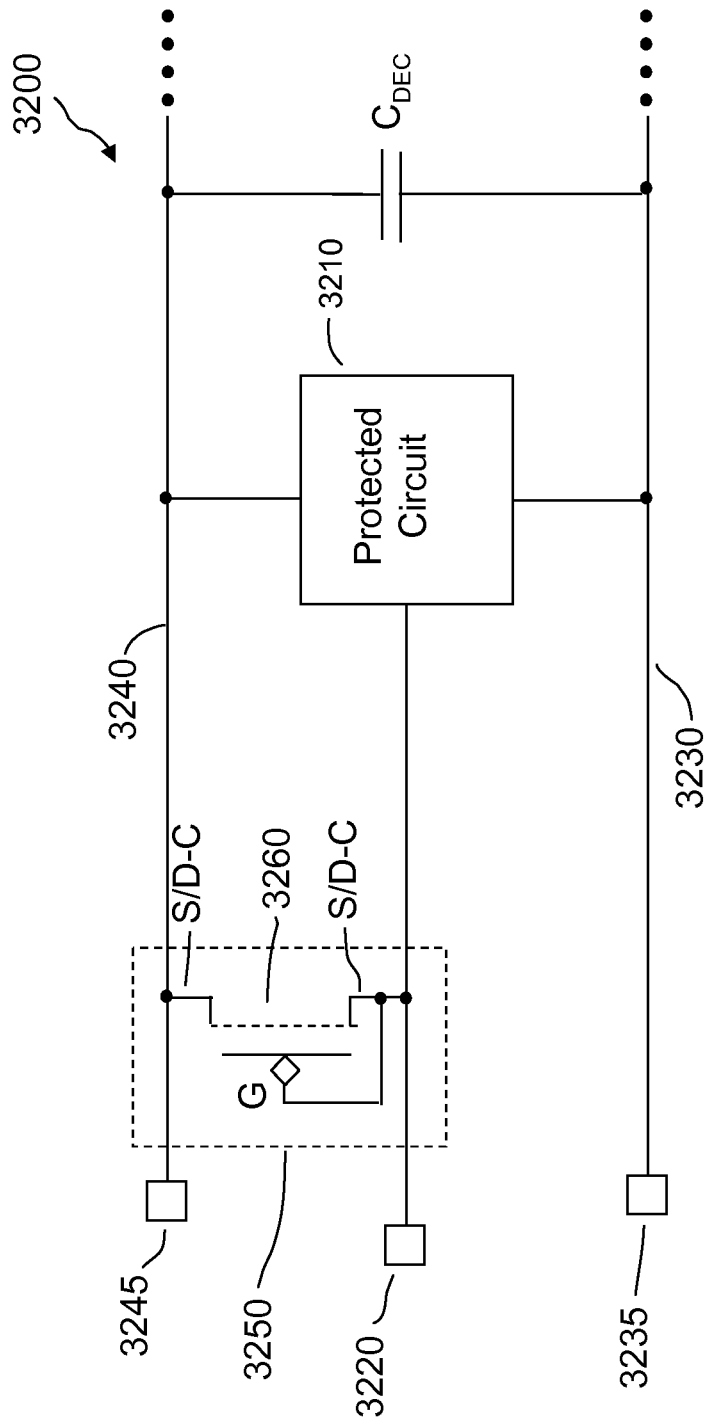
FIG. 32A illustrates a schematic representation of a carbon nanotube ESD protect circuit approach showing a signal pad, shared power supply bus, decoupling capacitor, shared ground bus, and where the carbon nanotube ESD protect circuit is formed by one aCNTFET diode placed between a signal pad and the shared power supply bus, with the gate connected to the signal pad.

Schematic Representation of aCNTFET Diode Between a Signal Pad and a Shared Power Supply Bus with aCNTFET Diode Gate Connected to the Signal Pad FIG. 32A illustrates a CNT ESD protection approach schematic 3200 showing a protected circuit 3210 electrically connected to a signal pad 3220, a shared ground bus 3230, and a shared power supply bus 3240, a CNT ESD protect circuit 3250 electrically connected to the signal pad 3220 and the shared power supply bus 3240, and a decoupling capacitor $C_{DEC}$ electrically connected to the shared ground bus 3230 and the shared power supply bus 3240. The shared ground bus 3230 is electrically connected to a ground pad 3235, the shared power supply bus 3240 is electrically connected to a power supply pad 3245, and other circuits (not shown) can be electrically connected to the shared ground bus 3230 and the shared power supply bus 3240. The CNT ESD protect circuit 3250 is formed using one ambipolar CNTFET (aCNTFET) device, with a gate G electrically connected to a first S/D-C contact, the first S/D-C contact electrically connected to the signal pad 3220, and a second S/D-C contact electrically connected to the shared power supply bus 3240, to form a two-terminal aCNTFET diode 3260. The aCNTFET diode 3260 is designed to protect the protected circuit 3210 from damage due to an ESD event corresponding to electrostatic discharge from HBM 105 described with respect to prior art FIG. 1A and corresponding ESD current ($I_{ESD}$) 150 illustrated in prior art FIG. 1B. The placement and values of decoupling capacitor $C_{DEC}$ illustrated in FIG. 32A and plan view 3300-1 illustrated in FIG. 33A further below, corresponds to the placement and description of $C_{DEC}$ and current flow through $C_{DEC}$ during an ESD event as described further above with respect to FIGS. 2-7 and with respect to equations 2.1, 2.2, and 2.3.

In normal circuit operating mode, with circuit voltage swings between ground (GND; zero volts) and power supply ($V_{DD}$), aCNTFET diode 3260 used to form CNT ESD protect circuit 3250 should be in an OFF state. Referring to FIGS. 32B1, 32B2, and 32B3 in this example, aCNTFET diode 3260 is designed such that no current flows as illustrated further below. Operating voltage $V_{DD}=1.5$ volts is present on shared power supply bus 3240 relative to shared ground bus 3230. $V_{DD}$ may be applied to power supply pad 3245 or may be generated on chip. Ground pad 3235 holds shared ground bus 3230 at GND (at zero volts). Signal pad 3220 swings between zero volts and $V_{DD}$ ($V_{DD}=1.5$ volts in this example). If signal pad 3220 is at ground (zero volts for example) and power supply pad 3245 is at a positive voltage $V_{DD}$ as shown in FIG. 32B2, then aCNTFET diode 3260 conducts unless threshold voltage $|V_{TP}|$ is set such that $|V_{TP}|=V_{DD}+\delta V$ to ensure that the p-type conduction mode of aCNTFET diode 3260 remains in an OFF state during normal operation. In this example, $\delta V=0.2$ volts is chosen, which is more than 10% above the nominal $V_{DD}$ voltage of 1.5 volts, such that $|V_{TP}|=1.7$ volts. If signal pad 3220 is at 1.5 volts as illustrated in FIG. 32B3, then no current flows during normal operation since both power supply pad 3245 and signal pad 3220 are at 1.5 volts. The n-type conduction mode of aCNTFET diode 3260 is not activated in the configuration illustrated in FIG. 32 and $V_{TN}$ may be set at 0.5 volts. With $|V_{TP}|=1.7$ volts, and $V_{TN}=0.5$ volts, and aCNTFET diode 3260 connected as illustrated in FIG. 32, no current flows through aCNTFET diode 3260 during normal operation. FIG. 29 illustrates aCNTFET device electrical (transfer) characteristic 2900, with nCNTFET segment 2910 and pCNTFET segment 2920 having corresponding $V_{TN}$ and $|V_{TP}|$, respectively, used to form aCNTFET diode 3260. aCNTFET device electrical (transfer) characteristic 2900 may be formed by scaling aCNTFET devices using nanotube fabric constants $NTFC_N=12 \times 10^5$ and $NTFC_P=6 \times 10^5$ cm/V-s in equations 12.23 and 12.24, respectively, and as illustrated further below with respect to FIGS. 33 and 34.

In the presence of an ESD event caused by HBM 105, a maximum ESD current 150 of 1 Ampere flows between pads and through on-chip circuits if ESD protect circuits are not present. The design of CNT ESD protect circuit 3250, and corresponding aCNTFET diode 3260, prevents an ESD-driven voltage/current pulse from exceeding a maximum allowed voltage on the chip. With respect to schematic 3200 shown in FIG. 32A, the operation of each device is explained with respect to ESD voltages applied between signal pad 3220 and ground pad 3235 connected to shared ground bus 3230 and between signal pad 3220 and power supply pad connected to shared power supply bus 3240, respectively. Shared ground bus 3230 and shared power supply bus 3240 may be used as part of CNT ESD protect circuit conducting paths, and in the case of ESD voltage applied between signal pad 3220 and shared ground bus 3230, the ESD voltage is applied though decoupling capacitor $C_{DEC}$ and applied to shared power supply bus 3240, as described further above with respect to FIGS. 2-7 and with respect to equations 2.1, 2.2, and 2.3.

Figure 33A:
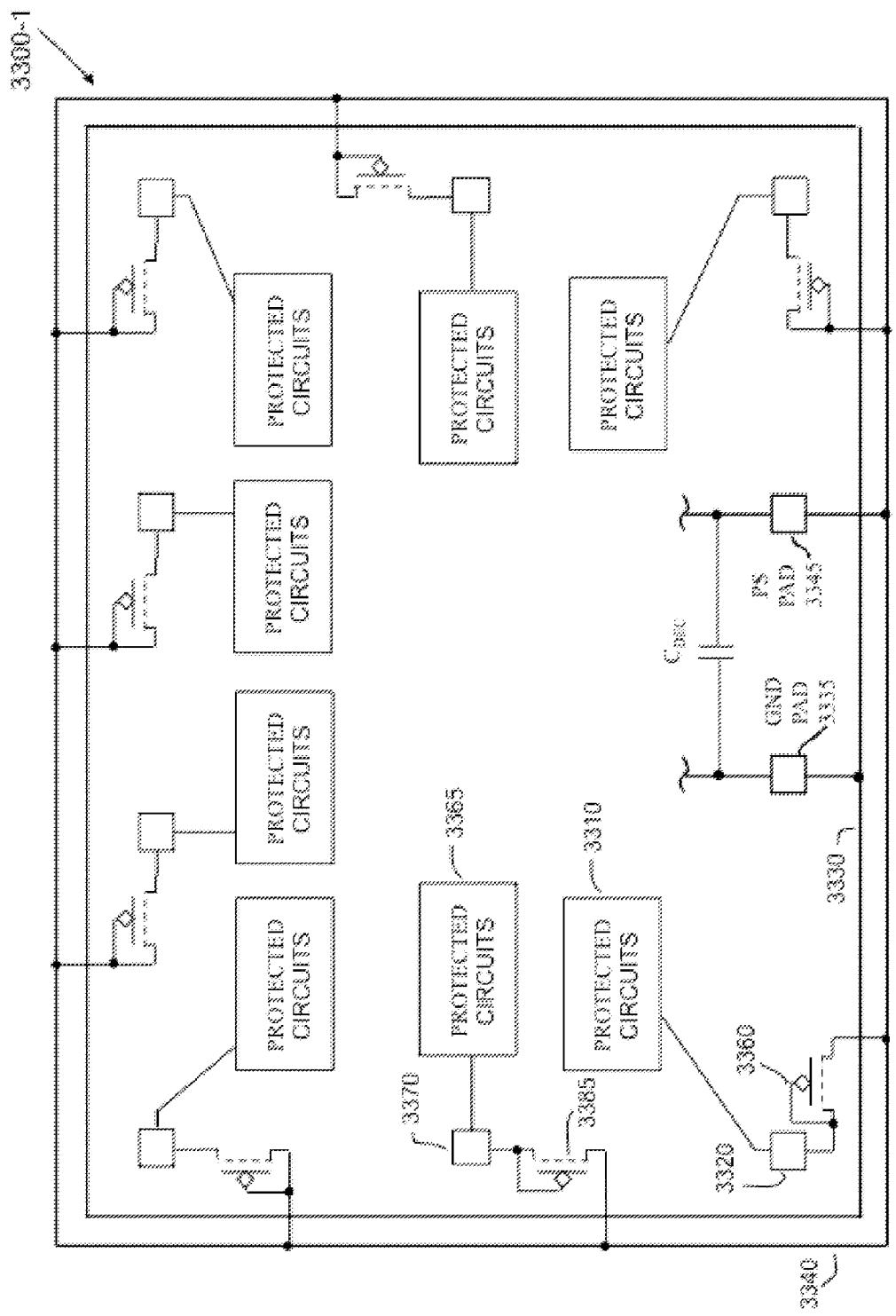
FIG. 33A illustrates a plan view of peripheral pad layouts of nanotube ESD protect circuits using an aCNTFET diode corresponding to the aCNTFET diode of FIG. 32A.

During an ESD event, ESD voltage/current may also be applied between two signal pads, similar to pad 3220, as illustrated and described further below with respect to FIGS. 33 and 34. In this example, aCNTFET diode 3385 is connected between signal pad 3370 and shared power supply bus 3340, and aCNTFET diode 3360 is connected between signal pad 3320 and shared power supply bus 3340 as shown in FIGS. 33A-C. As described further below, ESD current 150 flows between two signal pads flows through two aCNTFET devices in series when an ESD voltage is applied across two signal pads.

Figure 33B:
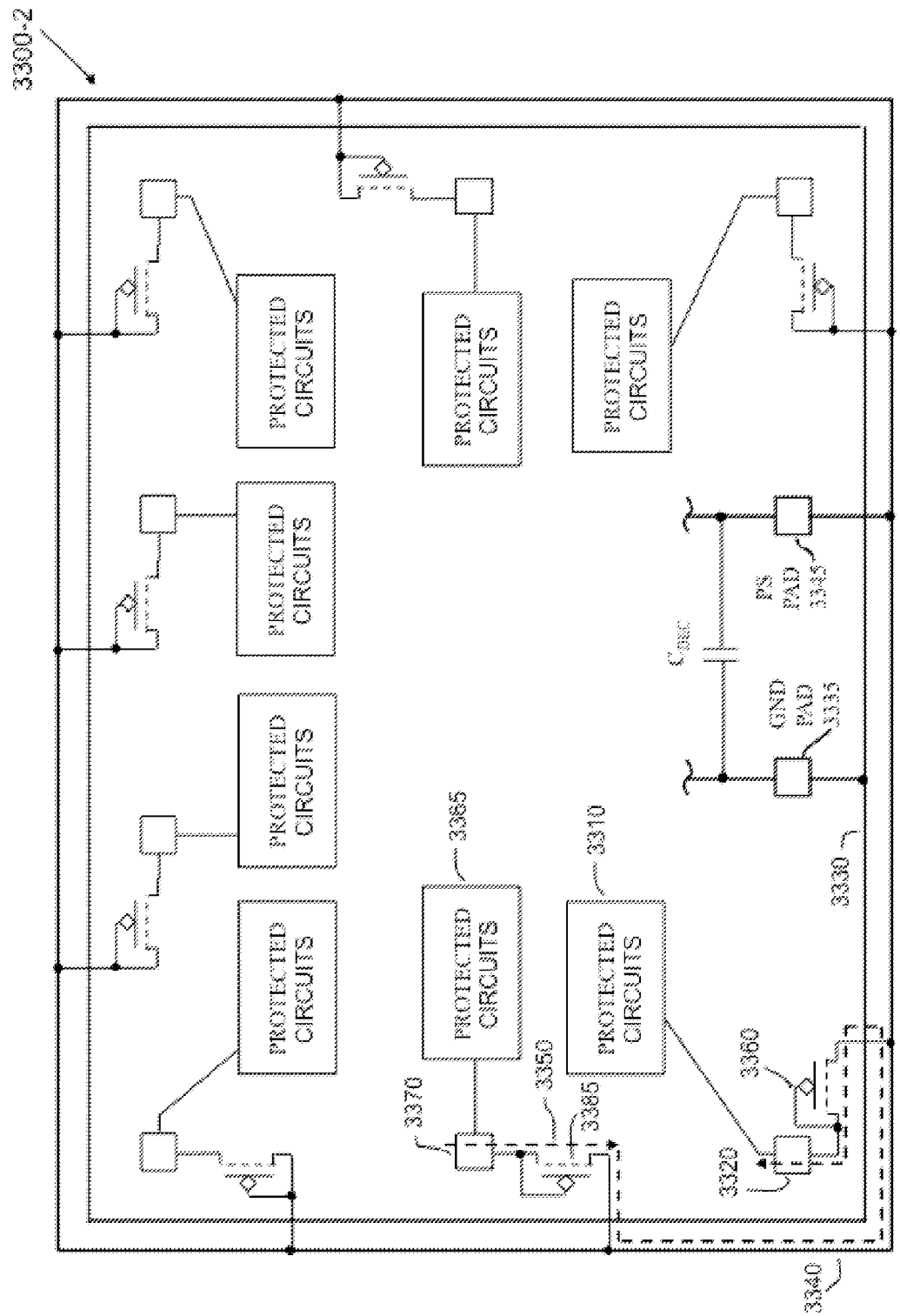
FIG. 33B illustrates the plan view of peripheral pad layouts of FIG. 33A showing ESD current flow for an ESD event of a first voltage polarity.

As illustrated by plan view 3300-2 in FIG. 33B, and also in FIG. 34B, a positive ESD voltage may be applied to signal pad 3370 relative to signal pad 3320. aCNTFET diode 3385 turns ON and conducts in an nCNTFET mode (with $V_{TN}$=0.5 volts), because signal pad 3370 connected to a first S/D-C contact and gate terminal G is more positive than a second S/D-C contact connected to shared power supply bus 3340. aCNTFET diode 3360 turns ON and conducts in an pCNTFET mode (with $|V_{TP}|$=1.7 volts), because signal pad 3320 connected to a first S/D-C contact and gate G that is more negative than a second S/D-C contact connected to shared power supply bus 3340. ESD current ($I_{ESD}$) 3350, corresponding to ESD current 150 in prior art FIG. 1B, flows through both aCNTFET diodes in series. The width W of aCNTFET diode 3385 is calculated further below such that the ESD-induced voltage $V_{ESD}$ between signal pad 3370 and shared ground bus 3330 is not greater than 4 volts. Width W is then used to calculate the ESD-induced voltage $V_{ESD}$ of aCNTFET diode 3360, as illustrated further below, to ensure that $V_{ESD}$ between signal pad 3320 and shared power supply bus 3340 is not greater than 4 volts. Therefore, ESD current 150 flowing between signal pads through two aCNTFET diodes in series results in an ESD-induced voltage $V_{ESD}$ voltage between any signal pad and a shared power supply bus of less than or equal to 4 volts across terminals of protected circuit 3310 and protected circuit 3365.

Figure 33C:
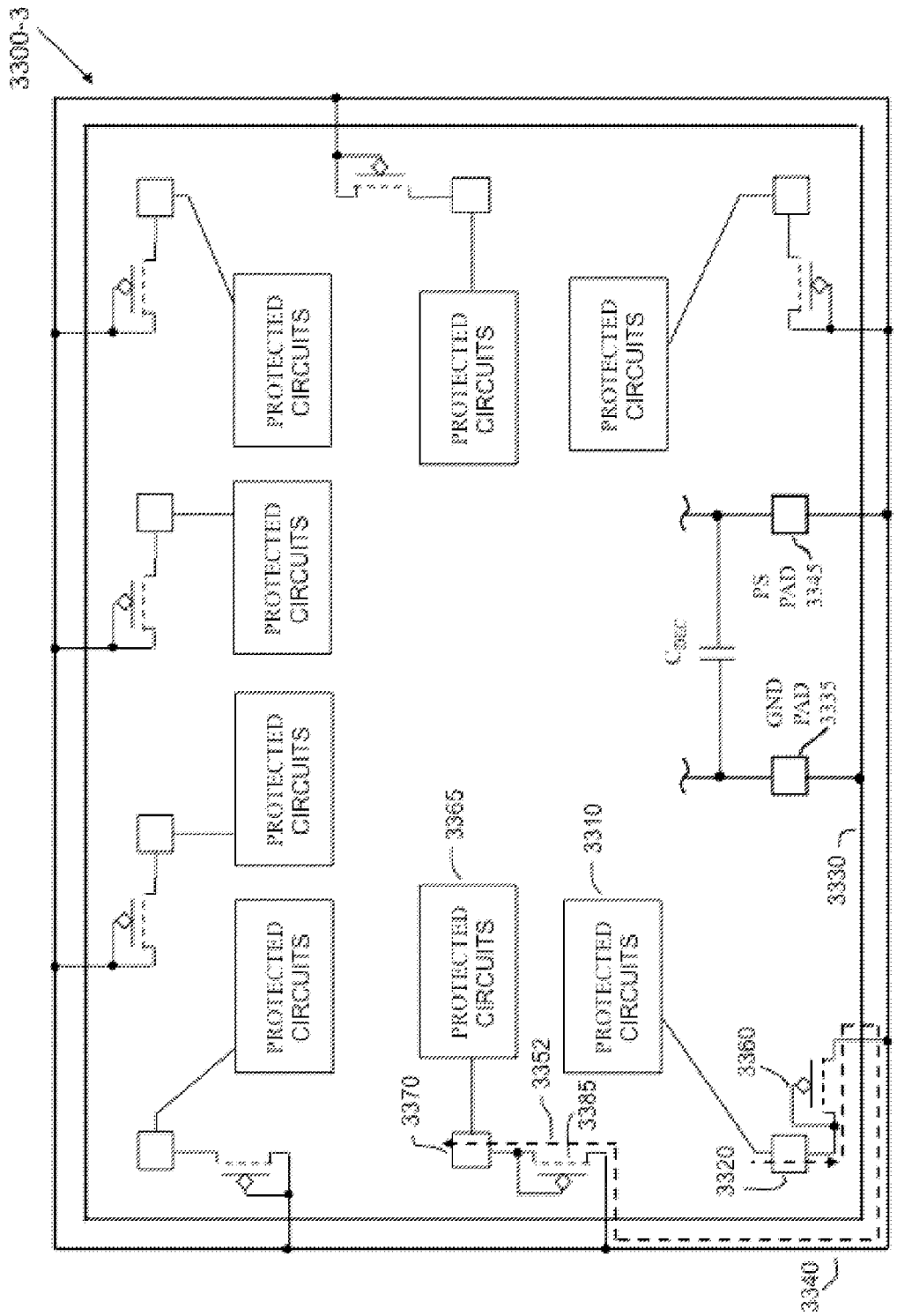
FIG. 33C illustrates the plan view of peripheral pad layouts of FIG. 33A showing ESD current flow for an ESD event of a second voltage polarity.

As illustrated by plan view 3300-3 in FIG. 33C, and also in FIG. 34C, a positive ESD voltage is applied to signal pad 3320 relative to signal pad 3370. aCNTFET diode 3360 turns ON and conducts in an nCNTFET mode (with $V_{TN}$=0.5 volts), because signal pad 3320 is connected to a first S/D-C contact and a gate G that is more positive than a second S/D-C contact connected to shared power supply bus 3340. aCNTFET diode 3385 turns ON and conducts in a pCNTFET mode (with $|V_{TP}|$=1.7 volts), because signal pad 3370 is connected to a first S/D-C contact and a gate G that is more negative than a second S/D-C contact connected to shared power supply bus 3340. ESD current ($I_{ESD}$) 3352, corresponding to ESD current 150 in prior art FIG. 1B, flows through both aCNTFET diodes in series. ESD current 3352 is in the opposite direction to ESD current 3350. The width W of aCNTFET diode 3360 is calculated further below such that the ESD-induced voltage $V_{ESD}$ between signal pad 3320 and shared power supply bus 3340 is not greater than 4 volts. Width W is then used to calculate the ESD-induced voltage $V_{ESD}$ of aCNTFET diode 3385, as illustrated further below, to ensure that $V_{ESD}$ between signal pad 3370 and shared power supply bus 3330 is not greater than 4 volts. Therefore, ESD current 150 flowing between signal pads through two aCNTFET diodes in series results in an ESD-induced voltage $V_{ESD}$ voltage between any signal pad and a shared power supply bus of less than or equal to 4 volts across terminals of protected circuit 3310 and protected circuit 3365.

A channel width dimension W=7,550 um for aCNTFET diodes with channel length L=0.05 um has been calculated as described further above with respect to equations 31.1-31.9 for aCNTFET diodes 3360 and 3385 illustrated further above with respect to FIGS. 33 and 34, respectively. ESD currents ($I_{ESD}$) corresponding to $I_{ESD}$ current 150 illustrated in prior art FIG. 1B flow through two aCNTFET diodes in series. pCNTFET and nCNTFET modes of operation are activated in aCNTFET diodes as illustrated further above in FIG. 33 and FIG. 34.

Comparing FIG. 31B and FIG. 34B, signal pads 3070 and 3020 in FIG. 31B correspond to signal pads 3370 and 3320 in FIG. 34B. aCNTFET diode 3060 and aCNTFET diode 3385 both respond in the same nCNTFET mode, and aCNTFET diode 3085 and aCNTFET device 3360 both respond in the same pCNTFET mode. aCNTFET diodes 3085 and 3060 are interconnected by shared ground bus 3030, while aCNTFET diodes 3385 and 3360 are interconnected by shared power supply bus 3340. Shared power supply bus 3040 and shared ground bus 3030 are decoupled by decoupling capacitor $C_{DEC}$ as illustrated in FIG. 33, and shared power supply bus 3340 and shared ground bus 3330 are also decoupled by decoupling capacitor $C_{DEC}$ as illustrated in FIG. 34. Decoupling capacitor $C_{DEC}$ does not charge significantly during an ESD voltage surge as described further above with respect to equations 2.1-2.3. Therefore, with respect to ESD voltage surges, shared power supply bus and shared power supply buses respond essentially the same. Hence, the same device dimensions calculated further above with respect to aCNTFET diodes 3060 and 3085 apply to aCNTFET diodes 3360 and 3385 as well, and there is no need for separate calculations. Table 3500 illustrated in FIG. 35 shows that example #3 and example #4 have the same electrical characteristics.

Comparing FIG. 31C and FIG. 34C, signal pads 3070 and 3020 in FIG. 31C correspond to signal pads 3370 and 3320 in FIG. 34C. aCNTFET diode 3060 and aCNTFET diode 3385 both respond in the same pCNTFET mode, and aCNTFET diode 3085 and aCNTFET device 3360 both respond in the same nCNTFET mode. aCNTFET diodes 3085 and 3060 are interconnected by shared ground bus 3030, while aCNTFET diodes 3385 and 3360 are interconnected by shared power supply bus 3340. Shared power supply bus 3040 and shared ground bus 3030 are decoupled by decoupling capacitor $C_{DEC}$ as illustrated in FIG. 31, and shared power supply bus 3340 and shared ground bus 3330 are also decoupled by decoupling capacitor $C_{DEC}$ as illustrated in FIG. 34. Decoupling capacitor $C_{DEC}$ does not charge significantly during an ESD voltage surge as described further above with respect to equations 2.1-2.3. Therefore, with respect to ESD voltage surges, shared power supply buses and shared ground buses respond essentially the same. Hence, the same device dimensions calculated further above with respect to aCNTFET diodes 3060 and 3085 apply to aCNTFET diodes 3360 and 3385 as well, and there is no need for separate calculations. Table 3500 illustrated in FIG. 35 shows that example #3 and example #4 have the same electrical characteristics.

Calculation of Multi-Fingered aCNTFET Diode Dimensions for aCNTFET Diodes Connected Between a Signal Pad and a Power Supply Bus The aCNTFET diodes described in example #3 and example #4 can be configured as one-finger devices or multi-finger devices. The aCNTFET diodes configured as multi-finger devices can have layout configurations that generally correspond to the layout configuration of multi-fingered nCNTFET diode 1510 illustrated in FIG. 15B. The multi-fingered aCNTFETs diodes can have gate fingers, source fingers, and drain fingers that have differing connections to the shared ground supply bus, shared power supply bus, and signal pads from those connections illustrated in FIG. 15B for multi-fingered nCNTFET diode 1510 and still generally correspond to the layout configuration of multi-fingered nCNTFET diode 1510. Multi-finger device calculations for multi-finger aCNTFET diodes having a layout configuration where the X dimension is approximately equal to the Y dimension can be similar to the calculations for multi-fingered nCNTFET diode 1510 having a layout configuration where the X dimension is approximately equal to the Y dimension shown further above with respect to equations 15.1, 15.2, 15.3, and 15.4. Accordingly, equations 15.1, 15.2, 15.3 and 15.4 derived above for calculating the value of $N_G$ and corresponding values of $W_{FNGR}$, X, Y, X', Y', and other dimensions are used for calculating layout dimensions for the aCNTFET diodes described example #3 and example #4 configured as multi-finger devices having a layout configuration where the X dimension is approximately equal to the Y dimension.

In example #3 and example #4, F=0.05 um, $\beta=\beta_P=\beta_N=151{,}000$, $L=L_P=L_N=0.5$ um, and $W=W_P=W_N=7{,}550$ um, the number of fingers $N_G$ may be calculated as follows:

$$N_G=(3.2+-(10.24+8.8\beta)^{1/2})/4.4 \qquad [\text{EQ. 15.3}]$$

$$N_G=(3.2+-(10.24+8.8\times151{,}000)^{1/2})/4.4$$

$$N_G=263$$

The width of the aCNTFET channel region may be calculated as follows:

$$W_{FNGR}=W/N_G \qquad [\text{EQ 15.4}]$$

$$W_{FNGR}=7{,}550/263$$

and $W_{FNGR}=28.7$ um.

The X dimension of the aCNTFET device may be calculated as follows:

$$X=(2.2N_G+1.2)F \qquad [\text{EQ 15.1}]$$

$$X=(2.2\times263+1.2)\times0.05$$

$$X=30 \text{ um}$$

The Y dimension of the aCNTFET device may be calculated as follows:

$$Y=(\beta/N_G+4.4)F \qquad [\text{EQ 15.2}]$$

$$Y=(151{,}000/263+4.4)\times0.05$$

$$Y=30 \text{ um}$$

Example #3 and example #4 shown in Table 3500 illustrated in FIG. 35 shows one-fingered aCNTFET diode dimensions based on calculations illustrated further above with respect to equations 31.1-to-31.9. aCNTFET diodes exhibit both p-mode and n-mode electrical characteristics as described further above. The CNT fabric constant for the p-mode of aCNTFET diode operation is $\text{NTFC}_P=6\times10^5$ cm/V-s, and the nanotube fabric constant for the n-mode of aCNTFET diode operation is $\text{NTFC}_N=12\times10^5$ cm/V-s. The aCNTFET diode dimensions for both modes of operation are identical since both modes are present in the same aCNTFET diode, with channel length L=0.05 um and channel width W=7,550 um. In the case of aCNTFET diodes, only one diode per pad is needed because aCNTFET operation is independent of voltage polarity and corresponding current direction as described further above with respect to FIGS. 27-33.

The dimensions of multi-finger aCNTFET diodes, in which X and Y dimensions are approximately equal, were calculated as described further above with respect to equations 15.1-to-15.4 and are also shown in example #3 and example #4 in table 3500. There are 263 fingers of length 28.7 um, interconnected to form an aCNTFET diode of dimensions X=30 um and Y=30 um. CNT ESD protect circuit area 3520-2 is defined by the X and Y dimensions and are designed to fit between pads for both peripheral pad configurations illustrated in FIGS. 30 and 33, and area pad configurations (not shown) corresponding to FIG. 7. aCNTFET diode 3520-2 layout area XY=900 um². Further, as discussed above multi-fingered devices can be laid out in a square configuration, a rectangular configuration, an L shaped configuration, a configuration at any angle to x-y coordinates, or any other configuration shapes.

Comparing aCNTFET diodes in examples #3 and #4 with the aCNTFET diodes in examples #1 and #2, the aCNTFET diode 3520-2 layout area XY=900 um² requires approximately 2× larger layout area than aCNTFET diode 3520-1 that requires layout area XY=420 um². aCNTFET diodes illustrated further above in example #1 and example #2 offer the same protection against ESD discharge corresponding to HBM 105 illustrated in FIG. 1A using half the area of aCNTFET diodes illustrated further above in example #3 and example #4.

CNTFET Device Structures and Methods of Fabrication

FIG. 10 illustrates a CNTFET device structure with a top gate and corresponding gate insulator above a semiconducting CNT fabric region, with contacts to the top surface of the semiconducting carbon nanotube (CNT) fabric forming corresponding source/drain regions adjacent to the gate region. However, it is also possible to fabricate CNTFET devices with top gate and corresponding gate insulator above the semiconducting NT fabric region, with contacts to the bottom surface of the semiconducting NT fabric forming corresponding source/drain regions adjacent to the gate region. Such CNTFET devices are typically pCNTFET devices as fabricated, but can be transformed into aCNTFET and nCNTFET devices using temperature annealing methods as described further above with respect to FIG. 13E, and also other methods described further below. These types of pCNTFET, aCNTFET, and nCNTFET devices may be optimized using various processing methods such as ion implantation, for example, as described in more detail in U.S. Pat. No. 7,852,114. Various structures and methods of fabrication described further below are with respect to top gate and bottom surface semiconducting NT fabric contacts. However, also these methods apply to the FIG. 10 device described further above and described in more detail in U.S. Pat. No. 7,852,114. These CNTFET devices may be used in various circuits as described in U.S. Pat. No. 7,852,114 and may also be used to form CNTFET diodes as described further above in this specification.

Figure 36:
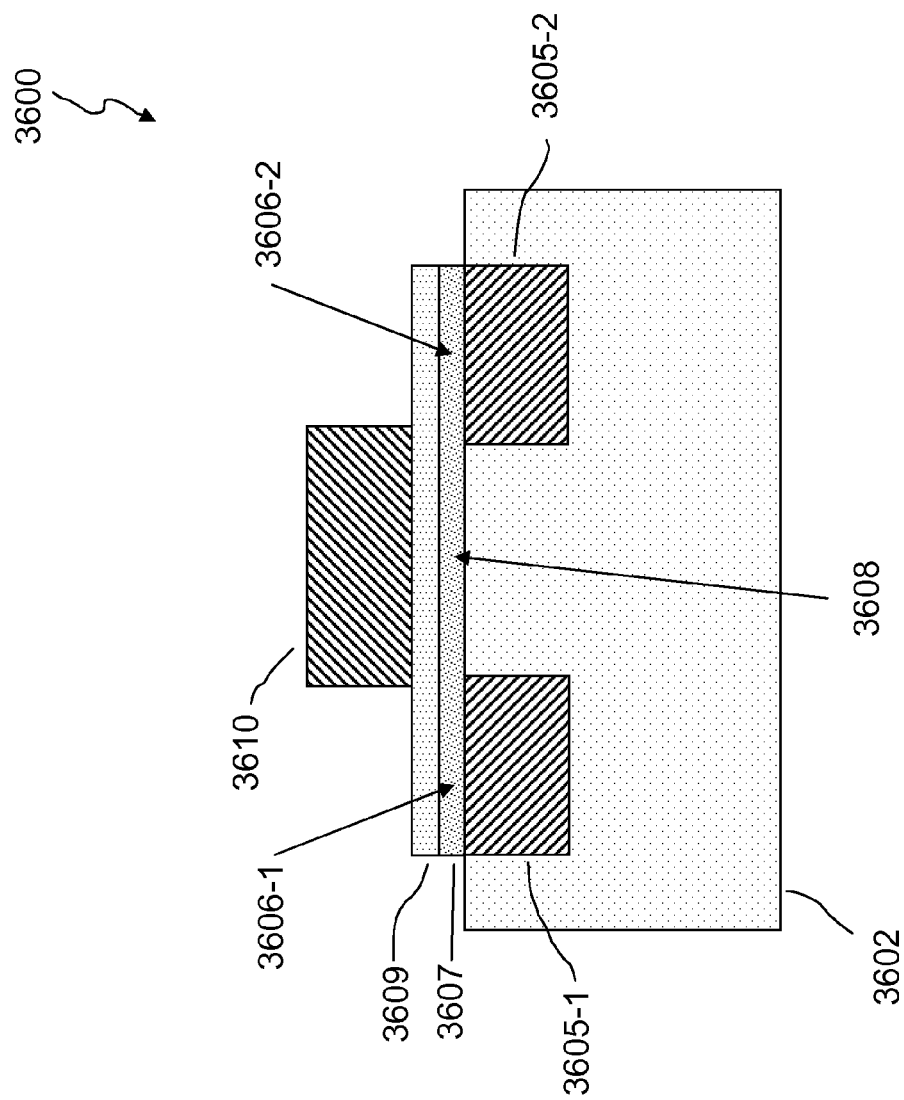
FIG. 36 illustrates a cross sectional view of a CNTFET device having source/drain contacts embedded in an insulator below a carbon nanotube fabric layer.

FIG. 36 illustrates CNTFET device 3600 cross section fabricated on, and partly embedded in, insulator (substrate) 3602. CNTFET device 3600 cross section includes gate 3610 on the top surface of patterned gate insulator 3609, which is in contact with the top surface of patterned semiconducting CNT fabric 3607, which is in contact with the top surface of underlying insulator 3602. Insulator 3602 includes embedded bottom contacts, such as contacts 3605-1 and 3605-2, in electrical and physical contact with the bottom surface of semiconductor CNT fabric 3607. Contact 3605-1 is in contact with semiconducting CNT fabric 3607 in S/D region 3606-1, contact 3605-2 is in contact with semiconducting CNT fabric 3607 in S/D region 3606-2, and gate 3610, which is electrostatically coupled to channel region 3608, form the three terminals of CNTFET device 3600. The device channel length $L_{CH}$ is defined by the separation of S/D regions 3606-1 and 3606-2, which is approximately equal to the separation between contacts 3605-1 and 3605-2 illustrated in FIG. 36. Semiconductor NT fabric 3607 replaces the semiconductor substrate used for well known industry NFET and PFET devices used in CMOS technology.

Semiconducting NT fabric 3607 illustrated in FIG. 36, and other semiconducting NT fabrics illustrated further below in FIGS. 37-40, may be formed using semiconducting single wall nanotubes (s-SWNTs). While in some cases double-wall CNTs, and even multi-walls may be modified for use in CNTFET devices, s-SWNTs are preferred for these CNTFET devices.

FIGS. 10C and 13B illustrate an unordered CNT fabric layer having a plurality of CNTs oriented in a plurality of directions with respect to each other. Carriers may travel through multiple CNT-segments when flowing between source/drain contacts. FIG. 10D illustrates an ordered CNT fabric layer having a plurality of CNTs oriented in a substantially parallel direction with respect to each other and a substantially uniform arrangement along the direction of an applied force. The ordered CNT fabric layer of FIG. 10D is considered to have a high density of CNTs with a relatively high number of CNTs per unit of cross-sectional area fabric than the unordered CNT fabric layer of FIG. 10C. Further, individual CNT lengths far exceed the separation source/drain contact spacing, such that carriers may travel in near-parallel paths within CNT segments and achieve higher NT fabric carrier mobility. The combination of higher NT fabric density (more CNTs) with higher carrier mobility can result in greater current per unit width. CNTs referred to in these example are typically 0.7 um, while source/drain spacing is typically less than 0.13 um, and often sub-0.1 um. NT fabrics may be formed as a monolayer, or may be deposited in multiple layers to increase the current per unit width. In some applications, unordered CNT fabric layers deposited individually on a substrate element will compress into each other under the applied force and reduce the thickness of an ordered CNT fabric layer as a result. In the NT fabric examples illustrated in FIGS. 10C and 10D, some metallic CNTs are present in addition to the semiconducting CNTs.

CNTFET device 3600 may have electrical characteristics of a pCNTFET, an nCNTFET, or of an ambipolar CNTFET (aCNTFET) device as described further above with respect to FIG. 13E. For a pCNTFET device (p-type CNFET device behavior), a more negative voltage than the threshold voltage applied to gate 3610 relative to at least one of the contacts 3605-1 and 3605-2 connected as a source, makes channel region 3608 more conductive and a less negative voltage makes channel region 3608 less conductive as illustrated further above with respect to FIG. 13F. A pair of pCNTFET devices may be connected to form a pCNTFET diode pair that operates as an ESD protect circuit as illustrated schematically further above in FIG. 2. The pCNTFET device layout may include a multi-fingered device as shown in FIGS. 15B and 15D.

For an ambipolar (aCNTFET) device (both p-type and n-type CNFET device behavior), a more negative voltage than the threshold voltage applied to gate 3610 relative to at least one of the contacts 3605-1 and 3605-2 connected as a source makes channel region 3608 more conductive when operating in a p-type mode. However, a more positive voltage than the threshold voltage applied to gate 3610 relative to at least one of the contacts 3605-1 and 3605-2 connected as a source also makes channel region 3608 more conductive when operating in an n-type mode as illustrated further above with respect to FIG. 18. An aCNTFET device may be connected to form an aCNTFET diode that operates as an ESD protect device as illustrated schematically further above in FIGS. 19, 24A, 27, and 32A. The aCNTFET device layout may include a multi-fingered device as shown in FIGS. 15B and 15D.

For an nCNTFET device (n-type CNTFET device behavior), a more positive voltage than the threshold voltage applied to gate 3610 relative to at least one of the contacts 3605-1 and 3605-2 makes channel region 3608 more conductive and a less positive voltage makes channel region 3608 less conductive. As described further above with respect to FIG. 13E, CNTFET devices are typically p-type (p CNTFET) as initially fabricated (formed) and can be modified by various methods described further below. A pair of nCNTFET devices may be connected to form an nCNTFET diode pair that operates as an ESD protect circuit as illustrated schematically further above in FIG. 3. The nCNTFET device layout may include a multi-fingered device as shown in FIGS. 15B and 15D.

Contacts 3605-1 and 3605-2 are preferably made of conductive materials such as Ru, Ti, Cr, Al, Au, Pd, Ni, W, Cu, Co, Mo, Ag, In, Ir, Pb, Sn, as well as other suitable metals, and combinations of these such as Ti/Pd, for example. pCNTFET electrical characteristics 1390 illustrated in FIG. 13F were measured on a pCNTFET device that included Ti/Pd contacts. Metal alloys such as TiAu, TiCu, TiPd, PbIn, TiC, and TiW and conductive nitrides, oxides, or silicides such as RuN, RuO, TiN, TaN, $CoSi_x$ and $TiSi_x$ may also be used. Semiconducting material such as polysilicon, germanium, and silicides of silicon, and other semiconducting materials may also be used. Carbon may be used as a contact material as well as carbon nanotube fabrics themselves (single walled, multi-walled, and/or double walled, for example) typically in the form of patterned CNT fabrics that may include both metallic and semiconducting carbon nanotubes. Also, contacts may be formed of mixed or nanoscopic materials that include conductor and semiconductor nanoscopic particles such as W, Ti, TiN, TiC, B, P, K, Pd, Si, and Ge and may also include carbon and one more allotropes of carbon, and other conductive materials such as those listed further above. Nanoscopic particles may also include insulators such as $SiO_2$, SiN, $Al_2O_3$, and other insulators. Mixed or nanoscopic materials and nanoscopic particles are described in more detail in U.S. Pat. No. 8,183,665, herein incorporated by reference in its entirety. Other kinds of conductor, semiconductor, or insulating materials may also be used. Contacts 3605-1 and 3605-2 generally have a thickness in the range of 5 to 500 nm, for example.

Gate insulator 3609 may be formed of SiO$_2$, SiN, Al$_2$O$_3$, BeO, and also high relative dielectric constant materials such as Ta$_2$O$_5$ (tantalum pentoxide), ZrO$_2$, and HfO$_2$ (hathium oxide), or other suitable insulating material, and have a thickness in the range of less than 2 to greater than 10 nm, for example. Gate 3610 may be formed of the same materials listed above with respect to contacts 3605-1 and 3605-2. The channel length, approximately equal to the spacing between contacts 3605-1 and 3605-2, is scaled based on gate insulator type and thickness, gate and contact electrical characteristics, and may range from sub-10 nm to 100 nm or more for example. The various conductor, semiconductor, and insulator materials listed above with respect to FIG. 36 may also be used in CNTFET device structures illustrated in FIGS. 37-40 illustrated further below.

Figure 37:
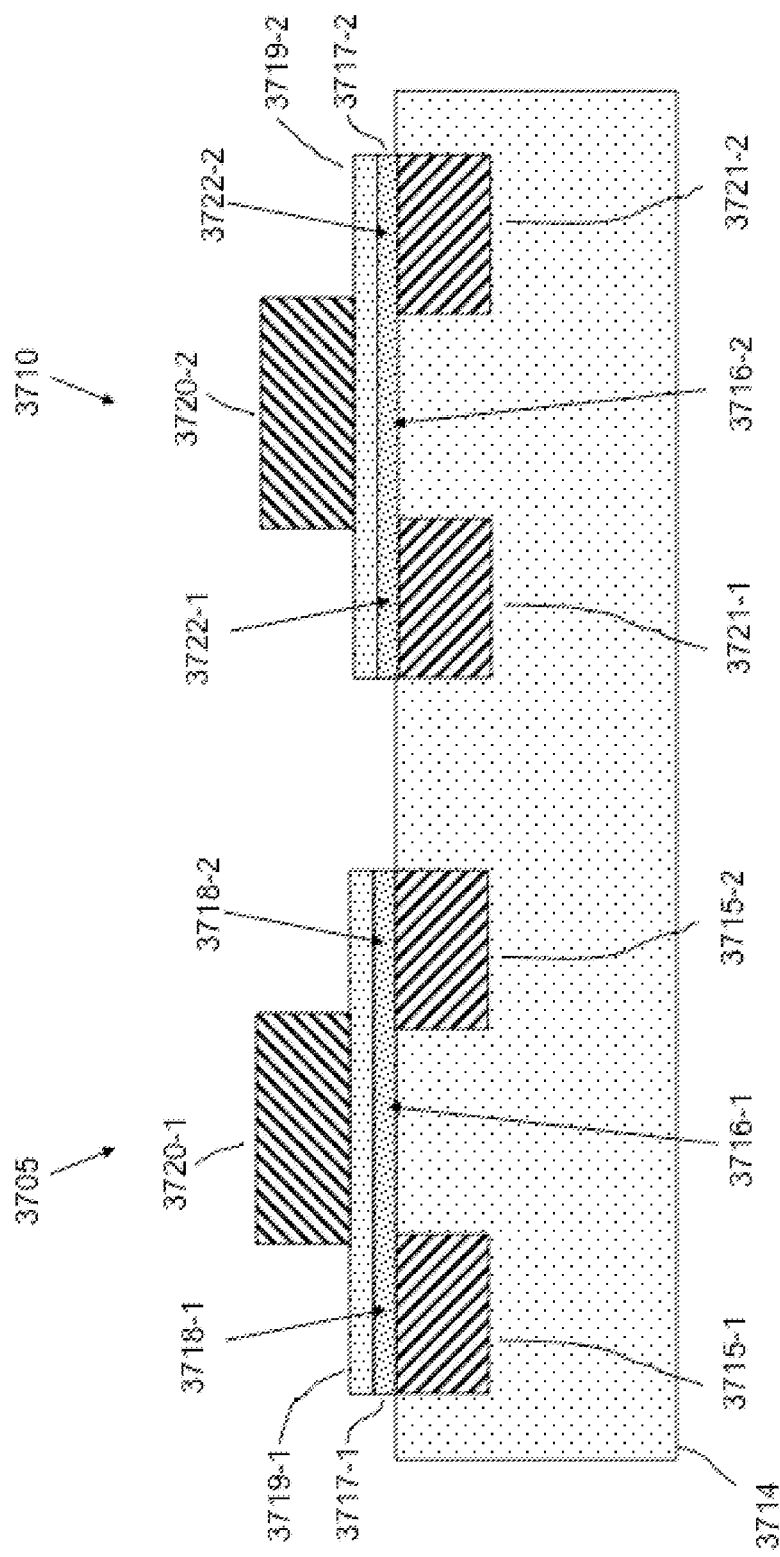
FIG. 37 illustrates a cross sectional view of two CNTFET devices each having source/drain contacts embedded in a common insulating substrate below a carbon nanotube fabric layer for each CNTFET device.

FIG. 37 illustrates the cross sectional structure of two CNTFET devices 3705 and 3710 in a common insulating substrate, although many more than two such devices may be fabricated. Typically, as-fabricated CNTFET devices are p-type, and in this example, CNTFET devices 3705 and 3710 are both pCNTFET devices as fabricated.

CNTFET devices 3705 and 3710, illustrated in FIG. 37, integrated in the same insulator 3714 correspond to CNTFET device 3600 illustrated in FIG. 36. For the CNTFET device 3705 structure, insulator 3714 corresponds to insulator 3602, contacts 3715-1 and 3715-2 correspond to contacts 3605-1 and 3605-2, respectively, semiconductor CNT fabric 3717-1 corresponds to semiconductor CNT fabric 3607, S/D regions 3718-1 and 3718-2 correspond to S/D regions 3606-1 and 3606-2, respectively, channel region 3716-1 corresponds to channel region 3608, gate insulator 3719-1 corresponds to gate insulator 3609, and gate 3720-1 corresponds to gate 3610. For the CNFET device 3710 structure, insulator 3714 corresponds to insulator 3602, contacts 3721-1 and 3721-2 correspond to contacts 3605-1 and 3605-2, respectively, semiconductor nanotube fabric 3717-2 corresponds to semiconductor CNT fabric 3607, S/D regions 3722-1 and 3722-2 correspond to S/D regions 3606-1 and 3606-2, respectively, channel region 3716-2 corresponds to channel region 3608, gate insulator 3719-2 corresponds to gate insulator 3609, and gate 3720-2 corresponds to gate 3610. Both CNTFET devices are assumed to p-type as initially fabricated.

After initial fabrication, CNTFET devices 3705 and 3710 may both be converted to aCNTFET devices by annealing in a vacuum or inert gas as described further above with respect to FIG. 13E and in Bertin et al. U.S. Pat. No. 7,598,544. Additional annealing may be used to convert CNTFET devices 3705 and 3710 to nCNTFET devices.

Figure 38:
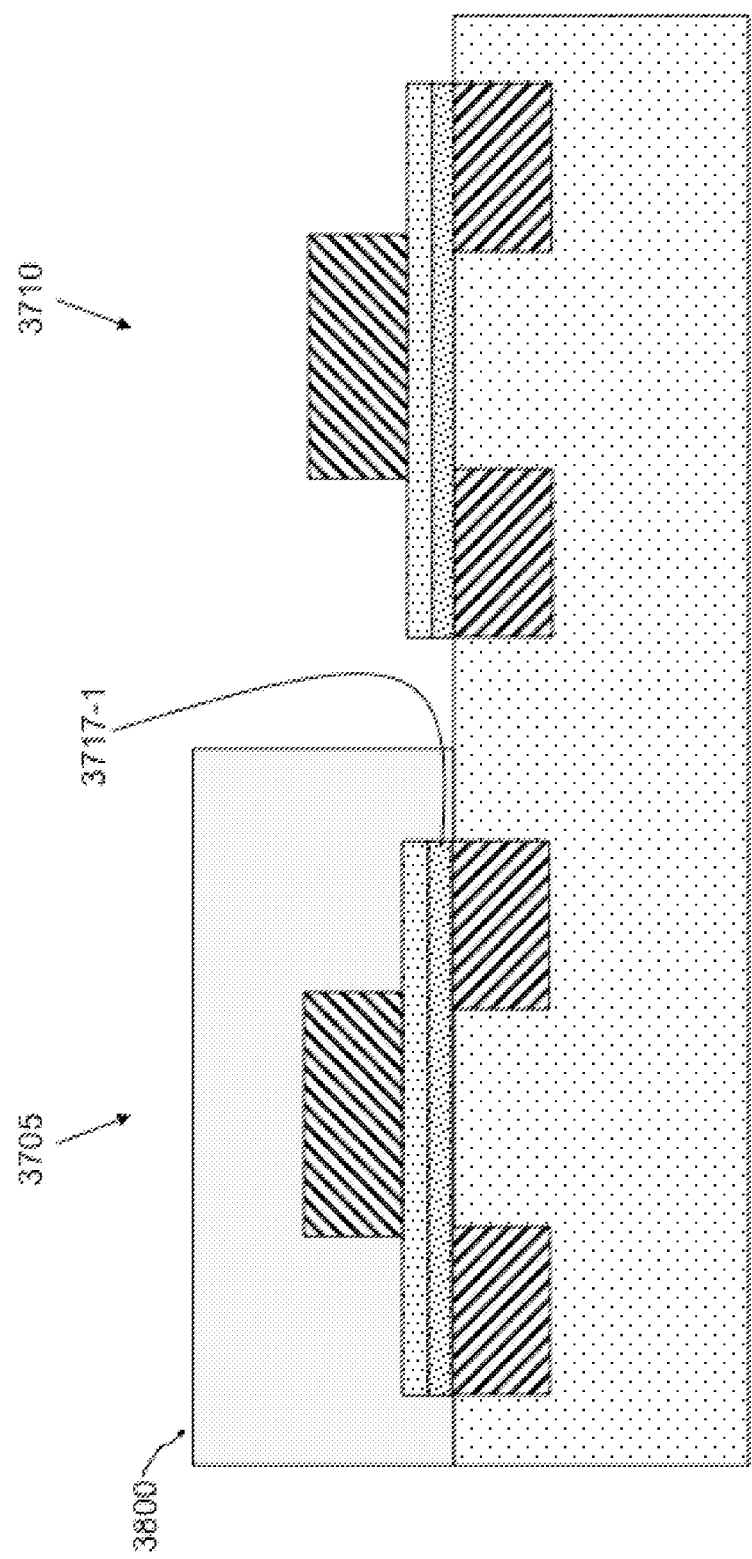
FIG. 38 illustrates a sacrificial mask applied to a CNTFET device to protect the CNTFET device.

Alternatively, CNTFET devices 3705 may be selectively changed such that one is a pCNTFET device and the other is an nCNTFET device. FIG. 38 illustrates sacrificial mask 3800 applied to the CNTFET devices illustrated in FIG. 37 so as to cover (protect) CNTFET device 3705. Sacrificial mask 3800 may be a resist mask. Sacrificial mask 3800 may be a hard mask of Ge, Al, or Al$_2$O$_3$/Ge bi-layer, for example, or other suitable materials. Sacrificial mask 3800 is used to prevent desorption of O$_2$, for example, from the CNTs in semiconducting NT fabric 3717-1. After annealing at elevated temperatures, CNTFET device 3710 changes from an as-fabricated pCNTFET device to an nCNTFET device. Wet chemical, or other methods, may be used to remove sacrificial mask 3800. In this example, after preferential anneal, CNTFET device 3705 is a pCNTFET device and CNTFET device 3710 is an nCNTFET device. CNTFET devices 3705 and 3710 may be used to form the ESD protect circuit illustrated in FIGS. 4 and 5.

CNTFET devices 3600, 3705, and 3710 typically operate as Schottky Barrier CNTFET devices (SB CNTFET devices). The resulting modulation of electrical characteristics of contact barriers formed by corresponding Schottky diodes enables hole injection but blocks electrons for pCNTFET operation; enables electron injection but blocks holes for nCNTFET operation; and enables both hole and electron injection for aCNFET operation as described further above. Hole and electron carrier modulation may be caused by a movement of the Fermi level caused by desorption (or absorption of oxygen) in semiconducting CNTs in the CNT fabric.

CNTFET devices 3600, 3705, and 3710 may be optimized using doping methods, in addition to desorption (or absorption) of oxygen. For example, p-type CNTs may be changed to n-type by doping the CNTs with species such as potassium or nitrogen as described further above with respect to FIG. 10 and illustrated below with respect to FIG. 39. Also, CNTs in the semiconducting NT fabric in contact regions and channel regions of CNTFET devices may be doped with different species or different concentrations of the same species as described in more detail in U.S. Pat. No. 7,852,114. Also, CNTs may be functionalized as described in Bertin et al. U.S. Pat. No. 7,567,414.

Figure 39:
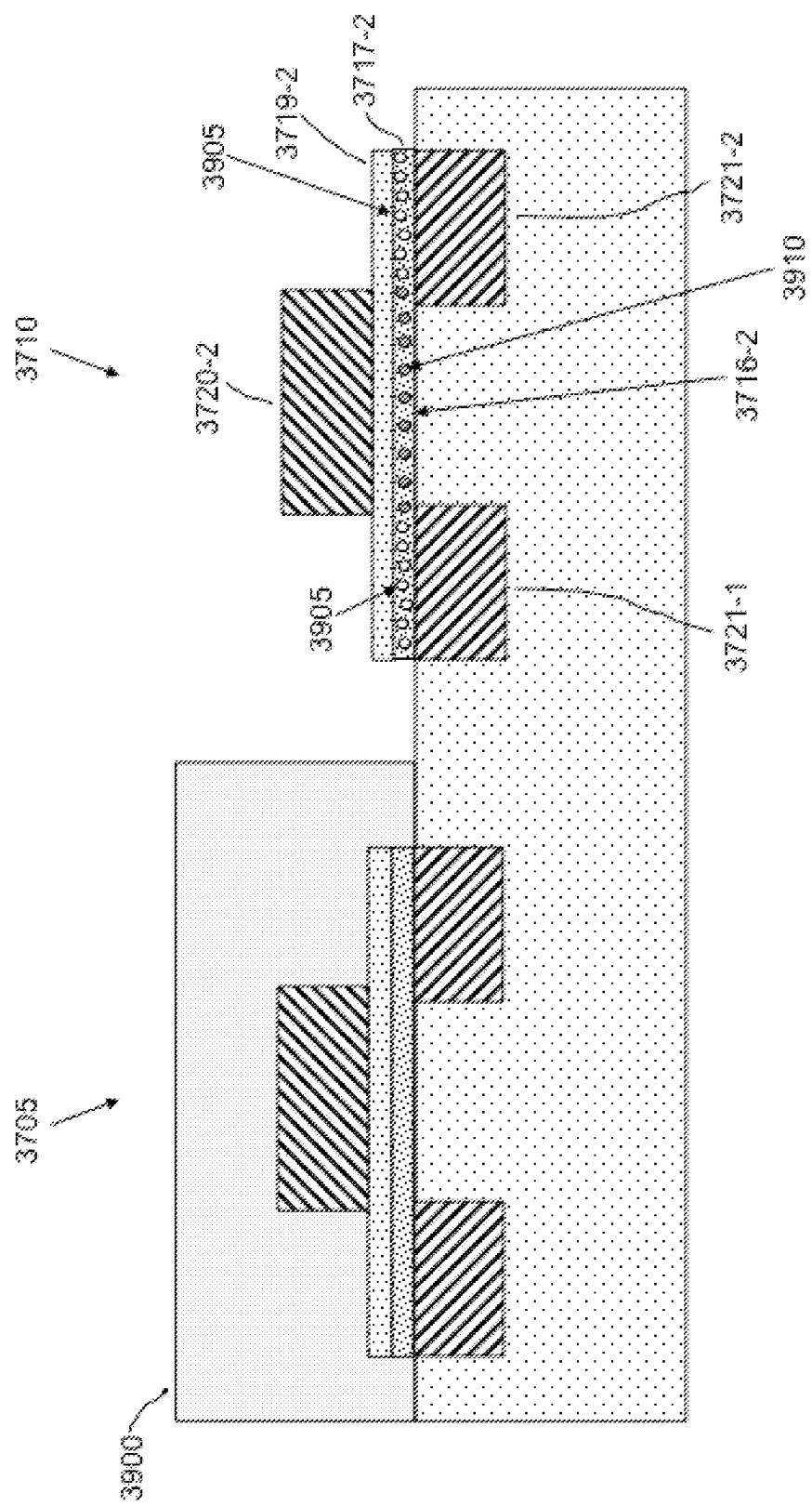
FIG. 39 illustrates a sacrificial mask applied to a first CNTFET device to protect the first CNTFET device and ion implantation occurring in a second CNTFET device.

FIG. 39 illustrates sacrificial mask 3900 applied to the CNTFET devices illustrated in FIG. 37 so as to cover (protect) CNTFET device 3705. Sacrificial mask 3900 may be a resist mask. Sacrificial mask 3900 may be a hard mask of Ge, Al, or Al$_2$O$_3$/Ge bi-layer, for example, or other suitable materials. Sacrificial mask 3900 is used to prevent ion implant species from affecting CNTFET device 3705. Donor species 3905 may be ion implanted at relatively low energy into semiconducting NT fabric 3717-2 corresponding to contacts 3721-1 and 3721-2 regions. Gate 3720-2 prevents donor species 3905 from doping channel region 3716-2. After annealing to activate the donor species 3905, CNTFET device 3710 operates as an nCNTFET device. Wet chemical, or other methods, may be used to remove sacrificial mask 3800. In this example CNTFET device 3705 is a pCNTFET device and CNTFET device 3710 is an nCNTFET device. CNTFET devices 3705 and 3710 may be used to form the ESD protect circuit illustrated in FIGS. 4 and 5.

CNTFET device 3710 optimization may also include ion implantation in the channel region for threshold voltage optimization. As illustrated in FIG. 39, a donor species 3910 may be ion implanted at relatively high energy through gate 3720-2 and gate insulator 3719-2 and into semiconductor NT fabric 3717-2 in channel region 3716-2. The relatively high energy of the ion implant propels the ion implant species through the semiconducting NT fabric and into contacts 3605-1 and 3605-2 regions where they have no effect. CNTFET device 3705 may also be doped to form an optimized pCNTFET device using similar methods of fabrication (not shown).

The CNTFET devices and corresponding CNTFET diodes in the examples used in this specification correspond primarily to Schottky-barrier (SB) CNTFET devices. Schottky-barrier (SB) CNTFET devices operate as somewhat unconventional Schottky barrier transistors in which the gate primarily varies the injection of carriers by Schottky barrier diodes in the source/drain (S/D) region formed by metals in contact with the NT fabric, and correspond to results obtained by Nantero using device-level burn-off post processing as described further above with respect to FIGS. 13E and 18. SB CNTFET devices form pCNTFET devices with p-type majority carriers, nCNTFET devices with n-type majority carriers, and aCNTFET devices that support both p and n-type majority carriers.

However, doping concentrations such as donor species 3905 (may also be acceptor species depending on the CNTFET device type) may be chosen to form Ohmic or near-Ohmic contacts in semiconducting NT fabric 3717-2 in the regions corresponding to contacts 3721-1 and contact 3721-2. Operation is similar to conventional transistors with Ohmic contacts in the S/D region and pCNTFET or nCNTFET device characteristics depending on the CNT doping species, gate material, and other factors. Doped-S/D CNTFET (S/D CNTFET) device operation is similar to conventional transistors with p or n-type CNTFET characteristics and ON-current determined by the amount of charge that can be induced in the channel region by the gate, and not by doping in the source. The CNTs forming the patterned NT fabric in the channel region are doped differently than those in the NT fabric between S/D contacts and the gate region as illustrated in FIG. 39.

Still other variations of CNTFET devices are possible. For example, the semiconductor NT fabric 3717-2 region corresponding to contact 3721-1 may be doped as Schottky-barrier, while the semiconductor NT fabric 3717-2 region corresponding to contact 3721-2 may be doped Ohmic or near-Ohmic resulting in a Schottky-Ohmic (SO) CNTFET device. In this example, CNTFET device 3710 may use Schottky diode contacts at the source, for example, and Ohmic contacts at the drain. Additional variations are possible. SB CNTFET devices, S/D CNTFET devices, SO CNTFET devices, and other variations (not shown) may be used as CNTFET devices to form CNTFET diodes described further above.

Figure 40:
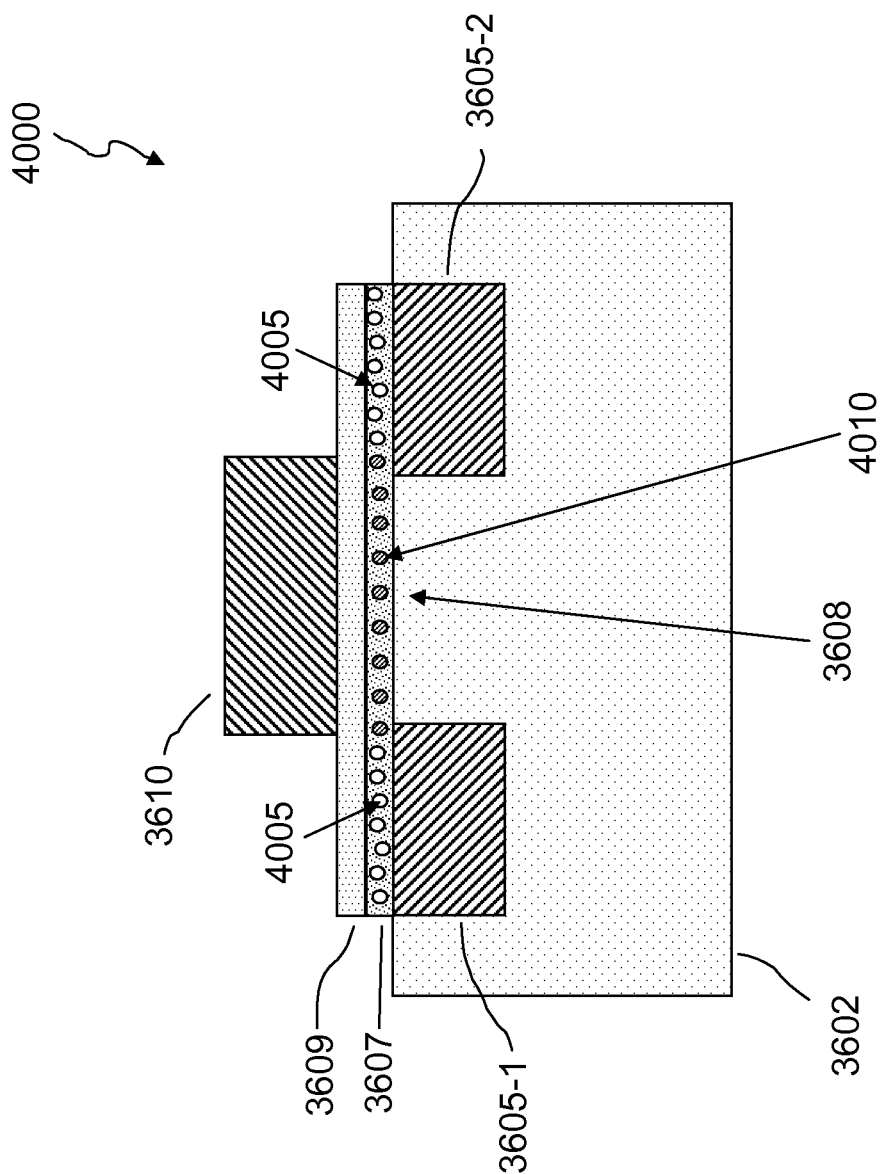
FIG. 40 illustrates ion implantation occurring in a CNTFET device.

CNTFET device 3600 illustrated in FIG. 36 may be as an optimized as an aCNTFET device using ion implantation methods described further above with respect to FIG. 39. Referring to FIG. 40, donor or acceptor species 4005 may be ion implanted at relatively low energy into semiconducting NT fabric 3607 corresponding to the contacts 3605-1 and 3605-2 regions. Gate 3610 prevents donor or acceptor species 4005 from doping channel region 3608. After annealing to activate the implanted, CNTFET device 4000 operates as an aCNTFET device. aCNTFET device Schottky-barrier contact regions inject both p and n-type majority carriers. In device optimization, it may be desirable to increase the injection of p or n type carriers, Hence, the implant species may be a donor or acceptor.

CNTFET device 4000 optimization may also include ion implantation in the channel region for threshold voltage optimization. As illustrated in FIG. 40, a donor or acceptor species 4010 may be ion implanted at relatively high energy through gate 3600 and gate insulator 3609 and into semiconductor NT fabric 3607 in channel region 3608. The relatively high energy of the ion implant propels the ion implant species through the semiconducting NT fabric and into contacts 3605-1 and 3605-2 regions where they have no effect.

The gates and contacts in illustrated in FIGS. 36-40 may be formed as part of chip wiring layers, with additional wiring layers below the contacts and above the gates. This enables the corresponding CNTFET devices to be integrated, within chip wiring layers and sandwiched between chip wiring layers. In order to enhance flexibility in integrating CNTFET devices within and between wiring layers in a process flow, gates may be placed above or below the NT fabric; contacts to the NT fabric may be to the top or bottom surface. One contact may be to the NT fabric top surface and another to the NT fabric bottom surface. Any combination that optimized various CNTFET device integration process flow and layout may be used.

Figure 41:
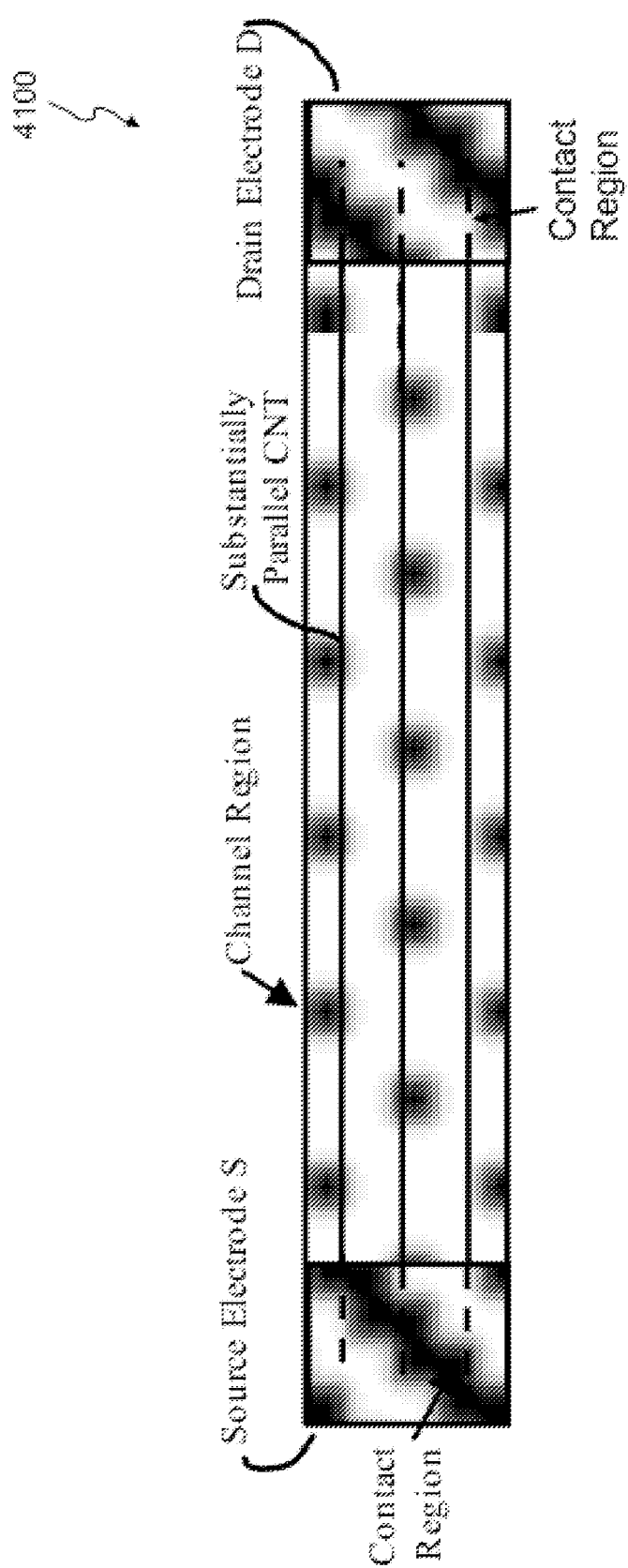
FIG. 41 illustrates a plan view of an ordered carbon nanotube fabric with substantially parallel carbon nanotubes in contact with source and drain electrodes.

CNTFET Device Layouts, Structures, Electrical Characteristics, and Corresponding CNTFET Diodes, Using Relatively High Density Ordered Carbon Nanotube Fabrics CNTFET device design, and corresponding nanotube diode design, have been described further above with respect to relatively low density unordered nanotube (NT) fabrics similar to the NT fabric illustrated in FIG. 10C. At this point in the description, an analysis of CNTFET device design and corresponding CNTFET diode is presented for a the NT fabric illustrated in FIG. 10D, and referred to as an ordered CNT fabric as described further above with respect to FIG. 10D. An ordered CNT fabric with substantially parallel CNTs is described in Bertin et al. U.S. Pat. No. 7,567,414, hereby incorporated in its entirety. FIG. 41 illustrates plan view 4100 of a CNTFET device structure, which is similar to FIGS. 10A and 10B, with CNT fabric 1052 formed with an ordered nanotube fabric with substantially parallel CNTs illustrated by plan view 4100 in FIG. 41. patent application Ser. No. 13/076,152, incorporated herein by reference in its entirety, illustrates a method of making ordered CNT fabrics with substantially parallel CNTs as illustrated in FIG. 10D. patent application Ser. No. 13/579,828 illustrates methods of forming CNTFET devices using ordered CNT fabrics in structures such as illustrated in FIGS. 10A and 10B, gate insulator and contact material properties, and methods of fabrication and corresponding CNT-based device electrical characteristics.

Current flow between source and drain electrodes in an ordered CNT fabric with substantially (effectively) parallel CNTs is determined by the contact resistance between electrodes and the carbon nanotubes, the quantum resistance reflecting the limited availability of mobile electron (or hole) carriers in carbon nanotubes, the carrier transport properties (mobility, determined by average carrier velocity), and the number of carriers induced by the gate in each of the substantially parallel CNT in the carbon nanotube (CNT) fabric. For pCNTFETs, nCNTFETs, and aCNTFETs, holes, electrons, or a combination of holes and electrons, respectively, flow in individual CNTs between source and drain electrodes. For relatively long CNTs, such as 1 um for example, and relatively short source-to-drain electrode spacing, such as 200 nm, 100 nm, 50 nm, and even smaller spacing, most substantially parallel CNTs span the entire distance between source and drain. Hole current flow is determined by current flow through the valence bands of high quality semiconducting SWNTs (s-SWNTs) and electron current flow is determined by current flow through the conduction bands of high quality s-SWNTs. In some cases, semiconducting MWNTs may also be used. High quality semiconducting CNTs typically result in CNTFETs with $I_{ON}/I_{OFF}$ ratios of $10^5$ to $10^6$ and even higher. For high quality semiconducting CNT fabrics in which CNTs essentially do not overlap, carrier transport may even approach ballistic conditions. While individual CNT illustrated in FIG. 41 are drawn parallel, individual CNTs are approximately parallel, not exactly parallel, as illustrated further above in FIG. 10D.

For CNTFET devices, the gate-to-nanotube capacitance as a function of geometry, materials, and applied voltages determines the number of mobile carriers available in the CNT fabric as described further below. The number of mobile carriers and the carrier mobility determines the corresponding current flow between source and drain regions of the CNTFET device.

Figure 42:
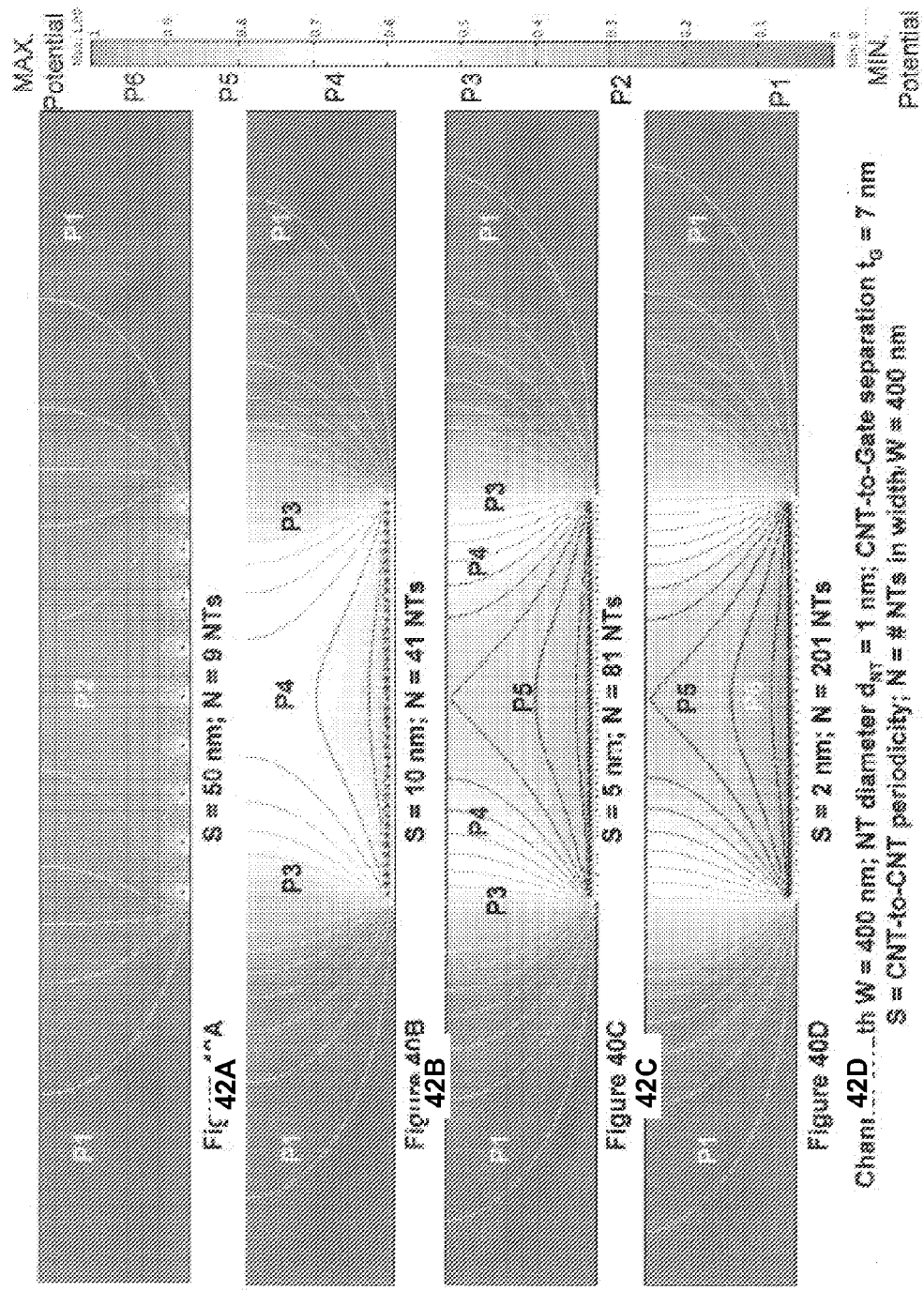
FIG. 42 illustrates a finite element simulation of electric potential for a an ordered carbon nanotube fabric with substantially parallel carbon nanotubes using the COMSOL simulator.

FIG. 42 illustrates a simulation of electrostatic potential for various CNTs of center-to-center periodicity S. For each case in this example, the CNT fabric is assumed to be approximately 400 nm wide. For the purpose of modeling electrical characteristics, individual CNTs in the nanotube channel element are approximated as substantially parallel and evenly spaced cylinders as illustrated in FIG. 41. The number of CNTs in width W=400 varies depending on the center-to-center periodicity S and the diameter of the carbon nanotubes. FIG. 42 illustrates changes in the electrostatic potential as the number of individual nanotubes in the CNT fabric are increased and brought in closer proximity, all within the fixed width of approximately 400 nm.

The electrostatic potential simulation was carried out by solving Poisson's equation using finite element analysis methods. The simulation program used for this simulation is referred to as COMSOL. COMSOL Multiphysics simulation software is available from the COMSOL Multiphysics Company; however, other programs may be used to solve Poisson's equation. Poisson's equation is shown in a compact form by equation 20.1 and in expanded form by equation 20.2:

$$\nabla^2 \phi = -\rho/\mathcal{E}, \text{ where } \mathcal{E} = \mathcal{E}_R \mathcal{E} \qquad [\text{EQ. 20.1}]$$

which may be expanded as:

$$\partial^2 \phi/\partial^2 x + \partial^2 \phi/\partial^2 y + \partial^2 \phi/\partial^2 z = -\rho \mathcal{E} \qquad [\text{EQ. 20.2}]$$

The electrostatic potential $\Phi$ is calculated from Poisson's equation, with a charge per unit volume $\rho$, and a dielectric constant $\mathcal{E}$, which may be written as $\mathcal{E} = \mathcal{E}_R \mathcal{E}_0$, the product of the relative dielectric constant $\mathcal{E}_R$ and the dielectric constant of space $\mathcal{E}_0$ as described further above. Poisson's equation is solved in the x-y plane; the z direction is along the length of the CNT. The electrostatic potential is assumed to remain essentially the same along each of the CNTs (the z axis) so corresponding capacitance calculations are in Farads/unit length; in this simulation, in Farads/meter (F/m), which may be converted to Farads/centimeter (F/cm), for example. The electrostatic potential is a function of geometry and dielectric material. The CNT diameter (cylindrical) $d_{NT}$, with R (sometimes also referred to as $R_{NT}$) the radius equal to $d_{NT}/2$, may be varied. The separation of individual CNTs from a conductive plane, corresponds to a gate-to-the nearest CNT surface distance, and is referred to as the gate separation $t_G$, and also as a distance r, in capacitance equations. The CNT center-to-center periodicity S, the diameter of the nanotubes, and the number of nanotubes N determine the CNT fabric width W.

Referring to FIG. 42, in these examples, the channel width W is approximately equal to 400 nm for all cases. The CNT-to-gate separation $t_G$=7 nm, and the nanotube diameter is $d_{NT}$=1 nm or corresponding nanotube radius R=0.5 nm. The CNT periodicity S and the number of nanotubes N vary. A scale on the right hand side of FIG. 42 illustrates relative electrostatic field intensity from 0 to 1.00. Relative electrostatic potential region P1 has the weakest relative electrostatic potential. Relative electrostatic potential strength increases in regions P2, P3, P4, and P5, until the relative electrostatic potential reaches a maximum of P6.

FIG. 42A illustrates the electrostatic potential for S=50 and N=9 substantially parallel carbon nanotubes. The separation between CNTs is large enough that there is only a small overlap of electric fields between nanotubes, and a good approximation to the capacitance may be calculated using the capacitance per unit length of one nanotube and multiplying by N=9 to get the total nanotube capacitance per unit length of the CNT fabric calculated using equations 20.3 or equation 20.4 shown further below. Equation 20.6 for a single nanotube N=1 may used as well. In FIG. 42A, the electric fields are mostly fringing fields concentrated around each nanotube, with relative electrostatic potential P3, P4, P5, and P6 concentrated around each individual nanotube. The region between nanotubes has weak relative electric potential P1 and P2. FIG. 42A represents a low density CNT fabric with substantially parallel nanotubes. However, for CNTFET design purposes, high density NT fabrics are typically more desirable as explained further below with respect to FIGS. 44, 45, and 47.

As CNT fabric density increases, separation between substantially parallel nanotubes decreases and the number of nanotubes increases. The electric potential contribution to a nanotube from other nanotubes increases and the pattern of fringing fields decreases. This effect is illustrated in FIGS. 42A-42D as the CNT center-to-center periodicity S decreases from S=50 nm with N=9 CNTs, to S=10 nm with N=41 CNTs, S=5 nm with N=81 CNT s, and S=2 nm with N=201 CNTs, respectively. In these examples shown in FIGS. 42A-42D, the CNT fabric has a width W=400 nm. The strength of the relative electrostatic potential increases in the region between the individual nanotubes as the CNT-to-CNT spacing is reduced.

Figure 43:
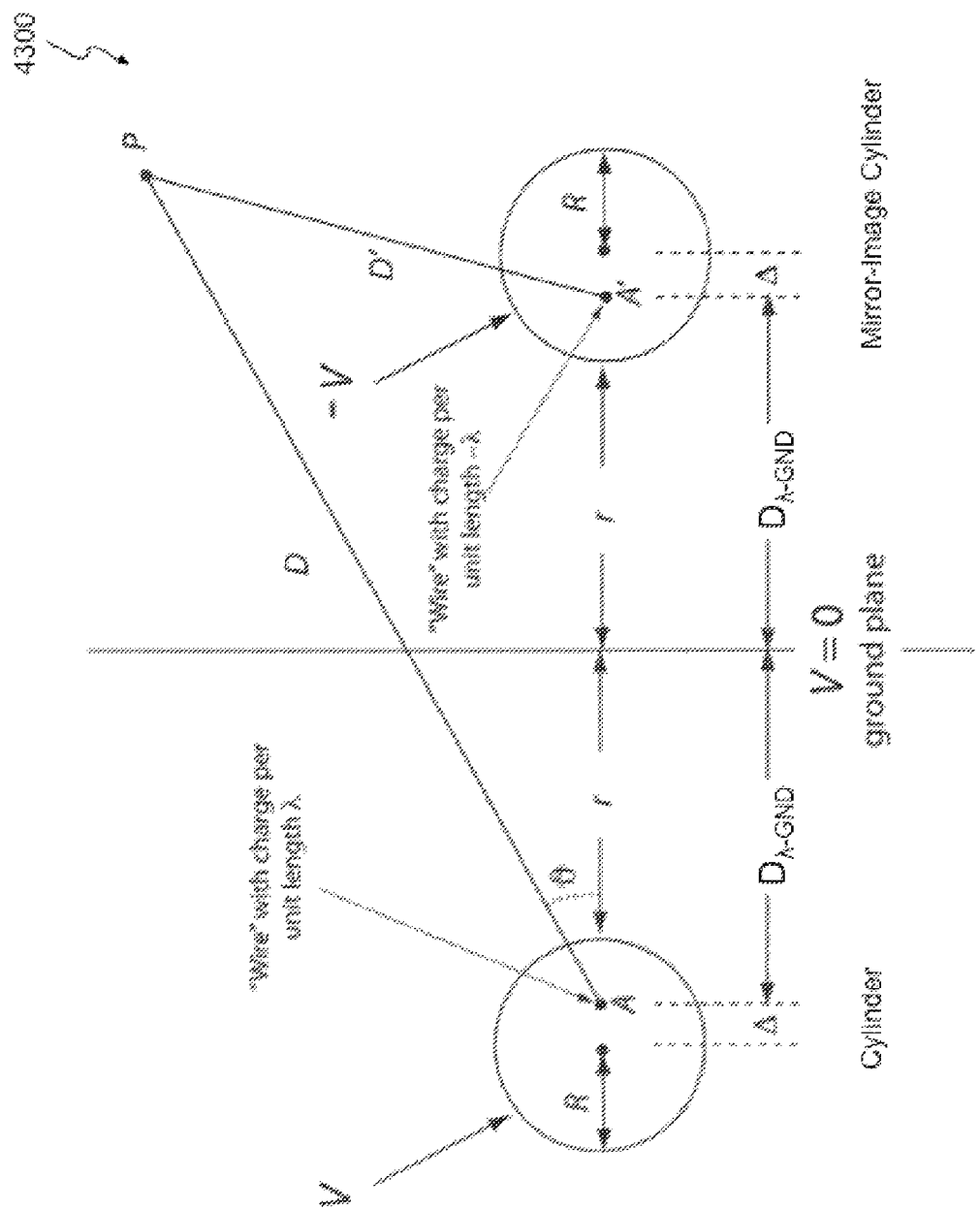
FIG. 43 illustrates a cylinder next to a ground plane with a mirror-image cylinder used to derive capacitance equations for a gate-to-carbon nanotube capacitance.

FIG. 43 illustrates a cylinder and ground plane structure 4300, with a mirror image cylinder used to calculate the electric fields and electrostatic potentials. A closed-form solution may be calculated based on a wire with a charge per unit length displaced (positioned) from the center of the cylinder by an amount that depends on cylindrical diameter and distance from of the outer circumference of the cylinder to a ground plane. In this example, an electrostatic potential of zero is present along the surface of the ground plane, and an electrostatic potential of V is present on the circumference of the cylinder, and an electrostatic potential of –V is present on a mirror-image cylinder that is used in the electrostatic potential calculation. Cylinder and ground plane structure 4300 corresponds to an ordered CNT fabric with substantially parallel carbon nanotubes that are widely separated, as illustrated in FIG. 42A, such that the capacitance of each nanotube may be calculated independently of other nanotubes. The equation for capacitance per unit length $G_E$ corresponding to FIG. 43, structure 4300 is as follows:

$$C_f = 2\pi \mathcal{E}_R \mathcal{E}_0 / \ln\left[(r+r/R) + ((r+r/R)^2 - 1)^{0.5}\right], \qquad [\text{EQ 20.3}]$$

where r corresponds to $t_G$, the separation between the cylindrical surface of a NT and the gate of a CNTFET, which is represented by a ground plane, and R corresponds to the radius $R_{NT}$ of a nanotube. Equation 20.3 may be found in the article by Dequesnes, et al., "Static and dynamic analysis of carbon nanotube-based switches", Transactions of the ASME, Vol. 126, July 2004, pp. 230-237.

For a relatively low ordered NT fabric density examples described in this specification, in which r>>R (may be used for r>2R), equation 20.3 may be simplified as:

$$C_f = 2\pi \mathcal{E}_R \mathcal{E}_0 / \ln(2t_G/R_{NT}), \qquad [\text{EQ 20.4}]$$

Equations 20.3 and 20.4 may not be used when substantially parallel nanotubes are closely spaced in a relatively high ordered CNT fabric density as illustrated in FIGS. 42B-42D.

The method of derivation of capacitance per unit length equation 20.3 may be modified and extended such that the electric potential contribution of all other NTs (cylinders) to each individual NT cylinder may be approximated, and the capacitance per unit length for nanotube m may calculated using equation 20.5.

$$C_l(m) = \frac{2\pi\varepsilon_0\varepsilon_r}{\left\{\ln\left[\left(1+\frac{r}{R}\right)+\sqrt{2\frac{r}{R}+\left(\frac{r}{R}\right)^2}\right]+2\sum_{n=1}^{+\infty}\ln\left(\frac{\{n^2S^2+[2(r+R)]^2\}^{1/2}}{|nS|}\right)\right\}} \quad \text{EQ 20.5}$$

Equation 20.5 may be used to calculate the capacitance per unit length $C_l(m)$ for nanotube m as part of an infinite number of substantially parallel nanotubes $n=1$ to $\infty$.

However, for design purposes, there are a finite number of nanotubes N in a CNT fabric of width W as illustrated in FIGS. 42A-42D. Equation 20.5 may be modified to calculate the capacitance per unit length $C_l(m)$ for each of N nanotubes with a periodicity S, diameter $d_{NT}$, and separated from a gate by distance r (or $t_G$) as illustrated by equation 20.6.

$$C_l(m) = \frac{2\pi\varepsilon_0\varepsilon_r}{\left\{\ln\left[\left(1+\frac{r}{R}\right)+\sqrt{2\frac{r}{R}+\left(\frac{r}{R}\right)^2}\right]+\sum_{\substack{n=1 \\ \text{but } n\neq m}}^{N}\ln\left(\frac{\{(n-m)^2S^2+[2(r+R)]^2\}^{1/2}}{|(n-m)S|}\right)\right\}} \quad \text{EQ 20.6}$$

Equation 20.6 is sufficiently accurate for design purposes as illustrated by capacitance values 4500 illustrated in FIG. 45 further below, in which capacitance calculations using equation 20.6 are compared with simulations of Poisson's equation, illustrated by equations 20.1 and 20.2, using the COMSOL simulator as described further above.

Figure 44:
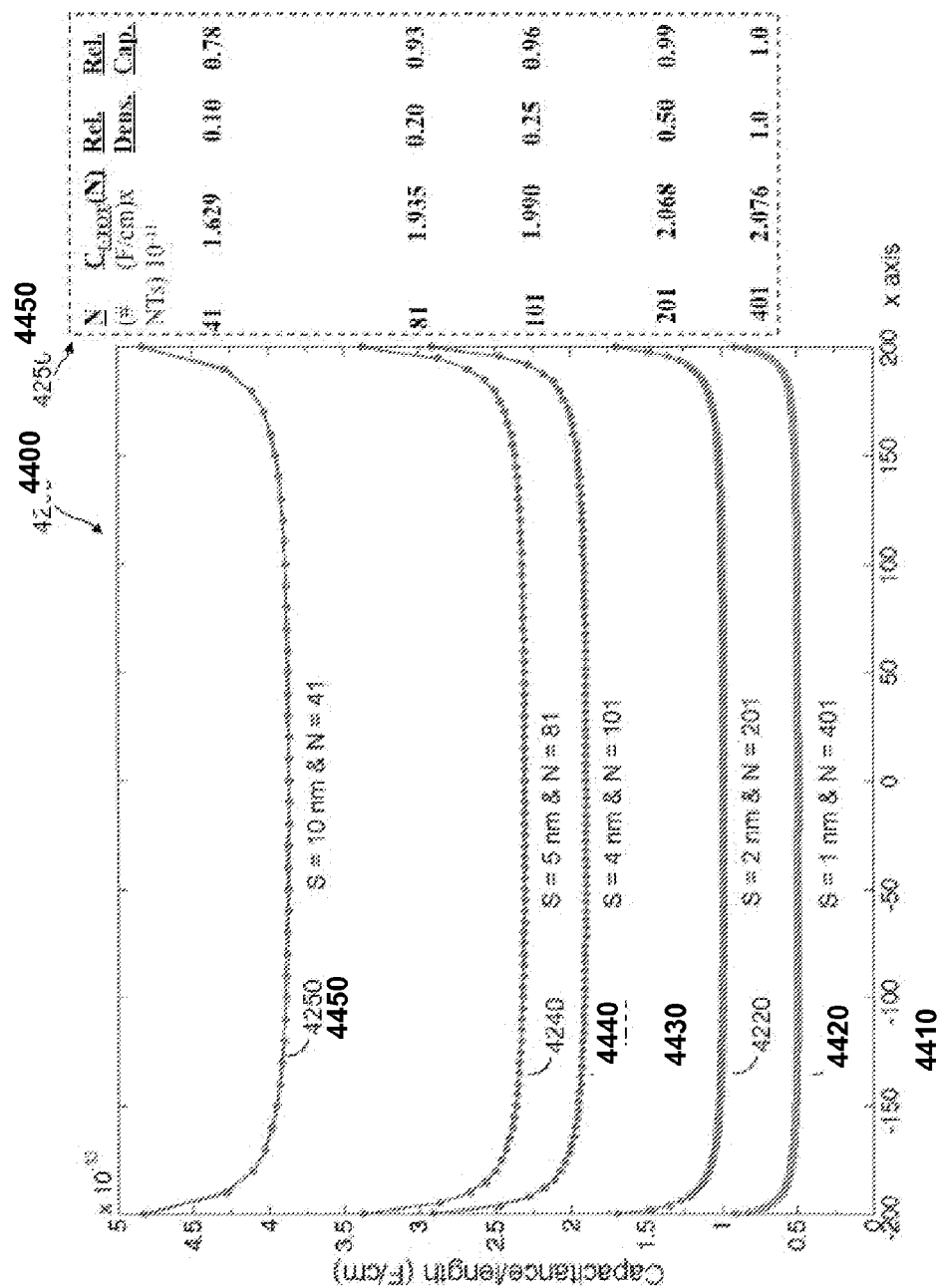
FIG. 44 illustrates a graphical representation of capacitance per unit length for substantially parallel carbon nanotubes as a function of position in the width direction of a carbon nanotube fabric of 400 nm width.

FIG. 44 illustrates capacitance values 4400 of each substantially parallel nanotube as a function of CNT periodicity and the total number of CNTs N in channel width W=400 nm calculated using equation 20.6. Table 4450 shows corresponding total capacitance values calculated using equations 20.8 and 20.6. Table 4450 also shows relative fabric densities (Rel. Dens.) and relative total capacitance (Rel. Cap.) values for ease of comparison of total capacitance values as a function of the ordered nanotube relative CNT fabric density, as the number of nanotubes N in width W=400 nm is varied between N=41 and N=401.

Capacitance values 4410 illustrate the capacitance per unit length of each of N nanotubes as a function of position. There are N=401 nanotubes with a periodicity S=1 nm, which means that the substantially parallel nanotubes are at a maximum density with no separation. Because of van der Waals interactions between adjacent nanotubes, there is a minimum separation of 0.45 nm; however, the total capacitance between gate and nanotube fabric remains unchanged because of close nanotube spacing effects illustrated in Table 4450. The nanotube at the mid-point of the CNT fabric 4100 illustrated in FIG. 41 may correspond to nanotube m=201 with a capacitance per unit length of $C_l(201)$ positioned along the x axis at x=0 of the NT fabric of width 400 nm in FIG. 44, if CNT fabric 4100 is at a density corresponding to nanotube periodicity S=1 nm. The NT fabric of width 400 nm is shown as going from x=−200 nm to x=+200 nm in FIG. 44. Nanotube $C_l(201)$ has 200 CNTs to the left, nanotubes n=1 to 200 and 200 CNTs to the right, nanotubes n=202 to 401. The capacitance of $C_l(201) \sim 0.5 \times 10^{-13}$ F/cm. The capacitance per unit length increases slowly for CNTs to the left and right of $C_l(201)$. For nanotubes near the edge of the CNT fabric, fringing fields increase, and this increases the capacitance per unit length. For capacitance values 4410, $C_l(1)=C_l(401) \sim 0.8 \times 10^{-13}$ F/cm at the edge of the NT fabric, fringing fields are highest and the capacitance is approximately 60% higher than for $C_l(201)$ at the center of the NT fabric based on calculations using equation 20.6. Comparison of calculated capacitance with capacitance values based on Poisson simulations illustrated in FIG. 45 differ by less than a few percent, except for the two nanotubes at each end of the NT fabric with simulated capacitance values almost 20% higher. Correcting for this difference shows that capacitance per unit length for the nanotubes at the edge of the NT fabric in the width direction, are approximately 90% higher in value than for a nanotube in the middle, such as nanotube $C_l(201)$ for example. Since only a few NTs have such relatively high capacitance values, their effect on the total capacitance per unit length for all N substantially parallel nanotubes that form the CNT fabric is relatively small. In these examples, values of N are chosen as odd numbers for ease of visualization and description, with equal number of nanotubes to the left and right of a nanotube in the center of the CNT channel element width. However, N may use an even number of nanotubes instead.

Capacitance values 4420 shown in FIG. 44 illustrate the capacitance per unit length of each of N nanotubes as a function of position. There are N=201 nanotubes with a periodicity S=2 nm corresponding to the electrical potential simulation results illustrated in FIG. 42D, which means that the substantially parallel nanotubes are separated by the diameter of a nanotube. The capacitance per unit length for each nanotube corresponding to capacitance values 4420, is approximately double the capacitance per unit length for each nanotube corresponding to capacitance values 4410, because of changes (reduction) in the electrostatic potential coupling between the N=201 nanotubes and the N=401 nanotubes described further above. For example, at x=0, the mid-point of the CNT fabric width, $C_l(101) \sim 1 \times 10^{-13}$ F/cm is approximately 2× higher than $C_l(201) \sim 0.5 \times 10^{-13}$ F/cm. Also, the nanotubes at the edge of the CNT fabric width, $C_l(1)=C_l(201) \sim 1.7 \times 10^{-13}$ is approximately 2× higher than $C_l(1)=C_l(401) \sim 0.8 \times 10^{-13}$ F/cm. So in this example, reducing the nanotube density by a factor of 2 results in approximately 2× greater capacitance per unit length per nanotube, resulting in approximately the same total CNT fabric capacitance. For example, table 4450, illustrated in FIG. 44, shows that the total capacitance value $C_{l\text{-}TOT}=2.076 \times 10^{-11}$ F/cm for the 400 nm wide CNT fabric with N=401 nanotubes, compared with $C_{l\text{-}TOT}=2.068 \times 10^{-11}$ F/cm for the 400 nm wide CNT fabric with N=201 nanotubes, shows the surprising result of a total capacitance per unit length reduction of 1% for a relative CNT fabric density reduction of a factor of 2. As also shown in table 4450, the total capacitance per unit length is reduced by approximately 4% for a factor of 4 reduction in relative CNT fabric density. For all cases illustrated in FIG. 44, the N nanotubes are positioned within the same NT fabric width of approximately W=400 nm.

The surprising insensitivity of total capacitance per unit length to CNT fabric density illustrated in FIG. 44 shows that the total capacitance between the CNT fabric channel element and gate described further above with respect to FIG. 41 would not vary significantly as a function of variations in CNT fabric density and geometry.

FIG. 44 also illustrates capacitance values 4430, 4440, and 4450. Capacitance values 4440 and 4450 correspond to electrical potential simulations of Poisson's equation illustrated in FIGS. 42C and 42B, respectively.

Figure 45:
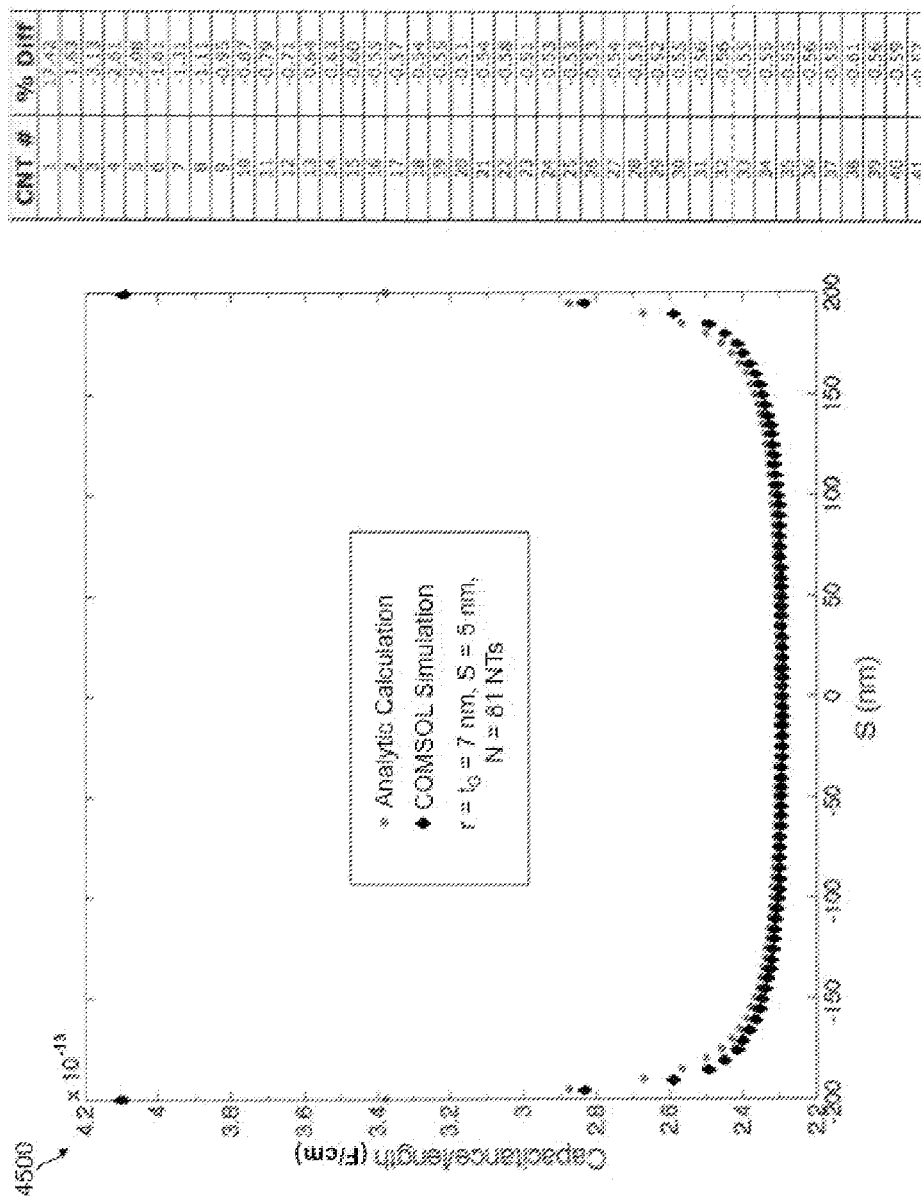
FIG. 45 illustrates a graph and table comparing capacitance calculations with capacitance values from simulations using the COMSOL simulator

FIG. 45 illustrates capacitance values 4500 calculated using equation 20.6 are compared with capacitance values calculated using Poisson's equations 20.1 and 20.2 simulated with the COMSOL program in graphical and table form. Capacitance values 4500 correspond to capacitance values 4440 illustrated in FIG. 44, and COMSOL simulated capacitance values, corresponding to the electrostatic potential illustrated in FIG. 42C. Capacitance values calculated with equation 20.6 and capacitance values based COMSOL simulations are compared in FIG. 4500 in graphical and tabular form. The table only shows half the nanotubes since the curve is symmetrical. The deviation between simulation and calculation for individual substantially parallel nanotubes forming the NT fabric varies between approximately 0.5% and 3% for 79 of the 81 nanotubes. The two nanotubes closest to the edge of the NT fabric, Cl(1) and Cl(81) deviate by approximately 17.5%. The accuracy of the calculation for the total capacitance summed over all 81 nanotubes is less than a few percent different from the COMSOL simulation, illustrating the accuracy of capacitance calculations based on equation 20.6.

The total current flowing between source and drain electrodes may be calculated as $I_{DS}=Q_C/\tau$ (equation 12.7), where $\tau=L^2/\mu \cdot V_{DS}$, L is the separation between source and drain electrodes illustrated in FIG. 41 and $\mu$ is the carrier mobility in units of $cm^2/N \cdot s$.

The total number of mobile carriers is determined by summing the mobile carriers (charge) induced in each nanotube as a function of the applied gate-to-source voltage, the threshold voltage of the device, and the voltage drop $V_{DS}$ due to current flow as described further above with respect to FIG. 12 and equation 12.1. The capacitance values, gate capacitance between gate and CNT fabric, are in capacitance per unit length and are multiplied by a length L. Mobility as a function of the induced carriers (charge) may be used for each nanotube. However, in this example, the mobility $\mu$ is assumed to be approximately the same for each of the nanotubes. Accordingly, the total mobile charge $Q_C$ for a CNT fabric with substantially parallel nanotubes is calculated as follows:

$$Q_C = L \cdot [C_l(1)+C_l(2)+ \ldots +C_l(N)] \cdot [V_{GS}-V_{TP}-V_{DS}/2], \quad [EQ\ 20.7]$$

Where the values of $C_l(m)$ are calculated using equation 20.6. The total capacitance per unit length is the sum of the capacitance per unit length of each nanotube. The total capacitance per unit length for N nanotubes may represented by:

$$C_{l-TOT}(N)=C_l(1)+C_l(2)+ \ldots +C_l(N), \quad [EQ\ 20.8]$$

and the equation for total mobile charge $Q_C$ may be written as:

$$Q_C = L \cdot C_{l-TOT}(N) \cdot [V_{GS}-V_T-V_{DS}/2], \quad [EQ\ 20.9]$$

Using $I_{DS}=Q_C/\tau$ (equation 12.7), where $\tau=L^2/\mu \cdot V_{DS}$, the current equation may be written as:

$$I_{DS}=\{L \cdot C_{l-TOT}(N) \cdot [V_{GS}-V_T-V_{DS}/2]\}/\{L^2/\mu \cdot V_{DS}\}, \text{ or}$$

$$I_{DS}=(\mu/L) \cdot C_{l-TOT}(N) \cdot [V_{GS}-V_T-V_{DS}/2]V_{DS}, \text{ or}$$

$$I_{DS}=(\mu/L) \cdot C_{l-TOT}(N) \cdot [(V_{GS}-V_T)V_{DS}-V^2_{DS}/2], \quad [EQ\ 20.10]$$

for calculating the current flow in the linear region of CNTFET device operation.

$$I_{DS}=(\mu/L) \cdot C_{l-TOT}(N) \cdot [(V_{GS}-V_T)^2/2], \quad [EQ\ 20.11],$$

may be used to calculate $I_{DS}$ for CNTFET devices in saturation, where $V_{DS,sat}=V_{GS}-V_T$ at the onset of saturation as described further above.

At this point in the calculation of CNTFET device structures and dimensions, the carrier (charge) transport mobility $\mu$ (units of $cm^2/V \cdot s$) is calculated. Research work on nanotube transport has been carried out by various university, industrial, and government laboratories on a single nanotube between two electrodes. In this example, the nanotube mobility $\mu$ is based on a mobility calculation using data for a single nanotube from the reference A. Javey et al., "Ballistic carbon field-effect transistors", Nature, Vol. 424, 7 Aug. 2003, pp. 654-657. Carrier transport through the valence or conduction bands of high-quality semiconducting SWNTs can achieve high values of mobility. However, non-ideal electrical contacts between source and drain electrodes and the nanotubes forming the CNT fabric can result in significant Schottky barriers which limit transport efficiency.

The Javey et al. reference reports the use of palladium contacts on SWNTs of 1.5 nm in diameter. This single nanotube device is fabricated on the surface of $SiO_2$ ($\epsilon_R=4$) of thickness 67 nm on a silicon wafer acting as a back-gate. In the example illustrated in FIG. 4c of the Javey et al. reference, hole mobility between palladium source/drain electrodes separated by L=300 nm is optimized by using palladium as the conductor contact for optimum transfer and flow of holes to the valence band of the semiconducting SWNT device by significantly reducing the Schottky barrier height, thereby achieving a relatively high hole mobility $\mu_P$ through the single nanotube pCNTFET device. The resulting $I_{DS}$ current as a function of gate to source voltage $V_{GS}$ for $V_{DS}=100$ mV was used to calculate the hole mobility $\mu_P$ for the single nanotube device as follows.

For $V_{GS}=-8$ V, $V_{TP}=0.8$ V, and $V_{DS}=0.1$ V, a current $I_{DS} \sim 1 \times 10^{-5}$ A ($I_{DS} \sim 10\ \mu$A) flows through the single nanotube pCNTFET device. The pCNTFET device in the Javey reference is ON when the gate voltage $V_{GS}=0$, and turns OFF when $V_{TP}=0.8$ volts, so $V_{GS}-V_{TP}$ used in the current equation is $V_{GS}-V_{TP}=-8-0.8=-8.8$ V. $|V_{GS}-V_{TH}|=0.8$ V. may be used when calculating $I_{DS}$ current values. The capacitance per unit length for a single nanotube coupling to a gate may be calculated using equation 20.4. The pCNTFET is operating in the linear region, so the current $I_{DS}$ for a pCNTFET device with a single nanotube may be written using equation 20.10, where $C_{l-TOT}(N)$ is replaced by the single nanotube capacitance approximation illustrated in equation 20.4, as follows.

$$I_{DSp}=(\mu_P/L_P) \cdot [2\pi \cdot \epsilon_R \epsilon_0/\ln(2t_G/R_{NT})] \cdot [(V_{GS}-|V_{TP}|)V_{DS}-V^2_{DS}/2], \quad [EQ\ 20.12]$$

Substituting in equation 20.12, $$1 \times 10^{-5}=(\mu_P/300 \times 10^{-7}) \cdot [2 \cdot 3.14 \cdot 4 \cdot 8.85 \times 10^{-14}/\ln(2 \cdot 67/0.85)] \cdot [(8.8)0.1-0.01/2],$$

$$1 \times 10^{-5}=(\mu_P/3 \times 10^{-5}) \cdot [43.94 \times 10^{-14}] \cdot [0.88], \text{ and}$$

$$\mu_P=775\ cm^2/N \cdot s, \quad [EQ\ 20.13]$$

FIGS. 41, 10A, 10B, and 10D illustrate the integration of CNT fabrics with substantially parallel nanotubes in an integrated circuit. For an integrated pCNTFET device, and assuming a value of $\mu_P=775\ cm^2/V \cdot s$ (equation 20.13) for each of the substantially parallel nanotubes forming a NT fabric of width W=400 nm, we calculate the electrical characteristics of one pCNTFET device corresponding to capacitance values 4410 in FIG. 44, and a second pCNTFET device corresponding to capacitance values 4420 in FIG. 44. These pCNTFET devices are assumed to be connected to form corresponding pCNTFET diodes for use in ESD protection circuits as described further above.

For Capacitance Values 4410 Illustrated in FIG. 44:

N=401 and S=1 nm, nanotube diameter $d_{NT}$=1 nm, L=200 nm, $t_G$=7 nm, $\mathcal{E}_R$=4, for a NT fabric of width W=400 nm formed with substantially parallel nanotubes. For S=1 nm, there is no separation between nanotubes. The pCNTFET diode must carry a peak current of 1 A at a maximum $V_{GS}$=3.5 volts; $|V_{TP}|$=0.5 V. The pCNTFET diode operates in the saturated region and the current $I_{DS}$ may be calculated as follows using equation 20.11 and the mobility in equation 20.13.

$$I_{DSp}=(\mu_P/L_P) \cdot C_{L\text{-}TOT}(N) \cdot [(V_{GS}-|V_{TP}|)^2/2],$$

the total capacitance is the sum of the capacitance of the 401 individual nanotubes as illustrated by equation 20.8.

$$I_{DSp}=(775/200\times10^{-7}) \cdot 2.076\times10^{-11} \cdot [(3.5-0.5)^2/2],$$

$$I_{DSp}=3.62 \text{ mA} \quad [\text{EQ 20.14}],$$

and the average CNT current is, $$I_{DS/NT}=I_{DS}/N \quad [\text{EQ 20.15}],$$

Using equation 20.15 with $I_{DS}=I_{DSp}$=3.62 mA and N=401 nanotubes, $I_{DS/NT}$=9.0 μA per nanotube for this example. The Javey et al. reference indicates that the upper limit for saturation current in a high quality s-SWNT is 25 uA. In this example, the current per nanotube is not near the current saturation limit.

For Capacitance Values 4420 Illustrated In FIG. 44:

N=201 and S=2 nm, $d_{NT}$=1 nm, L=200 nm, $t_G$=7 nm, $\mathcal{E}_R$=4, for a NT fabric of width W=400 nm formed with substantially parallel nanotubes. For S=2 nm, there is a separation of one nanotube diameter between nanotubes. The pCNTFET diode must carry a peak current of 1 A at a maximum $V_{GS}$=3.5 volts; $|V_{TP}|$=0.5 V. The pCNTFET diode operates in the saturated region and the current $I_{DS}$ may be calculated as follows using equation 20.11 and the mobility in equation 20.13.

$$I_{DSp}=(\mu_P/L_P) \cdot C_{L\text{-}TOT}(N) \cdot [(V_{GS}-|V_{TP}|)^2/2],$$

the total capacitance is the sum of the capacitance of the 201 individual nanotubes as illustrated by equation 20.8.

$$I_{DSp}=(775/200\times10^{-7}) \cdot 2.068\times10^{-11} \cdot [(3.5-0.5)^2/2],$$

$$I_{DSp}=3.61 \text{ mA} \quad [\text{EQ 20.16}],$$

and the average NT current is, $$I_{DS/NT}=I_{DS}/N \quad [\text{EQ 20.17}],$$

Using equation 20.17 with $I_{DS}=I_{DSp}$=3.61 mA and N=201 nanotubes, $I_{DS/NT}$=18.0 μA per nanotube for this example. The Javey et al. reference indicates that the upper limit for saturation current in a high quality s-SWNT is 25 uA. In this example, the current per nanotube is closer to the saturation limit, but is approximately 1.4× below the limit.

The pCNTFET device capacitance values 4410 and 4420 are nearly the same, and the current for both is nearly identical. However, in the case of capacitance values 4420, the nanotubes are operating closer to the current saturation limit. Comparison of CNTFET Devices and Corresponding CNTFET Diodes Formed with Relatively High Density Ordered Nanotube Fabrics with CNTFET Devices and Corresponding CNTFET Diodes Formed with Relatively Low Density Unordered Nanotube Fabrics Based on equations 20.14 and 20.16, a pCNTFET device formed with relatively dense ordered nanotube fabrics, can sink approximately 3.6 mA for a CNTFET device in saturation having a width of 0.4 um, a channel length of 0.2 um, a relative dielectric constant $\mathcal{E}_R$=4, a gate voltage $V_{GS}$=3.5 Volts, and a threshold voltage $|V_{TP}|$=0.5 Volts. However, such a pCNTFET device and corresponding pCNTFET diode needs to conduct (sink) a peak current of 1 A for ESD protection as described further above with respect to FIG. 1, with $V_{GS}$<=3.5 V. Therefore, the width of the pCNTFET diode acting as an ESD device, and sinking an ESD current 150 shown in FIG. 1B of 1A. (1,000 mA) of current with $V_{GS}$<=3.5 V., must be increased by the ratio of 1,000 mA to 3.6 mA as follows:

$$W_P=(1{,}000 \text{ mA}/3.6 \text{ mA}) \cdot 0.4 \text{ μm}$$

$$W_P=111 \text{ μm} \quad [\text{EQ 20.18}]$$

In the case of nCNTFET device characteristics selected when using nCNTFET devices formed formed with relatively dense ordered NT fabrics for $L_N$=0.2 um; $t_G$=7 nm; $d_{NT}$=1 nm; $\mathcal{E}_R$=4; $|V_{TP}|$=0.5 V; and $V_{DD}$=3.5V, dimensions are approximately the same as the electrical characteristics of pCNTFET device characteristics because the nCNTFET device mobility is assumed to be approximately equal to that of the pCNTFET device, therefore $\mu_P=\mu_N$=775 cm²/V·s. Therefore, in this example, the width of the nCNTFET diode $W_N$ acting as an ESD device and sinking and ESD current 150 shown in FIG. 1B of 1 A. (1,000 mA) of current with $V_{GS}$<=3.5 V., is the same as the width of the pCNTFET device $W_P$ shown in equation 20.18. Hence, $$W_N=111 \text{ μm} \quad [\text{EQ 20.19}]$$

At this point in the calculation of CNTFET device and corresponding CNTFET diode geometries with relatively dense ordered nanotube fabrics, widths $W_P$ and $W_N$ shown in equations 20.18 and 20.19, respectively, are relatively large. In order for layout of protective devices to fit between pads, multi-fingered CNTFET diode layouts are needed as described further above with respect to FIGS. 15A-15D. Equations 15.1-15.4 may be used to calculate multi-finger pCNTFET diode dimensions for $W_P$=111 μm and $L_P$=0.2 μm layouts, with gate insulator $t_G$=7 nm, $\mathcal{E}_R$=4 (SiO₂ gate insulator, for example), and mobility $\mu_P$=775 cm²/V·s. Since $W_P=W_N$, and $L_P=L_N$, with the same gate structure and gate insulator material ($\mathcal{E}_R$=4), and carrier mobility for both holes and electrons, the multi-finger pCNTFET diode dimensions are the same as those for nCNTFET diodes. Corresponding pCNTFET diode and nCNTFET diode dimensions are illustrated as cases #2 and #4, respectively, in table 4600 illustrated in FIG. 46.

At this point in the specification, the relative dimensions of CNTFET devices and corresponding CNTFET diodes formed with relatively high density ordered CNT fabrics are compared with CNTFET devices and corresponding CNTFET diodes formed with relatively low density unordered CNT fabrics. In these devices, the only difference is in the CNT fabrics. These diodes are formed by connecting the CNTFET gate to the source or drain as illustrated in FIGS. 2, 3, 4, and 5 for example.

Referring to case #1 in table 1400 illustrated in FIG. 14, a pCNTFET device formed with nonaligned nanotube fabric with a channel length $L_P$=100 nm, $t_G$=7 nm, $V_{TP}$=0.5 V, $\mathcal{E}_R$=4, and a width $W_P$=83,000 μm as described further above, is changed to a $W_P$ twice as wide. This is because the pCNTFET diode width with ordered nanotube fabric has a channel length $L_P$=200 nm, so the pCNTFET device in case #1 is scaled to $L_P$=200 nm. So for $\beta_P$=833,000, the pCNTFET diode width changes to $W_P$=166,600 μm for $L_P$=200 nm and is illustrated as case #1 in table 4600 in FIG. 46, and equation 20.20.

$$W_P = 166,600 \text{ μm} \quad [\text{EQ 20.20}]$$

Referring to case #3 in table 1400 illustrated in FIG. 14, an nCNTFET device formed with nonaligned nanotube fabric with a channel length $L_N=100$ nm, $t_G=7$ nm, $V_{TP}=0.5$ V, $\epsilon_R=4$, and a width $W_N=41,670$ μm as described further above, is changed to a $W_P$ twice as wide. This is because the CNTFET diode with ordered nanotube fabric has a channel length $L_N=200$ nm, so the nCNTFET device in case #3 is scaled to $L_N=200$ nm. So for $\beta_N=416,700$, the nCNTFET diode width changes to $W_N=83,340$ μm for $L_N=200$ nm and is illustrated as case #3 of table 4600 in FIG. 46, and equation 20.21.

$$W_N = 83,340 \text{ μm} \quad [\text{EQ 20.21}]$$

Channel width $W_P$ and $W_N$ values shown for cases #1, #2, #3, and #4 in table 4600 illustrated in FIG. 46 are relatively large for one-fingered CNTFET diodes. Therefore, multi-fingered CNTFET diode layouts designed to fit between pads are used and described further above with respect to FIGS. 15A-15D. Multi-finger CNTFET device geometries, layouts, and structures calculated further below with respect to equations 15.1-15.4 for both pCNTFET and nCNTFET diodes are included in table 4600 illustrated in FIG. 46.

Multi-Fingered Device Dimensions for CNTFET Diodes Formed with Unordered Nanotube Fabrics:

The following is an example of multi-fingered ESD protective CNTFET diode dimensions for pCNTFET diodes formed with unordered CNT fabrics and illustrated as case #1 in table 4600 in FIG. 46, in rows corresponding to stacked pair multi-fingered CNTFET devices, referred to as stacked CNTFET diode pairs 4620. For stacked CNTFET diode pairs 4620, X and Y dimensions are approximately the same as X and Y dimensions for an individual CNTFET diode.

In this example in which $\beta_P=833,000$ and $W_P=166,000$ um as shown in equation 20.20, with $L_P=0.2$ μm. $N_G$ may be calculated using equation 15.3 as follows:

$$N_G = (3.2 + -(10.24 + 8.8 \times 833,000)^{1/2})/4.4; N_G = 616 \text{ fingers}$$

Then using equation 15.1 and F=0.2 um, X may be calculated as follows:

$$X = (2.2 \times 616 + 1.2)0.2; X = 271.2 \text{ um}$$

The Y dimension may be calculated using equation 15.2 and F=0.2 um as follows:

$$Y = (833,000/616 + 4.4)0.2; Y = 271.4 \text{ um}$$

The width per finger $W_{FNGR}$ for $N_G$ fingers may be calculated for this example using equation 15.4 as follows:

$$W_P = 166,000 \text{ um}; N_G = 616; \text{therefore } W_{FNGR} = 166,000/617; W_{FNGR} = 269.5 \text{ um}$$

The $N_G$, $W_{FNGR}$, X, and Y values are shown as case #1 in table 4600 illustrated in FIG. 46, corresponding to stacked CNTFET diode pairs 4620. The CNT ESD protect circuit area XY=73,604 μm².

In cases where pairs of multi-fingered devices are placed adjacent to one another on the same level to form adjacent CNTFET diode pair 4660, instead of stacked CNTFET diode pair 4620, then:

$$X' = \sqrt{2} \cdot X, \text{ and } Y' = \sqrt{2} \cdot Y; X' = 384 \text{ μm, and } Y' = 384 \text{ μm}$$

Values of X' and Y' for adjacent pair of multi-fingered CNTFET diodes are also shown as case #1 in table 4600. The area X'Y' for adjacent CNTFET diode pair 4660 is approximately 2-times the area XY for stacked CNTFET diode pair 4620.

The following is an example of multi-fingered ESD protective CNTFET diode dimensions for nCNTFET diodes formed with unordered CNT fabrics and illustrated as case #3 in table 4600 in FIG. 46, in rows corresponding to stacked pair multi-fingered CNTFET devices, referred to as stacked CNTFET diode pairs 4620. For stacked CNTFET diode pairs 4620, X and Y dimensions are approximately the same as X and Y dimensions for an individual CNTFET diode.

In this example in which $\beta_N=416,700$ and $W_N=83,340$ um as shown in equation 20.21, with $L_P=0.2$ μm. $N_G$ may be calculated using equation 15.3 as follows:

$$N_G = (3.2 + -(10.24 + 8.8 \times 416,700)^{1/2})/4.4; N_G = 436 \text{ fingers}$$

Then using equation 15.1 and F=0.2 um, X may be calculated as follows:

$$X = (2.2 \times 436 + 1.2)0.2; X = 192.1 \text{ um}$$

The Y dimension may be calculated using equation 15.2 and F=0.2 um as follows:

$$Y = (416,700/436 + 4.4)0.2; Y = 192.0 \text{ um}$$

The width per finger $W_{FNGR}$ for $N_G$ fingers may be calculated for this example using equation 15.4 as follows:

$$W_N = 83,340 \text{ um}; N_G = 436; \text{hence } W_{FNGR} = 83,340/436; W_{FNGR} = 191.1 \text{ um}$$

The $N_G$, $W_{FNGR}$, X, and Y values are shown as case #3 in table 4600 illustrated in FIG. 46, corresponding to stacked CNTFET diode pairs 4620. The CNT ESD protect circuit area XY=36,883 μm².

In cases where pairs of multi-fingered devices are placed adjacent to one another on the same level to form adjacent CNTFET diode pair 4660, instead of stacked CNTFET diode pair 4620, then:

$$X' = \sqrt{2} \cdot X, \text{ and } Y' = \sqrt{2} \cdot Y; X' = 271.7 \text{ μm, and } Y' = 271.5 \text{ μm}$$

Values of X' and Y' for adjacent pair of multi-fingered CNTFET diodes are also shown as case #3 in table 4600. The area X'Y' for adjacent CNTFET diode pair 4660 is approximately 2-times the area XY for stacked CNTFET diode pair 4620.

Multi-Fingered Device Dimensions for CNTFET Diodes Formed with Ordered CNT Fabrics:

The following is an example of multi-fingered ESD protective CNTFET diode dimensions for pCNTFET diodes formed with ordered CNT fabrics and illustrated as case #2 in table 4600 in FIG. 46, in rows corresponding to stacked pair multi-fingered CNTFET devices, referred to as stacked CNTFET diode pairs 4620. For stacked CNTFET diode pairs 4620, X and Y dimensions are approximately the same as X and Y dimensions for an individual CNTFET diode.

In this example in which $\beta_P=555$ and $W_P=111$ um, $N_G$ may be calculated using equation 15.3 as follows:

$$N_G = (3.2 + -(10.24 + 8.8 \times 555)^{1/2})/4.4; N_G = 17 \text{ fingers}$$

Then using equation 15.1 and F=0.2 um, X may be calculated as follows:

$$X = (2.2 \times 17 + 1.2)0.2; X = 7.7 \text{ um}$$

The Y dimension may be calculated using equation 15.2 and F=0.2 um as follows:

$$Y = (555/17 + 4.4)0.2; Y = 7.4 \text{ um}$$

The width per finger $W_{FNGR}$ for $N_G$ fingers may be calculated for this example using equation 15.4 as follows:

$W_P$=111 um;$N_G$=17;therefore $W_{FNGR}$=111/17;
$W_{FNGR}$=6.53 um

The $N_G$, $W_{FNGR}$, X, and Y values shown as case #2 in table 4600 illustrated in FIG. 46, corresponding to stacked CNTFET diode pairs 4620. The CNT ESD protect circuit area XY=57 μm², a reduction in area of approximately 1,300 times relative to the case #1 device.

In cases where pairs of multi-fingered devices are placed adjacent to one another on the same level to form adjacent CNTFET diode pair 4660, instead of stacked CNTFET diode pair 4620, then:

$X'=\sqrt{2}\cdot X$, and $Y'=\sqrt{2}\cdot Y$;$X'$=10.9 μm, and $Y'$=10.5 μm

Values of X' and Y' for adjacent pair of multi-fingered CNTFET diodes are also shown as case #2 in table 4600. The area X'Y' for adjacent CNTFET diode pair 4660 is approximately 2-times the area XY for stacked CNTFET diode pair 4620.

Multi-fingered ESD protective CNTFET diode dimensions for nCNTFET diodes formed with ordered CNT fabrics and illustrated as case #4 in table 4600 in FIG. 46, in rows corresponding to stacked pair multi-fingered CNTFET devices, referred to as stacked CNTFET diode pairs 4620. For stacked CNTFET diode pairs 4620, X and Y dimensions are approximately the same as X and Y dimensions for an individual CNTFET diode. The X and Y, and other dimensions, such as $W_N$=$W_P$ as shown in equations 20.20 and 20.21 are the same for nCNTFET and pCNTFET devices. Also $L_N$=$L_P$, the electron and hole mobility are approximately the same, gate oxide thickness and $\varepsilon_R$=4. So the nCNTFET and pCNTFET devices have the same parameters as illustrated by case #2 and case #4 in table 4600 illustrated in FIG. 46.

The $N_G$, $W_{FNGR}$, X, and Y values shown as case #4 in table 4600 illustrated in FIG. 46, corresponding to stacked CNTFET diode pairs 4620. The CNT ESD protect circuit area XY=57 μm², a reduction in area of approximately 650 times relative to the case #3 device.

In summary, the $N_G$, $W_{FNGR}$, X, and Y values are shown as case #2 in table 4600 illustrated in FIG. 46, corresponding to stacked CNTFET diode pairs 4620. The CNT ESD protect circuit area XY=57 μm². Comparing CNT ESD protect circuit areas for circuits based on CNTFET diodes with identical physical characteristics, except for unordered CNT fabrics in one case and ordered CNT fabrics in the other case, results in the following. The CNT ESD protect circuit area for pCNTFET diodes formed with ordered CNT fabrics shown as case #2 in table 4600 occupies approximately 1,300 times less area than for pCNTFET diodes formed with unordered CNT fabrics shown as case #1 in table 4600. The CNT ESD protect circuit area for nCNTFET diodes formed with ordered CNT fabrics shown as case #4 in table 4600 occupies approximately 650 times less area than for pCNTFET diodes formed with unordered CNT fabrics shown as case #3 in table 4600.

The advantages of ordered CNT fabrics with respect to unordered CNT fabrics may be further illustrated by comparing CNT ESD protect circuit areas for circuits based on relatively more complex CNTFET diodes with 4× shorter channel lengths and a 6.25 times higher relative dielectric constant and unordered nanotube fabrics in one case, and the unchanged ordered nanotube fabrics-based pCNTFET diode in the other case, results in the following. Comparing pCNTFET device with dimensions $L_P$=0.2 um and $\varepsilon_R$=4 formed with ordered CNT fabrics illustrated in case #2 in table 4600, with pCNTFET devices with dimensions $L_P$=0.05 um and $\varepsilon_R$=25 formed with unordered fabrics illustrated in case #2 in table 1400 (FIG. 14), shows that the pCNTFET device with ordered CNT fabric occupies more than 10× less area. Comparing nCNTFET device dimensions formed with $L_N$=0.2 um and $\varepsilon_R$=4 formed with ordered CNT fabrics illustrated in case #4 in table 4600, with nCNTFET devices with $L_N$=0.05 um and $\varepsilon_R$=25 formed with unordered CNT fabrics illustrated in case #4 in table 1400 (FIG. 14), shows that the nCNTFET device with ordered nanotube fabric occupies more than 5× less area.

The improvement in pCNTFET devices with substantially parallel nanotubes was calculated for pCNTFET devices and nCNTFET devices used in protect circuit 130 in prior art FIG. 1 and shown in table 4600 illustrated in FIG. 46. aCNTFET devices with substantially parallel nanotubes used in protect circuit 130 may also show improvements corresponding to those illustrated for pCNTFET and nCNTFET devices. However, pCNTFET and nCNTFET devices with substantially parallel nanotubes applied to the design of protected circuits 140 illustrated in prior art FIG. 1 would also result in corresponding improvements. Examples of protected circuits such as NOT and NAND circuits illustrated in patent application Ser. No. 13/076,152 would decrease in size by over 100× and reduce delay by over 100× with enhanced pCNTFET and enhanced nCNTFET devices (not shown).

Ordered CNT Fabric Capacitance Values for Various Fabric Densities

For high performance digital circuits, current per unit width is typically used as a figure of merit in the semiconductor industry, usually expressed as micro-Amperes per micrometer, and is published for MOSFET devices in the International Technology Roadmap for Semiconductors (ITRS) updated every two years. Current per unit width is also a useful device figure of merit for CNTFET devices. Maximizing current per unit width values is dependent on maximizing the capacitance coupling between the gate of CNTFET devices to achieve a high number of available mobile carriers as explained further above, minimizing variations in capacitance as a function of NT fabric density variations as explained further below with respect to FIG. 47, and minimizing contact resistance as described in the Javey reference.

Figure 47:
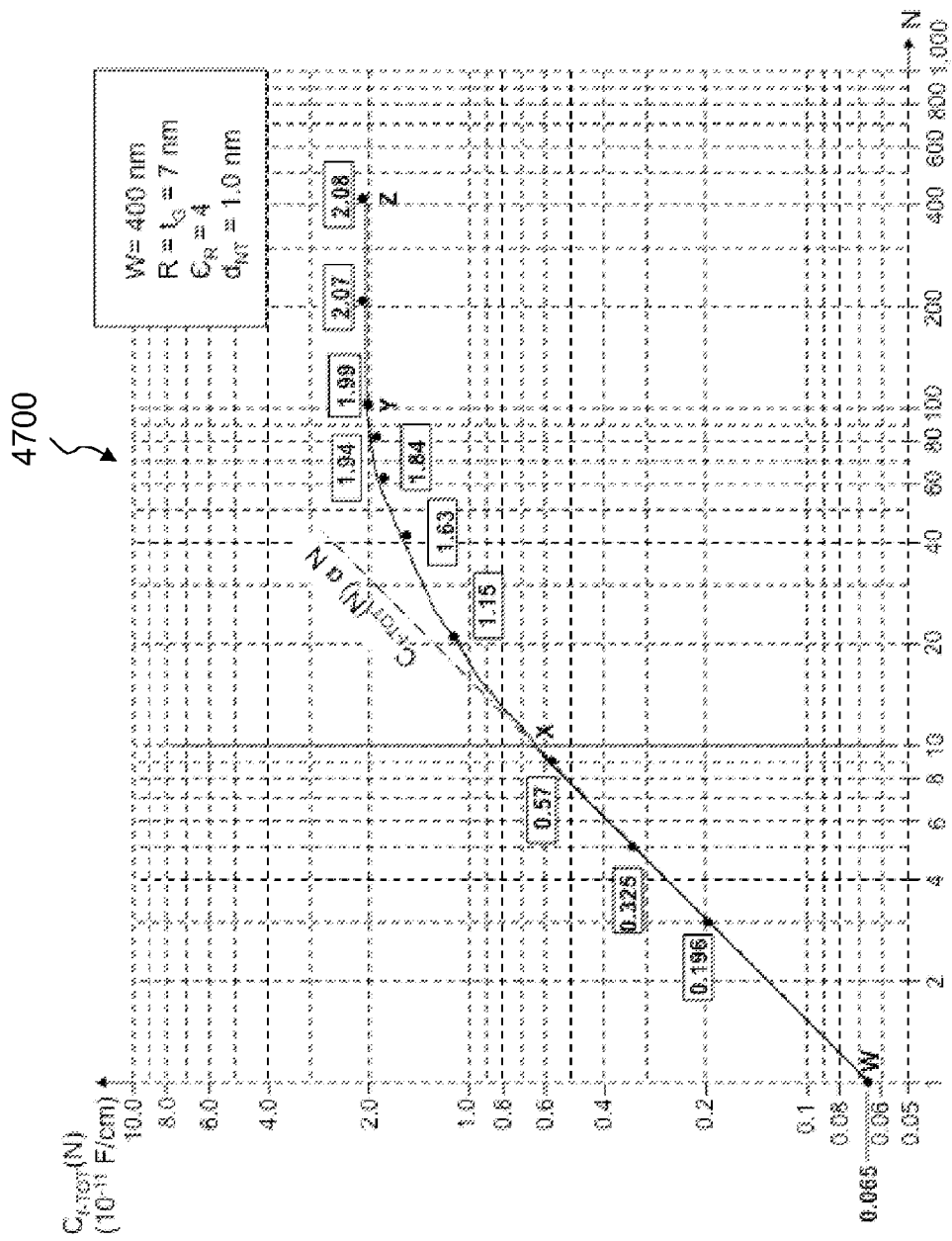
FIG. 47 illustrates a table showing gate-to-CNT fabric capacitance per unit length as a function of the number of CNTs. The gate-to-CNT fabric capacitance is for CNT fabric densities in low, medium, and high density ranges.

FIG. 47 illustrates gate-to-CNT fabric capacitance 4700, for a CNT fabric formed with semiconducting SWNTs of diameter $d_{NT}$=1.0 nm, expressed as total capacitance per unit length $C_{l\text{-}TOT}$(N) in units of Farads per centimeter (F/cm). Capacitance 4700 is plotted as a continuous curve for values of N=1 to N=401 nanotubes for a CNTFET device with a channel width of approximately 400 nm (W=400 nm).

The ordered CNT fabric formed with nanotubes of diameter $d_{NT}$=1.0 nm, corresponding to capacitance 4700, may be formed with a low CNT fabric density, such as illustrated by capacitance 4700 low CNT fabric density segment W-X in FIG. 47. At low CNT fabric density, the capacitance is proportional to the capacitance of a single nanotube multiplied by the number of nanotubes N (proportional to N), and corresponds, for example, to negligible electric field coupling between various individual nanotubes, as illustrated in FIG. 42A for example.

The ordered NT fabric formed with $d_{NT}$=1.0 nm nanotubes, corresponding to capacitance 4700, may be formed with a high fabric density, such as illustrated by capacitance 4700 high CNT fabric density segment Y-Z in FIG. 47. High CNT fabric density segment Y-Z is in a flat portion of the capacitance 4700 curve in which the capacitance variation is limited to less than or equal to 5%. So in this example, $C_{l\text{-}TOT}$(N=101)>=0.95·$C_{l\text{-}TOT}$(N=401). The corresponding ordered CNT fabric density range for high density fabric Y-Z, when using $d_{NT}=1.0$ nm nanotubes, is from approximately 250 NTs/um² to 1,000 NTs/um². Actually, since CNT-to-CNT minimum separation is approximately 0.45 nm as determined by van der Waals forces, the maximum number of CNTs is N=267, corresponding to a maximum CNT density of ~668 NTs/μm². A surprising result is that the corresponding ordered nanotube fabric density range variation of ~4× results in a capacitance variation of less than or equal to approximately 5%. This surprising low sensitivity of CNTFET device gate capacitance to CNT fabric density in the high fabric density segment Y-Z may be leveraged in CNTFET structures as described further below with respect to FIGS. 48-63. While s-SWNTs with $d_{NT}=1.0$ nm diameter CNTs are used in the gate capacitance example illustrated in FIG. 47, carbon nanotube fabrics with s-SWNT $d_{NT}$ diameters typically in the range of 0.50 to 10.0 nm may be also be used.

The ordered CNT fabric formed with $d_{NT}=1.0$ nm nanotubes, corresponding to capacitance 4700, may be formed with an intermediate CNT fabric density, such as illustrated by capacitance 4700 intermediate CNT fabric density segment X-Y in FIG. 47. Intermediate CNT fabric density segment X-Y is in a curved portion of the capacitance 4700 curve in which the capacitance increases from X to Y at a decreasing rate. Capacitance 4700 in intermediate CNT fabric density segment X-Y is no longer proportional to the number of nanotubes N above the point X and is below the point Y at which the capacitance variation is limited to less than or equal to 5% by the proximity of the CNTs forming the CNT fabric.

CNTFET devices described further below are designed using high CNT fabric densities to maximize current per unit width and minimize current variations as described with respect to FIG. 47.

Fabrication Methods and Corresponding Structures

Figure 48:
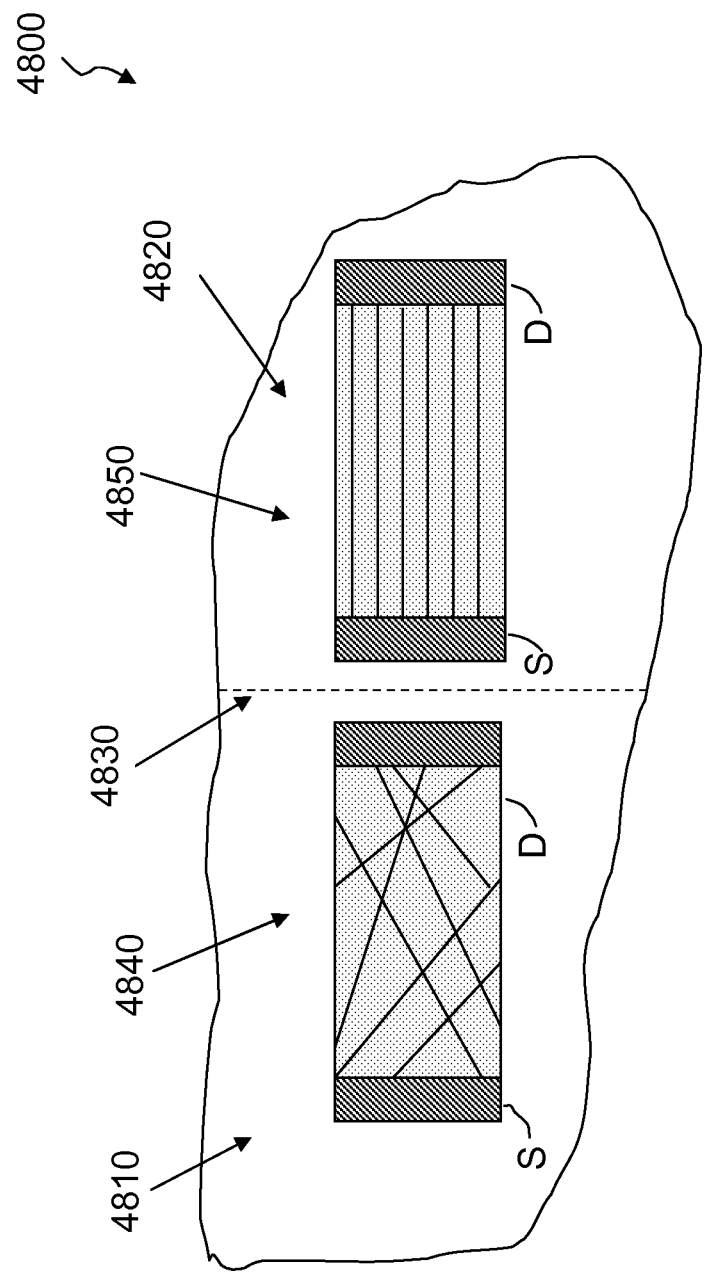
FIG. 48 illustrates a representation of a region within a chip that includes an unordered CNT fabric and an ordered CNT fabric.

FIG. 48 illustrates a representation 4800 of a region within a chip that includes an unordered CNT fabric 4810 and an ordered CNT fabric 4820, defined in part by boundary line 4830. Unordered CNT fabric 4810 corresponds to unordered CNT fabric 1080 illustrated in FIG. 10C, and ordered CNT fabric 4820 corresponds to ordered CNT fabric 1085 illustrated in FIG. 10D. CNTFET device 4840 corresponds to partial CNTFET device plan view 1000 illustrated in FIG. 10A with NT fabric 1052 formed using unordered CNT fabric 1080 illustrated in FIG. 10C. CNTFET device 4850 corresponds to partial CNTFET device 1000 illustrated in FIG. 10A with NT fabric 1052 formed using ordered CNT fabric 1085 illustrated in FIG. 10D. Ordered CNT fabrics may be formed from unordered CNT fabrics in selected regions, such as region 4820 illustrated in FIG. 48. CNTFET devices, as well as other components such as carbon nanotube-based resistors, carbon nanotube-based capacitors, carbon nanotube-based sensors along with corresponding digital and analog circuits, may be formed in unordered CNT fabric region 4810 and ordered CNT fabric region 4820. These CNTFET devices and carbon nanotube-based components in NT fabric regions 4810 and 4820 may be interconnected to form carbon nanotube-based circuits as well as system functions.

As described further below, CNTFET devices formed with ordered CNT fabrics may be substantially denser than unordered CNT fabrics and may exhibit higher mobility, and other features, resulting in more current per unit width in the same device area. Therefore circuits formed in ordered CNT fabric regions may have superior performance than those formed in unordered CNT fabric regions, resulting in substantially faster circuit operating speeds for CNTFET-based NOT (inverter) and NAND circuits of approximately the same physical dimensions, for example, as illustrated in patent application Ser. No. 13/076,152. Or, as in the case of ESD protect circuits described further below, CNTFET devices 4850 formed with ordered CNT fabrics and used in CNT ESD protect circuits may be of substantially smaller physical dimensions than CNTFET devices 4840 formed with unordered CNT fabrics, while still able to conduct the same relatively high ESD current 150 illustrated in prior art FIG. 1B.

Exemplary CNT ESD protect circuits may be formed using pCNTFET devices, nCNTFET devices, aCNTFET devices, and combinations of these devices as illustrated further above. For example, CNT ESD protect circuit 200 illustrated in FIG. 2 is formed using pCNTFET devices; CNT ESD protect circuit 300 illustrated in FIG. 3 is formed using nCNTFET devices; CNT ESD protect circuit 400 illustrated in FIG. 4 is formed using a combination of pCNTFET and nCNTFET devices. CNT ESD protect circuits 1950 and 2750, illustrated in FIGS. 19 and 27, respectively, show examples of CNT ESD protect circuits formed using ambipolar (aCNTFET) devices. As illustrated by Table 4600 in FIG. 46, pCNTFET and nCNTFET devices formed with ordered NT fabrics are structurally (geometrically) substantially smaller than those formed with unordered NT fabrics for the same current conducting capability. Similar smaller geometries may be realized for aCNTFET devices using ordered CNT fabrics (not shown in Table 4600).

At this point in the specification, various approaches to forming CNT fabric 1052, illustrated in FIGS. 10A and 10B, with ordered nanotube fabrics are described. The objective is to leverage the high CNTFET device current per unit width and surprising insensitivity of CNTFET device gate-to-CNT fabric to ordered CNT fabric density variations of 4× for ordered CNT fabric densities greater than a minimum value. This minimum value of fabric density is shown at a point Y on capacitance 4700 curve in FIG. 47 and corresponds to a NT fabric density of approximately 250 NTs/um². For ordered CNT fabrics formed with substantially parallel nanotubes, 250 NTs/um² is a density value for CNT typically 1 um in length. The same CNT fabric density for substantially parallel CNTs may also be expressed as 250 NTs/um.

Figure 49A:
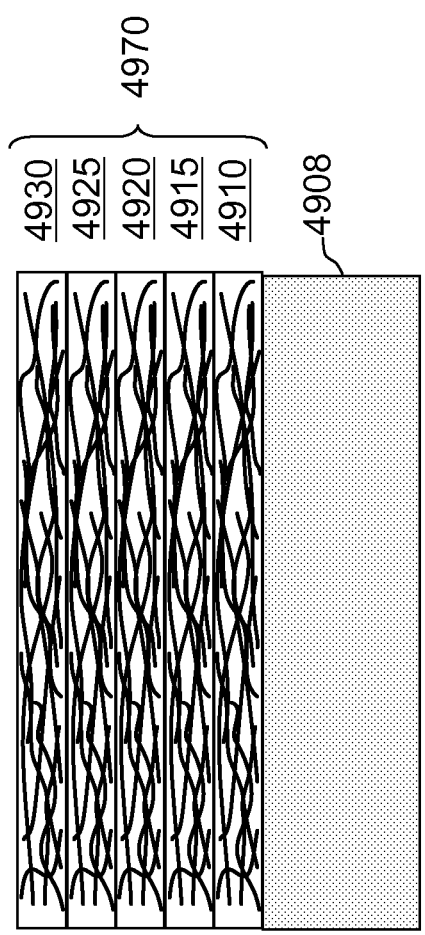
FIG. 49A illustrates a multi-layer unordered CNT fabric deposited on a substrate.

FIG. 49A illustrates an unordered CNT fabric on a substrate 4908. Unordered CNT fabric 4970 is formed by depositing five unordered CNT fabric layers 4910, 4915, 4920, 4925, and 4930. Each unordered CNT fabric layer surface is in contact with adjacent unordered CNT fabric layer surfaces. Unordered CNT fabric layer 4910 is in contact with the top surface of substrate 4908.

The number of individual nanotubes in each unordered fabric layer may vary. Individual nanotubes are mostly semiconducting SWNTs. The diameter and length of nanotubes in the starting carbon nanotubes available from various vendors may be deposited on a surface and measured using an atomic force microscope (AFM). Typically, these nanotubes may have a diameter as small as approximately 0.5 nm and as large as 10.0 nm, although diameters outside this range are possible. Nanotube lengths in the 1 micrometer range are typical, although individual CNTs may be less than 1 micrometer or several micrometers in length.

An indication of the CNT fabric area density of deposited CNT fabrics may be made using SEM images or AFM measurements and counting individual nanotubes. However, sheet resistance measurements (Ohms per square) of deposited CNT fabrics using methods known in the Semiconductor Industry may be used, correlated with AFM measurements for example, and also correlated with measured CNTFET device characteristics and/or CNT-based resistor values. In this example, an unorderd NT fabric area density of approximately 50 NTs/um² for each deposition is used for illustrative purposes.

In a first example, using individual NTs of diameter $d_{NT}$=1.0 nm, the objective is to achieve an ordered NT fabric with a minimum dense fabric area density of approximately 250 NTs/um² (corresponding to the 250 NTs/um² illustrated in FIG. 47). A directional mechanical force may be applied to an unordered NT fabric to form an ordered NT fabric, such as ordered NT fabric 1085 illustrated in FIG. 10D (as described within U.S. patent application Ser. No. 12/945,501).

In this first example, unordered NT fabric layers 4910, 4915, 4920, 4925, and 4930 are deposited to form unordered NT fabric 4970 on the surface of substrate 4908 as illustrated in FIG. 49A. Unordered NT fabric 4970 has approximately 250 NTs/um² of unordered NT fabric area density (5 times the 50 NTs/um² in each layer). Next, a CNT ordering force (a mechanical force for example) is applied to unordered CNT fabric 4970 and ordered CNT fabric 4975 is formed on the surface of substrate 4908 as shown by ordered CNT fabric structure 4900 illustrated in FIG. 49B. Ordered CNT fabric 4975 corresponds to cross section AA' of CNT fabric 1052 along the width direction of exemplary CNTFET device cross section 1050 illustrated in FIG. 10B. AFM measurements may be used to measure ordered CNT fabric density. Also, sheet resistance measurements may be used to check for desired ordered CNT fabric density prior to fabricating entire interconnected device structures. The area density of ordered CNT fabric 4975, in ordered CNT fabric structure 4900, is approximately 250 NTs/um².

In a second example, a variation of the first example, unordered CNT fabric layers 4910, 4915, and 4920 are deposited on substrate 4908. Next, a first CNT ordering force is applied (a mechanical force for example) and a first layer of an ordered CNT fabric is formed as illustrated in FIG. 49C. Then, unordered NT fabric layers 4925 and 4930 are deposited on the first CNT ordered NT fabric formed on substrate 4908. Next, a second CNT ordering force is applied (a mechanical force for example) resulting in a second layer of ordered CNT fabric on the first layer of ordered CNT fabric. The combination of the first and second ordered NT fabric layers form ordered CNT fabric layer 4976 on substrate 4908, resulting in ordered CNT fabric structure 4950 of approximately 250 CNTs/um² as illustrated in FIG. 49C. Ordered CNT fabric 4976 corresponds to cross section AA' of CNT fabric 1052 along the width direction of exemplary CNTFET device cross section 1050 illustrated in FIG. 10B.

In a third example, using individual NTs of diameter $d_{NT}$=1.0 nm, the objective is to achieve an ordered NT fabric with a minimum dense fabric area density of approximately 400 NTs/um² (corresponding approximately to the N=400 NTs illustrated in FIG. 47). A directional mechanical force may be applied to an unordered NT fabric to form an ordered NT fabric, such as ordered NT fabric 1085 illustrated in FIG. 10D (as described within U.S. patent application Ser. No. 12/945,501).

Figure 50A:
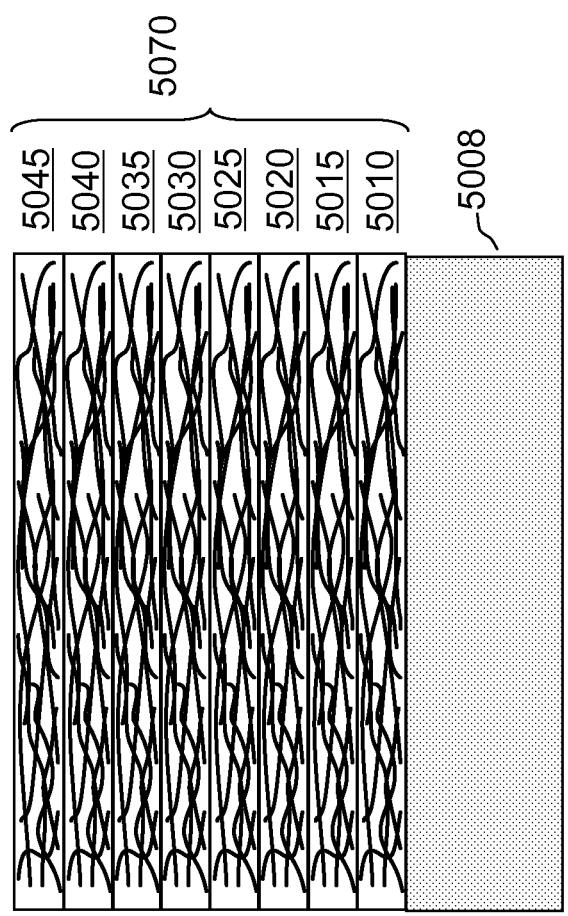
FIG. 50A illustrates a multi-layer unordered CNT fabric deposited on a substrate.

In this third example, unordered CNT fabric layers 5010, 5015, 5020, 5025, 5030, 5035, 5040, and 5045 are deposited to form unordered CNT fabric 5070 on the surface of substrate 5008 as illustrated in FIG. 50A. Unordered CNT fabric 5070 has approximately 400 NTs/um² of unordered CNT fabric area density (8 times the 50 CNTs/um² in each layer). Next, a CNT ordering force (a mechanical force for example) is applied to unordered CNT fabric 5070 and ordered CNT fabric 5075 is formed on the surface of substrate 5008 as shown by ordered CNT fabric structure 5000 illustrated in FIG. 50B. Ordered CNT fabric layer 5075 corresponds to cross section AA' of CNT fabric 1052 along the width direction of exemplary CNTFET device cross section 1050 illustrated in FIG. 10B. AFM measurements may be used to measure ordered CNT fabric density. Also, sheet resistance measurements may be used to check for desired ordered CNT fabric density prior to fabricating entire interconnected device structures. The area density of ordered CNT fabric 5075, in ordered CNT fabric structure 5000, is approximately 400 CNTs/um².

Figure 50C:
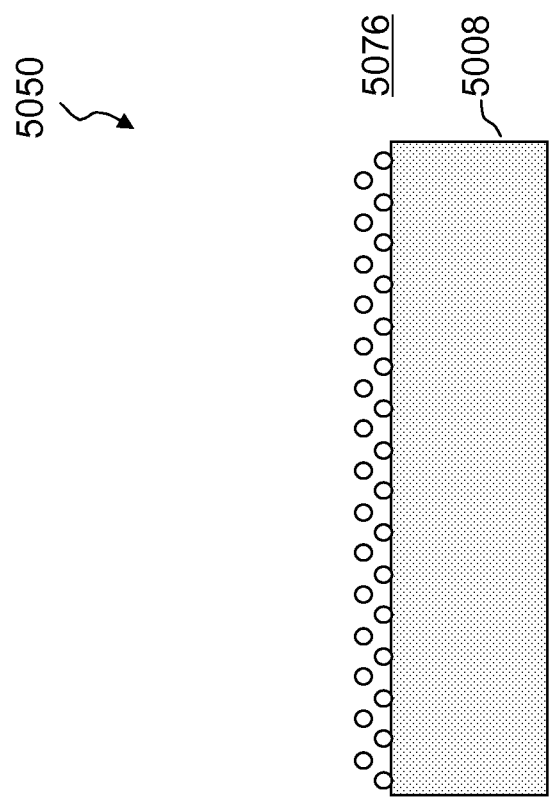
FIG. 50C illustrates a double-layer ordered CNT fabric formed on the surface of a substrate after applying a combination of unordered fabric depositions and directional forces when depositing unordered CNT fabric of FIG. 50A.

In a fourth example, a variation of the third example, unordered CNT fabric layers 5010, 5015, 5020, and 5025 are deposited on the surface of substrate 5008. Next, a first CNT ordering force is applied (a mechanical force for example) and a first layer of an ordered CNT fabric is formed on substrate 5008 as illustrated in FIG. 50C. Then, unordered CNT fabric layers 5030, 5035, 5040, and 5045 are deposited. Next, a second CNT ordering force is applied (a mechanical force for example) resulting in a second layer of ordered CNT fabric on the first layer of ordered CNT fabric. The combination of the first and second ordered CNT fabric layers form ordered CNT fabric 5076 on substrate 5008, resulting in ordered CNT fabric structure 5050 of approximately 400 NTs/um² as illustrated in FIG. 50C. Ordered CNT fabric 5076 corresponds to cross section AA' of CNT fabric 1052 along the width direction of exemplary CNTFET device cross section 1050 illustrated in FIG. 10B.

Figure 50D:
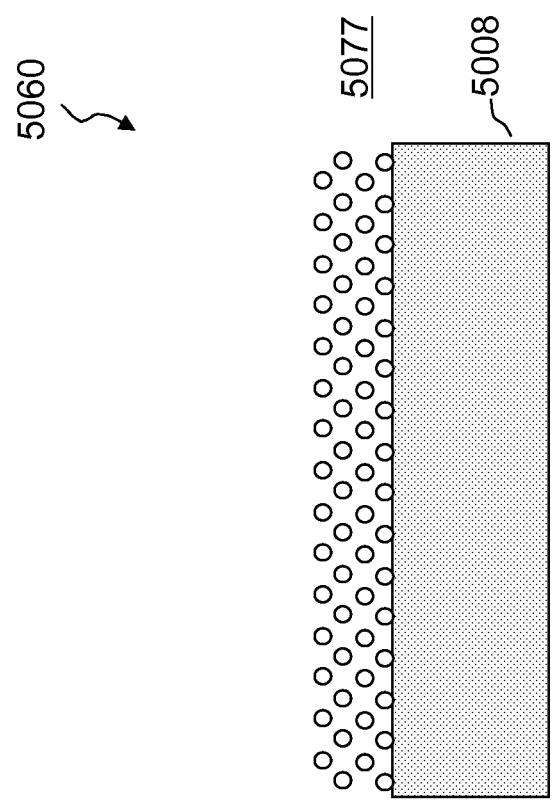
FIG. 50D illustrates a quadruple-layer ordered CNT fabric formed on the surface of a substrate after applying a combination of unordered fabric depositions and directional forces when depositing unordered CNT fabric of FIG. 50A.

In a fifth example, another variation of the third example, unordered CNT fabric layers 5010 and 5015 are deposited. Next, a first CNT ordering force is applied (a mechanical force for example) and a first layer of an ordered CNT fabric is formed on substrate 5008 as illustrated in FIG. 50D. Then, unordered CNT fabric layers 5020 and 5025 are deposited on the first ordered CNT fabric layer. Next, a second CNT ordering force is applied (a mechanical force for example) resulting in a second layer of ordered CNT fabric on the first layer of ordered CNT fabric. Then, unordered CNT fabric layers 5030 and 5035 are deposited on the second ordered CNT fabric layer. Next, a third CNT ordering force is applied (a mechanical force for example) resulting in a third CNT layer of ordered CNT fabric on the second layer of ordered CNT fabric. Then, unordered CNT fabric layers 5040 and 5045 are deposited on the third ordered CNT fabric layer. Next, a fourth CNT ordering force is applied (a mechanical force for example) resulting in a fourth CNT layer of ordered CNT fabric on the third layer of ordered CNT fabric. The combination of the first, second, third, and fourth ordered CNT fabric layers form ordered CNT fabric 5077 on substrate 5008, resulting in ordered CNT fabric structure 5060 illustrated in FIG. 50D. Ordered CNT fabric 5077 corresponds to cross section AA' of CNT fabric 1052 along the width direction of exemplary CNTFET device cross section 1050 illustrated in FIG. 10B.

In the first, second, third, fourth, and fifth examples described further above, a CNT ordering force is applied (a mechanical force for example) to several unordered CNT fabric layers resulting in a corresponding single layer of ordered NT fabric. However, modifications to the CNT ordering forces, the use of surfactants, for example, and other fabrication methods, may result in multilayered ordered CNT fabrics instead. So for example, modified fabrication methods applied to unordered CNT fabric 4970 illustrated in FIG. 49A may result in the first and second ordered CNT fabric layers that form ordered CNT fabric layer 4976 on substrate 4908 illustrated in FIG. 49C being formed at the same time.

In another example, modifications to the CNT ordering forces, the use of surfactants, for example, and other fabrication methods, may result in multilayered ordered NT fabrics instead. So for example, modified fabrication methods applied to unordered NT fabric 5070 illustrated in FIG. 50A may result in the first, second, third, and fourth ordered CNT fabric layers that form ordered CNT fabric 5077 on substrate 5008 illustrated in FIG. 50D being formed at the same time.

Unordered CNT fabrics 4970 and 5070 illustrated in FIGS. 49A and 50A, respectively, correspond to unordered CNT fabric 4810 illustrated in FIG. 48, illustrating two different unordered CNT fabric thicknesses for example. Although unordered CNT fabric 4810 is shown as one region in FIG. 48, multiple unordered CNT fabric regions may be formed.

Ordered CNT fabrics 4975, 4976, 5075, 5076, and 5077 illustrated in FIGS. 49B, 49C, 50B, 50C, and 50D, respectively, correspond to ordered CNT fabric 4820 illustrated in FIG. 48, and show single and multi-layer ordered CNT fabrics of various thicknesses. In these examples, single-layer ordered CNT fabrics, double-layer ordered CNT fabrics, and quadruple-layer ordered CNT fabrics are shown. Although ordered CNT fabric 4820 is shown as one region in FIG. 48, multiple ordered CNT fabric regions may be formed. Ordered carbon nanotube fabrics may be formed with metallic, semiconducting, and a mixture of metallic, semiconducting, and insulating carbon nanotubes. These may be formed using single wall carbon nanotubes, multiwalled carbon nanotubes, a mixture of single and multiwalled carbon nanotubes. For purposes of forming CNTFET devices, and corresponding CNTFET diodes, the ordered carbon nanotubes used to form single and multi-layer ordered CNT fabrics in these examples are near 100% semiconducting SWNTs as a starting material.

Ordered CNT fabrics with multiple CNT layers, such as shown in FIGS. 49C, 50C, and 50D enable more nanotubes per unit width of CNTFET devices, thereby increasing the available current per width. However, CNTs in the upper layers of CNT fabrics between the CNTFET device gate and lower CNT fabric layers may partially shield lower CNT layers from the gate resulting in lower capacitive coupling to the gate.

An approach to reducing the effects of nanotube partial screening is to increase the spacing between carbon nanotubes in a CNT fabric in a controlled and repeatable manner. One method is to selectively coat individual carbon nanotubes with silica, a silicon oxide or silicon dioxide insulating material. Other insulating material such as $HfO_2$ may be used as well as described further below with respect to FIGS. 56-63.

Figure 49B:
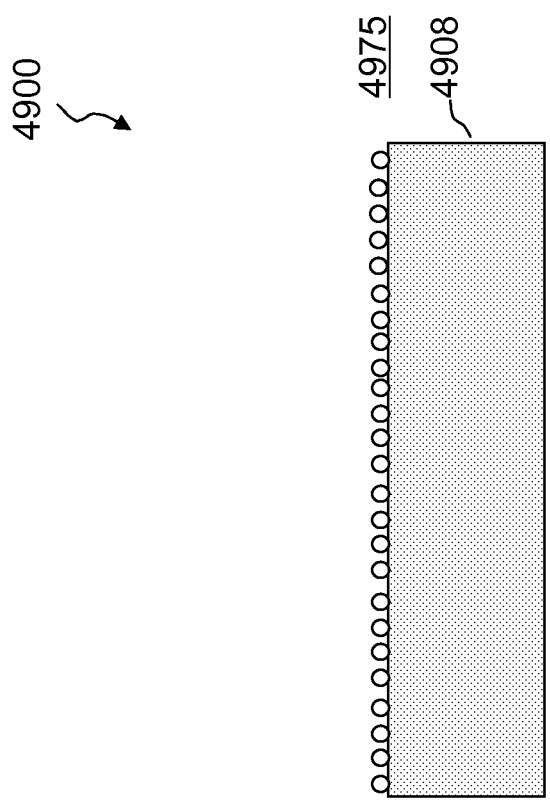
FIG. 49B illustrates a single-layer ordered CNT fabric formed on the surface of a substrate after applying a directional force to the unordered CNT fabric of FIG. 49A.
Figure 49C:
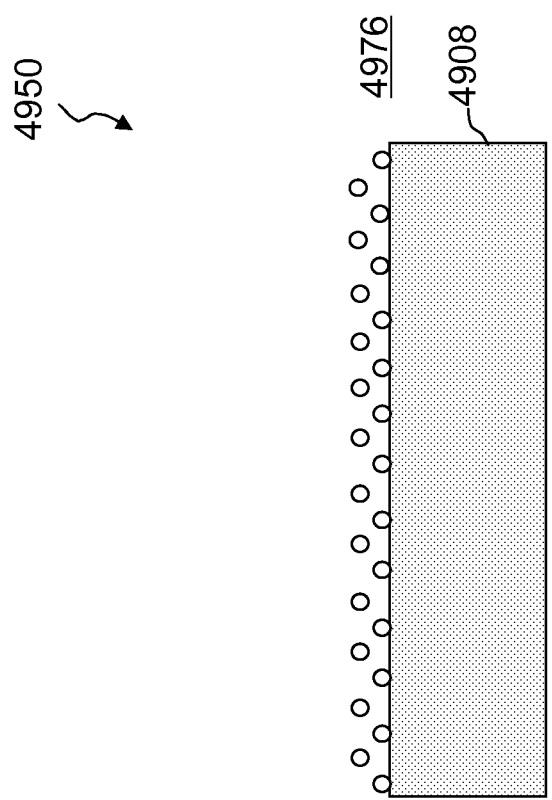
FIG. 49C illustrates a double-layer ordered CNT fabric formed on the surface of a substrate after applying a combination of unordered fabric depositions and directional forces when depositing unordered CNT fabric of FIG. 49A.

In the first and second examples illustrated in FIGS. 49B and 49C, formed with single-layer and double-layer ordered CNT fabric layers, no allowance was made for process variations. However, the surprising result illustrated in FIG. 47 shows that if the fabric density of ordered CNT fabric 4975 was increased by up to 4 times to approximately 1,000 CNTs/um², the gate-to-CNT fabric capacitance would increase by less than or equal to approximately 5%. A similar insensitivity to CNT fabric density is expected for CNT fabric 4976.

Electrical Characteristics of CNTFET Devices Formed using CNT Fabrics with Multiple Layers of Ordered CNTs CNT fabrics with multiple layers of ordered CNTs, that is multi-layer ordered CNT fabrics, exceed the CNT fabric density of single-layer ordered CNT fabrics. Gate-to-CNT fabric capacitance (which may be referred to as gate capacitance) per unit length as a function of the number of ordered CNTs (which corresponds to CNT fabric density) in single-layer ordered CNT fabrics is illustrated in FIG. 47 for CNTs with a 1 nm diameter. As illustrated by the YZ portion of the gate capacitance curve in FIG. 47, for high density fabrics, the gate capacitance per unit length $C_{l-TOT}(N)$ does not change significantly above a minimum density. However, increasing the number of ordered (essentially parallel) carbon nanotubes forming the device channel and source and drain contact regions of a CNTFET device reduces the overall quantum and contact resistances in series with the channel resistance when the CNTFET device is turned ON. As illustrated by cross section 1050 of the exemplary CNTFET illustrated in FIG. 10B, the contact resistance between source contact 1056 and a single CNT in CNT fabric 1052 may be represented by a contact resistance $R_C$. The contact resistance between drain contact 1062 and a single CNT in CNT fabric 1052 may also be represented by contact resistance $R_C$. The quantum resistance between source contact 1056 and drain contact 1062 caused by the limited number of free carriers in each CNT in CNT fabric 1052 is represented by $R_Q$. The reduction in the combined contact and quantum resistance values for an ordered CNT fabric of N CNTs forming substantially parallel electrically conductive paths is equal to $(2R_C+R_Q)/N$, assuming the same contact-to-CNT fabric resistance and for both source and drain. If these contact resistances are different, then $2R_C$ may be replaced by $R_D+R_S$, where $R_D$ is the drain-to-CNT fabric resistance, and $R_S$ is the source-to-CNT fabric resistance. Therefore, while increasing the number of CNTs N above a minimum CNT fabric density value does not appreciably change CNTFET gate-to-CNT fabric capacitance (gate capacitance), the combined contact and quantum resistance values are decreased in proportion to 1/N, Hence, ordered CNT fabrics formed with multiple layers of CNTs that increase the maximum CNT fabric density well above the minimum dense fabric value labeled Y in FIG. 47 are useful because they improve the overall electrical characteristics (I-V characteristics), of CNTFET devices. Ordered CNT fabrics formed with multi-layered CNTs have the added advantage of more uniform distribution on the underlying substrate and higher current carrying capability. Such improvements reduce variations between CNTFET devices which is important for circuit and product design.

CNTFET device $I_{DS}$ current calculated with equation 20.11 uses an equivalent mobility μ to represent an equivalent carrier mobility that includes contact resistance $2R_C$, quantum resistance $R_Q$, and channel resistance $R_{CH}$. Equation 20.11 is a good approximation when the channel resistance $R_{CH}$ is much greater (more than 10×) than the contact plus quantum resistance value. However, as device dimensions are scaled and dielectric constant values are increased, the CNTFET channel resistance $R_{CH}$ is reduced significantly (conductivity increases) while the contact and quantum resistance values remain the same for the same number of nanotubes N in the CNT fabric. In order to enable scaled CNTFET devices to carry more current, the number of CNTs N in the CNT fabric needs to be increased well beyond the minimum density of the high density CNT fabric shown in FIG. 47 in order to reduce contact and quantum resistance as described further below with respect to FIGS. 51-63.

Figure 51A:
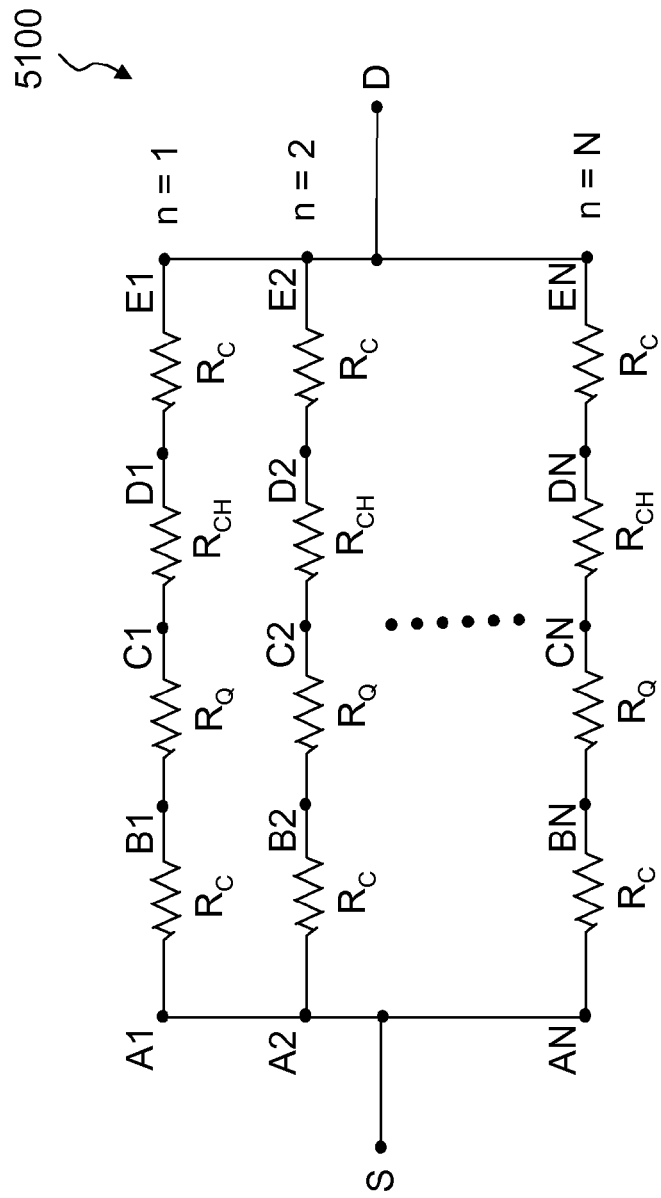
FIG. 51A-B illustrates equivalent circuit schematic representations of an ordered CNT fabric CNTs connected electrically in parallel.

FIG. 51A illustrates equivalent circuit 5100 representing an ordered CNT fabric with N CNTs (n=1 to n=N) connected electrically in parallel. One end of each CNT is connected to a CNTFET device source contact S and another end of each CNT is connected to a CNTFET device drain contact D. With respect to CNTFET device cross section 1050 illustrated in FIG. 10B, S corresponds to source contact 1056, D corresponds to drain contact 1062, and the N CNTs form CNT fabric 1052.

Nodes A1, A2, ..., AN of equivalent circuit 5100 are connected in parallel and connected to source contact S and held at the same source voltage. Nodes E1, E2, ..., EN are connected to drain contact D and held at the same drain voltage. As illustrated in FIG. 44 further above, the capacitance between each CNT and the gate of the CNTFET device is approximately the same across the width W of the channel region. Since nodes A1-AN are at the same source voltage and E1-EN are at the same drain voltage, then the voltage on other nodes such as nodes B1-BN are expected to be at approximately the same voltage; nodes C1-CN are expected to be at approximately the same voltage; and D1-DN are expected to be at approximately the same voltage. Hence, corresponding nodes may be connected resulting in equivalent circuit 5150 illustrated in FIG. 51B.

Equivalent circuit 5150 is a representation of a CNTFET device, such as the CNTFET device cross section 1050 illustrated in FIG. 10B, in which S, referred to as node 1, corresponds to source contact 1056 and drain contact D, referred to as node 3, corresponds to drain contact 1062. The conductive ON-state CNTFET device region between nodes 1 and 3 is represented by resistance $R_{21}$ and $R_{32}$ in series. $R_{21}$ represents the combined contact and quantum resistance values for N electrically parallel CNTs and $R_{32}$ represents the channel resistance $R_{CH}$. Based on equivalent circuit 5150, a better approximation of CNTFET device electrical characteristics may be derived as described further below.

At this point in the specification, new current-voltage (I-V) equations are derived based on equivalent circuit 5150 so as to provide enhanced approximations (enhanced with respect to equation 20.11) for CNTFET device electrical characteristics and corresponding CNTFET device structures. These enhanced CNTFET device structures include physical dimensions such as channel length and width, and gate insulator thickness for example. These may include various CNT diameters in the range of 0.5 to 10.0 nm, CNT-to-CNT separation from ~0.5 to 10 nm and more, CNT fabric densities in the range illustrated in FIG. 47 and even greater densities in the thousands of CNTs/μm² when using multi-layer ordered CNT fabrics. Contact resistance $R_C$ values may be optimized for various combinations of conductor materials and CNTs, and channel resistance $R_{CH}$ may be optimized as a function of gate insulator thickness and insulator dielectric constants that change for different gate insulator materials.

Equation 20.11 represents a CNTFET device in saturation, and $I_{DS}$ is the corresponding saturation current value when $V_{DS,Sat}=V_{GS}-V_T$.

$$I_{DS}=(\mu/L) \cdot C_{l\text{-}TOT}(N) \cdot [(V_{GS}-V_T)^2/2] \quad [\text{EQ 20.11}]$$

Figure 51B:
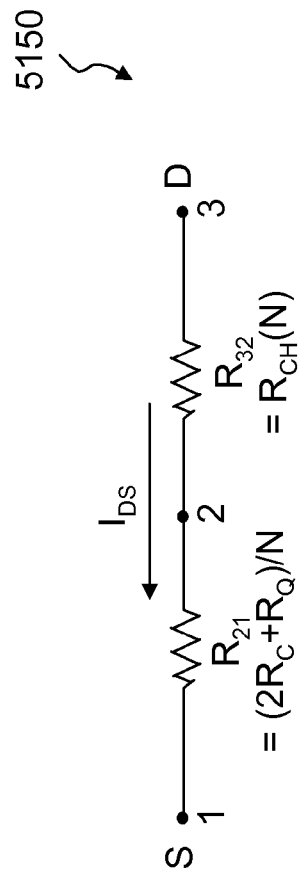

The current $I_{DS}$ flowing between drain contact node 3 and source contact node 1 in equation 5150 illustrated in FIG. 51B is calculated using the voltage $V_{32}$ in the channel region of a CNTFET device. Voltage $V_{32}$ is less than the voltage $V_{DS}$ between drain and source contacts, and for a CNTFET device in the saturation region, may be rewritten as:

$$I_{DS}=(\mu/L) \cdot C_{l\text{-}TOT}(N) \cdot [(V_{32}-V_T)^2/2] \quad [\text{EQ 20.22}]$$

The resistance value $R_{12}$ may be calculated using equation 20.23 as discussed further above $$R_{12}=(2R_C-R_Q)/N \quad [\text{EQ 20.23}]$$

For a current $I_{DS}$, the voltage drop across $R_{12}$ is give by $$V_{21}=R_{12} \cdot I_{DS} \quad [\text{EQ 20.24}]$$

Therefore, the value of voltage $V_{32}$ across the channel region of the CNTFET device is reduced by the voltage drop $V_{21}$ to $$V_{32}=V_{DS}-V_{21} \quad [\text{EQ 20.25}]$$

The voltage drop $V_{32}$ as a function of channel resistance $R_{CH}$ is $$V_{32}=R_{CH} I_{DS} \quad [\text{EQ 20.26}]$$

Since $$R_{CH}=V_{32}/I_{DS} \quad [\text{EQ 20.27}]$$

Combining equations 20.27 and 20.22, $R_{CH}$ may be expressed as $$R_{CH}=V_{32}/\{(\mu/L) \cdot C_{l\text{-}TOT}(N) \cdot [(V_{32}-V_T)^2/2]\} \quad [\text{EQ 20.28}]$$

The total voltage $V_{DS}$ between terminals 1 and 3 may be written as $$V_{31}=V_{DS}=V_{21}+V_{32} \quad [\text{EQ 20.29}]$$

Combining EQs. 20.22, 20.23, and 20.24, $V_{21}$ may be calculated as $$V_{21}=[(2R_C+R_Q)/N]\{(\mu/L) \cdot C_{l\text{-}TOT}(N) \cdot [(V_{32}-V_T)^2/2]\} \quad [\text{EQ 20.30}]$$

Equations 20.29 and 20.30 may be combined, resulting in equation 20.31

$$V_{DS}=[(2R_C+R_Q)/N] \cdot \{(\mu/L) \cdot C_{l\text{-}TOT}(N) \cdot [(V_{32}-V_T)^2/2]\} + V_{32} \quad [\text{EQ 20.31}]$$

Next, equation 20.31 is solved for $V_{32}$, the voltage across the CNTFET device channel, by first rearranging terms to form equation 20.32.

$$2V_{DS}=[(2R_C+R_Q)/N] \cdot \{(\mu/L) \cdot C_{l\text{-}TOT}(N) \cdot [(V_{32}-V_T)^2]\} + 2V_{32}$$

$$2V_{DS}=[(2R_C+R_Q)/N] \cdot \{(\mu/L) \cdot C_{l\text{-}TOT}(N) \cdot [(V_{32}-V_T)^2]\} + 2V_{32}/\{[(2R_C+R_Q)/N] \cdot (\mu/L) \cdot C_{l\text{-}TOT}(N)\}$$

$$2V_{DS}=[(2R_C+R_Q)/N] \cdot \{(\mu/L) \cdot C_{l\text{-}TOT}(N)\}=V^2_{32}-2V_{32}V_T+V^2_T+2V_{32}/\{[(2R_C+R_Q)/N] \cdot (\mu/L) \cdot C_{l\text{-}TOT}(N)\}$$

$$V^2_{32}-2V_{32}V_T+V^2_T+2V_{32}/([(2R_C+R_Q)/N] \cdot [(\mu/L) \cdot C_{l\text{-}TOT}(N)])-2V_{DS}/([(2R_C+R_Q)/N] \cdot [(\mu/L) \cdot C_{l\text{-}TOT}(N)])=0$$

$$V^2_{32}+V_{32}\{[2/([(2R_C+R_Q)/N] \cdot [(\mu/L) \cdot C_{l\text{-}TOT}(N)])-2V_T]-\{2V_{DS}/([(2R_C+R_Q)/N] \cdot [(\mu/L) \cdot C_{l\text{-}TOT}(N)])-V^2_T\}=0 \quad [\text{EQ 20.32}]$$

Equation 20.32 has a well known quadratic equation form with a known solution and may be expressed as:

$$aV^2_{32}+bV_{32}+c=0; \text{and } V_{32}=(-b+-[b^2-4ac]^{1/2})/2a \quad [\text{EQ 20.33}]$$

Where:
a=1
b=2/{[(2R_C+R_Q)/N] \cdot [(\mu/L) \cdot C_{l\text{-}TOT}(N)]\}-2V_T
c=-{2V_{DS}/([(2R_C+R_Q)/N] \cdot [(\mu/L) \cdot C_{l\text{-}TOT}(N)])-V^2_T\}

$V_{32}$ may be calculated by first calculating the values in b and c. The CNTs in these examples are semiconducting single wall CNTs (s-SWNTs) with a bandgap energy proportional to $1/d_{NT}$, where $d_{NT}$ is the CNT diameter. $R_C$ varies depending on the contact metal work function relative to the s-SWNT bandgap energy, the wetting properties of the metal to individual CNTs in the CNT fabric, among other factors. The following assumptions are used in the examples described further below. A contact resistance $R_C$=3 kΩ and a quantum resistance $R_Q$=6.5 kΩ. The number of nanotubes N is for a CNTFET device of width W=400 nm and depends on CNT diameter $d_{NT}$ and the CNT-to-CNT spacing. A value of $d_{NT}$=1.0 nm corresponding to FIG. 47 is used. However, any diameter value may be used. A channel length $L_{CH}$=200 nm is assumed. The gate capacitance per unit length $C_{l\text{-}TOT}(N)$ is calculated using equations 20.6 and 20.8 as described further above. For the pCNTFET devices used in these examples, the mobility $\mu_P$=775 cm²/V·s in equation 20.13 is used. However, the value of mobility without the contact and quantum resistance components would be higher, probably at least 2,000 cm$^2$/V·s based on the Javey reference. As devices are scaled, the insulator may be replaced with a high dielectric constant material. Values of $\epsilon_R$=4 and $\epsilon_R$=10 are used in the examples further below. $\epsilon_R$=4 corresponds to a gate insulator of SiO$_2$, while $\epsilon_R$=10 corresponds to a combination of SiO$_2$ and a high dielectric constant material such as HfO$_2$ presently used in semiconductor device gate insulators, for example. In these examples, $\epsilon_R$ values of 4 and 10 are used, and V$_{DS}$=3.5 volts and |V$_{TP}$|=0.5 volts are used in some cases, and V$_{DS}$=1.2 volts and |V$_{TP}$|=0.4 volts are used in other cases.

Figure 52:
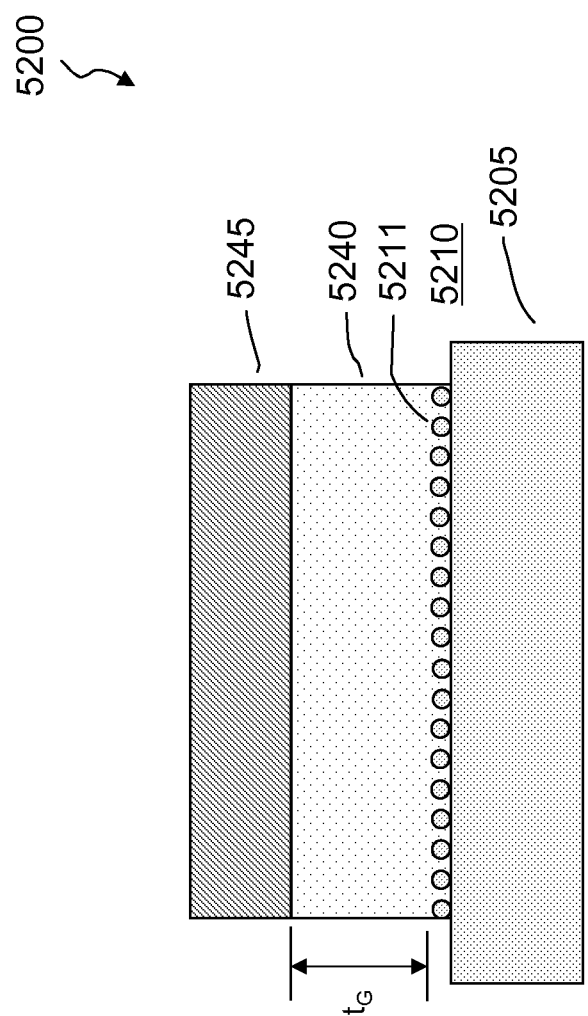
FIG. 52 illustrates a cross section of a CNTFET device formed with a single-layer ordered CNT fabric, which corresponds to cross section AA' shown in FIG. 10B.
Figure 54:
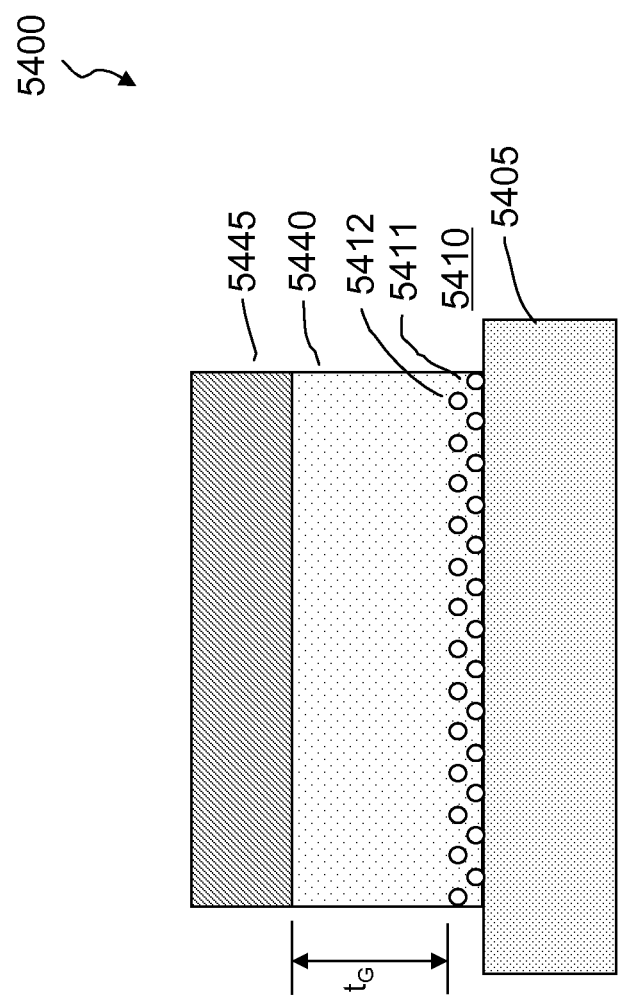
FIG. 54 illustrates a cross section of a CNTFET device formed with a double-layer ordered CNT fabric, which corresponds to cross section AA' shown in FIG. 10B.
Figure 58:
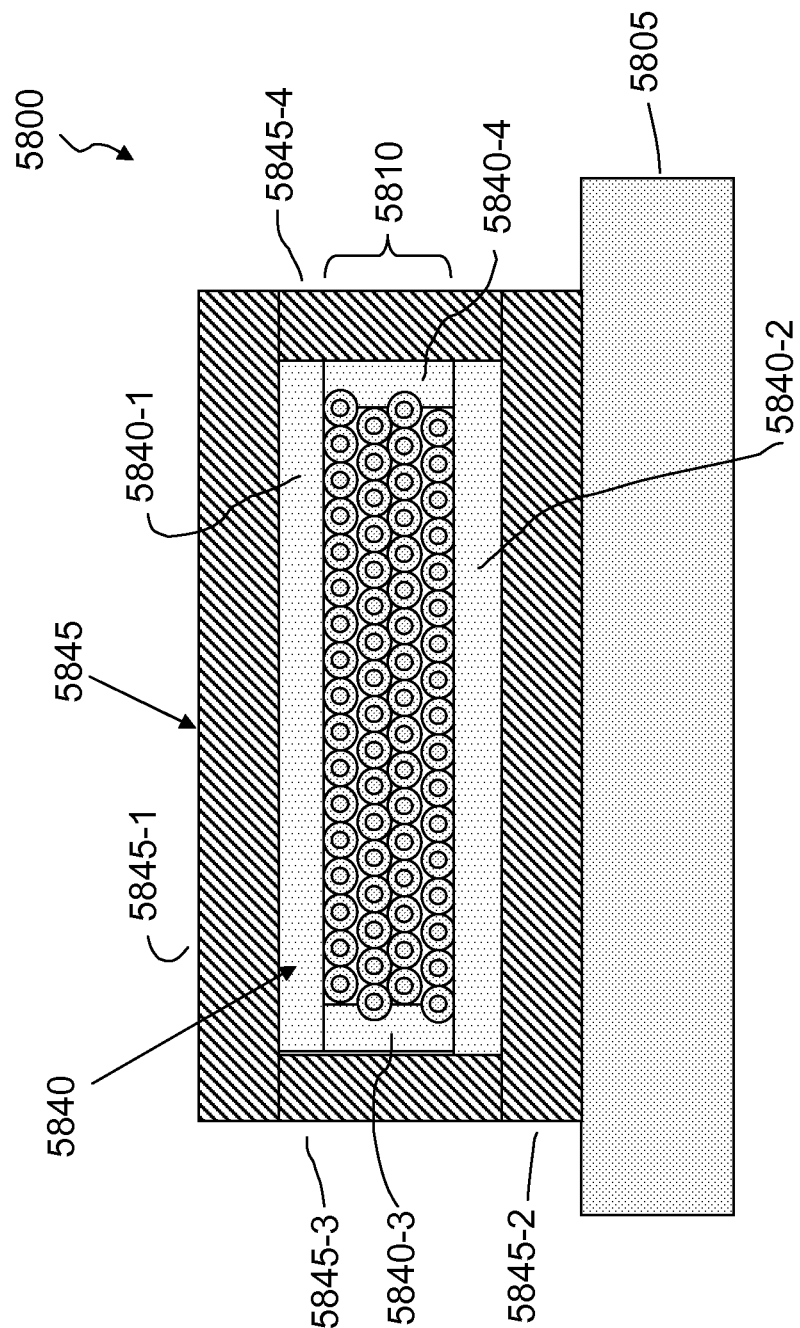
FIG. 58 illustrates a cross section of a CNTFET device formed with a quadruple-layer ordered insulated-CNT fabric as the channel region.
Figure 59:
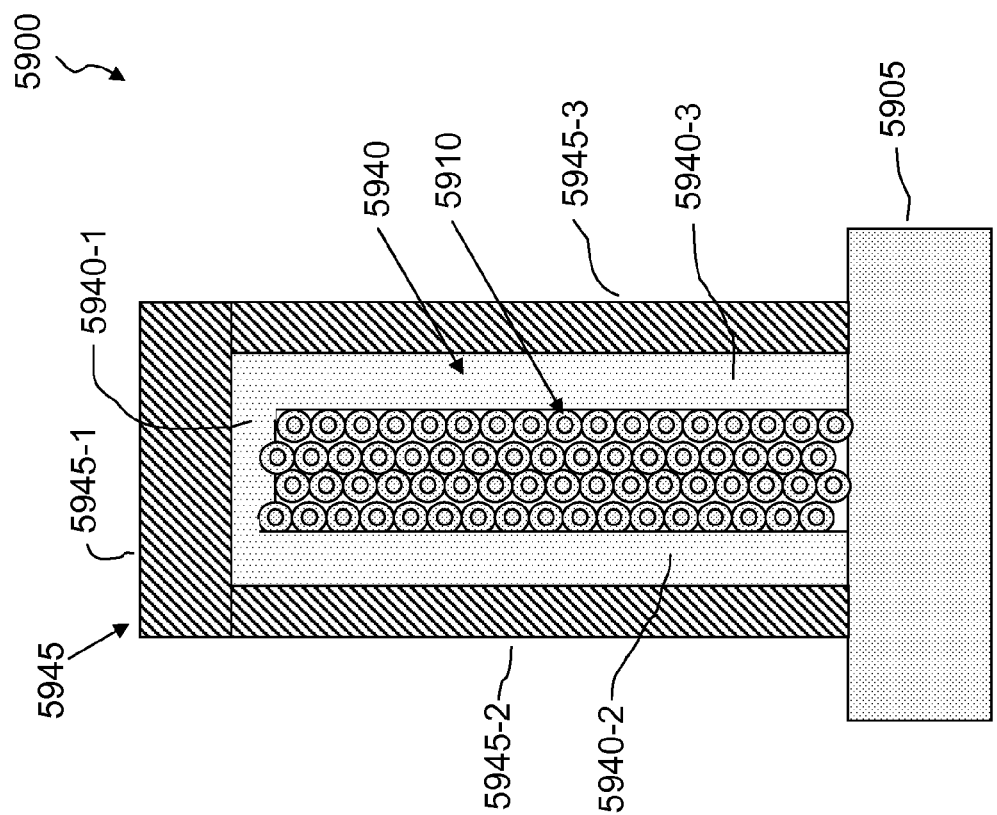
FIG. 59 illustrates a cross section of a CNTFET device formed with a quadruple-layer ordered insulated-CNT fabric, oriented in a vertical direction, as the channel region.

The calculated examples described further below are described in terms of ordered CNT fabrics formed with a single layer CNTs as illustrated in FIG. 52, with individual CNTs forming the CNT fabric that may be un-insulated or insulated. CNT fabrics may also be formed with double layers of CNTs as illustrated in FIG. 54, with individual CNTs forming the CNT fabric that may be un-insulated or insulated. CNT fabrics may also be formed with multiple layers of CNTs in excess of double layers as illustrated in FIGS. 58 and 59.

FIG. 52 illustrates a cross section of CNTFET device 5200 formed with a single-layer ordered CNT fabric, which corresponds to cross section AA' shown in FIG. 10B. CNTFET device 5200 substrate 5205 corresponds to substrate 5008 in FIG. 50B, and single-layer ordered CNT fabric 5210 formed on substrate 5205 corresponds to ordered CNT fabric 5075, a single-layer ordered NT fabric. CNT fabric 5210 is formed of multiple CNTs such as CNT 5211. CNT 5211 may be metallic, semiconducting, or insulating and SWNT or MWNT. For purposes of fabricating CNTFET devices, CNT 5211 is preferably formed using semiconducting SWNTs (s-SWNTs). s-SWNT diameters may range from 0.5 nm to 10 nm, but are typically in the 1.0 to 3.0 nm range. Gate insulator 5240 is in contact with single-layer ordered CNT fabric 5210 and gate conductor 5245. The gate capacitance per unit length $C_{l-TOT}$(N) shown in FIGS. 44 and 47 correspond to $C_{l-TOT}$(N) calculations using EQ. 20.6 and 20.8 for CNTFET devices with cross sections similar to CNTFET device 5200 illustrated in FIG. 52. By way of example, CNT diameter $d_{NT}$=1 nm, gate insulator 5240 thickness $t_G$=7 nm, gate insulator 5240 relative dielectric constant $\epsilon_R$=4 or $\epsilon_R$=10 in the various examples, and the number of nanotubes N corresponds to the number of nanotubes in a CNTFET device of width W=400 nm. The number of nanotubes in CNTFET device width W=400 nm depends on nanotube diameter and CNT-to-CNT spacing which together determine the carbon nanotube periodicity.

Table 5300 illustrated in FIG. 53 shows the results of various calculations for $\epsilon_R$=4 and $\epsilon_R$=10 for pCNTFET devices with structures using ordered single layer CNTFET fabrics corresponding to CNTFET device 5200 structure illustrated in FIG. 52. Table 5300 gives CNT fabric characteristics and corresponding pCNTFET device electrical parameters. There are four cases. In case 1) the CNT fabric is formed with s-SWNTs with diameter $d_{NT}$=1.0 nm, with a CNT-to-CNT separation $\delta_{NT}$=0.5 nm as determined by van der Waals forces, resulting in a periodicity S=1.5 nm. With a pCNTFET device width W=400 nm, there are approximately N=267 CNTs, with a corresponding CNT fabric density of 668 NTs/µm$^2$. Equations 20.6 and 20.8 are used to calculate $C_{l-TOT}$(N)=2.07×10$^{-11}$ F/cm for $\epsilon_R$=4 and $C_{l-TOT}$(N)=5.18× 10$^{-11}$ F/cm for $\epsilon_R$=10. Equation 20.33 is used to calculate the value of V$_{32}$ (V$_{32}$ is the channel voltage V$_{CH}$), then V$_{32}$ is substituted in equation 20.22 to calculate I$_{DS}$ for relative dielectric constant values $\epsilon_R$=4 and $\epsilon_R$=10. V$_{32}$=3.35 V with I$_{DS}$=3.20 mA for $\epsilon_R$=4, and V$_{32}$=3.17 V with I$_{DS}$=7.05 mA for $\epsilon_R$=10. Resistance R$_{21}$ illustrated in FIG. 51B, which corresponds to contact and quantum resistance, is calculated with equation 20.23. Resistance R$_{32}$, corresponding to channel resistance R$_{CH}$, is calculated using the values of I$_{DS}$ and V$_{32}$ with equation 20.27. As illustrated in Table 2300 for case 1) with $\epsilon_R$=4, V$_{CH}$=3.35V or 95% of the applied voltage V$_{DS}$=3.5 V appears across the channel region. However, for case 1) with $\epsilon_R$=10, V$_{CH}$=3.17V or 91% of the applied voltage V$_{DS}$=3.5 V appears across the channel region. This drop in channel voltage V$_{CH}$ is due to the decrease in channel resistance R$_{CH}$ from 1,045Ω to 450Ω, while contact and quantum resistance R$_{12}$ remains unchanged at 46.8 Ω.

The CNT-to-CNT spacing δN=0.5 nm corresponding to case 1) illustrated in table 5300 results in the maximum number of CNTs in width W=400 nm, limited only by van der Waals minimum separation. In un-insulated ordered NT fabrics, such as shown in SEM image 1085 illustrated in FIG. 10D, CNTs are in a substantially parallel direction. However, adjacent CNTs may come in close proximity, within ~0.5 nm for example, and in some cases even overlap. Ordered CNT fabrics formed at CNT fabric density of 668 NTs/µm$^2$ may experience some mobility reduction from such CNT proximity. In order to minimize potential proximity effects, ordered CNT fabrics such as CNT fabric 5210 shown in FIG. 52 may formed using individual insulated CNTs. Examples of such ordered CNT fabrics with various CNT insulator thicknesses are shown in table 5300 as cases 2), 3), and 4).

CNTs may be insulated using silica (silicon oxide), for example, as described in the following references: E. A. Whitsitt and A. R. Barron, "Silica coated single walled nanotubes", Nano Letters, 2003, 3, 775-778, R. Colorado, Jr. and A. R. Barron, "Silica-coated single walled nanotubes: nanostructure formation", Chem. Mater., 2004, 16, 2691-2693, and E. A. Whitsitt, V. C. Moore, R. E. Smalley, and A. R. Barron, "LPD silica coating of individual single walled carbon nanotubes", J. Mater. Chem., 2005, 15, 4678-4687. Silica is a silicon oxide with a relative dielectric constant of approximately $\epsilon_R$=4. Other insulating material may also be used, for example a combination of silicon oxide with a high dielectric constant material such as hafnium oxide (HfO$_2$) for example, to achieve higher effective dielectric constants of $\epsilon_R$=10 for example. Ordered CNT fabrics may be formed using a solution of insulated CNTs and methods similar to those described further above for ordered NT fabrics formed with un-insulated CNTs. Ordered CNT fabrics formed with insulated CNTs may be formed as single-layer, or multi-layered CNT fabrics as described further below with respect to FIGS. 54, 58, and 59, and used to reduce or eliminate proximity effects while maintaining desired I-V electrical characteristics of the corresponding CNTFET devices.

Cases 2), 3), and 4) shown in Table 5300 illustrated in FIG. 53 show CNT fabric and corresponding pCNTFET device characteristics for CNT dielectric coating thicknesses of 0.5, 1.0, and 1.5 nm, respectively. These CNT dielectric coating thicknesses result in CNT-to-CNT spacing δNT of 1.0, 2.0, and 3.0 nm, respectively and reduce the number of CNTs in a pCNTFET device of width W=400 nm as shown in table 5300. In these examples, $\epsilon_R$=10 is assumed for both the CNT insulator and the gate insulator 5240 illustrate in FIG. 52. The ordered CNT fabric density is reduced by a factor of 2.6× from 668 NTs/µm$^2$ in case 1) to 253 NTs/µm$^2$ in case 4). However, the gate capacitance of the pCNTFET device is only reduced by approximately 4%. However, the contact and quantum resistance value $R_{12}$ which is proportional to 1/N increases from 46.8Ω to 123.2Ω as the number of CNTs decreases, a resistance increase of 2.6x. This increase in $R_{12}$ is the primary reason for the reduction in $V_{CH}$ shown in table 5300, which in turn reduces the current $I_D$ at applied voltage $V_{DS}$=3.5 volts by approximately 35%.

Because of the low sensitivity of gate capacitance to the CNT fabric density above a minimum value as illustrated in FIG. 47 and table 5300 in FIG. 53, it is desirable to increase the maximum number of CNTs beyond the maximum in a single-layer ordered CNT fabric by forming ordered CNT fabrics with more CNT layers (multi-layered ordered CNT fabrics) as illustrated in FIGS. 50C and 50D.

FIG. 54 illustrates a cross section of CNTFET device 5400 formed with a double-layer ordered CNT fabric, which corresponds to cross section AA' shown in FIG. 10B. CNTFET device 5400 substrate 5405 corresponds to substrate 5008 in FIG. 50C, and double-layer ordered CNT fabric 5410 formed on substrate 5405 corresponds to ordered CNT fabric 5076, a double-layer ordered CNT fabric. CNT fabric 5410 is formed of multiple CNTs such as CNT 5411 on a first CNT layer, and CNT 5412 on a second CNT layer. CNTs 5411 and 5412 may be metallic, semiconducting, or insulating and SWNT or MWNT. For purposes of fabricating CNTFET devices, CNTs 5211 and 5212 are preferably formed using semiconducting SWNTs (s-SWNTs). s-SWNT diameters may range from 0.5 nm to 10 nm, but are typically in the 1.0 to 3.0 nm range. Gate insulator 5240 is in contact with double-layer ordered CNT fabric 5410 and gate conductor 5445.

The gate capacitance per unit length $C_{l\text{-}TOT}(N)$ of a double-layer ordered CNT fabric, such as double-layer ordered CNT fabric 5410 illustrated in FIG. 54, may be simulated using the COMSOL simulator described further above with respect to equations 20.1 and 20.2. However, as shown in FIGS. 44, 47, and table 5300 illustrated in FIG. 53, gate capacitance $C_{l\text{-}TOT}(N)$ has a very low sensitivity to CNT fabric density over a broad range. Simulations also have shown a low gate capacitance sensitivity to CNT diameter. Accordingly, $C_{l\text{-}TOT}(N)$ calculations using EQ. 20.6 and 20.8 were carried out for CNTFET devices in which double-layer ordered CNT fabric 5410 was replaced with an approximately equivalent single-layer ordered CNT fabric with CNTs referred to as having equivalent diameters $d_{NT\text{-}EQ}$ and equivalent periodicities $S_{EQ}$ as illustrated in FIGS. 55 and 56 for purpose of calculating channel region gate capacitance. So for example, double-layer ordered CNT fabric 5410 may be formed with CNTs having $d_{NT}$=1.0 nm and periodicity S=1.5 nm. However, for purposes of channel region gate capacitance calculations, double layered ordered fabric 5410 is approximated by a single-layer ordered CNT fabric of $d_{NT\text{-}EQ}$=1.54 nm with an equivalent periodicity $S_{EQ}$=2.25 nm and a correspondingly lower effective number of CNTs of $N_{EFF}$, as described further below with respect to FIGS. 55 and 56, and illustrated by case 5) in table 5700 in FIG. 57. $N_{EFF}$ may be approximately calculated by multiplying the number of spaces between CNTs by the equivalent periodicity $(N_{EFF}-1) S_{EQ} \sim W$; in these examples, W=400 nm. However, for purposes of contact and quantum resistance calculations $R_{12}$, the actual number of nanotubes N is used. Therefore, it is possible to use equations 20.22-20.33 to calculate the channel region electrical characteristics using $N_{EFF}$ and the contact and quantum resistance $R_{12}$ using the actual number of nanotubes N.

Figure 55A:
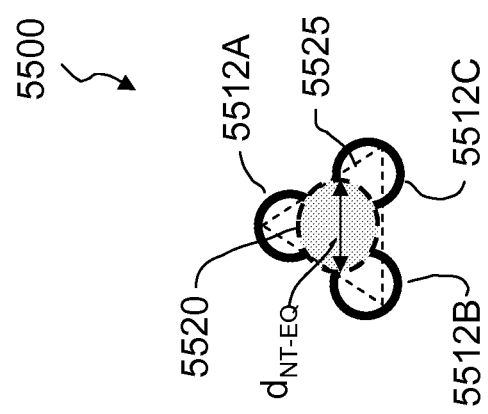
FIG. 55A-B illustrates a cross section of a CNTFET device formed with a double-layer ordered CNT fabric with an equivalent single-layer ordered CNT fabric formed with larger diameter CNTs for purposes of calculating gate-to-fabric capacitance.

FIG. 55A illustrates structure 5500 showing three CNTs 5512A, 5512B, and 5512C of equal diameter $d_{NT}$ represented by an equivalent CNT 5520 of equivalent diameter $d_{NT\text{-}EQ}$. The equivalent CNT 5520 diameter $d_{NT\text{-}EQ}$ is calculated as the diameter of circle inscribed in equilateral triangle 5525. In this example, the dimensions of equilateral triangle 5525 are calculated in two steps. The dimensions of a first equilateral triangle connecting the center of each of the three CNTs 5512A, 5512B, and 5512C are calculated. For CNTs 5512A, 5512B, and 5512C each of diameter $d_{NT}$=1.0 nm, and CNT-to-CNT separation $\delta_{NT}$=0.5 nm, the sides of the first equilateral triangle are 1.5 nm in length. Next, the height of a line connecting the center of CNT 5512A and intersecting the midpoint of the segment of the first equilateral triangle connecting the centers of CNTs 5512B and 5512C at a right angle is calculated using the well know Pythagorean Theorem. In this example the height $h_1^2=1.5^2-0.75^2$ and $h_1$=1.3 nm. The dimensions of the second equilateral triangle 5525 are calculated as follows. The height $h_1$ described above with respect to the first equilateral triangle is increased by the diameter $d_{NT}$ of CNTs 5512A, 5512B, and 5512C, in this example $d_{NT}$=1.0 nm, such that $h_2$ of equilateral triangle 5525 equals $h_1+d_{NT}$ to better approximate to the combination of diameters and separations of CNTs 5512A, 5512B, and 5512C. Height $h_2$=1.3+1.0; $h_2$=2.3 nm. Since $h_2$, as in the case of $h_1$, is connected to one node of equilateral triangle 5525 and bisects the opposite segment at a right angle, the Pythagorean Theorem may be used to estimate the length x of each side of equilateral triangle 5525. In this example, $x^2-(x/2)^2=h_2^2$, and for $h_2$=1.3 nm, x=2.66 nm. Next, using the well known formula for the diameter of a circle inscribed in an equilateral triangle, inscribed circle diameter=$(3)^{0.5} \cdot x/3$, and therefore the diameter of equivalent CNT 5520 inscribed in equilateral triangle 5525 may be calculated as $d_{NT\text{-}EQ}=(3)^{0.5} \cdot 2.66/3$; $d_{NT\text{-}EQ}$=1.54 nm. This method of calculating $d_{NT\text{-}EQ}$ may be used for any CNT diameter $d_{NT}$ and CNT-to-CNT separation $\delta NT$.

Figure 55B:
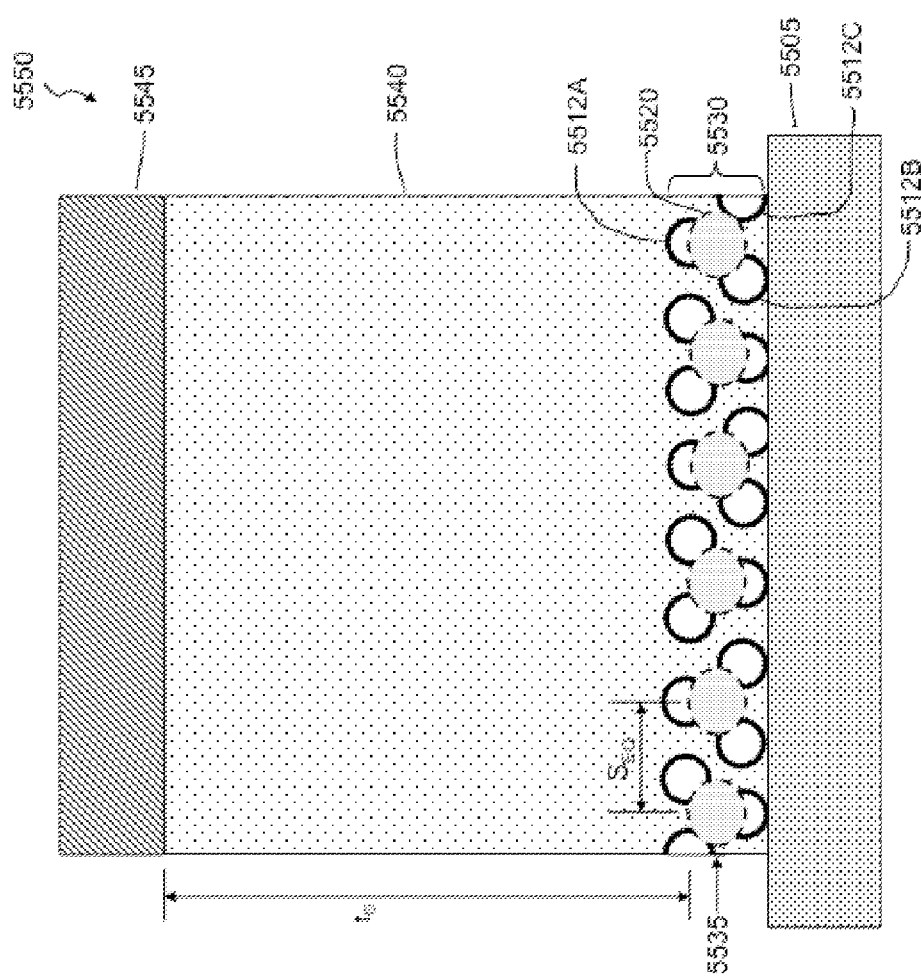

FIG. 55B illustrates a cross section of CNTFET device 5550 formed with a double-layer ordered CNT fabric 5530 on substrate 5505, in contact with gate insulator 5540, which is also in contact with gate conductor 5545, and corresponds to cross section AA' shown in FIG. 10B. Double-layer ordered CNT fabric 5530 is formed with CNTs corresponding to CNTs 5512A, 5512B, and 5512C. Substrate 5505 corresponds to substrate 5405 shown in FIG. 54, double-layer ordered CNT fabric 5330 corresponds to double-layer ordered CNT fabric 5410, gate insulator 5540 corresponds to gate insulator 5440, and gate conductor 5545 corresponds to gate conductor 5445.

Also shown in FIG. 55B is a representative single-layer ordered CNT fabric 5535 formed with equivalent CNTs 5520 of equivalent diameter $d_{NT\text{-}EQ}$ as described further above with respect to structure 5500 illustrated in FIG. 55A. CNT fabric 5535 has an equivalent diameter $d_{NT\text{-}EQ}$ and an equivalent periodicity $S_{EQ}$ and a corresponding number of equivalent CNTs 5520 equal to $N_{EFF}$. Insulator thickness $t_G$ is the separation between the bottom of the gate conductor and the top of the equivalent CNTs in the equivalent CNT fabric as shown in FIG. 55B. If CNTs are insulated, the relative dielectric constant $\epsilon_R$ of the CNT insulator and gate insulator are assumed to be approximately the same. By way of example, and as shown by case 5) in table 5700 illustrated in FIG. 57:

Double-layer ordered CNT fabric 5530 uses the following CNTs:
  $d_{NT}$=1.0 nm, $\delta_{NT}$=0.5 nm, and N=534 CNTs, 267 CNTs in each layer
Representative single-layer ordered CNT fabric 5535 uses the following CNTs:
  $d_{NT\text{-}EQ}$=1.54 nm, $S_{EQ}$=2.25 nm, and $N_{EFF}$=179 CNTs The number of CNTs N=534 is used when calculating contact and quantum resistance $R_{12}$ (FIG. 51B) using equation 20.23, When calculating gate capacitance $C_{l\text{-}TOT}(N)$ using equations 20.6 an 20.8, N may represent an actual number of CNTs or may represent an effective number CNTs $N_{EFF}$ with equivalent corresponding diameters $d_{NT\text{-}EQ}$ and equivalent periodicities $S_{EQ}$ as described further above with respect to FIGS. 55A and 55B. In equations 20.22-20.33, N always represents the actual number of CNTs in an ordered CNTFET fabric of width W, whether single or multi-layered, and in these examples W=400 nm is used. $C_{l\text{-}TOT}(N)$ represents the gate capacitance per unit length, calculated based on the number of CNTs N, or an effective number of CNTs $N_{EFF}$, as described further above. While gate capacitance per unit length values $C_{l\text{-}TOT}(N)$ based on a representative single-layer fabric with equivalent CNTs of diameter $d_{NT\text{-}EQ}$, periodicity $S_{EQ}$, and corresponding effective number of CNTs $N_{EFF}$ are used in these examples, COSMOS-based simulations of multi-layer fabrics (two or more) using equations 20.1 and 20.2 may be used for greater accuracy.

The CNTs illustrated in FIGS. 55A and 55B are illustrated at their maximum density, limited by the allowed minimum CNT-to-CNT spacing of ≈0.5 nm. However, CNTs are typically only approximately parallel, densities can vary due to process variations, and some CNTs may cross other CNTs between source and drain regions forming conductive pathways. When CNTs interact via conductive pathways, charge scattering and charge transfer may occur that reduces carrier mobility. In addition, for multi-layers of CNTs, CNTs closest to the MOSFET gate, on the top layer in FIG. 55B, may reduce the electrostatic coupling of CNTs in CNT layers below the top layer. Referring to FIG. 55B, CNT 5512A may shield CNT 5512B.

Figure 56A:
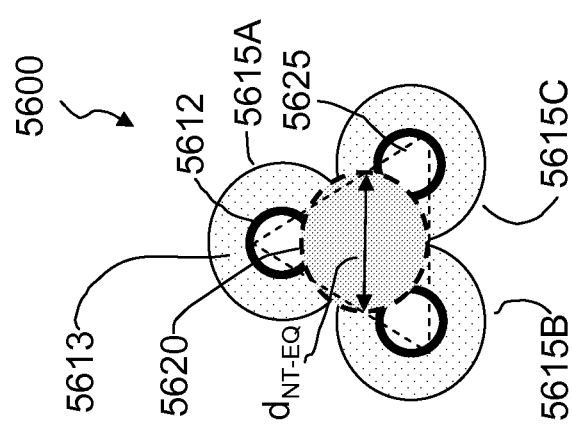
FIG. 56A-B illustrates a cross section of a CNTFET device formed with a double-layer ordered insulated-CNT fabric with an equivalent single-layer ordered CNT fabric formed with larger diameter CNTs for purposes of calculating gate-to-fabric capacitance.
Figure 56B:
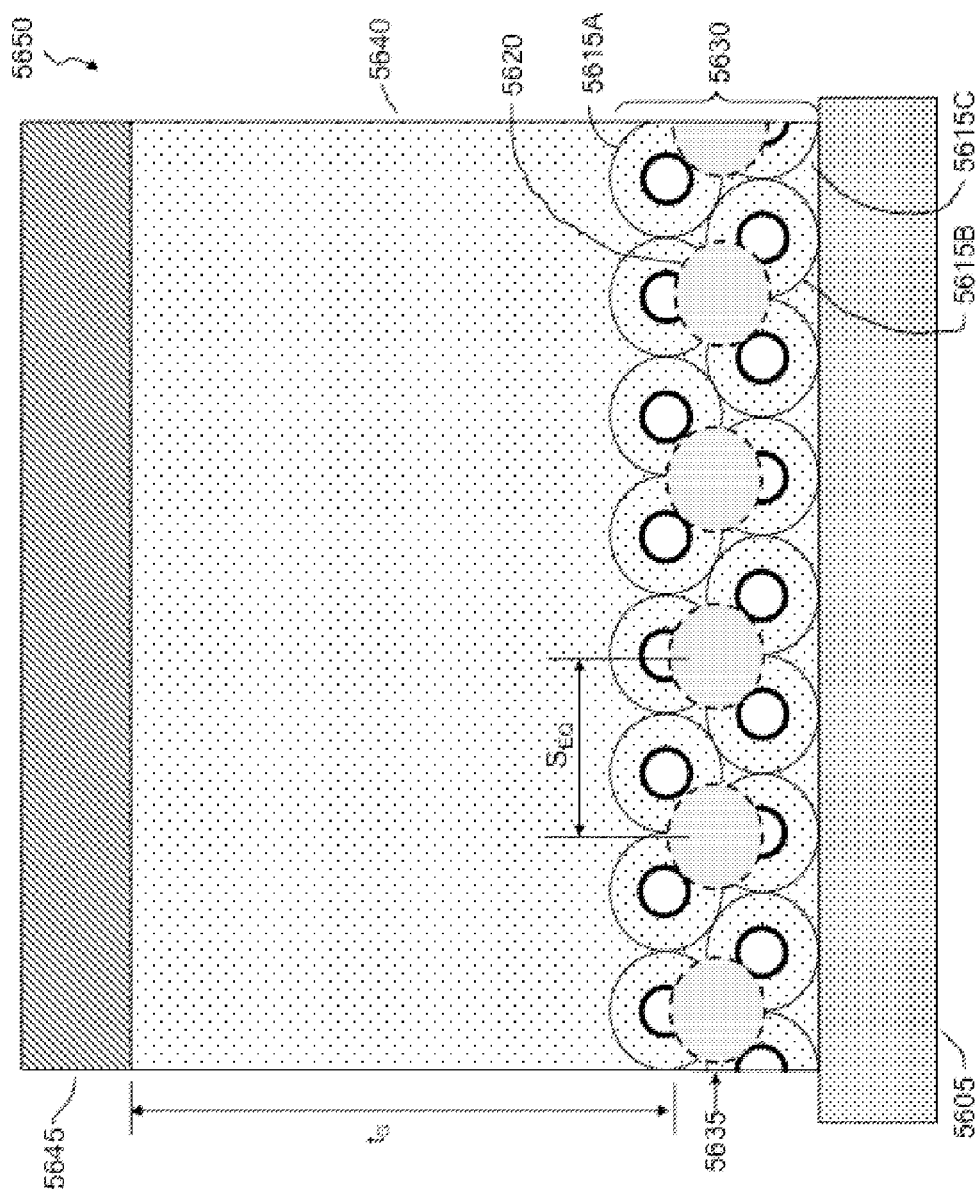

One way to eliminate CNT-to-CNT conductive pathways and reduce shielding effects is to use CNTs coated with an insulating material as illustrated in FIG. 56B. CNT density is reduced relative to non-insulated CNTs. However, by eliminating conductive pathways and reducing or eliminating shielding of lower layers may result in overall improved CNTFET performance. CNTFET devices formed with CNT fabrics formed with insulated CNTs are described with respect to FIGS. 56A and 56B.

FIG. 56A illustrates structure 5600 showing three insulated CNTs 5615A, 5615B, and 5615C of equal diameter represented by an equivalent CNT 5620 of equivalent diameter. Each of the insulated CNTs 5615A, 5615B, and 5615C includes a CNT 5612 of diameter $d_{NT}$ plus an insulator 5613. As is the case with respect to FIG. 55A, the equivalent CNT 5520 diameter $d_{NT\text{-}EQ}$ is calculated as the diameter of circle inscribed in an equilateral triangle, in this case equilateral triangle 5625. In this example, the dimensions of equilateral triangle 5625 are calculated in two steps. The dimensions of a first equilateral triangle connecting the center of each of the three insulated CNTs 5615A, 5615B, and 5615C are calculated. In this example, a CNT 5612 of 1.0 nm with an insulator thickness 5613 of 1.0 nm is chosen for a total insulated CNT diameter of 3 nm for insulated CNTs 5615A, 5615B, and 2615C, corresponding to case 7) shown in table 5700 illustrated in FIG. 57. For CNTs 5615A, 5615B, and 5615C each of diameter $d_{NT}=1.0$ nm, and CNT-to-CNT separation $\delta_{NT}=2.0$ nm, the sides of the first equilateral triangle are 3.0 nm in length. Next, the height of a line connecting the center of CNT 5615A and intersecting the midpoint of the segment of the first equilateral triangle connecting the centers of CNTs 5615B and 5615C at a right angle is calculated using the well know Pythagorean Theorem. In this example the height $h_1^2=3.0^2-1.5^2$ and $h_1=2.6$ nm. The dimensions of the second equilateral triangle 5625 are calculated as follows. The height $h_1$ described above with respect to the first equilateral triangle is increased by the diameter $d_{NT}$ of CNTs 5612, in this example $d_{NT}=1.0$ nm, such that $h_2$ of equilateral triangle 5625 equals $h_1+d_{NT}$ to better approximate the combination of diameters and separations of CNTs 5615A, 5615B, and 5615C. Height $h_2=2.6+1.0$; $h_2=3.6$ nm. Since $h_2$, as in the case of $h_1$, is connected to one node of equilateral triangle 5625 and bisects the opposite segment at a right angle, the Pythagorean Theorem may be used to estimate the length x of each side of equilateral triangle 5625. In this example, $x^2-(x/2)^2=h_2^2$, and for $h_2=3.6$ nm, $x=4.16$ nm. Next, using the well known formula for the diameter of a circle inscribed in an equilateral triangle, inscribed circle diameter=$(3)^{0.5} \cdot x/3$, and therefore the diameter of equivalent CNT 5620 inscribed in equilateral triangle 5625 may be calculated as $d_{NT\text{-}EQ}=(3)^{0.5} \cdot 4.16/3$; $d_{NT\text{-}EQ}=2.40$ nm. This method of calculating $d_{NT\text{-}EQ}$ may be used for any CNT diameter, insulator thickness, and CNT-to-CNT separation $\delta_{NT}$.

FIG. 56B illustrates a cross section of CNTFET device 5650 formed with a double-layer ordered insulated-CNT fabric 5630 on substrate 5605, in contact with gate insulator 5640, which is also in contact with gate conductor 5645, and corresponds to cross section AA' shown in FIG. 10B. Double-layer ordered insulated-CNT fabric 5630 is formed with CNTs corresponding to CNTs 5615A, 5615B, and 5615C. Substrate 5605 corresponds to substrate 5405 shown in FIG. 54, double-layer ordered insulated-CNT fabric 5630 corresponds to double-layer ordered CNT fabric 5410, gate insulator 5640 corresponds to gate insulator 5440, and gate conductor 5645 corresponds to gate conductor 5445. When using insulated-CNT fabric, gate insulator 5640 may be eliminated for some devices.

Also shown in FIG. 56B is a representative single-layer ordered CNT fabric 5635 formed with equivalent CNTs 5620 of equivalent diameter $d_{NT\text{-}EQ}$ as described further above with respect to structure 5600 illustrated in FIG. 56A. CNT fabric 5635 has an equivalent diameter $d_{NT\text{-}EQ}$ and an equivalent periodicity $S_{EQ}$ and a corresponding number of equivalent CNTs 5620 equal to $N_{EFF}$. Insulator thickness $t_G$ is the separation between the bottom of the gate conductor and the top of the equivalent CNTs in the equivalent CNT fabric as shown in FIG. 56B. If CNTs are insulated, the relative dielectric constant $\varepsilon_R$ of the CNT insulator and gate insulator are assumed to be approximately the same. By way of example, and as shown by case 7) in table 5700 illustrated in FIG. 57:

Double-layer ordered CNT fabric 5630 uses the following CNTs:

$d_{NT}=1.0$ nm, insulation thickness=1.0 nm, $\delta_{NT}=2.0$ nm, and N=270 CNTs, 135 CNTs in each layer Representative single-layer ordered CNT fabric 56535 uses the following CNTs:

$d_{NT\text{-}EQ}=2.4$ nm, $S_{EQ}=4.5$ nm, and $N_{EFF}=89$ CNTs

The number of CNTs N=270 is used when calculating contact and quantum resistance $R_{12}$ (FIG. 51B) using equation 20.23, When calculating gate capacitance $C_{l\text{-}TOT}(N)$ using equations 20.6 an 20.8, N may represent an actual number of CNTs or may represent an effective number CNTs $N_{EFF}$ with equivalent corresponding diameters $d_{NT\text{-}EQ}$ and equivalent periodicities $S_{EQ}$ as described further above with respect to FIGS. 56A and 56B. In equations 20.22-20.33, N always represents the actual number of CNTs in an ordered CNTFET fabric of width W, whether single or multi-layered, and in these examples W=400 nm is used. $C_{l\text{-}TOT}(N)$ represents the gate capacitance per unit length, calculated based on the number of CNTs N, or an effective number of CNTs $N_{EFF}$, as described further above. While gate capacitance per unit length values $C_{I-TOT}(N)$ based on a representative single-layer fabric with equivalent CNTs of diameter $d_{NT-EQ}$, periodicity $S_{EQ}$, and corresponding effective number of CNTs $N_{EFF}$ are used in these examples, COSMOS-based simulations of multi-layer fabrics (two or more) using equations 20.1 and 20.2 may be used for greater accuracy.

Table 5300 illustrated in FIG. 53 shows single-layer ordered CNT fabrics formed with un-insulated CNTs in case 1), and single-layer ordered insulated-CNT fabrics formed with insulated CNTs in cases 2), 3), and 4). Table 5700 illustrated in FIG. 57 shows double-layer ordered CNT fabrics formed with un-insulated CNTs in case 5), and double-layer ordered insulated-CNT fabrics formed with insulated CNTs in cases 6), 7), and 8). The pCNTFET device dimensions used in both tables were the same, with W=400 nm and $L_{CH}$=200 nm, as were applied voltages, and other parameters shown in tables 5300 and 5700.

At this point in the specification, parameters are compared for single-layer ordered CNT fabrics and double-layer ordered CNT fabrics formed with un-insulated CNTs; in this example case 1) in table 5300 and corresponding case 5) in table 5700 for $\varepsilon_R$=10 may be compared. The double-layered ordered CNT fabric has 534 CNTs, or 2× the number 267 CNTs than in the single-layer ordered CNT fabric, resulting in a contact and quantum resistance $R_{12}$=23.4Ω which is ½ of the $R_{12}$=46.8Ω for the single-layer ordered CNT fabric as calculated using equation 20.23. When comparing gate capacitance per unit length $C_{I-TOT}(N)$, the number of CNTs forming the channel region is 267 for the single-layer ordered CNT fabric and an equivalent $N_{EFF}$=179 CNTs for the double-layer ordered CNT fabric. As described further above with respect to FIG. 47, above a minimum CNT ordered fabric density, the value of $C_{I-TOT}(N)$ is not a strong function of the number of CNTs in the channel region, and the value of $C_{I-TOT}(N)$ calculated using equations 20.6 and 20.8 only drops from $5.18\times10^{-11}$ F/cm to $5.10\times10^{-11}$ F/cm, a decrease in gate capacitance per unit length of approximately 1.5%. For the same drain-to-source voltage $V_{DS}$=3.5 V and the same threshold voltage $|V_{TP}|$=0.5 V for the double-layer vs single-layer ordered CNT fabric, the voltage across the channel region VcH, corresponding to $V_{32}$ in equation 20.33, is $V_{CH}$=3.32 V and $V_{CH}$=3.17 V, respectively, which shows that the 2× lower $R_{12}$ resistance of the double-layer CNT fabric has a greater effect than the 1.5% reduction in gate capacitance per unit length $C_{I-TOT}(N)$ when drain-to-source current $I_{DS}$ is calculated using equation 20.22 for example. For the double-layer vs single-layer ordered CNT compared in cases 5) and 1), respectively, $I_{DS}$=7.69 mA and $I_{DS}$=7.05 mA, respectively, and the double-layer ordered CNT fabric $I_{DS}$ value is approximately 9% higher.

At this point in the specification, parameters are compared for single-layer ordered insulated-CNT fabrics and double-layer ordered insulated-CNT fabrics formed with insulated CNTs; in this example cases 2-4) in table 5300 and corresponding cases 6-8) in table 5700 for $\varepsilon_R$=10 may be compared. The double-layered ordered insulated-CNT fabric shown in case 6) has 402 CNTs, or 2× the number 201 CNTs than in the single-layer ordered insulated-CNT fabric shown in case 2), resulting in a contact and quantum resistance $R_{12}$=31.1Ω which is ½ of the $R_{12}$=62.2Ω for the single-layer insulated-ordered CNT fabric as calculated using equation 20.23. When comparing gate capacitance per unit length $C_{I-TOT}(N)$, the number of CNTs forming the channel region is 201 for the single-layer ordered insulated-CNT fabric and an equivalent $N_{EFF}$=135 CNTs for the double-layer ordered insulated-CNT fabric. As described further above with respect to FIG. 47, above a minimum CNT ordered fabric density, the value of $C_{I-TOT}(N)$ is not a strong function of the number of CNTs in the channel region, and the value of $C_{I-TOT}(N)$ calculated using equations 20.6 and 20.8 only drops from $5.17\times10^{-11}$ F/cm to $5.07\times10^{-11}$ F/cm, a decrease in gate capacitance per unit length of approximately 1.9%. For the same drain-to-source voltage $V_{DS}$=3.5 V and the same threshold voltage $|V_{TP}|$=0.5 V for the double-layer vs single-layer ordered insulated-CNT fabric, the voltage across the channel region $V_{CH}$, corresponding to $V_{32}$ in equation 20.33, is $V_{CH}$=3.27 V and $V_{CH}$=3.10 V, respectively, which shows that the 2× lower $R_{12}$ resistance of the double-layer insulated-CNT fabric has a greater effect than the 1.9% reduction in gate capacitance per unit length $C_{I-TOT}(N)$ when drain-to-source current $I_{DS}$ is calculated using equation 20.22 for example. For the double-layer vs single-layer ordered insulated-CNT fabric compared in cases 6) and 2), respectively, $I_{DS}$=7.40 mA and $I_{DS}$=6.43 mA, respectively, the double-layer ordered insulated-CNT fabric $I_{DS}$ value is approximately 15% higher.

At this point in the specification, parameters are compared for single-layer ordered insulated-CNT fabrics and double-layer ordered insulated-CNT fabrics formed with insulated CNTs; in this example cases 2-4) in table 5300 and corresponding cases 6-8) in table 5700 for $\varepsilon_R$=10 may be compared. The double-layered ordered insulated-CNT fabric shown in case 7) has 270 CNTs, or 2× the number 135 CNTs than in the single-layer ordered insulated-CNT fabric shown in case 3), resulting in a contact and quantum resistance $R_{12}$=46.3Ω which is ½ of the $R_{12}$=95.6Ω for the single-layer insulated-ordered CNT fabric as calculated using equation 20.23. When comparing gate capacitance per unit length $C_{I-TOT}(N)$, the number of CNTs forming the channel region is 135 for the single-layer ordered insulated-CNT fabric and an equivalent $N_{EFF}$=89 CNTs for the double-layer ordered insulated-CNT fabric. As described further above with respect to FIG. 47, above a minimum CNT ordered fabric density, the value of $C_{I-TOT}(N)$ is not a strong function of the number of CNTs in the channel region, and the value of $C_{I-TOT}(N)$ calculated using equations 20.6 and 20.8 only drops from $5.11\times10^{-11}$ F/cm to $4.87\times10^{-11}$ F/cm, a decrease in gate capacitance per unit length of approximately 4.7%. For the same drain-to-source voltage $V_{DS}$=3.5 V and the same threshold voltage $|V_{TP}|$=0.5 V for the double-layer vs single-layer ordered insulated-CNT fabric, the voltage across the channel region $V_{CH}$, corresponding to $V_{32}$ in equation 20.33, is $V_{CH}$=3.19 V and $V_{CH}$=2.94 V, respectively, which shows that the 2× lower $R_{12}$ resistance of the double-layer insulated-CNT fabric has a greater effect than the 4.7% reduction in gate capacitance per unit length $C_{I-TOT}(N)$ when drain-to-source current $I_{DS}$ is calculated using equation 20.22 for example. For the double-layer vs single-layer ordered insulated-CNT fabric compared in cases 7) and 3), respectively, $I_{DS}$=6.70 mA and $I_{DS}$=5.86 mA, respectively, the double-layer ordered insulated-CNT fabric $I_{DS}$ value is approximately 14% higher.

At this point in the specification, parameters are compared for single-layer ordered insulated-CNT fabrics and double-layer ordered insulated-CNT fabrics formed with insulated CNTs; in this example cases 2-4) in table 5300 and corresponding cases 6-8) in table 5700 for $\varepsilon_R$=10 may be compared. The double-layered ordered insulated-CNT fabric shown in case 8) has 202 CNTs, or 2× the number 101 CNTs than in the single-layer ordered insulated-CNT fabric shown in case 4), resulting in a contact and quantum resistance $R_{12}=61.6\Omega$ which is ½ of the $R_{12}=123.2\Omega$ for the single-layer insulated-ordered CNT fabric as calculated using equation 20.23. When comparing gate capacitance per unit region $C_{l-TOT}(N)$, the number of CNTs forming the channel region is 101 for the single-layer ordered insulated-CNT fabric and an equivalent $N_{EFF}=67$ CNTs for the double-layer ordered insulated-CNT fabric. As described further above with respect to FIG. 47, above a minimum CNT ordered fabric density, the value of $C_{l-TOT}(N)$ is not a strong function of the number of CNTs in the channel region, and the value of $C_{l-TOT}(N)$ calculated using equations 20.6 and 20.8 only drops from 4.97×10⁻¹¹ F/cm to 4.76×10⁻¹¹ F/cm, a decrease in gate capacitance per unit length of approximately 4.4%. For the same drain-to-source voltage $V_{DS}=3.5$ V and the same threshold voltage $|V_{TP}|=0.5$ V for the double-layer vs single-layer ordered insulated-CNT fabric, the voltage across the channel region $V_{CH}$, corresponding to $V_{32}$ in equation 20.33, is $V_{CH}=3.11$ V and $V_{CH}=2.85$ V, respectively, which shows that the 2× lower $R_{12}$ resistance of the double-layer insulated-CNT fabric has a greater effect than the 4.4% reduction in gate capacitance per unit length $C_{l-TOT}(N)$ when drain-to-source current $I_{DS}$ is calculated using equation 20.22 for example. For the double-layer vs single-layer ordered insulated-CNT fabric compared in cases 8) and 4), respectively, $I_{DS}=6.30$ mA and $I_{DS}=5.25$ mA, respectively, the double-layer ordered insulated-CNT fabric $I_{DS}$ value is approximately 20% higher.

Comparing tables 5300 in FIGS. 53 and 5700 in FIG. 57 shows that double-layer ordered CNT fabrics formed with un-insulated CNTs compared with single-layer ordered CNT fabrics formed with un-insulated CNTs result in more current flow for the same device parameters, as illustrated by comparing cases 5) and 1), respectively. Also, comparing tables 5300 in FIGS. 53 and 5700 in FIG. 57 shows that double-layer ordered insulated-CNT fabrics formed with insulated CNTs compared with single-layer ordered insulated-CNT fabrics formed with insulated CNTs result in more current flow for the same device parameters, as illustrated by comparing cases 6-8) and 2-4), respectively.

Saturation Currents of CNTFET Devices Formed Using CNT Fabrics with Single or Multiple Layers of Ordered CNTs Table 5300 illustrated in FIG. 53 shows electrical characteristics of pCNTFET devices formed with single-layer ordered CNT fabrics and single-layer ordered insulated-CNT fabrics summarized in case 1-4). Table 5700 illustrated in FIG. 57 shows double-layer ordered CNT fabrics and double-layer ordered insulated-CNT fabrics summarized in cases 5-8). The examples that follow are based on case 8). Other cases could have been used instead. The pCNTFET channel length $L_{CH}$ is assumed to be 200 nm and the channel width is assumed to be W=400 nm. For the cases illustrated in tables 5300 and 5700, the operating voltage is assumed to be 3.5 volts, the pCNTFET threshold voltage is assumed to be $|V_{TP}|=0.5V$, and the currents $I_{DS}$ are saturation currents. For other cases described further below, the operating voltage is assumed to be 1.2 volts, the pCNTFET threshold voltage is assumed to be $|V_{TP}|=0.4V$, and the currents $I_{DS}$ are saturation currents.

For high performance digital circuits using MOSFET devices, saturation current per unit width is typically used as a figure of merit in the semiconductor industry, usually expressed as micro-Amperes per micrometer (µA/µm), and published in the International Technology Roadmap for Semiconductor (ITRS) and updated every two years. Saturation currents occur when $V_{DS} \sim V_{GS} - V_T$. Saturation current per unit width is also a useful figure of merit for CNTFET devices used in CNTFET logic circuits, for example, and CNTFET protective devices required to sink large ESD surge current. ITRS data for pMOSFET devices published in 2009 give $I_{SATp}=1,210$ µA/µm for low operating voltages in the range of 1.0-1.2 volts for use in high performance and relatively low power operation. This pMOSFET device is fabricated with high complexity scaled silicon processes and a short channel lengths of 29 nm, which limits the allowed operating voltage. Future generations of pMOSFET devices are expected to have $I_{SATp}<1,500$ µA/µm and operate in the 1.0 to 1.2 volt range. The operating voltage range for the pCNTFET devices shown in tables 5300 and 5700 are typically voltages of 3.5V for example. At this point in the specification, the operating voltage of pCNTFET devices shown in table 5700 illustrated in FIG. 57 is set at $V_{DS}=1.2$ volts, $|V_{TP}|=0.4V$, and corresponding pCNTFET device $I_{DS}$ currents are calculated for purposes of comparison with pMOSFET devices. More specifically, pCNTFET and pMOSFET saturation currents per unit width $I_{SATp}$ (µA/µm) are compared. In the examples that follow, saturation currents $I_{SATp}$ are compared for three pCNTFET device structures corresponding to case 8) shown in table 5700.

In a first example, a pCNTFET device corresponding to the CNTFET device 5400 structure is assumed. The case 8) pCNTFET device structure corresponds to the double-layer ordered insulated-CNT fabric 5630 shown in CNTFET device 5650 illustrated in FIG. 56. The first example structure described with respect to case 8) of table 5700 is formed with double-layer ordered insulated-CNT-fabric 5630 with 202 insulated CNTs in which the CNT diameter $d_{NT}=1.0$ nm and the insulator thickness surrounding the CNT is 1.5 nm. The diameter of each insulated CNT is 4.0 nm and the minimum separation between CNTs is δNT=3.0 nm. The double-layer ordered insulated-CNT-fabric thickness $t_{FAB} \sim 6$ nm. In this first example, and others that follow, the value of gate capacitance per unit length $C_{l-TOT}(N)=4.76 \times 10^{-11}$ F/cm for a width W=400 nm. When reducing the operating voltage from 3.5 volts to 1.2 volts, $|V_{TP}|$ is reduced to 0.4 V. For $V_{DS}=1.2V$, using the 0.89 multiplier from case 8), $V_{32}=1.07V$ across the channel region. Also from case 8), the gate capacitance per unit length $C_{l-TOT}(N)=4.76 \times 10^{-11}$ F/cm. $I_{DS}$ for the pCNTFET in the first example, referred to as $I_{DSp\_1}$, may be calculated using equation 20.22 as follows:

$$I_{DSp\_1} = (775/200 \times 10-7) \cdot (4.76 \times 10^{-11}) \cdot (1.07-0.4)^{0.5}/2$$

$$I_{DSp\_1} \sim 400 \text{ µA} \qquad \text{[EQ 20.34]}$$

Since the width W=0.4 um, the saturation current for the first example is:

$$I_{SATp\_1} \sim 400 \text{ µA}/0.4 \text{ µm}; I_{SATp\_1} \sim 1,000 \text{ µA/µm} \qquad \text{[EQ 20.35]}$$

In a second example, a pCNTFET device is formed by "folding" double-layer ordered insulated-CNT fabric 5630 shown in CNTFET device 5650 as illustrated in FIG. 56B to form quadruple-layer ordered insulated-CNT fabric 5810 as the channel region, shown in cross section, for CNTFET device 5800 shown in FIG. 58. FIG. 58 illustrates a channel region cross section of CNTFET device 5800 corresponding to cross section AA' illustrated in FIG. 10B in which quadruple-layer ordered insulated-CNT fabric 5810 corresponds to CNT fabric 1052, and gate conductor 5845 corresponds to a structural modification of gate conductor 1060. Gate conductor 5845 includes a top gate conductor section 5845-1 in contact with gate insulator region 5840-1, which is in contact with a first side of quadruple-layer ordered insulated-CNT fabric 5810. Gate conductor 5845 includes a bottom gate conductor section 5845-2 in contact with gate insulator region 5840-2, which is in contact with a second side of quadruple-layer ordered insulated-CNT fabric 5810. Gate conductor section 5845-2 is also in contact with substrate 5805. Gate conductor sections 5845-1 and 5845-2 are electrically connected by gate conductor section 5845-3, which is in contact with gate insulator region 5840-3, and by gate conductor section 5845-4, which is in contact with gate insulator region 5840-4. Gate insulator regions 5840-3 and 5840-4 are also in contact with quadruple-layer ordered insulated-CNT fabric 5810 at opposite ends. While insulated-CNT fabric is shown in FIG. 58, CNTFET device 5800 may also be formed using CNT fabric with non-insulated carbon nanotubes.

This second example structure uses a modified case 8) of table 5700 structure in which quadruple-layer ordered insulated-CNT fabric 5810 has a width of approximately 200 nm (because of "folding") with electrical parameters corresponding to those shown in table 5700 case 8). The top two insulated CNT layers and the bottom two insulated CNT layers each carry half the current $I_{DS}$ shown in table 5700 case 8), with 202 insulated CNTs in which the CNT diameter $d_{NT}$=1.0 nm and the insulator thickness surrounding the CNT is 1.5 nm. The diameter of each insulated CNT is 4.0 nm and the minimum separation between CNTs is $\delta NT$=3.0 nm. The quadruple-layer ordered insulated-CNT fabric thickness $t_{FAB}$~12 nm. In this second example, and others that follow, the value of gate capacitance per unit length $C_{l\text{-}TOT}(N)$=4.76×10$^{-11}$ F/cm for a combined width W=400 nm (200 nm top side and 200 nm bottom side of quadruple-layer insulated-CNT-fabric 5810). The total device channel width is approximately 200 nm plus the thickness of gate insulator sections 5840-3 and 5830-4 and the thickness of gate conductor sections 5845-3 and 5845-4. The gate insulator thickness $t_G$ for all gate insulator sections is $t_G$=7 nm, corresponding to table 5700 case 8). Conductor sections 5845-3 and 5845-4 are assumed to be deposited on the vertical sidewalls to a thickness of approximately 25 nm. So the total CNTFET device 5800 width is approximately 200+14+50 nm; W=264 nm. In the second example, the same assumptions apply for the corresponding physical and electrical parameter as in the first example. When reducing the operating voltage from 3.5 volts to 1.2 volts, $|V_{TP}|$ is reduced to 0.4 V. For $V_{DS}$=1.2V, using the 0.89 multiplier from case 8), $V_{32}$=1.07V across the channel region. Also from case 8), the gate capacitance per unit length $C_{l\text{-}TOT}(N)$=4.76×10$^{-11}$ F/cm. $I_{DS}$ for the pCNTFET in the second example, referred to as $I_{DSp\_2}$, may be calculated using equation 20.22 as follows:

$$I_{DsP\_2}=(775/200\times10^{-7})\cdot(4.76\times10^{-11})\cdot(1.07-0.4)^{0.5}/2$$

$$I_{DSp\_2} \sim 400 \text{ μA} \quad \text{[EQ 20.36]}$$

$I_{DSp-2}$ is equal to $I_{DSp-1}$ shown in equation 20.34. Since the width W=0.264 um, the saturation current for the second example is:

$$I_{SATp\_2} \sim 400 \text{ μA}/0.264 \text{ μm}; I_{STp\_1} \sim 1,500 \text{ μA/μm} \quad \text{[EQ 20.37]}$$

In a third example, a pCNTFET device is also formed by "folding" double-layer ordered insulated-CNT fabric 5630 shown in CNTFET device 5650 as illustrated in FIG. 59 to form quadruple-layer insulated-CNT fabric 5910 as the channel region, shown in cross section but with a vertical orientation, for CNTFET device 5900. FIG. 59 illustrates a channel region cross section of CNTFET device 5900 corresponding to cross section AA' illustrated in FIG. 10B in which vertically-oriented quadruple-layer ordered insulated-CNT fabric 5910 corresponds to CNT fabric 1052, and gate conductor 5945 corresponds to a structural modification of gate conductor 1060. Gate conductor 5945 includes a top gate conductor section 5945-1 in contact with gate insulator region 5940-1, which is in contact with the top of vertically-oriented quadruple-layer ordered insulated-CNT fabric 5910. The bottom of vertically-oriented quadruple-layer ordered insulated-CNT fabric 5910 is in contact with substrate 5905. Gate conductor 5945 includes a first side gate conductor section 5945-2 in contact with gate insulator region 5940-2, which is in contact with a first side of vertically-oriented quadruple-layer ordered insulated-CNT fabric 5910. First side gate conductor section 5945-2 and gate insulator region 5940-2 are also in contact with substrate 5905. Gate conductor 5945 also includes a second side of vertically-oriented quadruple-layer ordered insulated-CNT fabric 5910 conductor section 5945-3 in contact with gate insulator region 5940-3, which is in contact with a second side of vertically-oriented quadruple-layer ordered insulated-CNT fabric 5910. Second side gate conductor section 5945-3 and gate insulator section 5940-3 are also in contact with substrate 5905. Gate conductor sections 5945-1, 5945-2, and 5945-3 are electrically connected and to form gate conductor 5945. Gate insulator regions 5940-1, 5940-2, and 5940-3 are in contact to form gate insulator 5940. Alternatively, gate conductor 5945 may also be formed to include a bottom gate conductor section separated from quadruple layer ordered insulated-CNT fabric 5910 by a bottom gate insulator region added to gate insulator 5940 (not shown).

This third example structure uses a modified case 8) of table 5700 structure in which quadruple-layer insulated-CNT-fabric 5910 with a vertical orientation has a width of approximately 12 nm, a height of approximately 200 nm, and electrical parameters corresponding to those shown in table 5700 case 8). The two first side insulated CNT layers and the two second side insulated CNT layers each carry half the current $I_{DS}$ shown in table 5700 case 8), with 202 insulated CNTs in which the CNT diameter $d_{NT}$=1.0 nm and the insulator thickness surrounding the CNT is 1.5 nm. The diameter of each insulated CNT is 4.0 nm and the minimum separation between CNTs is $\delta NT$=3.0 nm. The vertically-oriented quadruple-layer insulated-CNT-fabric thickness in the width direction is $t_{FAB}$~12, with a height of approximately 200 nm. In this third example the value of gate capacitance per unit length $C_{l\text{-}TOT}(N)$=4.76×10$^{-11}$ F/cm for a combined width W=400 nm (200 nm first side height and 200 nm second side height of vertically-oriented quadruple-layer ordered insulated-CNT fabric 5910). The total device channel width is approximately 12 nm for the vertically-oriented quadruple-layer ordered insulated-CNT fabric 5910 thickness in the width direction, plus the thickness of gate insulator sections 5940-2 and 5840-2, and the thickness of gate conductor sections 5945-2 and 5845-3. The gate insulator thickness $t_G$ for all gate insulator sections is $t_G$=7 nm, corresponding to table 5700 case 8). Gate conductor sections 5945-2 and 5945-3 are assumed to be deposited on the vertical sidewalls to a thickness of approximately 25 nm. So the total CNTFET device 5900 width is approximately 12+14+50 nm; W=76 nm. In the third example, the same assumptions apply for the corresponding physical and electrical parameter as in the first example. When reducing the operating voltage from 3.5 volts to 1.2 volts, $|V_{TP}|$ is reduced to 0.4 V. For $V_{DS}$=1.2V, using the 0.89 multiplier from case 8), $V_{32}$=1.07V across the channel region. Also from case 8), the gate capacitance per unit length $C_{l\text{-}TOT}(N)$=4.76×10$^{-11}$ F/cm. $I_{DS}$ for the pCNTFET in the third example, referred to as $I_{DSp\_3}$, may be calculated using equation 20.22 as follows:

$$I_{DSp\_3}=(775/200\times10^{-7})\cdot(4.76\times10^{-11})\cdot(1.07-0.4)^{0.5}/2$$

$$I_{DSp\_3} \sim 400 \text{ μA} \quad \text{[EQ 20.38]}$$

$I_{DSp\_3}$ is equal to $I_{DSp\_1}$ and $I_{DSp\_2}$ shown in equations 20.34 and 20.36, respectively. Since the width W=0.076 um, the saturation current for the third example is:

$$I_{SATp\_3} \sim 400 \ \mu A/0.076 \ \mu m; I_{SATp\_1} \sim 5{,}200 \ \mu A/\mu m \quad [EQ\ 20.39]$$

A summary of saturation currents $I_{SATp}$ for the first, second, and third examples for lower voltage operation is as follows:

First example: double-layer ordered insulated-CNT fabric structure:

$I_{SATp} \sim 1{,}000 \ \mu A/\mu m$ at $V_{DS}=1.2$ V from [EQ 20.35]

Second example: quadruple-layer ordered insulated-CNT fabric structure:

$I_{SATp} \sim 1{,}500 \ \mu A/\mu m$ at $V_{DS}=1.2$ V from [EQ 20.37]

Third example: vertically oriented quadruple-layer ordered insulated-CNT fabric structure:

$I_{SATp} \sim 5{,}200 \ \mu A/\mu m$ at $V_{DS}=1.2$ V from [EQ 20.39]

However, CNTFET devices used to sink ESD current surges, such as such as illustrated in prior art FIG. 1B, a voltage surge of up to 3.5 volts is allowed for a peak current of 1 Ampere. Driver circuits may also operate at higher voltage such as 3.5 volts to deliver larger currents. Source-drains $I_{DS}$ currents corresponding to the first, second, and third example described further above, but for pCNTFET devices operating in saturation with $V_{DS}=3.5$ V with $|V_{TP}|=0.5$ V as shown in table 5700 case 8), result in a current $I_{DS}=6.30$ mA. For pCNTFET device of width W corresponding to the first, second, and third examples and shown with respect to equations 20.35, 20/37, and 20.39, respectively, further above, saturation currents may be calculated as shown in equations 20.40, 20.41, and 20.42 further below as follows:

Summary of saturation currents $I_{SATp}$ for the first, second, and third examples for higher voltage operation.

First example: double-layer ordered insulated-CNT fabric structure:

$$I_{SATp} \sim 16 \ mA/\mu m \ \text{at} \ V_{DS}=3.5 \ V \quad [EQ\ 20.40]$$

Second example: quadruple-layer ordered insulated-CNT fabric structure:

$$I_{SATp} \sim 24 \ mA/\mu m \ \text{at} \ V_{DS}=3.5 \ V \quad [EQ\ 20.41]$$

Third example: vertically oriented quadruple-layer ordered insulated-CNT fabric structure:

$$I_{SATp} \sim 83 \ mA/\mu m \ \text{at} \ V_{DS}=3.5 \ V \quad [EQ\ 20.42]$$

A pCNTFET diode such as pCNTFET diode 260 shown in FIG. 2, formed with pCNTFET devices corresponding to the physical and electrical characteristics shown in table 5700 case 8) and structured as a third example pCNTFET device, could conduct an ESD peak current of 1 Ampere with 12 devices in parallel, without exceeding 3.5 volts. That is, using an $I_{SATp}=83$ mA per device shown in equation 20.42, the maximum current capability of 12 device is 12×83 mA~1 A at a maximum of 3.5 volts. For the third example pCNTFET device, with a width per device of W=0.076 um, the combined widths of 12 devices is ~1 μm.

At this point in the specification, width dimensions of pCNTFET devices formed with unordered CNT fabrics and pCNTFET devices formed with single-layer ordered CNT fabrics shown in table 4600 illustrated in FIG. 46 are compared with multi-layer ordered insulated-CNT fabric pCNTFET device 5900 illustrated in FIG. 59. All devices have the same channel length $L_{CH}=200$ nm and the same insulator thickness $t_G=7$ nm. However, the pCNTFET devices shown in table 4600 have a relative dielectric constant $\varepsilon_R=4$, while pCNTFET device 5900 uses $\varepsilon_R=10$. Therefore, for purposes of comparison, the width dimensions of the pCNTFET devices shown in table 4600 are reduced by a factor of 2.5× to adjust for the relative dielectric constant difference with respect to pCNTFET device 5900. The following pCNTFET device width dimensions may be used to conduct EST current 150 illustrated in prior art FIG. 1B, with a peak current of 1 Ampere, with a drain-to-source voltage $V_{DS}<=3.5$ volts:

| CNT Fabric used to Form the pCNTFET Device | | | |
|---|---|---|---|
| | Unordered CNT Fabric | Single-Layer Ordered CNT Fabric | Multi-Layer Ordered Insulated-CNT Fabric |
| Width $W_p$: | 66,640 μm | 44 μm | 1 μm |
| Relative Width: | 66,640× | 44× | 1× |

In summary, pCNTFET devices formed using single-layer ordered CNT fabrics require ~1,500× less width than those formed using unordered CNT fabrics; pCNTFET devices formed using multi-layer ordered insulated-CNT fabrics require ~44× less width than those formed using single-layer ordered CNT fabrics; and pCNTFET devices formed using multi-layer ordered insulated-CNT fabric require ~66,640× less width than those formed with unordered CNT fabric.

Figure 60:
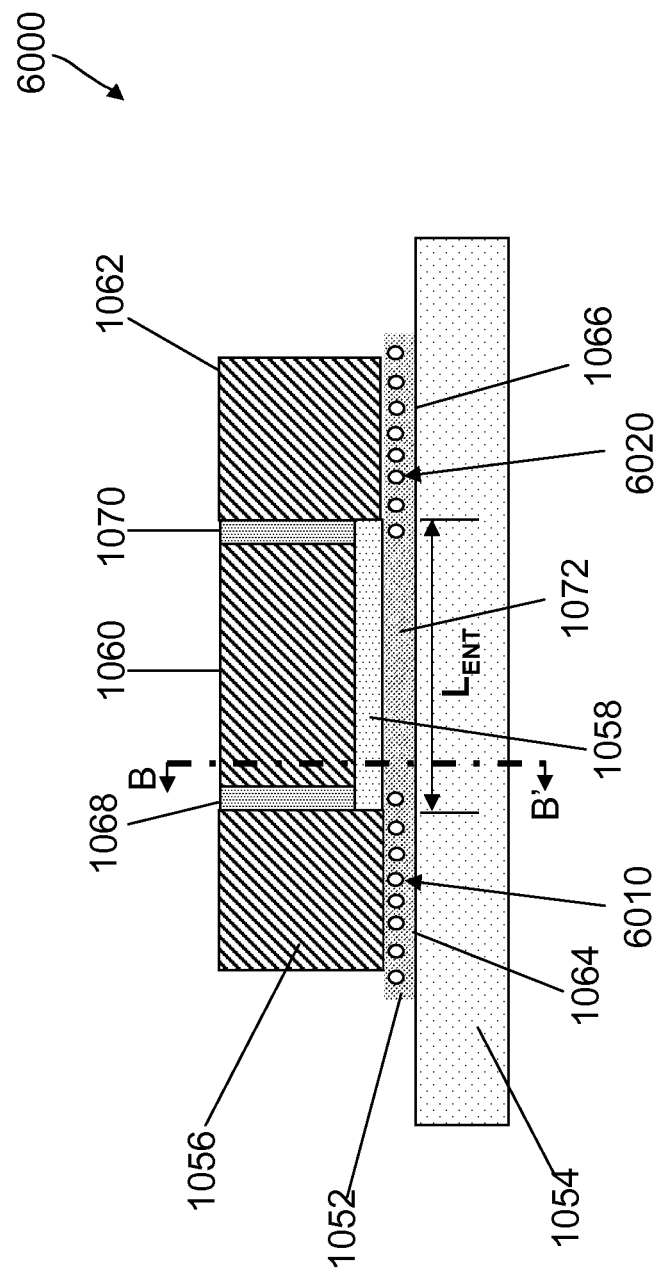
FIG. 60 illustrates a cross section of a CNTFET device formed with single or multi-level ordered CNT fabric with ion implantation in the contact regions and corresponds to the CNTFET device illustrated in FIG. 10B.

Exemplary CNTFET 6000 illustrated in FIG. 60 corresponds to exemplary CNTFET 1050 illustrated in FIG. 10B. CNT fabric 1052 corresponds to single-layer ordered CNT fabric 5075 or multi-layer ordered CNT fabrics such as double-layer ordered CNT fabric 5076 and quadruple-layer ordered CNT fabric 5077 shown in FIGS. 50B, 50C, and 50D, respectively, for example. Methods of fabrication of ordered CNT fabrics are described with respect to FIGS. 49A and 50A and may be applied to un-insulated or insulated CNTs shown in cross sections in FIGS. 55B and 56B, respectively, that correspond to cross section AA' in FIG. 10B. High saturation current device such as those described further above with respect to equations 20.36-20.42 require Ohmic or near-Ohmic contacts between source contacts 1056 and drain contacts 1062, both in contact with CNT fabric 1052, in source region 1064 and drain region 1066, respectively. Electrical characteristics described further above with respect to tables 5300 and 5700 illustrated in FIGS. 53 and 57, respectively, are described in terms of pCNTFET devices. However, both p and n-type CNTFET devices may be fabricated.

pCNTFET device hole injection may be enhanced by acceptor atom deposition. Exemplary CNTFET 6000 illustrated in FIG. 60 corresponds to exemplary CNTFET 1050 illustrated in FIG. 10B, except that doping atoms 6010 and doping atoms 6020 have been ion implanted, or deposited using plasma deposition, or other deposition methods, in source region 1064 and drain region 1066, respectively. Such atoms are typically activated by annealing. Examples of acceptor atoms that may be used to enhance pCNTFET device source and drain regions are oxygen, boron, and other types of atoms.

nCNTFET device electron injection may be enhanced by donor atom deposition. Doping atoms 6010 and doping atoms 6020 have been ion implanted, or deposited using plasma deposition, or other deposition methods, in source region 1064 and drain region 1066, respectively. Such atoms are typically activated by annealing. Examples of donor atoms used to form nCNTFET device source and drain regions are potassium, phosphorous, arsenic, scandium, yttrium and other types of atoms. Hydrogen may also be used to enhance electron injection.

In the examples described further above, the gate insulator, such as insulator 1058 is typically $SiO_2$, positioned between gate conductor 1060 and CNT fabric 1052 in channel region 1072 illustrated in FIGS. 10B and 55B, 56B, for example. However, gate insulator 1052 may be also be formed of SiN, $Al_2O_3$, BeO, and also high relative dielectric constant materials such as tantalum oxide ($Ta_{o_x}$), hafnium oxide ($Hf_xO_2$), yttrium oxide ($Y_2O_2$) or other suitable insulating materials. In some cases, gate insulator 1058 may be formed using a combination of insulators such ONO, $Hf_xO_2/SiO_2$, $Y_2O_2/SiO_2$ and other examples. Gate conductor 1060 may be formed with semiconductors such as Si or Ge, silicides, or metals. For example, the gate structure (gate stack) of exemplary CNTFET device 6000 may be formed with $Al/Hf_xO_2/SiO_2/NT$ fabric, or $Al/Y_2O_2/SiO_2/NT$ fabric, in channel region 1072. Other combinations may also be used. Gate insulator 1058 may have a thickness in the range of less than 1 nm to greater than 25 nm, for example.

Gate conductor 1060, combined with gate insulator 1058 materials, may be selected so as to achieve desired threshold voltage characteristics for exemplary CNTFET device 6000. Exemplary device 6100 illustrated in FIG. 61, corresponding to exemplary device 6000, shows that CNT fabric 1052 may be doped, by ion implantation or other methods, in channel region 1072 so as to adjust threshold voltage $V_{TP}$ for pCNTFET devices, or $V_{TN}$ for nCNTFET devices, as illustrated by doping atoms 6130. Gates, such as gate conductor 1060, generally have a thickness in the range of 5 to 500 nm, for example.

Figure 61:
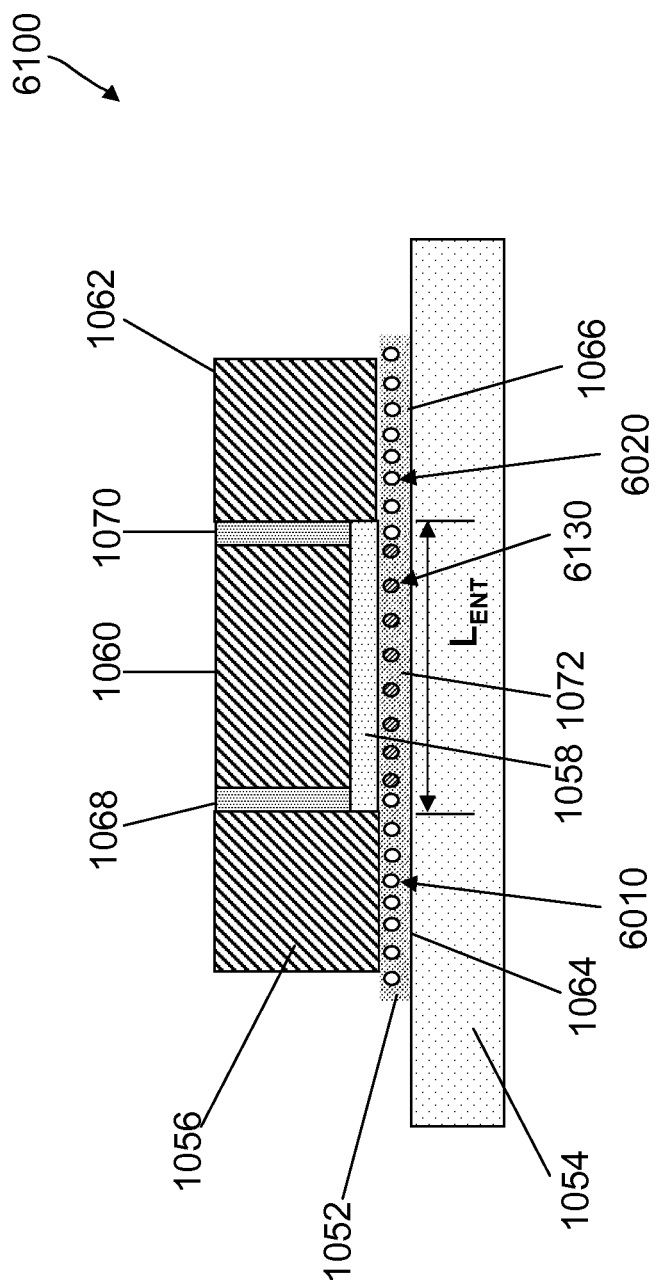
FIG. 61 illustrates a cross section of a CNTFET device formed with single or multi-level ordered CNT fabric with ion implantation in the contact and gate regions and corresponds to the CNTFET device illustrated in FIG. 10B.

As part of the methods of fabrication of CNTFET devices 6000, or 6100 illustrated in FIGS. 60 and 61, respectively, exposed CNT fabric regions between CNTFET devices may be removed using an oxidizing etch. For example, an oxygen plasma formed using oxygen with an inert carrier gas such as helium or argon may be used.

A desirable integrated circuit process flow includes CNTFET devices formed within and between wiring layers, and wiring layers separated by insulating regions, compatible with integrated circuit technology and tools while ensuring CNTFET devices with high saturation currents and competitive with technologies such as CMOS that also have high saturation current devices Such devices may require including other conductor materials for source, drain, and gate conductors and wiring interconnections. Examples of conductor materials, some of which are not listed further above, include, but are not limited to, Al, Au, W, Cu, Mo, Pd, Ni, Ru, Ti, Cr, Ag, In, Ir, Pb, Sn, Sc, and Y, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$, and combinations thereof. Carbon may be used as a conductor or contact material. Carbon nanotube fabrics themselves (single walled, multi-walled, and/or double walled), metallic, semiconducting, or a combination of metallic and semiconducting nanotubes may be used in the form of patterned unordered or ordered nanotube fabrics.

Contacts may also be formed of mixed or nanoscopic material that include conductor and semiconductor nanoscopic particles such as, but not limited to, W, Ti, TiN, TiC, B, P, K, Pd, Si, and Ge and also include carbon and/or allotropes of carbon and other conductive materials, including others listed further above. When contacting CNT fabrics formed with insulated-CNTs, the insulator on the individual CNTs in the contact region is removed prior to contact deposition, for example contacts 1056 and 1062 illustrated in FIGS. 10B, 60, and 61. Also, modified gate conductor, gate insulator, and ordered CNT fabrics (using un-insulated and insulated CNTs) such as illustrated in FIGS. 58 and 59 may also be used.

CNT fabrics, such as CNT fabric 1052, may also include nanoscopic particles. A further description of various mixed or nanoscopic materials, doping atoms, and other methods and structures as described within U.S. patent application Ser. No. 12/356,447.

Methods of Fabrication of High Saturation Current CNTFET Devices

Figure 62:
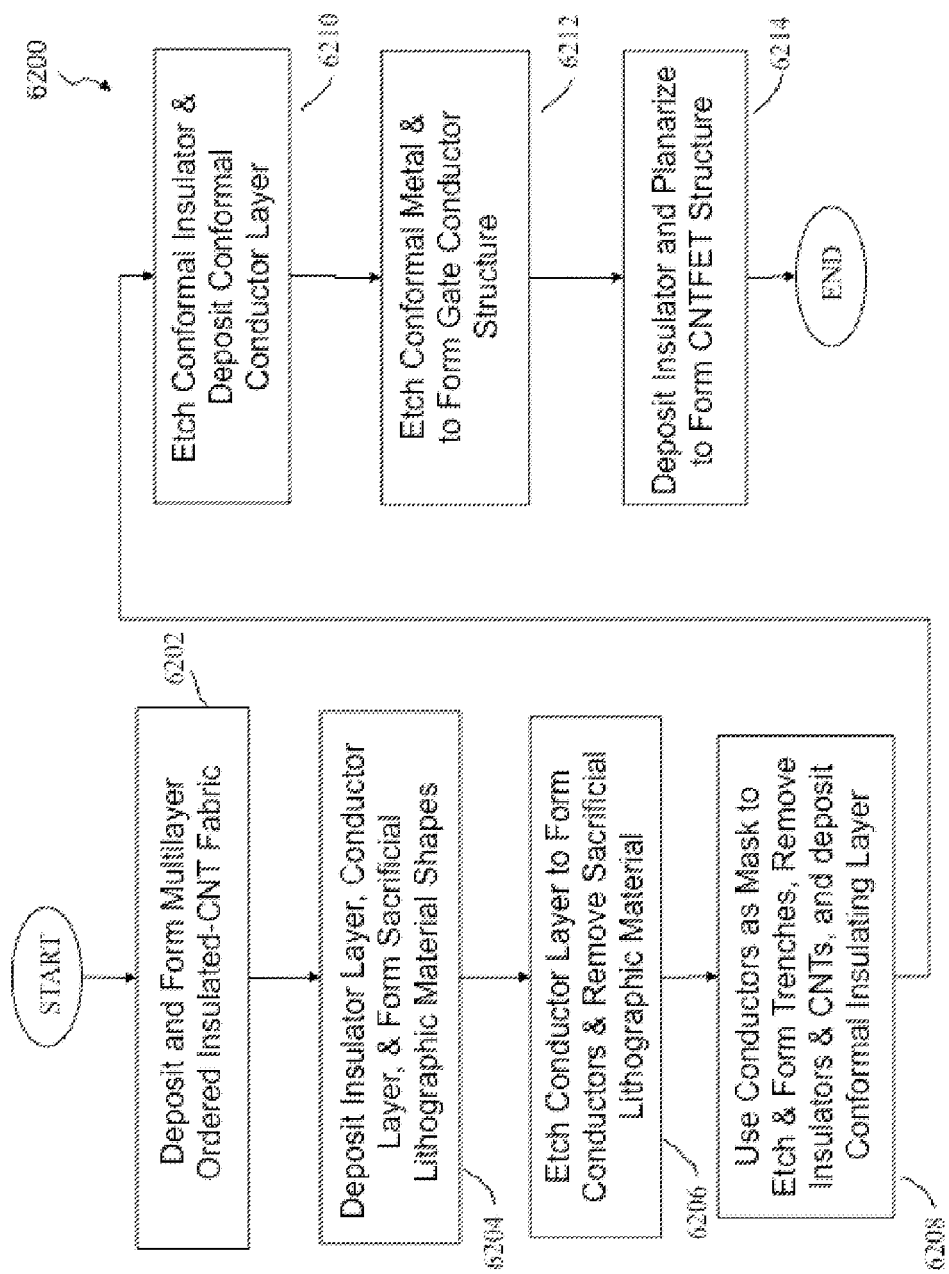
FIG. 62 illustrates methods of manufacturing preferred embodiments of the invention.

At this point in the specification, it is desirable to describe preferred methods of fabrication of high saturation current CNTFET devices. FIG. 62 illustrates basic methods 6200 of manufacturing preferred embodiments of the invention. FIG. 63 illustrates various structures created when applying basic methods shown in FIG. 62. Various material options and corresponding thickness ranges are described further above with respect to CNTFET device 1050B illustrated in FIG. 10B, CNTFET device 6000 illustrated in FIG. 60, and CNTFET device 6100 illustrated in FIG. 61. In this example, cross section BB' shown in the channel region of CNTFET device 6000 illustrated in FIG. 60, corresponding to cross section AA' shown in FIG. 10B, uses the CNTFET device 5900 cross section illustrated in FIG. 59 because CNTFET device 5900 resulted in the largest value of saturation current $I_{SATp}$ per width for the same number of CNTs forming CNT fabric 1052 as shown in equations 20.39 and 20.42 further above. Approximately the same saturation current values are expected n-type CNTFET devices.

Figure 63A:
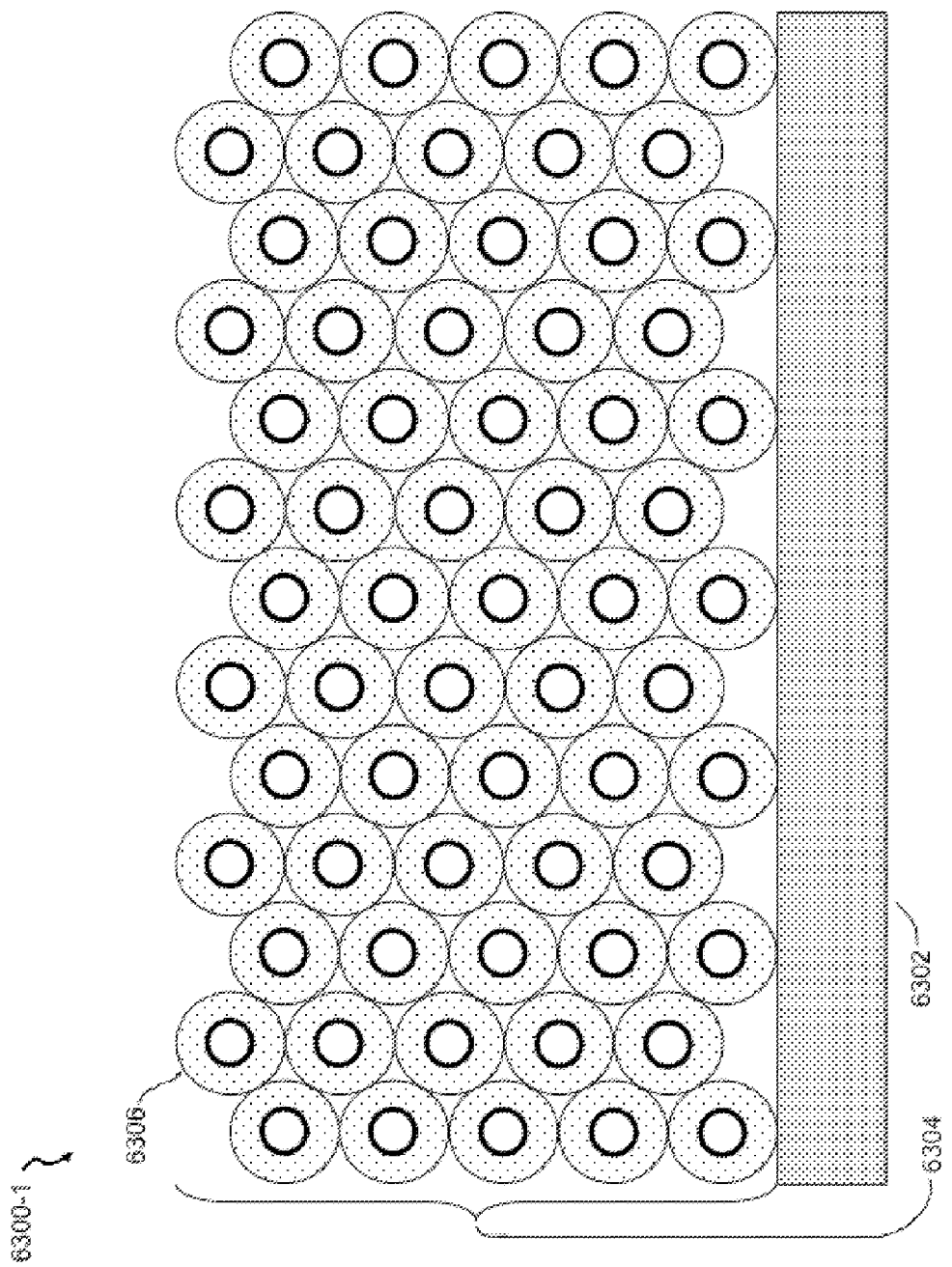
FIGS. 63A-63G illustrate various cross sections of structures corresponding to methods of manufacturing described in FIG. 62.

Referring to basic methods 6200 of manufacturing illustrated in FIG. 62, methods 6202 first deposit and form multilayer ordered CNT fabric 6304 on substrate 6302 as illustrated by structure 6300-1 in FIG. 63A. Structure 6300-1 may be formed within or between wiring layers as described further above. By way of example, ordered CNT fabric 6304 may be formed as a single ordered CNT fabric as illustrated in FIGS. 49A, 50A, and 50B. Alternatively, CNT fabric 6304 may be formed as a multilayer ordered CNT fabric as illustrated in FIGS. 50C and 50D. Un-insulated CNTs or insulated CNTs may be used when forming single or multilayer ordered CNT fabrics. In these examples, the CNTs are semiconducting CNTs of purity approaching 100% semiconducting (non-metallic) CNTs. In this example, the CNTs are insulated as shown by insulated-CNT 6306 in FIG. 63A, with an insulator thickness of 1.5 nm as described in table 5700, case 8), shown in FIG. 57, with a total of 202 CNTs per CNTFET device 5900. In order to fabricate a CNTFET device similar to CNTFET device 5900 illustrated in FIG. 59, with 202 CNTs arranged in a vertically-oriented quadruple-layer ordered insulated-CNT fabric 5910 as the channel region, multilayer ordered insulated-CNT fabric 6304 is fabricated with approximately 50 insulated-CNT layers. Methods 6202 use approximately 10 depositions and forming steps to form ordered CNT fabric 6304. One deposition and forming step includes multilayer depositions of randomly oriented CNTs, in this example, insulated randomly oriented CNTs. Then, a directional mechanical force may be applied as described further above with respect to FIG. 10D. On average, methods 6202 may result in an ordered insulated CNT fabric of approximately 5 insulated CNT layers. Repeating methods 6202 ten times forms multilayer ordered insulated-CNT fabric 6304 of approximately 50 insulated-CNT layers shown in FIG. 63A.

Figure 63B:
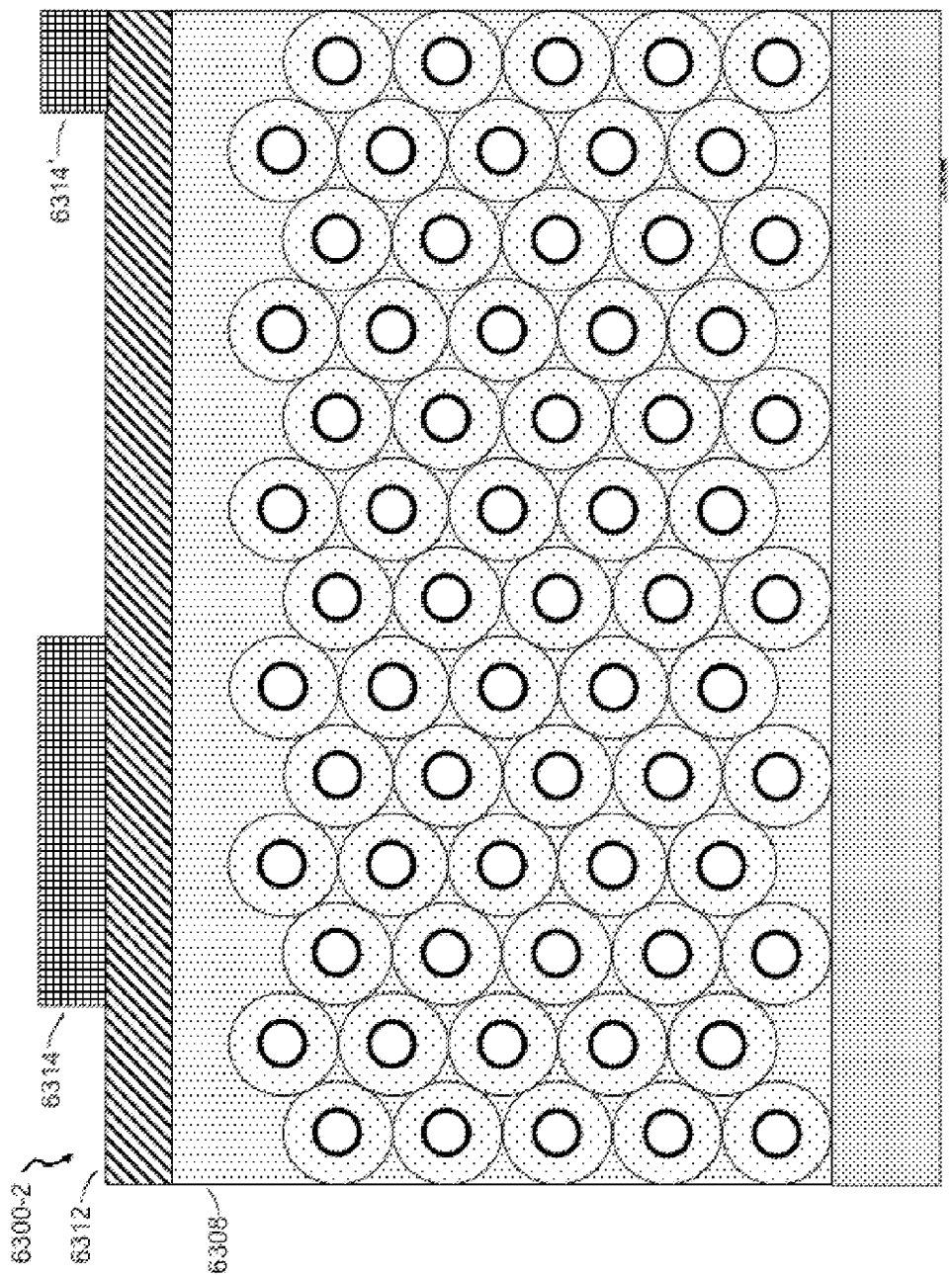

Then, methods 6204 deposit insulator 6308 illustrated in FIG. 63B using methods known in the semiconductor industry. Insulator 6308 may be any of the insulator materials and thickness range described further above with respect to FIGS. 60 and 61, or still other insulator materials and thicknesses. However, in this example, the insulator is chosen as described in table 5700, case 8), is an insulator with a relative dielectric constant $\varepsilon_R=10$ and thickness of approximately 7 nm. However, other insulator materials and thicknesses may be used. Next, a conductor layer 6312 is formed using known methods in the semiconductor industry and may be any of the conducting or semiconducting materials and thickness ranges described further above with respect to FIGS. 60 and 61, or still other conductive or semiconductive materials and thicknesses may be used. Then, a disposable masking layer is formed with regions of sacrificial lithographic material 6314 and 6314'. The minimum dimensions for sacrificial lithographic material 6314 and 6314' is determined by the technology. In this example, a sub-20 nm technology may be used to form sacrificial 6314 and 6314'. Alternatively, for technology in excess of 20 nm, sub-lithographic images may be used to form sub-20 nm sacrificial lithographic material 6314 and 6314' dimensions. Methods of forming sub-lithographic images using sidewall spacer and planarization techniques are know in the semiconductor industry. Bertin et al. U.S. Pat. No. 7,115,901, hereby incorporated by reference in its entirety, illustrates the forming of sub-lithographic images on structures with CNT fabrics. At this point in the process, structure 6300-2 in FIG. 63B is formed.

Figure 63C:
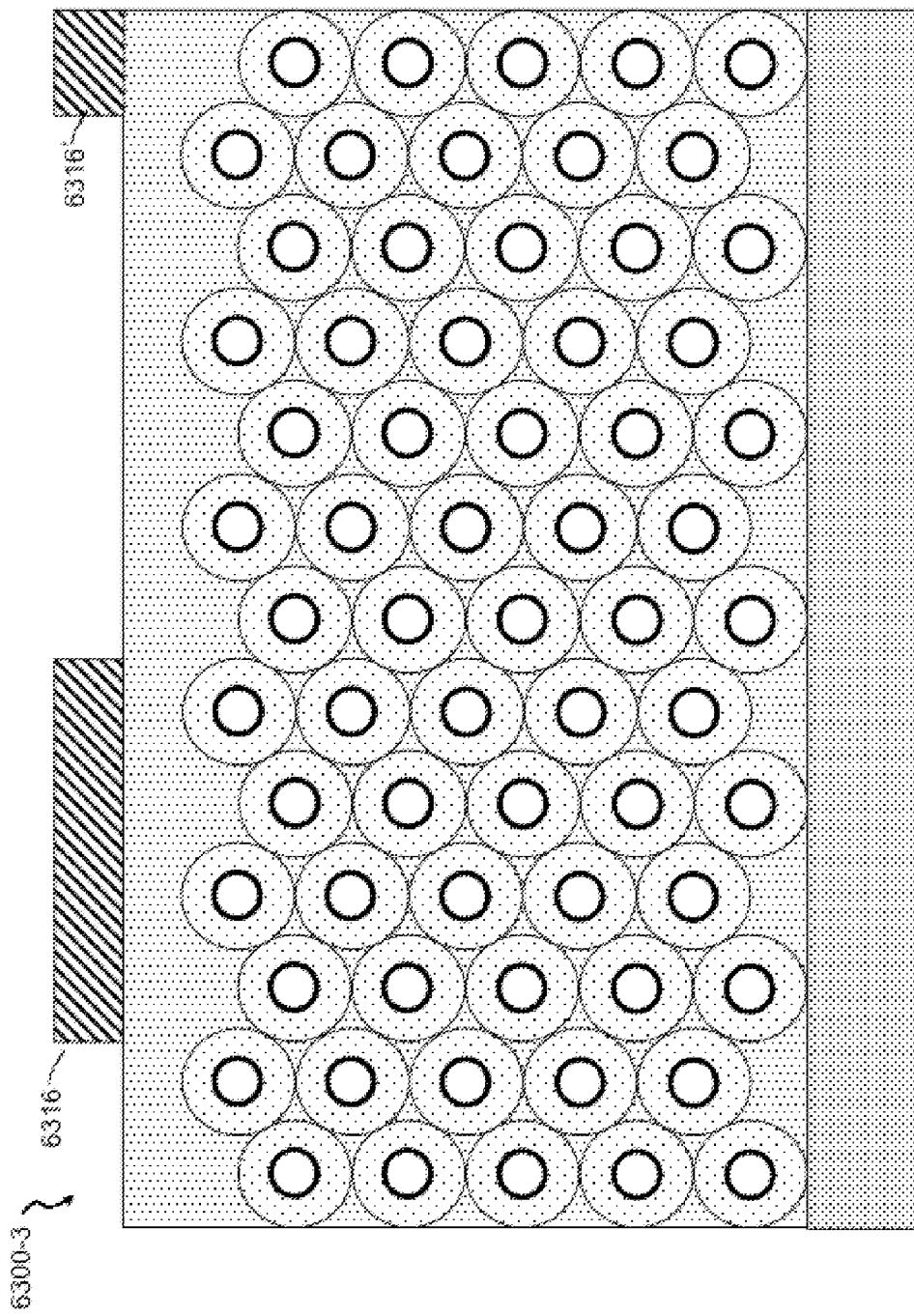
Figure 63D:
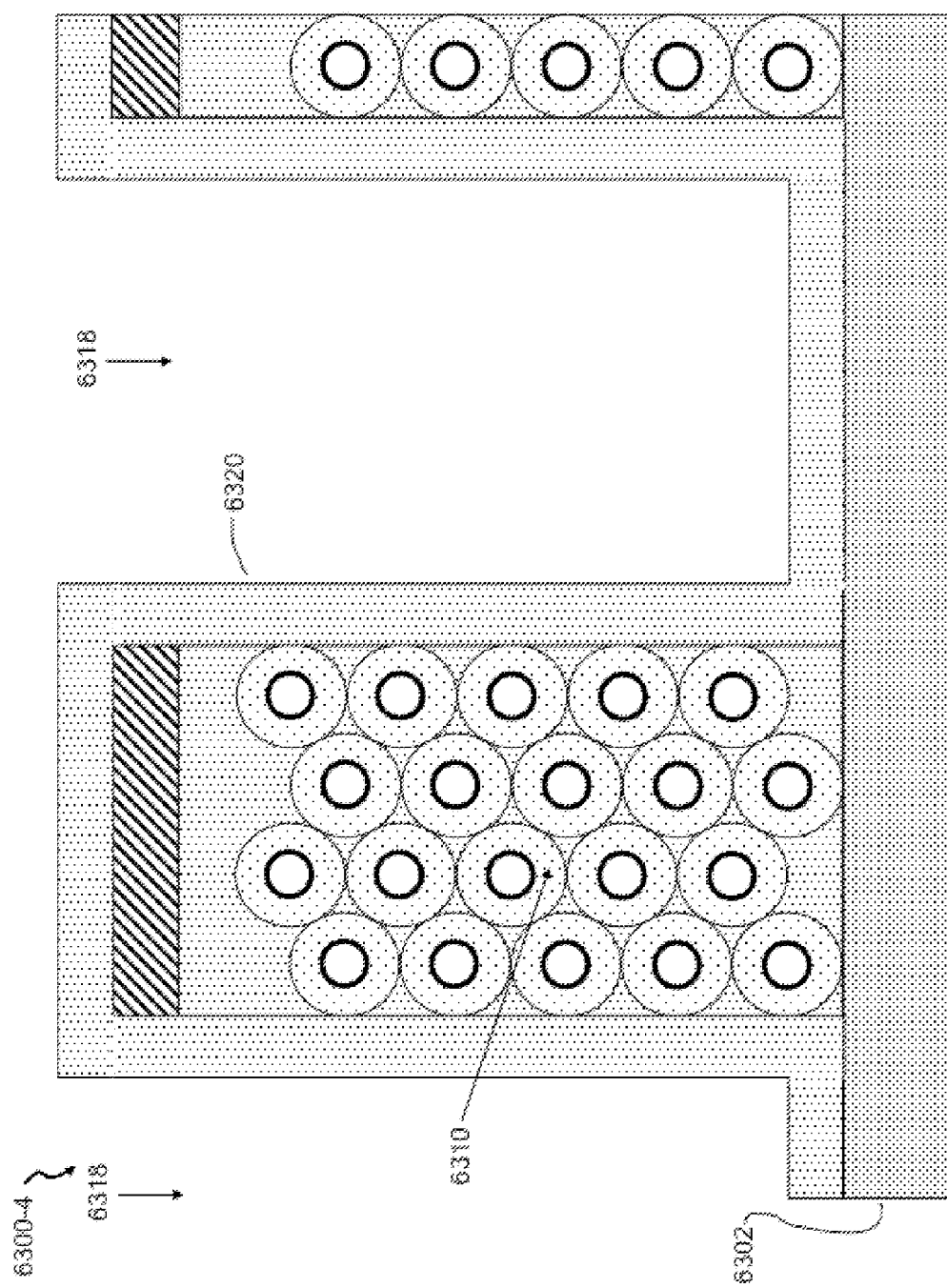

Next, methods 6206 etch conductor layer 6312 to form conductors 6316 and 6316' with sacrificial lithographic material 6314 and 6314' as a masking layer using methods known in the semiconductor industry. Then, sacrificial lithographic material 6314 and 6314' is removed using methods known in the semiconductor industry. Conductor layer 6312 may be any of the conductor or semiconductor materials and thickness ranges described further above with respect to FIGS. 60 and 61, and other figures as well. At this point in the process, structure 6300-3 in FIG. 63C is formed.

Then, methods 6208 use conductors 6316 and 6316' as a masking layer to preferentially etch insulator 6308 and also etch (remove) the insulator layers surrounding each of the CNTs using known semiconductor industry methods. Then, the exposed CNTs maybe etched with an oxygen plasma formed using oxygen with an inert carrier gas such as helium or argon for example, down to substrate 6302. Methods of etching CNTs are described in U.S. Pat. No. 6,706,402 and U.S. Pat. No. 6,835,591 hereby incorporated in the entirety by reference. Trenches are formed. Then, a conformal insulator layer 6320 is deposited using known semiconductor industry methods. Insulator layer 6320 may be any of the insulator materials and thickness ranges described further above with respect to FIGS. 60 and 61, or still other insulator materials and thicknesses. At this point in the process, as shown by structure 6300-4 illustrated in FIG. 63D, multilayer ordered insulated-CNT fabric 6310 is formed, which corresponds to vertically-oriented quadruple-layer ordered insulated-CNT fabric 5910 shown in FIG. 59. Trenches 6318 show structure 6300-4 after etching and conformal insulator 6320 deposition.

Figure 63E:
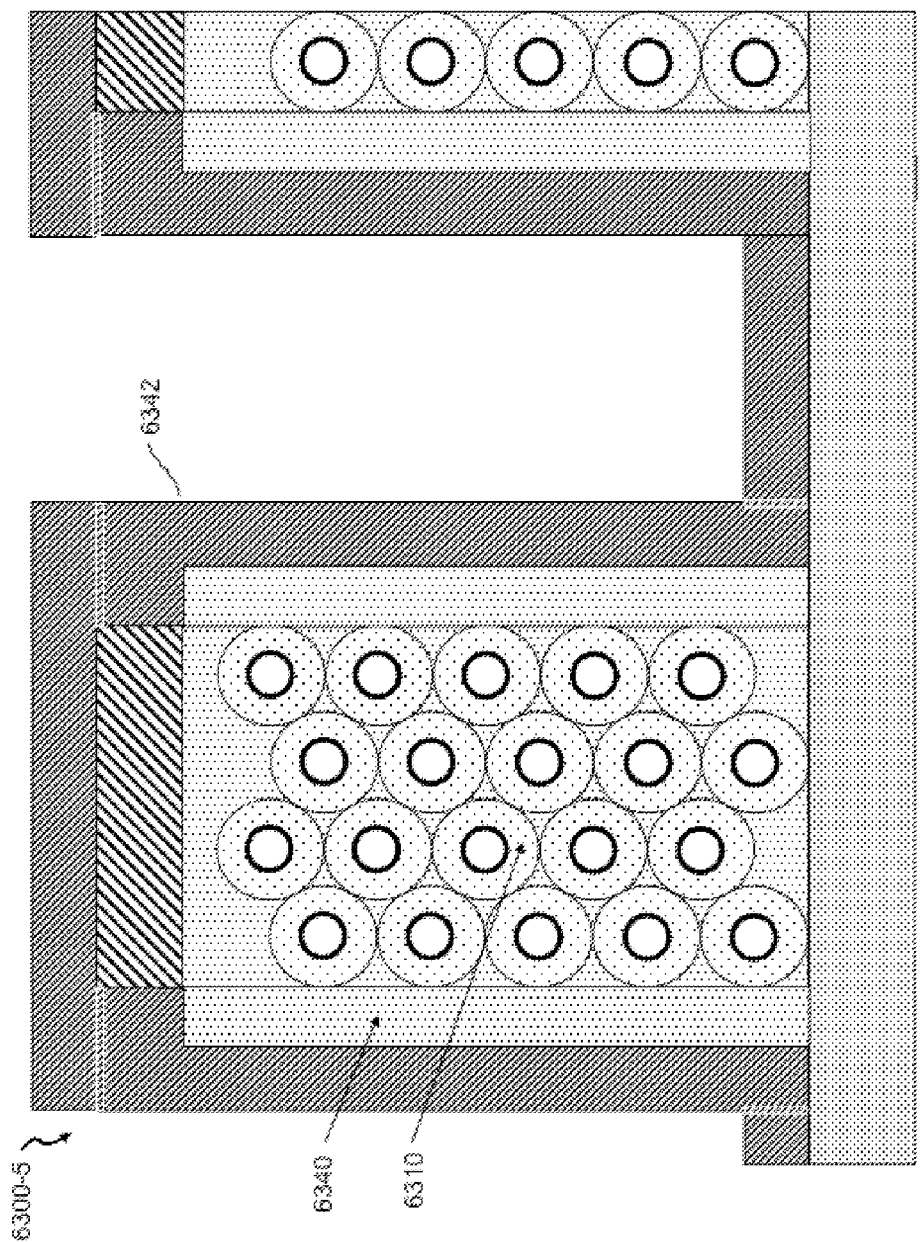

Next, methods 6210 directionally etch conformal insulator 6320, preferential to conductors 6316 and 6316' and substrate 6302, using methods known in the semiconductor industry. Conformal insulator 6320 is etched sufficiently to expose the vertical sidewalls of conductors 6316 and 6316'. Then, conformal conductor 6342 is deposited using methods known in the semiconductor industry. Conductor layer 6342 may be any of the conductor or semiconductor materials and thickness ranges described further above with respect to FIGS. 60 and 61, or still other conductor or semiconductor materials and thicknesses. At this point in the process, structure 6300-5 in FIG. 63E is formed.

Figure 63F:
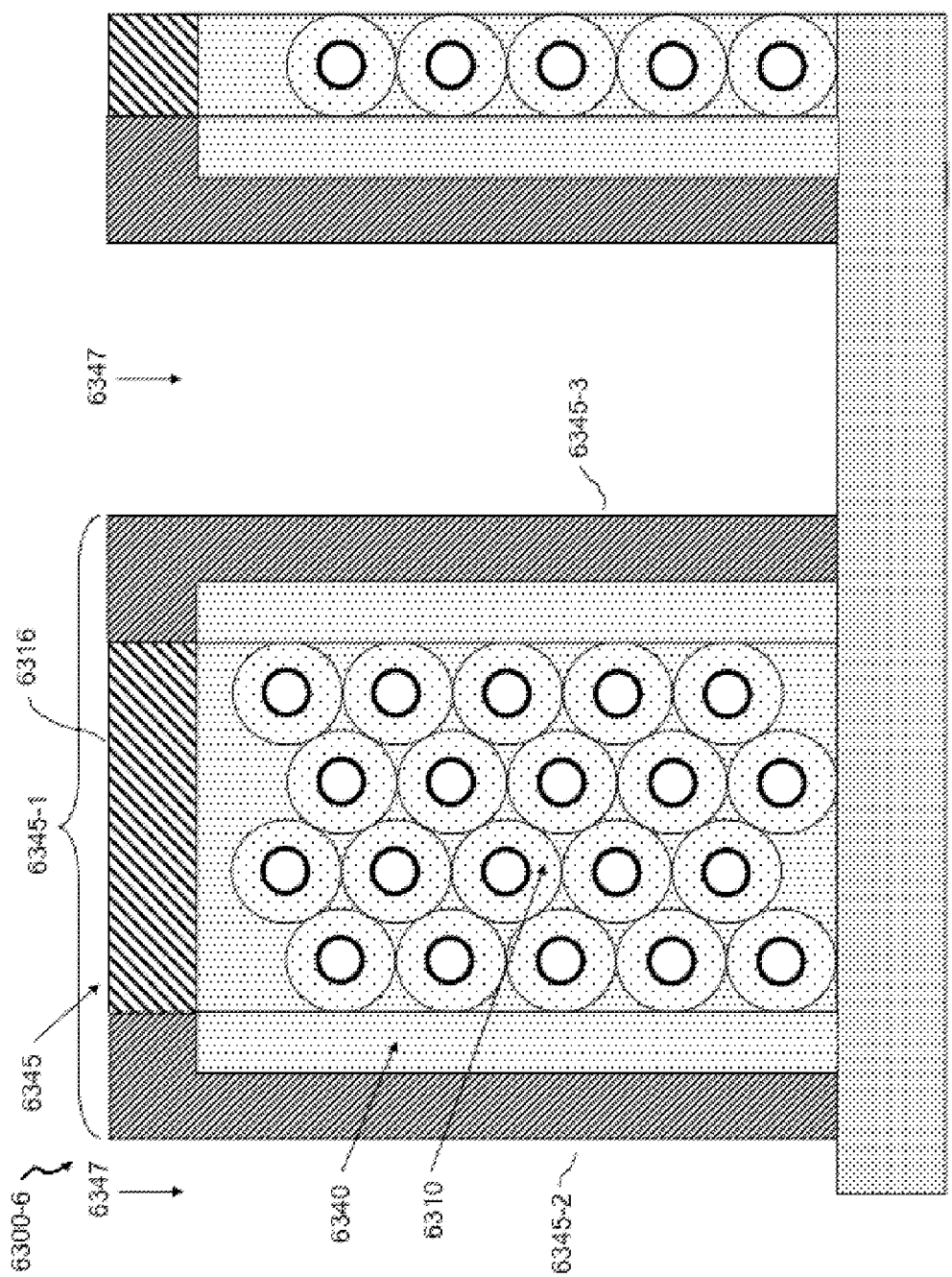
Figure 63G:
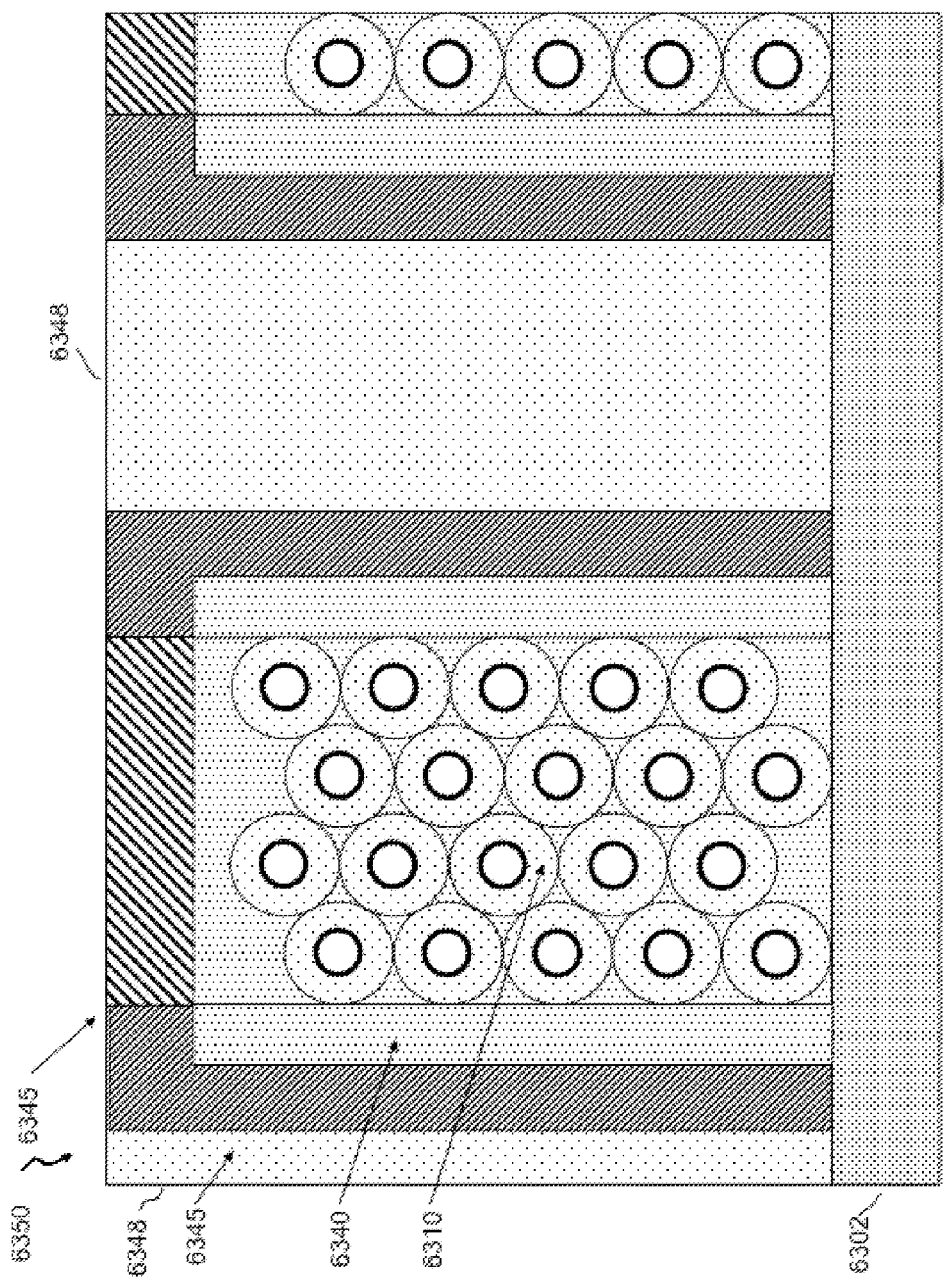

Next, methods 6312 directionally etch conformal metal layer 6342 using methods known in the semiconductor industry and forming trenches 6347, gate conductor section 6345-2 and 6345-3 in contact with the vertical sidewalls of conductor 6316. Conductor 6316 and the sidewall-contact portion of gate conductor sections 6345-2 and 6345-3 form gate conductor section 6345-1. Gate conductor sections 6345-1, 6345-2, and 6345-3 form gate conductor 6345. Adjacent devices (one device partially shown) also are formed at the same time. At this point in the process, structure 6300-6 in FIG. 63F is formed.

Then, preferred methods 6314 deposit and planarize insulator 6348 using methods known in the semiconductor industry. Insulator 6348 may be TEOS for example, or another insulator material. At this point in process, structure 6350 illustrated in FIG. 63G has been formed. Structure 6350 corresponds to the pCNTFET device 5900 illustrated in FIG. 59.

Although the present invention has been described in relation to particular embodiments thereof, many other variations and modifications and other uses will become apparent to those skilled in the art. It is preferred, therefore, that the present invention not be limited by the specific disclosure herein, but rather be defined by the appended claims; and that these claims will encompass modifications of and improvements to what has been described.

What is claimed is:

1. An electrostatic discharge (ESD) protection circuit for protecting a protected circuit from an electrostatic discharge induced voltage, said electrostatic discharge protection circuit comprising:
  a CNTFET (carbon nanotube field effect transistor) diode having at least two terminals, wherein said CNTFET diode is electrically connected to said protected circuit by a first node and said CNTFET diode is electrically connected to a second node;
  wherein said CNTFET diode creates a conducting path in response to said electrostatic discharge induced voltage exceeding a desired voltage, thereby limiting said electrostatic discharge induced voltage and protecting said protected circuit from said electrostatic discharge induced voltage; and
  wherein said CNTFET diode terminates said conducting path in response to a decrease in said electrostatic discharge induced voltage.

2. The electrostatic discharge protection circuit of claim 1, wherein said CNTFET diode is electrically connected to a signal pad by said first node and said CNTFET diode is electrically connected to a power supply pad by said second node.

3. The electrostatic discharge protection circuit of claim 1, wherein said CNTFET diode is electrically connected to a signal pad by said first node and said CNTFET diode is electrically connected to a ground pad by said second node.

4. The electrostatic discharge protection circuit of claim 1, wherein said CNTFET diode is formed using a carbon nanotube field effect transistor (CNTFET) device.

5. The electrostatic discharge protection circuit of claim 4, wherein said CNTFET diode is formed using an ambipolar nanotube field effect transistor (aCNTFET) device.

6. The electrostatic discharge protection circuit of claim 1, wherein said CNTFET diode is on a semiconductor chip.

7. The electrostatic discharge protection circuit of claim 1, wherein said CNTFET diode is formed on an insulator.

8. The electrostatic discharge protection circuit of claim 1, wherein said CNTFET diode is formed below said protected circuit.

9. The electrostatic discharge protection circuit of claim 1, wherein said CNTFET diode comprises a nanotube fabric.

10. An electrostatic discharge (ESD) protection circuit for protecting a protected circuit from an electrostatic discharge induced voltage, said electrostatic discharge protection circuit comprising:
- a CNTFET (carbon nanotube field effect transistor) diode pair having a first CNTFET diode and a second CNTFET diode, wherein said first CNTFET diode has at least two terminals and said CNTFET diode has at least two terminals;
- wherein said first CNTFET diode is electrically connected to said protected circuit by a first node and said first CNTFET diode is electrically connected to a second node;
- wherein said second CNTFET diode is electrically connected to said protected circuit by a third node and said second CNTFET diode is electrically connected to a fourth node;
- wherein said CNTFET diode pair creates a conducting path in response to said electrostatic discharge induced voltage exceeding a desired voltage, thereby limiting said electrostatic discharge induced voltage and protecting said protected circuit from said electrostatic discharge induced voltage; and
- wherein said CNTFET diode pair terminates said conducting path in response to a decrease in said electrostatic discharge induced voltage.

11. The electrostatic discharge protection circuit of claim 10, wherein said first node and said third node correspond to the same node.

12. The electrostatic discharge protection circuit of claim 10, wherein said first CNTFET diode is electrically connected to a signal pad by said first node and said first CNTFET diode is electrically connected to a power supply pad by said second node.

13. The electrostatic discharge protection circuit of claim 12, wherein said second CNTFET diode is electrically connected to said signal pad by said third node and said second CNTFET diode is electrically connected to a ground pad by said fourth node.

14. The electrostatic discharge protection circuit of claim 10, wherein said CNTFET diode pair is formed using carbon nanotube field effect transistor (CNTFET) devices.

15. The electrostatic discharge protection circuit of claim 14, wherein said CNTFET diode pair is formed using at least one ambipolar nanotube field effect transistor (aCNTFET) device.

16. The electrostatic discharge protection circuit of claim 10, wherein said CNTFT diode pair is on a semiconductor chip.

17. The electrostatic discharge protection circuit of claim 10, wherein said CNTFET diode pair is formed on an insulator.

18. The electrostatic discharge protection circuit of claim 10, wherein said first CNTFET diode and said second CNTFET diode are configured in a stacked configuration.

19. The electrostatic discharge protection circuit of claim 10, wherein at least one of said first CNTFET diode and said second CNTFET diode is formed below a pad.

20. The electrostatic discharge protection circuit of claim 10, wherein at least one of said first CNTFET diode and said second CNTFET diode is formed below said protected circuit.

21. The electrostatic discharge protection circuit of claim 10, wherein at least one of said first CNTFET diode and said second CNTFET diode comprises a nanotube fabric.

* * * * *